United States Patent
Esumi et al.

(10) Patent No.: US 7,812,745 B2
(45) Date of Patent: Oct. 12, 2010

(54) CODING APPARATUS, DECODING APPARATUS, AMPLITUDE ADJUSTMENT APPARATUS, RECORDED INFORMATION READER, SIGNAL PROCESSING APPARATUS AND STORAGE SYSTEM

(75) Inventors: Atsushi Esumi, Kanagawa (JP); Kai Li, Kanagawa (JP)

(73) Assignee: Rohm Co., Ltd. (JP)

( * ) Notice: Subject to any disclaimer, the term of this patent is extended or adjusted under 35 U.S.C. 154(b) by 42 days.

(21) Appl. No.: 12/178,423

(22) Filed: Jul. 23, 2008

(65) Prior Publication Data

US 2009/0045989 A1  Feb. 19, 2009

Related U.S. Application Data

(63) Continuation of application No. PCT/JP2007/000025, filed on Jan. 22, 2007.

(30) Foreign Application Priority Data

| Jan. 23, 2006 | (JP) | ............................... 2006-014398 |
| Jan. 24, 2006 | (JP) | ............................... 2006-015615 |
| Jan. 25, 2006 | (JP) | ............................... 2006-016787 |
| Jan. 25, 2006 | (JP) | ............................... 2006-016789 |
| Jan. 25, 2006 | (JP) | ............................... 2006-016797 |

(51) Int. Cl.
*H03M 7/00* (2006.01)

(52) U.S. Cl. .......................................... 341/59; 341/58

(58) Field of Classification Search ................ 341/143, 341/61, 68, 69, 59, 58, 106; 360/234.7, 234.8, 360/236.7, 235.9, 319

See application file for complete search history.

(56) References Cited

U.S. PATENT DOCUMENTS 4,675,650 A * 6/1987 Coppersmith et al. ......... 341/58

(Continued)

FOREIGN PATENT DOCUMENTS

JP  8-293164 A  11/1996

(Continued)

OTHER PUBLICATIONS

Japanese Office Action for Japanese Patent Application No. 2006-016797 dated Apr. 21, 2009 with English translation.

(Continued)

*Primary Examiner*—Brian Young
(74) *Attorney, Agent, or Firm*—Cantor Colburn, LLP

(57) ABSTRACT

A general purpose of the present invention is to improve a DC-free property with a further reduced circuit scale while satisfying a run-length limit. An RLL/DC-free coding unit coding includes a first RLL coding unit, a first signal processing unit, a second RLL coding unit, and a DC component removal coding unit. The first RLL coding unit generates a first coded sequence by subjecting a digital signal sequence outputted from a scrambler to run-length limited coding. The first signal processing unit performs a predetermined signal processing on the digital signal sequence without changing the number of a plurality of bits contained in the digital signal sequence outputted from the scrambler 302. The second RLL coding unit generates a second coded sequence by subjecting the digital signal sequence, which is outputted from the first signal processing unit and on which the predetermined signal processing has been performed by the signal processing unit, to run-length limited coding.

84 Claims, 35 Drawing Sheets

U.S. PATENT DOCUMENTS 5,982,308 A * 11/1999 Bang .......................... 341/96
6,141,167 A * 10/2000 Nishida et al. ................. 360/65

FOREIGN PATENT DOCUMENTS

| JP | 11-177431 | 7/1999 |
| JP | 2000-105981 | 4/2000 |
| JP | 2001-230677 A | 8/2001 |
| JP | 2002-100125 | 4/2002 |
| JP | 2002-367291 A | 12/2002 |
| JP | 2003-179497 | 6/2003 |
| JP | 2003-203435 A | 7/2003 |
| JP | 2004-213863 | 7/2004 |
| JP | 2004-522371 | 7/2004 |
| JP | 2004-253017 A | 9/2004 |
| JP | 2005-166089 A | 6/2005 |

OTHER PUBLICATIONS

International Search Report for International Patent Application No. PCT/JP2007/000025 mailed Apr. 10, 2007 with English Translation.

International Preliminary Report on Patentability for International Patent Application No. PCT/JP2007/000025 mailed Jul. 29, 2008 with English Translation.

Office Action for Japanese Patent Application No. 2006-016797 dated Jul. 21, 2009 with English translation.

* cited by examiner

303

66

323

2303

2066

CODING APPARATUS, DECODING APPARATUS, AMPLITUDE ADJUSTMENT APPARATUS, RECORDED INFORMATION READER, SIGNAL PROCESSING APPARATUS AND STORAGE SYSTEM

BACKGROUND OF THE INVENTION

1. Field of the Invention

The present invention relates to an error correction coding/decoding technology. The present invention particularly relates to a coding apparatus and a decoding apparatus for performing error correction coding/decoding on data stored in a storage medium, an amplitude adjustment apparatus, a recorded information reader, a signal processing apparatus and a storage system.

2. Description of the Related Art

In recent years, storage devices using hard disks are becoming indispensable in various fields such as personal computers, hard disk recorders, video cameras and mobile telephones. Depending on the fields applied, there are various specifications required of the storage devices using the hard disks. For example, high speed and large capacity are required of a hard disk mounted on a personal computer. In order to improve the high-speed performance and the large capacity, the error correction coding with high correction capability needs to be implemented. However, since the amount of data handled per unit time increases as the high-speed performance advances, the error per unit time increase proportionally.

Thus, reloading back into a hard disk takes places when an error correction method having a low error correction capability is used. This increases the access time, causing a bottleneck in achieving the high speed operation.

It is generally desired that a signal sequence whose DC components are reduced or eliminated be used as a signal sequence on which the error correction coding is to be performed. Hereinafter this will be referred to as "DC-free" or "DC-free property". The DC-free means that the frequency is 0, that is, the spectrum in the DC components is 0. In other words, the ratio of 0's and 1's contained in a plurality of bits contained in a signal sequence before a modulation is the same or the like. With a signal sequence provided with the DC-free property, the average level of a reproduced signal obtained from a recording pattern of modulation data stored in the storage medium is constantly fixed within a range of a predetermined signal sequence length. This property contributes to enhancing the noise tolerance. That is, in a signal sequence having a low DC-free property, the detection probability will be low in the detection of data using a Viterbi algorithm. As a result, the correction capability in low-density parity check decoding or Reed-Solomon decoding will be also reduced. In general, run-length limited codes are used in order to ensure the synchronism between the sampling timing and the data. The run-length limited code is a coding where the maximum length of consecutive 0's and the maximum length of consecutive 1's are restricted.

Conventionally, a method is proposed, as a run-length limited coding method, where while the DC-free property is met, the run-length limited coding is performed on a signal sequence with different redundancy bits affixed and a sequence having a characteristic closer to the DC-free is selected from among a plurality of coded sequences (See Patent Document 1, for instance). Also, proposed is a method where a run-length limited coding having a plurality of different properties is executed and a sequence having a characteristic closer to the DC-free is selected from among a plurality of coded sequences (See Patent Document 2, for instance).

[Patent Document 1] Japanese Patent Application Laid-Open No. 2002-100125.
[Patent Document 2] Japanese Patent Application Laid-Open No. 2004-213863.

Under these circumstances, the inventors of the present invention had come to recognize the following problems to be resolved. When the DC-free coding is to be accomplished by selecting sequences having a satisfactory DC-free property from among a plurality of coded sequences, there are cases where in a plurality of coded sequences to be selected there is no coded sequences having a satisfactory DC-free property. That is, there is a problem where a structure is required such that at least one sequence having the satisfactory DC-free property and this required structure affects the circuit scale and storage capacity.

SUMMARY OF THE INVENTION

The present invention has been made in view of the foregoing circumstances described as above, and a general purpose thereof is to provide a signal coding apparatus, a signal decoding apparatus, a signal processing apparatus with a further reduced circuit scale, a coding method and a storage system where the DC-free property can be enhanced while satisfying the run-length limit.

In order to resolve the above problems to be solved, a coding apparatus according to one embodiment of the present invention comprises a first run-length limited coding unit, a signal processing unit, a second run-length limited coding unit, and a DC component removal coding unit. The first run-length limited coding unit generates a first coded sequence by subjecting a digital signal sequence to run-length limited coding. The signal processing unit performs a predetermined signal processing on the digital signal sequence without changing the number of a plurality of bits contained in the digital signal sequence. The second run-length limited coding unit generates a second coded sequence by subjecting the digital signal sequence, on which the predetermined signal processing has been performed by the signal processing unit, to run-length limited coding. The DC component removal coding unit selects and outputs either one of the first coded sequence generated by the first run-length limited coding unit and the second coded sequence generated by the second run-length limited coding unit.

Here, the "DC component removal coding unit" includes a circuit and the like which eliminate DC components of an inputted sequence or reduce them and a circuit and the like which output a sequence having a high DC-free property. The "first run-length limited coding unit" and the "second run-length limited coding unit" may be run-length limited coding circuits having the same property. If they are the run-length limited coding circuits having the same property, the "first run-length limited coding unit" and the "second run-length limited coding unit" may be realized by executing a run-length limited circuit in a time-division manner.

According to this embodiment, the run-length limited coding is performed on two different sequences, so that totally different two coded sequences can be obtained. A predetermined signal processing is performed in order not to increase the number of bits contained in a sequence on which the run-length limited coding is to be performed, so that the coded sequence is obtained without degrading the overall coding rate. The two coded sequences are totally different from each other, so that more suitable choices are available in choosing a sequence having a high DC-free property. Choosing a coded sequence having a high DC-free property from among more suitable choices enchances the possibility of selecting a coded sequence having a higher DC-free property. Also, the use of the same run-length limited coding circuit can simplify the circuit configuration and also reduce the circuit scale.

The signal processing unit may perform bit inversion processing on each of a plurality of bits contained in the digital signal sequence. Also, the signal processing unit may also rearrange the order of a plurality of bits contained in the digital signal sequence. Also, the signal processing unit may perform the bit inversion processing on each of a plurality of bits contained in the digital signal sequence and then perform processing of rearranging the order of bits. According to this embodiment, the bit inversion processing and/or the processing of rearranging the order of bits are/is performed, so that different sequences can be generated without increasing the number of bits contained in a sequence on which the run-length limited coding is to be performed. Since the number of bits contained in the sequence does not increase, the coded sequence can be obtained without deteriorating the coding rate as a whole. The bit inversion processing and/or the processing of rearranging the order of bits are/is performed as a predetermined processing executed to generate different sequences, so that the predetermined processing can be achieved with a simplifier circuit configuration.

The DC component removal coding unit may include: a coded sequence selection unit which selects either one of the first coded sequence and the second coded sequence; a selection identifying information generator which generates selection identifying information that indicates a coded sequence selected by the coded sequence selection unit; and an identification information adding unit which adds the selection identifying information generated by the selection identifying information generator, to any position of the coded sequence selected by the coded sequence selection unit. The coded sequence selection unit may include: a first coupling unit which connects a coded sequence, which has already been selected by the coded sequence selection unit, with the first coded sequence; and a second coupling unit which connects a coded sequence, which has already been selected by the coded sequence selection unit, with the second coded sequence. The coded sequence selection unit may set the sequence connected by the first coupling unit as a new first coded sequence and set the sequence connected by the second coupling unit as a new second coded sequence, and select either one of the new coded sequences. The apparatus may further comprise: a first adding unit which adds a first decision bit to any of positions in the first coded sequence outputted from the first run-length limited coding unit; and a second adding unit which adds a second decision bit, where the first decision bit is bit-inverted, to any of positions in the second coded sequence outputted from the second run-length limited coding unit.

Here, "adding" includes addition, multiplication, insertion and so forth. "Connects a coded sequence, which has already been selected by the coded sequence selection unit, with the first coded sequence" includes connecting a coded sequence selected in the past with the coded sequences which are currently candidates for a selection, and so forth. According to this embodiment, information indicating that any of coded sequences has been selected is appended to the coded sequence. Thereby, the selected coded sequence can be easily determined at a decoding side.

The coded sequence selection unit may include a first rate calculation unit, a second calculation unit and a selection output unit. The first rate calculation unit calculates a ratio of the number of bits indicating 0 and that of bits indicating 1 among a plurality of bits contained in the first coded sequence generated by the first run-length limited coding unit or connected by the first coupling unit. The second rate calculation unit calculates a ratio of the number of bits indicating 0 and that of bits indicating 1 among a plurality of bits contained in the second coded sequence generated by the second run-length limited coding unit or connected by the second coupling unit. The selection output unit selects a coded sequence corresponding to either the ratio calculated in the first rate calculation unit or the ratio calculated in the second rate calculation unit whichever is closer to 50%, and outputs the selected sequence. According to this embodiment, a coded sequence whose ratio of bits indicating 0's and bits indicating 1's is closer to 50% is selected, so that a coded sequence having a high DC-free property can be selected.

The coded sequence selection unit may include a first summation unit, a second summation unit, a coded sequence detector and a selection output unit. The first summation unit adds up a plurality of bits contained in the first coded sequence generated by the first run-length limited coding unit or connected by the first coupling unit and generates a first summation value. The second summation unit adds up a plurality of bits contained in the second coded sequence generated by the second run-length limited coding unit or connected by the second coupling unit and generates a second summation value. The coded sequence detector compares an absolute value of the first summation value generated by the first summation unit with an absolute value of the second summation value generated by the second summation unit, and detects a coded sequence corresponding to a smaller summation value either in the first coded sequence or the second coded sequence. The selection output unit selects the coded sequence detected by the sequence detector from the first coded sequence and the second coded sequence, and outputs the selected coded sequence.

Here, a "summation value" includes that bits contained in a sequence are summed up and so forth. "A plurality of bits contained in a sequence" includes bits indicating 1's or 0's and the like and also includes bits in a case where the bit indicating 0 is substituted by +1 and the bit indicating 1 is substituted by −1 and other cases. According to this embodiment, a plurality of bits contained in a coded sequence are added up and a sequence corresponding to a smaller summation value is selected. Thus, a coded sequence having a high DC-free property can be selected.

The coded sequence selection unit may include a first additive shift unit, a first maximum value detector, a second maximum value detector, a coded sequence detector, and a selection output unit. The first additive shift unit shifts and adds a plurality of bits contained in the first coded sequence generated by the first run-length limited coding unit or connected by the first coupling unit, and generates first additive shift values the number of which is equal to the number of the plurality of bits. The first maximum value detector detects a maximum value in a plurality of first additive shift values generated by the first additive shift unit. The second additive shift unit shifts and adds a plurality of bits contained in the second coded sequence generated by the second run-length limited coding unit or connected by the second coupling unit, and generates second additive shift values the number of which is equal to the number of the plurality of bits. The second maximum value detector detects a maximum value in a plurality of second additive shift values generated by the second additive shift unit. The coded sequence detector compares the maximum value detected by the first maximum value detector and the maximum value detected by the second maximum value detector, and detects either the first coded sequence or the second coded sequence whichever corresponds to a smaller maximum value. The selection output unit selects either the first coded sequence or the second coded sequence whichever is detected by the coded sequence detector, and outputs the selected sequence.

Here, "shifts and adds" includes shifting and adding and further calculating the absolute value thereof. According to this embodiment, a coded sequence is selected by using the maximum value in a result where a plurality of bits contained in the coded sequence have been shifted and added. Thus, a coded sequence having a high DC-free property can be selected.

Another embodiment of the present invention relates to a decoding apparatus. This apparatus comprises an input unit, a decision-bit acquiring unit, a run-length limited decoding unit, and a signal processing unit. The input unit inputs a coded sequence to which a predetermined decision bit is added. The decision-bit acquiring unit acquires the predetermined decision bit added to the coded sequence inputted by the input unit;

The run-length limited decoding unit performs a run-length limited decoding on the coded sequence inputted by the input unit so as to generate a digital signal sequence. The signal processing unit performs either a processing in which a plurality of bits contained in the digital signal sequence generated by said run-length limited decoding unit are bit-inverted, respectively, according to the decision bit acquired by the decision-bit acquiring unit or a processing in which a plurality of bits contained in the digital signal sequence are outputted intact. Also, the signal processing unit may perform a processing of interchanging the order of a plurality of bits contained in the digital sequence, in place of bit-inverting and outputting a plurality of bits contained in the digital signal sequence, respectively. According to this embodiment, a processing corresponding to the DC-free coding executed at a coding side is executed, so that the original digital signal sequence can be decoded.

Still another embodiment of the present invention relates to a signal processing apparatus. This apparatus is a signal processing apparatus comprised of a coding unit and a decoding unit. The coding unit includes a first run-length limited coding unit, a first signal processing unit, a second run-length limited coding unit, a first adding unit, a second adding unit, and a DC component removal coding unit.

The first run-length limited coding unit generates a first run-length coded sequence by subjecting a digital signal sequence to run-length limited coding. The first signal processing unit performs bit inversion processing on each of a plurality of bits contained in the digital signal sequence without changing the number of a plurality of bits contained in the digital signal sequence. The second run-length limited coding unit generates a second coded sequence by subjecting the digital signal sequence, on which the bit inversion processing has been performed by the signal processing unit, to run-length limited coding. The first adding unit adds a first decision bit to any of positions in the first coded sequence outputted from the first run-length limited coding unit. The second adding unit adds a second decision bit, where the first decision bit is bit-inverted, to any of positions in the second coded sequence outputted from the second run-length limited coding unit. The DC component removal coding unit selects and outputs either one of the first coded sequence generated by the first run-length limited coding unit and the second coded sequence generated by the second run-length limited coding unit. The decoding unit includes an input unit, a decision-bit acquiring unit, a run-length limited decoding unit, and a second signal processing unit. The input unit inputs a coded sequence to which the first decision bit or the second decision bit is added. The decision-bit acquiring unit acquires either one of the first decision bit and the second decision bit added to the coded sequence inputted by the input unit. The run-length limited decoding unit performs a run-length limited decoding on the coded sequence inputted by the input unit so as to generate a decoded signal sequence. When the decision bit acquired by the decision-bit acquiring unit is the first decision bit, the second signal processing unit outputs the digital signal sequence generated by the run-length limited decoding unit, intact. When the decision bit acquired by the decision-bit acquiring unit is the second decision bit, the second signal processing unit outputs the signal sequence generated by performing the bit inversion on a plurality of bits contained in the decoded signal sequence generated by the run-length limited decoding unit.

According to this embodiment, the run-length limited coding is performed on two different sequences, so that totally different two coded sequences can be obtained. A predetermined signal processing is performed in order not to increase the number of bits contained in a sequence on which the run-length limited coding is to be performed, so that the coded sequence is obtained without degrading the overall coding rate. The two coded sequences are totally different from each other, so that more suitable choices are available in choosing a sequence having a high DC-free property. Choosing a coded sequence having a high DC-free property from among more suitable choices enhances the possibility of selecting a coded sequence having a higher DC-free property. Also, a processing corresponding to the DC-free coding executed at a coding side is executed at a decoding side, so that the original digital signal sequence can be decoded.

Still another embodiment of the present invention relates to a signal storage system. This storage system comprises a write channel for writing data to a storage apparatus and a read channel for reading out the data stored in the storage apparatus. The write channel includes: a first coding unit which performs a run-length limited coding on the data; a second coding unit which codes the data coded by the first coding unit using a low-density parity check code; and a write unit which writes the data coded by second coding unit to the storage apparatus. The read channel includes: an input unit which inputs an analog signal outputted from the storage apparatus; an analog-to-digital converter which converts the analog signal inputted from the input unit into a digital so as to be outputted; a soft-output detector which calculates a likelihood of the digital signal outputted from the analog-to-digital converter and outputs a soft-decision value; a first decoding unit, compatible with the second coding unit, which decodes data outputted from the soft-output detector; and a second decoding unit, compatible with the first coding unit, which decodes data decoded by the first decoding unit. The first coding apparatus includes: a first run-length limited coding unit which generates a first run-length coded sequence by subjecting a digital signal sequence to run-length limited coding; a signal processing unit which performs a predetermined processing on the digital signal sequence without changing the number of a plurality of bits contained in the digital signal sequence; a second run-length limited coding unit which generates a second coded sequence by subjecting the digital signal sequence, on which the predetermined processing has been performed by the signal processing unit, to run-length limited coding; and a DC component removal coding unit which selects and outputs either one of the first coded sequence generated by the first run-length limited coding unit and the second coded sequence generated by the second run-length limited coding unit. The second decoding unit includes: a run-length limited decoding unit which performs a run-length limited decoding on the data decoded by the first decoding unit so as to generate a digital signal sequence; and a signal processing unit which performs either a processing in which for the digital signal sequence generated by the run-length limited decoding unit a plurality of bits contained in the digital signal sequence are bit-inverted, respectively, according to the selection by the DC component removal coding unit or a processing in which a plurality of bits contained in the digital signal sequence is outputted intact. By performing a coding processing having a high DC-free property, access can be made faster to the storage system.

Still another embodiment of the present invention relates also to a storage system. This storage system further comprises a storage apparatus which stores data; and a control unit which controls a write to and a read from the storage apparatus. The read channel reads the data stored in the storage apparatus according to an instruction of the control unit, and the write channel writes coded data to the storage apparatus according to an instruction of the control unit. According to this embodiment, by performing a coding processing having a high DC-free property, access can be made faster to the storage system.

Still another embodiment of the present invention relates to a coding apparatus. The apparatus may be integrated on a single semiconductor substrate. According to this embodiment, a coding processing having a high DC-free property can be performed efficiently. Also, since there is no need to mount any unnecessary hardware, a semiconductor integrated circuit with a reduced circuit scale can be realized.

It is to be noted that any arbitrary combination of the aforementioned constituent elements and the components or expression of the present invention replaced among a method, an apparatus, a system and so forth are also effective as the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
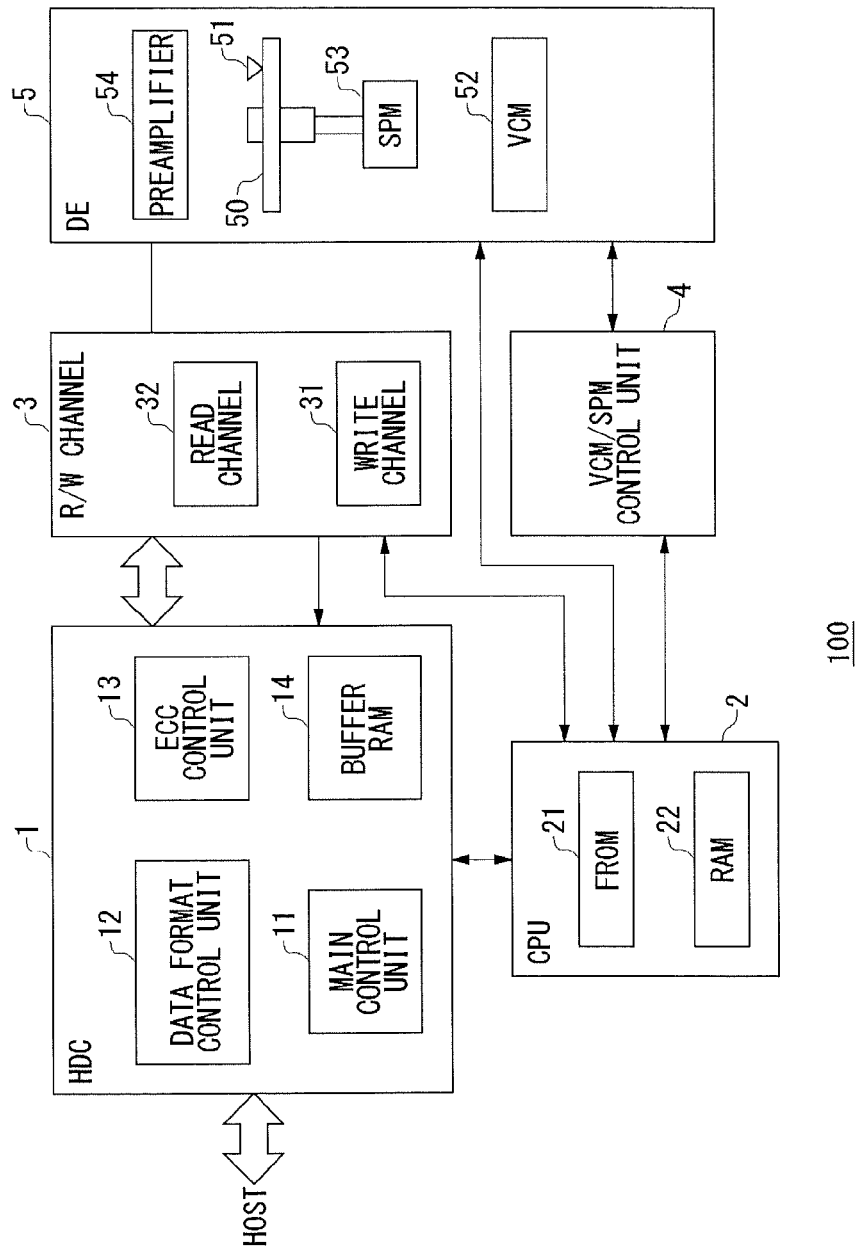
FIG. 1 is a diagram showing a structure of a storage system according to a first embodiment of the present invention.

The invention will now be described based on preferred embodiments which do not intend to limit the scope of the present invention but exemplify the invention. All of the features and the combinations thereof described in the embodiment are not necessarily essential to the invention.

First Embodiment

Before explaining a first embodiment of the present invention in concrete terms, a brief description will be first given of a storage system 100 according to the first embodiment. The storage system 100 according to the first embodiment includes a hard disk controller, a magnetic disk apparatus, and a read/write channel which includes a read channel and a write channel. At the write channel, run-length limited coding, DC-free coding and LDPC coding are performed as coding. At the read channel, data detection using Viterbi algorithm or the like and LDPC decoding are carried out. Since there exist DC components, the detection accuracy in this data detection is known to deteriorate. Further, since the detection accuracy deteriorates, the correction capability of LDPC decoding drops. Thus, in the first embodiment of the present invention, a structure is provided such that the DC-free coding for reducing the DC components is performed at a stage prior to performing the LDPC coding. Note that the storage system 100 according to the first embodiment is not limited to the LDPC coding and a structure may be implemented where other error correction coding schemes, such as turbo coding and convolutional coding, are performed.

The DC-free coding is realized by selecting a sequence having a higher DC-free property from two different sequences. When RLL codings having two different properties are performed, the circuit scale increases by the scale equivalent to the required second RLL coding circuit. Even in the case of an application where the circuit scale is no concern, the execution of RLL codings having two different properties does not guarantee the satisfactory DC-free property for the both sequences. Accordingly, the same RLL coding is performed in the first embodiment of the present invention.

In the case when the same RLL is to be performed, it is necessary to avoid a case where the sequences to be selected are identical to each other. Also, it is necessary to avoid a case where the limited coded sequence having a satisfactory DC-free property does not exist at all. In the light of this, two sequences which are an arbitrary signal sequence and a sequence that has undergone a predetermined signal processing are considered before executing the RLL coding in the first embodiment of the present invention. Thereby, the sequences generated are all different from one another, so that the sequences having a statistically satisfactory DC-free property can be generated. Also, the reduction in coding gain is avoided by performing this predetermined signal processing without changing the number of bits in the signal sequence. Further various sequences can be generated by arbitrarily changing the processing contents of the signal processing, thus resulting in a wide range of options to choose from. Accordingly, the probability that the sequences having a more satisfactory DC-free property is produced increases. Thus, the first embodiment of the present invention is suitable for such applications as one in which the coding rate cannot be set lower as in the case of a hard disk or the like. The detail will be described later.

Referring to Figures, the first embodiment of the present invention will be described in detail hereinbelow.

FIG. 1 is a diagram showing a structure of a storage system 100 according to the first embodiment of the present invention. The storage system 100 in FIG. 1 is comprised roughly of a hard disk controller 1 (hereinafter abbreviated as "HDC 1"), a central processing arithmetic unit 2 (hereinafter abbreviated as "CPU 2"), a read/write channel 3 (hereinafter abbreviated as "R/W channel 3"), a voice coil motor/spindle motor controller 4 (hereinafter abbreviated as "VCM/SPM controller 4"), and a disk enclosure 5 (hereinafter abbreviated as "DE 5"). Generally, an HDC 1, CPU 2, R/W channel 3, and VCM/SPM controller 4 are structured on a single substrate.

The HDC 1 includes a main control unit 11 for controlling the whole HDC 1, a data format control unit 12, an error correction coding control unit 13 (hereinafter abbreviated as "ECC control unit 13"), and a buffer RAM 14. The HDC 1 is connected to a host system via a not-shown interface unit. It is also connected to the DE 5 via the R/W channel 3, and carries out data transfer between the host and the DE 5 according to the control by the main control unit 11. Inputted to this HDC 1 is a read reference clock (RRCK) generated by the R/W channel 3. The data format control unit 12 converts the data transferred from the host into a format that is suited to record it on a disk medium 50 and also converts the data reproduced by the disk medium 50 into a format that is suited to transfer it to the host. The disk medium 50 includes a magnetic disk, for example. The ECC control unit 13 adds redundancy symbols, using data to be recorded as information symbols, in order to enable the correction and detection of errors contained in data reproduced by the disk medium 50. The ECC control unit 13 also determines if any error has occurred in reproduced data and corrects or detects the error if there is any. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the Reed-Solomon (RS) code for ECC, the number of errors correctable will be "Number of redundancy symbols/2". The buffer RAM 14 stores temporarily data transferred from the host and transfers it to the R/W channel 3 with proper timing. Also, the buffer RAM 14 stores temporarily the read data transferred from the R/W channel 3 and transfers it to the host with proper timing after the completion of ECC decoding or the like.

The CPU 2 includes a flash ROM 21 (hereinafter abbreviated as "FROM 21") and a RAM 22, and is connected to the HDC 1, R/W channel 3, VCM/SPM controller 4, and DE 5. The FROM 21 stores an operation program for the CPU 2.

The R/W channel 3, which is roughly divided into a write channel 31 and a read channel 32, transfers data to be recorded and reproduced data to and from the HDC 1. Connected to the DE 5, the R/W channel 3 also performs transmission of recorded signals and reception of reproduced signals. This will be described in detail later.

The VCM/SPM controller 4 controls a voice coil motor 52 (hereinafter abbreviated as "VCM 52") and a spindle motor 53 (hereinafter abbreviated as "SPM 53") in the DE 5.

The DE 5, which is connected to the R/W channel 3, performs reception of recorded signals and transmission of reproduced signals. The DE 5 is also connected to the VCM/SPM controller 4. The DE 5 includes a disk medium 50, a head 51, a VCM 52, an SPM 53, a preamplifier 54 and so forth. In the storage system 100 of FIG. 1, it is so assumed that there is one disk medium 50 and the head 51 is disposed only on one side of the disk medium 50, but the arrangement may be such that a plurality of disk mediums 50 are formed in a stacked structure. Also, the head 51 is generally provided corresponding to each face of the disk medium 50. The recorded signals transmitted from the R/W channel 3 are supplied to the head 51 by way of the preamplifier 54 in the DE 5 and then recorded on the disk medium 50 by the head 51. Conversely, the signals reproduced from the disk medium 50 by the head 51 are transmitted to the R/W channel 3 by way of the preamplifier 54. The VCM 52 in the DE 5 moves the head 51 in a radial direction of the disk medium 50 to position the head 51 at a target position on the disk medium 50. The SPM 53 rotates the disk medium 50.

Figure 2:
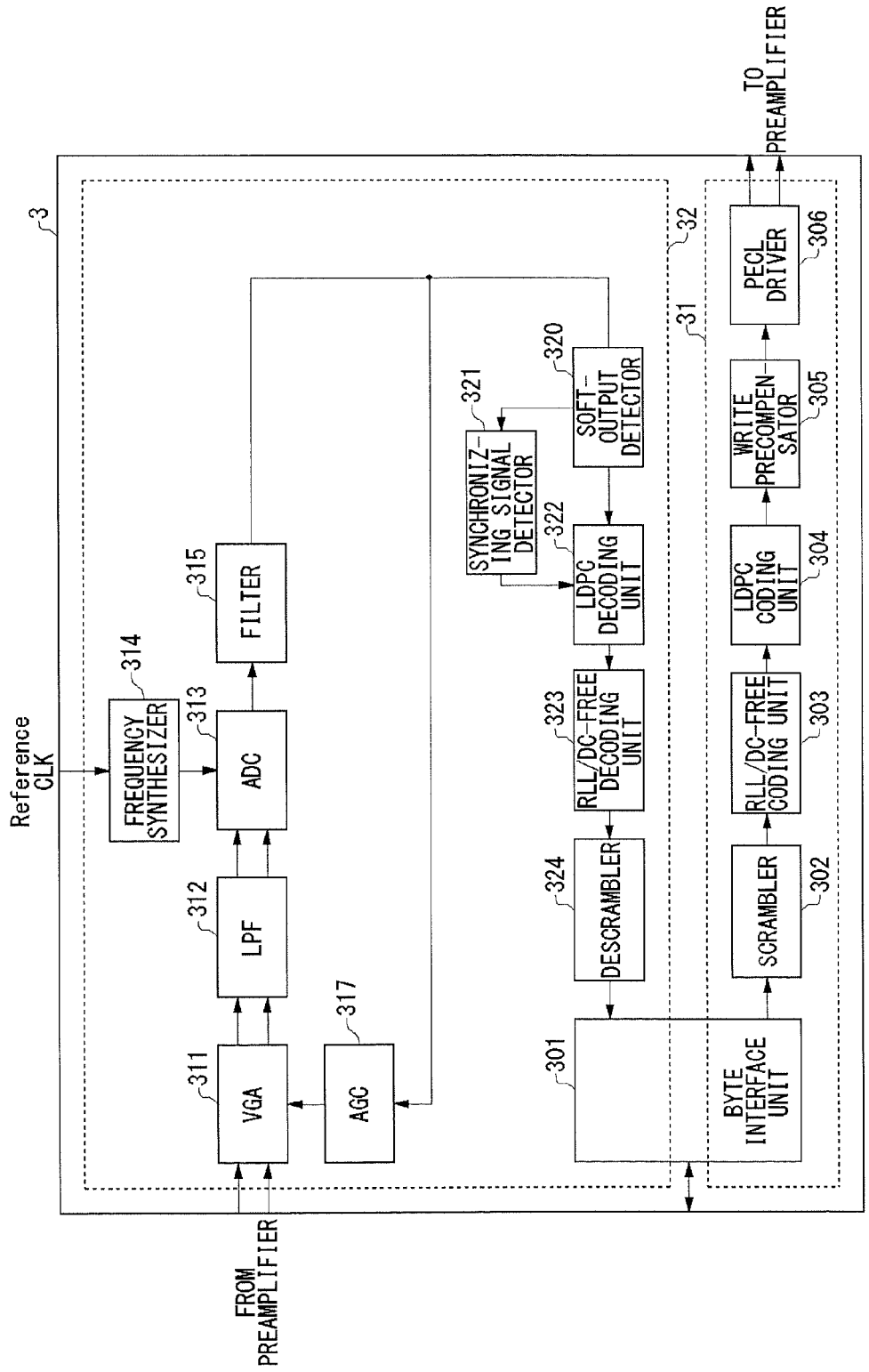
FIG. 2 is a diagram showing a structure of an R/W channel shown in FIG. 1.

Referring now to FIG. 2, a description will be given of the R/W channel 3. FIG. 2 is a diagram showing a structure of the R/W channel 3 shown in FIG. 1. The R/W channel 3 is comprised roughly of a write channel 31 and a read channel 32.

The write channel 31 includes a byte interface unit 301, a scrambler 302, a run-length limited and DC-free coding unit 303 (hereinafter abbreviated as "RLL/DC-free coding unit 303"), a low-density parity check coding unit 304 (hereinafter abbreviated as "LDPC coding unit 304"), a write compensation unit 305 (hereinafter referred to as "write precompensator 305"), and a driver 306.

At the byte interface unit 301, data transferred from the HDC 1 are processed as input data. Data to be written onto the medium are inputted from the HDC 1 sector by sector. At this time, not only user data (512 bytes) for one sector but also ECC bytes added by the HDC 1 are also inputted simultaneously. The data bus, which is normally 1 byte (8 bits) long, is processed as input data by the byte interface unit 301. The scrambler 302 converts write data into a random sequence. The repetition of data of the same pattern is designed to remove any adverse effects on detection performance at reading, which may deteriorate the error rate.

The RLL/DC-free coding unit 303 is used to limit the maximum length of consecutive 0's. By limiting the maximum length of consecutive 0's, data are turned into a data sequence appropriate for an automatic gain controller 317 (hereinafter abbreviated as "AGC 317") and the like. Further, DC components are reduced to help enhance the data detection capability, thereby improving the error correction capability. The detail will be described later.

The LDPC coding unit 304 plays a role of generating a sequence containing parity bits, which are redundancy bits, by LDPC coding. The LDPC coding is done by multiplying a matrix of k×n, called a generator matrix, by a data sequence of length k from the left. The elements contained in a check matrix H corresponding to this generator matrix are 0 or 1, and they are called Low-Density Parity Check codes because the number of 1's is smaller than the number of 0's.

By utilizing the arrangement of these 1's and 0's error correction will be carried out efficiently by an LDPC repeat decoding unit.

The write precompensator 305 is a circuit for compensating the nonlinear distortion resulting from the continuation of magnetization transition on the medium. The write precompensator 305 detects a pattern necessary for compensation from write data and preadjusts the write current waveform in such a manner as to cause magnetization transition in correct positions. The driver 306 outputs signals corresponding to a pseudo ECL level. The output from the driver 306 is sent to the not-shown DE 5 and then sent to the head 51 by way of the preamplifier 54 before the write data are recorded on the disk medium 50.

The read channel 32 includes a variable gain amplifier 311 (hereinafter abbreviated as "VGA 311"), a low-pass filter 312 (hereinafter abbreviated as "LPF 312"), an AGC 317, a digital-to-analog converter 313 (hereinafter abbreviated as "ADC 313"), a frequency synthesizer 314, a filter 315, a soft-output detector 320, an LDPC repeat decoding unit 322, a synchronizing signal detector 321, a run-length-limited/DC-free decoding unit 323 (hereinafter abbreviated as "RLL/DC-free decoding unit 323"), and a descrambler 324.

The VGA 311 and AGC 317 adjust the amplitude of the read waveform of data sent from a not-shown preamplifier 54. The AGC 317 compares an actual amplitude with an ideal amplitude and determines a gain to be set for the VGA 311. The LPF 312, which can adjust the cut-off frequency and boost amount, plays a partial role in reducing high-frequency noise and performing equalization on a partial response (hereinafter abbreviated as "PR") waveform. In the equalization to a PR waveform by the LPF 312, it is difficult to carry out a perfect equalization of analog signals by an LPF because of a number of factors including variation in head lift, non-uniformity of the medium, and variation in motor speed. Hence, equalization to the PR waveform is carried out again by a filter 315 located in a subsequent position and having greater flexibility. The filter 315 may have a function of adjusting its tap coefficient in an adaptable manner. The frequency synthesizer 314 generates a sampling clock for the ADC 313.

The ADC 313 is of a structure to acquire a synchronous samples directly by A-D conversion. Note that in addition to this structure, the structure may be one to acquire asynchronous samples by A-D conversion. In such a case, a zero phase restarter, a timing controller, and an interpolation filter may be further provided in positions subsequent to the ADC 313. Since a synchronous sample needs to be obtained from the asynchronous sample, such a function is performed by these blocks.

The zero phase restarter, which is a block for determining an initial phase, is used to acquire a synchronous sample as quickly as possible. After the determination of the initial phase, the timing controller detects a phase shift by comparing an actual sample value against an ideal sample value. This phase shift is used to determine the parameter for the interpolation filter, and thus a synchronous sample can be obtained.

The soft-output detector 320 uses a Soft-Output Viterbi Algorithm (hereinafter abbreviated as "SOVA"), a kind of Viterbi algorithm, in order to avoid the deterioration of decoding characteristics resulting from intersymbol interference. In other words, there is a problem of deteriorating decoding characteristics as a result of increased interference between recorded codes along with the rise in recording density of magnetic disk apparatuses in recent years. And a Partial Response Maximum Likelihood (hereinafter abbreviated as "PRML") method, which utilizes the partial response due to intersymbol interference, is used as a method to overcome the problem. The PRML is a method for obtaining a signal sequence that maximizes the likelihood of the partial response of reproduced signals.

When the SOVA method is used in the soft-output detector 320, the soft-output detector 320 outputs a soft-decision value. Assume, for instance, that soft-decision values (−0.71, +0.18, +0.45, −0.45, −0.9) have been outputted as SOVA outputs. These values numerically represent their likelihood of being "0" or their likelihood of being "1". For example, the first value of "−0.71" signifies a strong likelihood of being 1, whereas the second value of "+0.18" is more likely to be 0 but is also significantly likely to be 1. The output of a conventional Viterbi detector is hard values, which are the results of hard decision of SOVA output. In the case of the above example, the values will be (1, 0, 0, 1, 1). The hard values, which represent either 0 or 1, no longer have the information suggesting the likelihood of being 0 or 1. Accordingly, the inputting of the soft-decision values to the LDPC repeat decoding unit 322 can realize improved decoding performance.

The LDPC repeat decoding unit 322 plays a role of restoring an LDPC-coded data sequence to the sequence before the LDPC coding from the LDPC-coded data sequence. The principal methods for such decoding are the sum-product decoding method and the min-sum decoding method. While the sum-product decoding method gives a better decoding performance, the min-sum decoding method is easily realizable by hardware. In the actual decoding by the use of the LDPC code, a fairly satisfactory decoding performance can be accomplished by repeatedly carrying out the decoding between the soft-output detector 320 and the LDPC repeat decoding unit 322. In practice, therefore, the soft-output detector 320 and the LDPC repeat decoding unit 322 need to be arranged in multiple stages. The synchronizing signal detector 321 plays a role of recognizing the top position of data by detecting the synchronizing signal (sync mark) added to the top of data.

The RLL/DC-free decoding unit 323 restores the data outputted from the LDPC repeat decoding unit 322, to the original data sequence by carrying out a reverse operation of the RLL/DC-free coding unit 303 of the write channel 31 thereon. The detail will be described later.

The descrambler 324 restores the original data sequence by carrying out a reverse operation of the scrambler 302 of the write channel 31. The data generated here are transferred to the HDC 1.

Figure 3A:
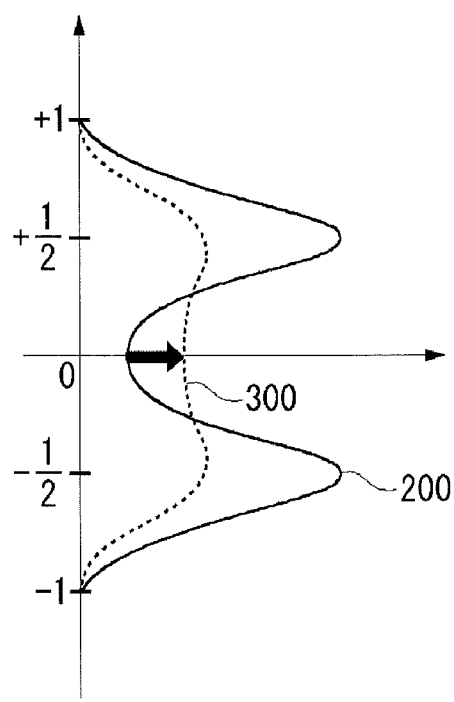
FIGS. 3(a) and 3(b) are diagrams showing examples of DC-free characteristics according to a first embodiment of the present invention.
Figure 3B:
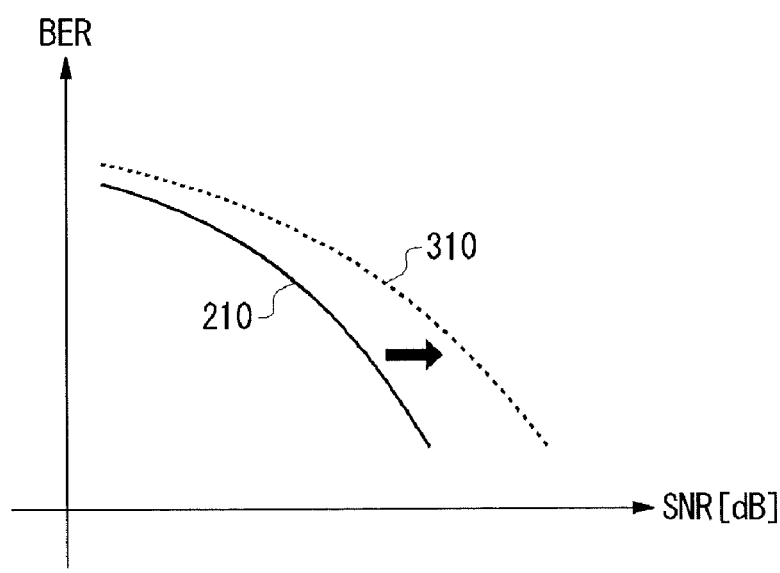

A description is here given of "DC-free". FIGS. 3(a) and 3(b) are diagrams showing examples of DC-free characteristics according to the first embodiment of the present invention. FIG. 3(a) is a diagram showing an example of the distribution of soft-decision values in the case of being DC-free and not being DC-free. The horizontal axis indicates the quantity and the vertical axis indicates the soft-decision value. The vertical axis is an axis that contains the soft-decision values at both the positive side and the negative side with the center being ±0. A first characteristic 200 indicated by a solid line shows a distribution thereof in the case of being DC-free. A second characteristic 300 indicated by a dotted line shows a distribution thereof in the case of being not DC-free. As described above, DC-free means that ratio of the number of 0's to the number of 1's contained in a sequence is 50%. In other words, as shown with the first characteristic 200 of FIG. 3(a), DC-free means that ±½ are the center values, the distribution quantity in the vicinity of ±0 is small and so forth. On the other hand, in the case of not being DC-free as shown with the second characteristic 300 of FIG. 3(a), for example, the distribution amount in the vicinity of ±0 is increased in the distribution of the soft-decision values.

FIG. 3(b) is a diagram showing an example of bit error rates in the case of being DC-free and not being DC-free. The horizontal axis indicates the signal-to-noise ratio and the vertical axis indicates the bit error rate. A third characteristic 210 indicated by a solid line shows a bit error rate characteristic in the case of being DC free. A fourth characteristic 310 indicated by a dotted line shows a bit error rate characteristic in the case of being not DC-free. As shown in the Figure, in the case of not being DC-free the bit error rate deteriorates as compared with the case of being DC-free.

Figure 4:
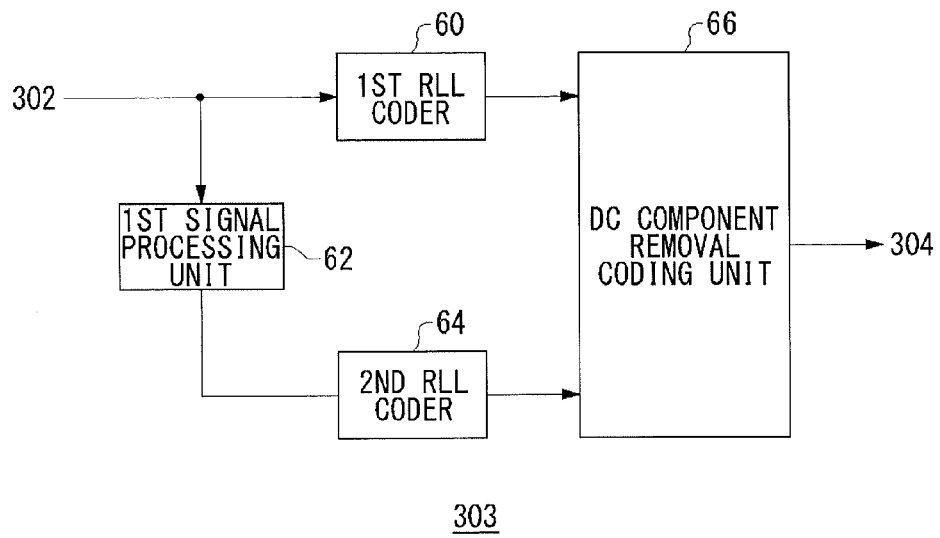
FIG. 4 is a diagram showing an exemplary structure of an RLL/DC-free coding unit shown in FIG. 2.

FIG. 4 is a diagram showing an exemplary structure of the RLL/DC-free coding unit 303 of FIG. 2. The RLL/DC-free coding unit 303 includes a first RLL coder 60, a first signal processing unit 62, a second RLL coder 64, and a DC component removal coding unit 66.

The first RLL coder 60 performs run-length limited coding of a digital signal sequence outputted from the scrambler 302 so as to generate a first coded sequence. The first signal processing unit 62 performs a predetermined signal processing on the digital signal sequence without changing the number of a plurality of bits contained in the digital signal sequence outputted from the scrambler 302. The predetermined signal processing may be any processing as long as the number of a plurality of bits contained in the digital signal sequence is unchanged. For example, it may be a processing that performs bit inversion processing on a plurality of bits contained in the digital signal sequence, respectively. Also, the order of a plurality of bits contained in the digital signal sequence may be rearranged. Also, both the bit inversion processing and the rearrangement of the bit order may be carried out. The second RLL coder 64 performs run-length limited coding of a digital signal sequence outputted from the first signal processing unit 62 so as to generate a second coded sequence. The DC component removal coding unit 66 selects either the first codec sequence generated by the first RLL coder 60 or the second codec sequence generated by the second RLL coder 64 whichever has a higher DC-free property, and then outputs it.

A description is now given using a specific example. If a digital signal sequence to be processed is composed of 300 bits, the RLL/DC-free coding unit 303 processes the bits in ten divided sets where one sets holds 30 bits together. Here, if the coding rate of the first RLL coder 60 and the second RLL coder 64 is 30/31, the number of bits in a sequence, per output, from the first RLL coder 60 and the second RLL coder 64 will be 31 bits.

Figure 5:
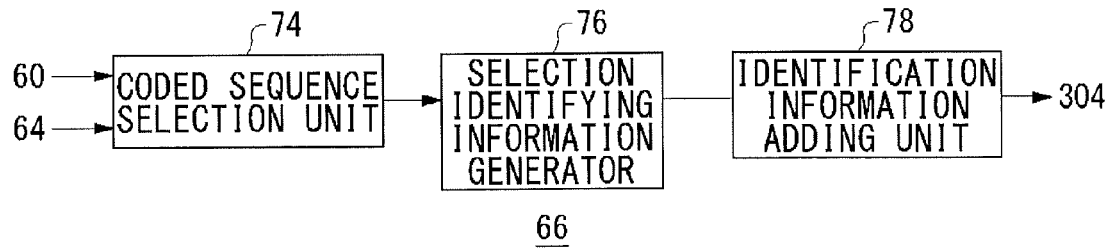
FIG. 5 is a diagram showing an exemplary structure of a DC component removal coding unit shown in FIG. 4.

FIG. 5 is a diagram showing an exemplary structure of the DC component removal coding unit 66 of FIG. 4. The DC component removal coding unit 66 includes a coded sequence selection unit 74, a selection identifying information generator 76, and an identification information adding unit 78. The coded sequence selection unit 74 selects either one of the first coded sequence generated by the first RLL coder 60 and the second coded sequence generated by the second RLL coder 64. The selection identifying information generator 76 generates selection identifying information that indicates the coded sequence selected by the coded sequence selection unit 74. The identification information adding unit 78 adds the selection identifying information generated by the selection identifying generator 76, to any of positions in the coded sequence selected by the coded sequence selection unit 74.

A description is now given in concrete terms. If the first coded sequence is selected by the coded sequence selection unit 74, the selection identifying information added to the first coded sequence by the identification information adding unit 78 will be "0". If, on the other hand, the second coded sequence is selected by the coded sequence selection unit 74, the selection identifying information added to the first coded sequence by the identification information adding unit 78 will be "1". In other words, the first coded sequence added with the selection identifying information "0" or the second coded sequence added with the selection identifying information "1" is outputted to the LDPC coding unit 304. Note that a position at which the selection identifying information is added may be an arbitrarily fixed position in a coded sequence and it may be, for example, a rearmost position. Though the detail will be described later, the selection identifying information added here is a decision bit, so that appropriate decoding processing is realized by analyzing the position at which a decision bit is located and the content of the decision bit. In the above-described specific example, a sequence having the total of 32 bits is outputted where 1-bit selection identifying information is added to a 31-bit coded sequence per output. That is, the coding rate in the RLL/DC-free coding unit 303 as a whole will be 30/32.

The coded sequence selection unit 74 may include a first coupling unit and a second coupling unit which are not shown here. The first coupling unit connects a coded sequence, which has already been selected by the coded sequence selection unit 74, with the first coded sequence. The second coupling unit connects a coded sequence, which has already been selected by the coded sequence selection unit 74, with the second coded sequence. In this case, the coded sequence selection unit 74 may set the sequence connected by the first coupling unit as a new first coded sequence and set the sequence connected by the second coupling unit as a new second coded sequence so as to select either one of them. That is, the coded sequence selection unit 74 makes a selection decision on coded sequences where the coded sequences selected in the past are connected with the coded sequences which are currently candidates for a selection. This can enhance the DC-free characteristics in a long interval.

Figure 6A:
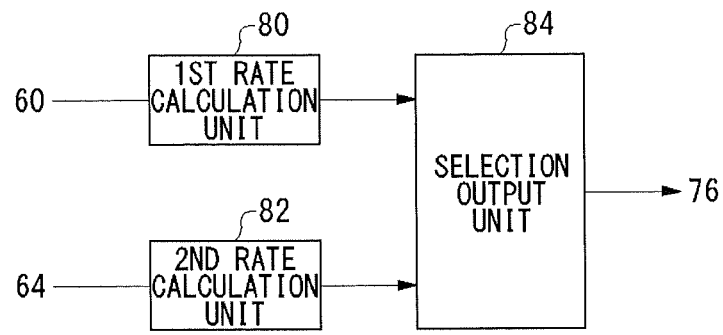
FIGS. 6(a) to 6(c) are diagrams showing first to third exemplary structures of a coded sequence selection unit shown in FIG. 5.

FIGS. 6(*a*) to 6(*c*) are diagrams showing first to third exemplary structures of the coded sequence selection unit 74 of FIG. 5. FIG. 6(*a*) is a diagram showing the first exemplary structure of the coded sequence selection unit 74 of FIG. 5. The coded sequence selection unit 74 in the first structure includes a first rate calculation unit 80, a second rate calculation unit 82 and a selection output unit 84.

The first rate calculation unit 80 calculates a ratio of bits indicating 0 and bits indicating 1 among a plurality of bits contained in the first coded sequence. The second rate calculation unit 82 calculates a ratio of bits indicating 0 and bits indicating 1 among a plurality of bits contained in the second coded sequence. The selection output unit 84 selects a coded sequence corresponding to either the ratio calculated in the first rate calculation unit 80 or the ratio calculated in the second rate calculation unit 82 whichever is closer to 50%, and outputs the selected sequence.

A description is now given using a specific example. Suppose that, at time t=1, 31-bit coded sequences are outputted from the first RLL coder 60 and the second RLL coder 64, respectively. In this case, the first rate calculation unit 80 and the second rate calculation unit 82 analyze the bits contained in the coded sequences, respectively, and calculates the ratios. Here, if there are 14 bits indicating 0's and there are 17 bits indicating 1's in the bits contained in the coded sequence inputted to the first rate calculation unit 80, the ratio will be calculated as follows by the first rate calculation unit 80.

$$\text{Ratio}_{(t=1)} = (\text{the number of bits indicating 0's}+1)/(\text{the number of bits in a coded sequence}+1) = (14+1)/(31+1) \approx 46.9\%$$

Also, if there are 12 bits indicating 0's and there are 19 bits indicating 1's in the bits contained in the coded sequence inputted to the second rate calculation unit 82, the ratio will be calculated as follows by the second rate calculation unit 82. Since in this case the ratio in the first coded sequence is closer to 50%, the first coded sequence is selected by the selection output unit 84 at time t=1. Also, the number of bits, namely "14", for the selected first coded sequence is stored.

The reason why "1" and "0" are added in the numerators on the right-hand sides of the above and the following equation, respectively, is that the selection identifying information is presupposed to be "0" and "1", respectively. Also, the reason why "1" is added in the denominators on the right-hand sides of the above and the following equation is to calculate the ratio of the number of 0's in the coded sequence containing the selection identifying information.

$$\text{Ratio}_{(t=1)} = (\text{the number of bits indicating 0's}+0)/(\text{the number of bits in a coded sequence}+1) = 12/(31+1) = 37.5\%$$

Suppose next that, similar to the case of t=1, 31-bit coded sequences are outputted from the first RLL coder 60 and the second RLL coder 64, respectively, at t=2. Here, if there are 11 bits indicating 0's and there are 20 bits indicating 1's in the bits contained in the coded sequence inputted to the first rate calculation unit 80, the ratio will be calculated as follows.

$$\text{Ratio}_{(t=2)} = (\text{the number of bits indicating 0's}+1)/((\text{the number of bits in a code sequence}+1) \times t) = (14+1+11+1)/((31+1) \times 2) \approx 42.2\%$$

In the above case differing from the case of t=1, the first rate calculation unit 80 calculates the ratio on a sequence where the coded sequence selected at t=1 is connected with the first coded sequence at t=2 by the first coupling unit. That is, the number of bits, "14+1", indicating 0's in the first coded sequence selected at t=1 will be added with the number of bits, "11+1", indicating 0's in the first coded sequence at t=2, in the numerator of the above equation. In the denominator, it will the number of bits for the two sets of coded sequences.

Also, if there are 17 bits indicating 0's and there are 14 bits indicating 1's in the bits contained in the coded sequence inputted to the second rate calculation unit 82, the ratio will be calculated as follows by the second rate calculation unit 82. Since in this case the ratio in the second coded sequence is closer to 50%, the second coded sequence is selected by the selection output unit 84 at time t=2.

$$\text{Ratio}_{(t=2)} = (\text{the number of bits indicating 0's}+0)/((\text{the number of bits in a coded sequence}+1) \times t) = (14+1+17+0)/((31+1) \times 2) = 50.0\%$$

Hereinbelow, at t=3 and thereafter, the ratio is calculated in a similar manner. Here, the ratio at t=k is expressed as follows, where k is an integer greater than or equal to 1. Nbit(m) denotes the number of bits indicating 0's in the bits contained in a coded sequence selected at t=m. Nbit(k) denotes the number of bits indicating 0's in the bits contained in a coded sequence where the ratio is to be calculated. It is assumed here that selection identifying information is also contained in the coded sequence where the ratio is to be calculated.

$$Ratio_{1=k} = \sum_{m=1}^{k} Nbit(m)/(32 \times k)$$

Figure 6B:
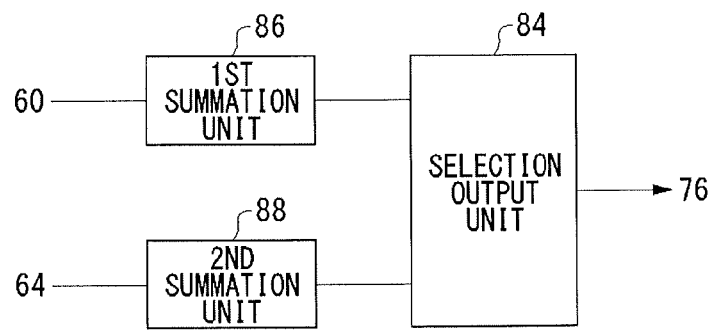

FIG. 6(b) is a diagram showing the second exemplary structure of the coded sequence selection unit 74 of FIG. 5.

The coded sequence selection unit 74 in the second structure includes a first summation unit 86, a second summation unit 88 and a selection output unit 84. The first summation unit 86 adds up a plurality of bits contained in the first coded sequence so as to generate a first summation value.

The second summation unit 88 adds up a plurality of bits contained in the second coded sequence so as to generate a second summation value. A coded sequence detector compares the first summation value generated by the first summation unit 86 with the second summation value generated by the second summation unit 88, and detects a coded sequence corresponding to a smaller summation value either in the first coded sequence or the second coded sequence. Of the first coded sequence and the second coded sequence, the selection output unit 84 selects the coded sequence selected by the sequence detector and outputs it.

A description is now given using a specific example.

Suppose first that 31-bit coded sequences are outputted from the first RLL coder 60 and the second RLL coder 64, respectively. In this case, the first summation unit 86 and the second summation unit 88 sum up the bits contained in the respective coded sequences. In the adding up, 0 may be replaced with "+1" and 1 may be replaced with "−1" so as to be added up. If the summation is done in this manner, the added value will be 0 if the number of bits indicating 1's equals to the number of bits indicating 0's. Thus, it is only necessary that a coded sequence whose summation value is closer to 0 is selected by the selection output unit 84. For example, a coded sequence whose absolute value of the summation value is smaller may be selected. Note that this technique is also called the running digital summation (hereinafter abbreviated as "RDS").

Here, if at t=1 there are 14 bits indicating 0's and there are 17 bits indicating 1's in the 31 bits contained in the coded sequence inputted to the first summation unit 86, the ratio will be calculated as follows. The reason why "1" is added in the first term of the right-hand side is that the selection identifying information is presupposed to be 0.

$$RDS_{abs} = |(14+1) \times (+1) + 17 \times (-1)| = 2$$

Also, if there are 12 bits indicating 0's and there are 19 bits indicating 1's in the bits contained in the coded sequence inputted to the second summation unit 88, the ratio will be calculated as follows.

Since the RDS of the first coded sequence is smaller in this case, the first coded sequence is selected by the selection output unit 84 at t=1. Here, the RDS on the first coded sequence prior to calculating the absolute value is stored as "$RDS_1 = -2$". The reason why "1" is added in the second term of the right-hand side is that the selection identifying information is presupposed to be 1.

$$RDS_{abs} = |12 \times (+) + (19+1) \times (-1)| = 6$$

Suppose next that, similar to the case of t=1, 31-bit coded sequences are outputted from the first RLL coder 60 and the second RLL coder 64, respectively, at t=2. Here, if there are 11 bits indicating 0's and there are 20 bits indicating 1's in the bits contained in the coded sequence inputted to the first summation unit 86, the RDS will be calculated as follows.

Different from the case of t=1, at t=2 the number of bits for the coded sequence selected at t=1 is also taken into account.

$$RDS_{abs} = |RDS_1 + (11+1) \times (+1) + 20 \times (-1)| = |-2+(-8)| = 10$$

Also, if there are 17 bits indicating 0's and there are 14 indicating 1's in the bits contained in the coded sequence inputted to the second summation unit 88, the ratio will be calculated as follows. Since in this case the RDS of the second coded sequence is smaller, the second coded sequence is selected by the selection output unit 84 at t=2. $RDS_2 = 0$ is stored.

$$RDS_{abs} = |RDS_1 + 17 \times (+1) + (14+1) \times (-1)| = |-2+(+2)| = 0$$

Hereinbelow, at t=3 and thereafter, the $RDS_{abs}$ is calculated in a similar manner.

Here, the $RDS_{abs}(k)$ at t=k is expressed as follows, where t is an integer greater than or equal to 1.

Nbit0(m) denotes the number of bits indicating 0's in the bits contained in a coded sequence and selection identifying information selected at t=m. Nbit1(m) denotes the number of bits indicating 1's in the bits contained in the coded sequence and selection identifying information selected at t=m. Here, Nbit0(k) and Nbit1(k) denote respectively the number of bits indicating 0's and the number of bits indicating 1's in the bits contained in a coded sequence where the summation value is to be calculated.

$$RDS_{abs}(k) = |RDS(k-1) + Nbit0(k) \times (+1) + Nbit(k) \times (-1)|$$
$$= \left| \sum_{m=1}^{k} (Nbit0(m) \times (+1) + Nbit1(m) \times (-1)) \right|$$

An operation of the coded sequence selection 74 is characterized by a feature that while it carries out an interval arithmetic processing at given time, it carries out a moving processing in between continuous times in the past. By combining the interval processing and the moving processing in this manner, the DC-free property can be enhanced in a long interval, for example, in an entire sequence of 300 bits.

The summation processing in the first summation unit 86 and the second summation unit 88 may be such that bits indicating 0 or 1 contained in a coded sequence are directly summed up as numerical values. In this case, a coded sequence corresponding to one whose summation value is closer to the half of the number of bits in the coded sequence is selected.

Figure 6C:
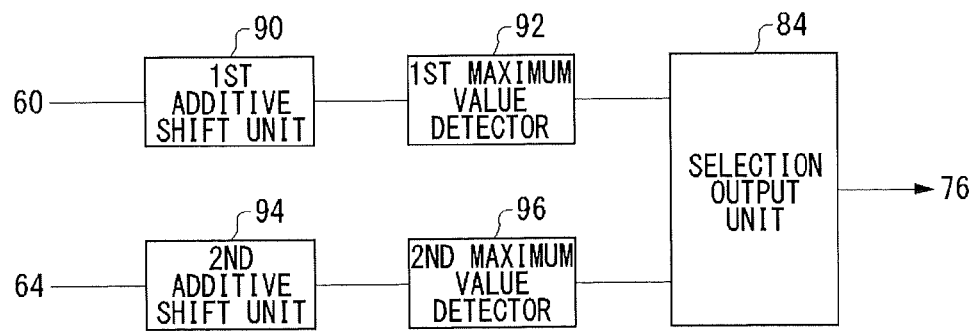

FIG. 6(c) is a diagram showing the third exemplary structure of the coded sequence selection unit 74 of FIG. 5. The coded sequence selection unit 74 in the third structure includes a first additive shift unit 90, a first maximum value detector 92, a second additive shift unit 94, a second maximum value detector 96, and a selection output unit 84. The first additive shift unit 90 shifts and adds a plurality of bits contained in the first coded sequence so as to generate first additive shift values the number of which is identical to the number of a plurality of bits. The first maximum value detector 92 detects a maximum value in a plurality of first additive shift values generated by the first additive shift unit 90. The second additive shift unit 94 shifts and adds in a plurality of bits contained in the second coded sequence so as to generate second additive shift values the number of which is identical to the number of a plurality of bits. The second maximum value detector 96 detects a maximum value in a plurality of second additive shift values generated by the second additive shift unit 94. The coded sequence detector compares the maximum value detected by the first maximum value detector 92 and the maximum value detected by the second maximum value detector 96, and detects either the first coded sequence or the second coded sequence whichever corresponds to the smaller maximum value. The selection output unit 84 selects either the first coded sequence or the second coded sequence whichever was selected by the coded sequence detector, and outputs it.

Similar to the second exemplary structure, in the third exemplary structure of the coded sequence selection unit 74 the selection output unit 84 selects a coded sequence by calculating the respective RDSs in the first additive shift unit 90 and the second additive shift unit 94.

The third exemplary structure differs from the second exemplary structure in that a coded sequence whose maximum value is smaller in the midst of a calculation of RDS of 32 bits is selected. Here, in the second exemplary structure, a coded sequence which is closer to 0 is selected in consideration only of the final calculation value of 32 bits in the RDS calculation. In other words, in the third exemplary structure the selection processing is performed using a moving operation both in a predetermined interval and a plurality of intervals. By implementing such a mode of carrying out the invention as this, a sequence having a satisfactory DC-free property can be selected even in the middle of an interval.

Here, the "maximum value in the midst of a calculation of RDS" at each time t is derived as follows. Here, Min{y(0), y(1)} denotes a function by which a smaller value is selected and the number of the selected sequence is outputted. For example, if y(0)>y(1), S(t) will be 1. Max{x} denotes a function by which a maximum value is detected in x. k denotes a value in the range of 32×(t−1)+1 to 32×t. Bit(m, j) indicates 1 if the mth bit is 0 in the jth coded sequence and indicates −1 if it is 1.

$$S(t) = \text{Min}\{\text{Max}RDS(1), \text{Max}RDS(2)\}$$

$$\text{Max}RDS(1) = \max\{RDS(k, 1)\}$$

$$\text{Max}RDS(2) = \max\{RDS(k, 2)\}$$

$$RDS(k, 1) = \left|\sum_{m=1}^{k} \text{Bit}(m, 1)\right|$$

$$RDS(k, 2) = \left|\sum_{m=1}^{k} \text{Bit}(m, 2)\right|$$

Every time t increases, Bit(m, 1) and Bit(m, 2), the above-described equations and so forth are calculated after the bits of the selected sequence are rewritten as follows.

Bit(m, 1)=Bit(m, 2)=Bit(m, S(t−1)):m=(t−1)×32+1 to t×32, t≠1

Figure 7:
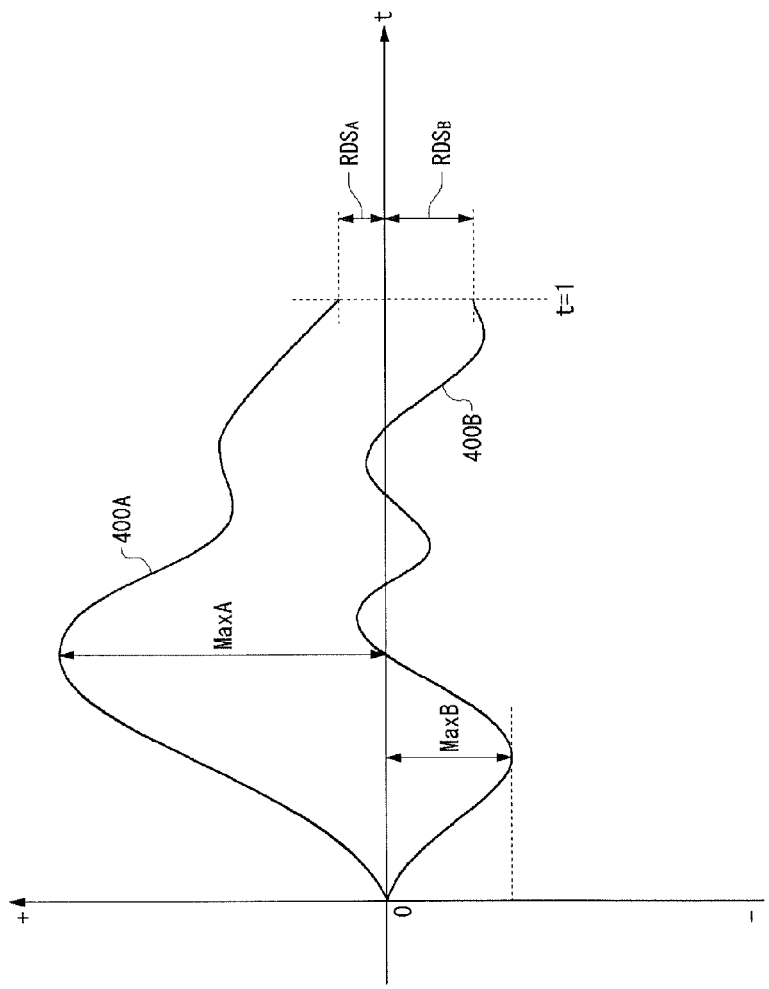
FIG. 7 is a graph showing differences in operation between a coded sequence selection unit shown in FIG. 6(b) and a coded sequence selection unit shown in FIG. 6(c)

The operation in the third exemplary structure of the coded sequence selection unit 74 shown in FIG. 6(c) is here compared with the operation in the second exemplary structure of the coded sequence selection unit 74 shown in FIG. 6(b). FIG. 7 is a graph showing differences in operation between the coded sequence selection unit 74 shown in FIG. 6(b) and the coded sequence selection unit 74 shown in FIG. 6(c). The horizontal axis indicates time, whereas the vertical axis indicates RDS.

Here, 400A indicates a transition of RDS in the first coded sequence. 400B indicates a transition of RDS in the second coded sequence. In the second exemplary structure of the coded sequence selection unit 74 shown in FIG. 6(b), $RDS_A$ and $RDS_B$ which are the final values in the interval arithmetic of RDS are compared with each other, and a coded sequence having a smaller RDS is selected. Since $RDS_A < RDS_B$ in FIG. 7, the selection output unit 84 selects the first coded sequence. On the other hand, in the third exemplary structure of the coded sequence selection unit 74 shown in FIG. 6(c), the RDS in each bit is compared, that is, the maximum values are compared among the absolute values obtained after 32 bits have been subjected to a sequential moving processing, and a coded sequence having a smaller one is selected. In FIG. 7, MaxA is the maximum value for the first coded sequence, whereas MaxB is the maximum value for the second coded sequence. Since MaxA>MaxB here, the selection output unit 84 selects the second coded sequence. With any of the exemplary structures applied to the coded sequence selection unit 74, a coded sequence having a high DC-free property can be selected.

Figure 8:
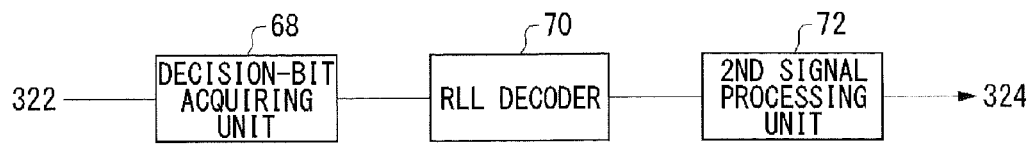
FIG. 8 is a diagram showing an exemplary structure of an RLL/DC-free decoding unit shown in FIG. 2.

FIG. 8 is a diagram showing an exemplary structure of the RLL/DC-free decoding unit 323. The RLL/DC-free decoding unit 323 includes a decision-bit acquiring unit 68, an RLL decoder 70, and a second signal processing unit 72. The decision-bit acquiring unit 68 acquires a predetermined decision bit added to a coded sequence which has been inputted by the LDPC repeat decoding unit 322. The RLL decoder 70 performs run-length limited decoding on the coded sequence inputted by the LDPC repeat decoding unit 322 so as to generate a digital signal sequence. The second signal processing unit 72 performs a signal processing, which is reverse to a predetermined signal processing executed in the first signal processing unit 62, on the digital signal sequence generated by the RLL decoder 70 according to the decision bit acquired by the decision-bit acquiring unit 68. For example, if a bit inversion processing and/or a processing, in which the order of bits is interchanged, are/is performed in the first signal processing unit 62 of FIG. 4, a bit inversion processing and/or a processing, in which the interchanged sequences are restored, are/is performed. Alternatively, according to the decision bit acquired by the decision-bit acquiring unit 68, the second signal processing unit 72 performs a processing in which a plurality of bits contained in the digital signal sequence are outputted as they are.

In terms of hardware, these structures described as above can be realized by a CPU, a memory and other LSIs of an arbitrary computer. In terms of software, it can be realized by memory-loaded programs which have communication functions and the like, but drawn herein are function blocks that are realized in cooperation with those. Hence, it is understood by those skilled in the art that these function blocks can be realized in a variety of forms such as by hardware only, software only or the combination thereof.

According to the first embodiment, the identical RLL coding is performed, so that a sequence having a satisfactory DC-free property can be produced without increasing the circuit scale. Before the RLL coding, two sequences which are an arbitrary signal sequence and a sequence obtained after a predetermined signal processing has been performed on an arbitrary signal sequence are to be processed. Accordingly, the sequences generated are all different and therefore the sequences having a statistically satisfactory DC-free property can be generated. Also, since this predetermined signal processing is executed without changing the number of bits in the signal sequence, the reduction in coding gain can be avoided. Further, various kinds of sequences can be generated by arbitrarily changing the processing contents of the signal processing, so that the range of choices can be expanded. Thus, sequences having further satisfactory DC-free property can be generated. As a result, this is suitable for applications such as one in which the coding rate cannot be set low as with a hard disk. Also, the circuit configuration can be simplified and the circuit scale can be reduced by using the same RLL coding circuit.

By employing the bit inversion processing and/or by interchanging the order of bits, different sequences can be generated without changing the number of bits contained in a sequence on which the run-length limited coding is to be performed. Since the number of bits contained in the sequence does not increase, the coded sequence can be obtained without deteriorating the total coding rate. A bit inversion processing and/or a processing, in which the order of bits is interchanged, are/is performed as a predetermined processing for generating different sequences, so that the predetermined processing can be achieved by a simple circuit configuration. Also, information indicating that any of coded sequences has been selected is added to the coded sequence, so that the selected coded sequence can be easily determined at a decoding side.

The coded sequence selection unit 74 makes a selection decision on coded sequences where the coded sequences selected in the past are connected with the coded sequences which are currently candidates for a selection, so that the DC-free characteristics in a long interval can be enhanced. The RDS is calculated in the coded sequence selection unit 74 by combining the interval processing and the moving processing, so that the DC-free property can be enhanced in a long interval, for example, in an entire sequence of 300 bits. Also, a coded sequence whose ratio of bits indicating 0's and bits indicating 1's is closer to 50% is selected, so that a coded sequence having a high DC-free property can be selected. Also, a plurality of bits contained in coded sequences are added up and then a coded sequence corresponding to a smaller summation value is selected. Hence, a coded sequence having a high DC-free property can be selected. Of a result where the additive shift has been done to a plurality of bits contained in the coded sequences, a coded sequence is selected using the maximum value. Hence, a coded sequence having a high DC-free property can be selected. A processing corresponding to the DC-free coding executed at a coding side is executed, so that the original digital signal sequence can be decoded. By performing a coding processing having a high DC-free property, access can be made faster to the storage system. Also, since there is no need to mount any unnecessary hardware, a semiconductor integrated circuit with a reduced circuit scale can be realized.

In the first embodiment, the R/W channel 3 may be integrated on a single semiconductor substrate. In the coded sequence selection unit 74 according to the first embodiment, a description has been given of the interval arithmetic processing or the moving processing. However, this should not be considered as limiting, and the selection and sorting of coded sequences having a high DC-free property can be made by performing an interval averaging or a moving averaging. In this case, too, the similar advantage can be obtained. Also, in the structure of the RLL/DC-free coding unit 303, a description has been given of a case where two different signal sequences are generated by use of the first signal processing unit 62 that executes a predetermined signal processing. However, this should not be considered as limiting and a plurality of signal sequences may be generated by use of a plurality of signal processing units. For example, there may be provided signal processing units that execute a bit inversion processing, a processing of interchanging the order of bits, and a bit inversion processing and processing of interchanging the order of bits, respectively. In this case, the decision bits indicating that any one of the four sequences has been selected are of 2 bits, so that a proper decoding processing can be realized at the decoding side. Also, the four different sequences including those to which no signal processing has been given can be generated. Since choices can be broadened, the possibility of generating sequences having a high DC-free property can be improved.

Second Embodiment

A second embodiment relates to an error correction coding/decoding technology. It particularly relates to a signal coding apparatus and a signal decoding apparatus for performing error correction coding or error correction on data stored in a storage medium, a signal processing apparatus and a storage system.

The background technology for the second embodiment is first described.

In recent years, storage devices using hard disks are becoming indispensable in various fields such as personal computers, hard disk recorders, video cameras and mobile telephones. Depending on the fields applied, there are various specifications required of the storage devices using the hard disks. For example, high speed and large capacity are required of a hard disk mounted on a personal computer. In order to improve the high-speed performance and the large capacity, the error correcting coding with high correction capability needs to be implemented. However, since the amount of data handled per unit time increases as the high-speed performance advances, the error per unit time increase proportionally. Thus, reloading back into a hard disk takes places when an error correction method having a high error correction capacity is used. This increases the access time, causing a bottleneck in achieving the high speed operation.

It is generally desired that a signal sequence whose DC components are reduced or eliminated be used as a signal sequence on which the error correction coding is to be performed. Hereinafter this will be referred to as "DC-free" or "DC-free property". The DC-free means that the frequency is 0, that is, the spectrum in the DC components is 0. In other words, the ratio of 0's and 1's contained in a plurality of bits contained in a signal sequence before a modulation is the same or the like. With a signal sequence provided with the DC-free property, the average level of a reproduced signal obtained from a recording pattern of modulation data stored in the storage medium is constantly fixed within a range of a predetermined signal sequence length. This property contributes to enhancing the noise tolerance. That is, in a signal sequence having a low DC-free property, the detection probability will be low in the detection of data using a Viterbi algorithm. As a result, the correction capability in low-density parity check decoding or Reed-Solomon decoding will be also reduced. In general, run-length limited codes are used in order to ensure the synchronism between the sampling timing and the data. The run-length limited code is a coding where the maximum length of consecutive 0's and the maximum length of consecutive 1's are restricted.

Conventionally, a method is proposed, as a run-length limited coding method, where while the DC-free property is met, the run-length limited coding is performed on a signal sequence with different redundancy bits affixed and a sequence having a characteristic closer to the DC-free is selected from among a plurality of coded sequences (See Japanese Patent Application Laid-Open No. 2002-100125, for instance). Also, proposed is a method where a run-length limited coding having a plurality of different properties is executed and a sequence having a characteristic closer to the DC-free is selected from among a plurality of coded sequences (See Japanese Patent Application Laid-Open No. 2004-213863, for instance).

Problems to be resolved by the second embodiment are now described.

Under these circumstances, the inventors of the present invention had come to recognize the following problems to be resolved. When at a decoding side the DC-free coding is to be accomplished by selecting sequences having a satisfactory DC-free property among from a plurality of coded sequences, there are cases where in a plurality of coded sequences to be selected there is no coded sequences having a satisfactory DC-free property. Also, there is a problem to be resolved where when the coded sequences selected at a coding side are to be determined at the decoding side, the decision turns out to be false and therefore the error increases.

The second embodiment of the present invention has been made in view of the foregoing circumstances described as above, and a general purpose thereof is to provide a signal coding apparatus, a signal decoding apparatus, a signal processing apparatus and a storage system with a further reduced circuit scale where the DC-free property can be enhanced while satisfying the run-length limit.

Means for resolving the problems in the second embodiment are now described.

In order to resolve the above problems, a signal coding apparatus according to one aspect of the second embodiment comprises: a run-length limited coding unit which generates a run-length coded sequence by subjecting a predetermined signal sequence to run-length limited coding; and a Reed-Solomon coding unit which performs Reed-Solomon coding on the run-length coded sequence generated by the run-length limited coding unit. The Reed-Solomon coding unit includes: a redundancy sequence generator which generates a redundancy sequence used to perform Reed-Solomon coding on the run-length coded sequence; and a redundancy sequence adding unit which adds the redundancy sequence generated by the redundancy sequence generator, to the run-length coded sequence.

Here, "adding" includes addition, multiplication, insertion and so forth. According to this embodiment, the Reed-Solomon coding is performed after the run-length limited coding has been done. This means that at the decoding side the run-length limited decoding is performed on the signal sequence on which the Reed-Solomon decoding has already been performed. Thereby the error correction capability can be enhanced.

Another aspect of the second embodiment of the present invention relates also to a signal coding apparatus. This apparatus comprises: a first run-length limited coding unit which generates a first run-length coded sequence by subjecting a digital signal sequence to run-length limited coding; a signal processing unit which performs a predetermined signal processing on the digital signal sequence without changing the number of a plurality of bits contained in the digital signal sequence; a second run-length limited coding unit which generates a second coded sequence by subjecting the digital signal sequence, on which the predetermined signal processing has been performed by the signal processing unit, to run-length limited coding; a DC component removal coding unit which selects and outputs either one of the first coded sequence generated by the first run-length limited coding unit and the second coded sequence generated by the second run-length limited coding unit; a Reed-Solomon coding unit which generates a redundancy sequence by performing Reed-Solomon coding on the run-length coded sequence outputted by the DC component removal unit; and a redundancy sequence adding unit which adds the redundancy sequence generated by the Reed-Solomon coding unit, to the run-length coded sequence outputted by the DC component removal coding unit.

Here, the "DC component removal coding unit" includes a circuit and the like which eliminate DC components of an inputted sequence or reduce them and a circuit and the like which output a sequence having a high DC-free property. The "first run-length limited coding unit" and the "second run-length limited coding unit" may be run-length limited coding circuits having the same property. If they are the run-length limited coding circuits having the same property, the "first run-length limited coding unit" and the "second run-length limited coding unit" may be realized by executing a run-length limited coding circuit in a time-division manner.

According to this embodiment, the run-length limited coding is performed on two different sequences, so that totally different two coded sequences can be obtained. A predetermined signal processing is performed in order not to increase the number of bits contained in a sequence on which the run-length limited coding is to be performed, so that the coded sequence is obtained without degrading the coding rate as a whole. The two coded sequences are totally different from each other, so that more suitable choices are available in choosing a sequence having a high DC-free property. Choosing a coded sequence having a high DC-free property from among more suitable choices enhances the possibility of selecting a coded sequence having a higher DC-free property. Also, the use of the same run-length limited coding circuit can simplify the circuit configuration and reduce the circuit scale. Since the run-length limited coding is performed and then the Reed-Solomon coding is performed, the run-length limited decoding is performed on a signal sequence on which Reed-Solomon decoding has been performed. In other words, the run-length limited decoding is performed on a sequence which has been error-corrected by the Reed-Solomon decoding. Thereby, the coded sequence selected at a coding side can be determined properly, so that the error correction capability can be enhanced as a whole.

The signal processing unit may perform bit inversion processing on each of a plurality of bits contained in the digital signal sequence. The signal processing unit may also rearrange the order of a plurality of bits contained in the digital signal sequence. The signal processing unit may perform the bit inversion processing on each of a plurality of bits contained in the digital signal sequence and then perform processing of rearranging the order of bits. According to this embodiment, the bit inversion processing and/or the processing of rearranging the order of bits are/is performed, so that different sequences can be generated without increasing the number of bits contained in a sequence on which the run-length limited coding is to be performed. Since the number of bits contained in the sequence does not increase, the coded sequence can be obtained without deteriorating the coding rate as a whole. The bit inversion processing and/or the processing of rearranging the order of bits are/is performed as a predetermined processing executed to generate different sequences, so that the predetermined processing can be achieved with a simplified circuit configuration.

The DC component removal coding unit may include: a coded sequence selection unit which selects either one of the first coded sequence and the second coded sequence; a selection identifying information generator which generates selection identifying information that indicates a coded sequence selected by the coded sequence selection unit; and an identification information adding unit which adds the selection identifying information generated by the selection identifying information generator, to any position of the coded sequence selected by the coded sequence selection unit. The coded sequence selection unit may include: a first coupling unit which connects a coded sequence, which has already been selected by the coded sequence selection unit, with the first coded sequence; and a second coupling unit which connects a coded sequence, which has already been selected by the coded sequence selection unit, with the second coded sequence. The coded sequence selection unit may set the sequence connected by the first coupling unit as a new first coded sequence and may set the sequence connected by the second coupling unit as a new second coded sequence, and may select either one of the new coded sequences. The apparatus may further comprise: a first adding unit which adds a first decision bit to any of positions in the first coded sequence outputted from the first run-length limited coding unit; and a second adding unit which adds a second decision bit, where the first decision bit is bit-inverted, to any of positions in the second coded sequence outputted from the second run-length limited coding unit.

Here, "connects a coded sequence, which has already been selected by the coded sequence selection unit, with the first coded sequence" includes connecting a coded sequence selected in the past with the coded sequences which are currently candidates for a selection, and so forth. According to this embodiment, information indicating that any of coded sequences has been selected is added to the coded sequence. Thereby, the selected coded sequence can be easily determined at a decoding side.

The coded sequence selection unit may include a first rate calculation unit, a second rate calculation unit and a selection output unit. The first rate calculation unit calculates a ratio of bits indicating 0 and bits indicating 1 among a plurality of bits contained in the first coded sequence generated by the first run-length limited coding unit or connected by the first coupling unit. The second rate calculation unit which calculates a ratio of bits indicating 0 and bits indicating 1 among a plurality of bits contained in the second coded sequence generated by the second run-length limited coding unit or connected by the second coupling unit. The selection output unit selects a coded sequence corresponding to either the ratio calculated in the first rate calculation unit or the ratio calculated in the second rate calculation unit whichever is closer to 50%, and outputs it. According to this embodiment, one with ratio of bits indicating 0 and bits indicating 1 closer to 50% is selected, so that a coded sequence having a high DC-free property can be selected.

The coded sequence selection unit includes a first summation unit, a second summation unit, a coded sequence detector and a selection output unit. The first summation unit adds up a plurality of bits contained in the first coded sequence generated by the first run-length limited coding unit or connected by the first coupling unit, and generates a first summation value. The second summation unit adds up a plurality of bits contained in the second coded sequence generated by the second run-length limited coding unit or connected by the second coupling unit, and generates a second summation value. The coded sequence detector compares the absolute value of the first summation value generated by the first summation unit with the absolute value of the second summation value generated by the second summation unit, and detects a coded sequence corresponding to a smaller summation value either in the first coded sequence or the second coded sequence. The selection output unit selects the coded sequence detected by the sequence detector from the first coded sequence and the second coded sequence, and outputs the selected coded sequence.

Here, a "summation value" includes that bits contained in a sequence are summed up and so forth. "A plurality of bits contained in a sequence" includes bits indicating 1's or 0's and the like and also includes bits in a case where the bit indicating 0 is substituted by +1 and the bit indicating 1 is substituted by −1 and other cases. According to this embodiment, a plurality of bits contained in a coded sequence are added up and a sequence corresponding to a smaller summation value is selected. Thus, a coded sequence having a high DC-free property can be selected.

The coded sequence selection unit may include a first additive shift unit, a first maximum value detector, a second additive shift unit, a second maximum value detector, a coded sequence detector, and a selection output unit. The first additive shift unit shift and adds a plurality of bits contained in the first coded sequence generated by the first run-length limited coding unit or connected by the first coupling unit so as to generate first additive shift values the number of which is equal to the number of a plurality of bits. The first maximum value detector detects a maximum value in a plurality of first additive shift values generated by the first additive shift unit. The second additive shift unit shifts and adds a plurality of bits contained in the second coded sequence generated by the second run-length limited coding unit or connected by the second coupling unit so as to generate second additive shift values the number of which is equal to the number of a plurality of bits. The second maximum value detector detects a maximum value in a plurality of second additive shift values generated by the second additive shift unit. The coded sequence detector compares the maximum value detected by the first maximum value detector and the maximum value detected by the second maximum value detector and detects either the first coded sequence or the second coded sequence whichever corresponds to the smaller maximum value. The selection output unit selects either the first coded sequence or the second coded sequence whichever is detected by the coded sequence detector and outputs the selected sequence.

Here, "shifts and adds" includes shifting and adding and further calculating the absolute value thereof. According to this embodiment, a coded sequence is selected by using the maximum value in a result where a plurality of bits contained in the coded sequence have been shifted and added. Thus, a coded sequence having a high DC-free property can be selected.

The redundancy sequence adding unit may have a division unit which divides the redundancy sequence generated by the Reed-Solomon coding unit into a plurality of groups. Each of the groups obtained as a result of the division by the division unit may be added to any position, of the run-length coded sequence, which is a different position for each of the groups. The redundancy sequence adding unit may add to the run-length coded sequence equidistantly for each of the groups obtained as a result of division by the division unit. According to this embodiment, a redundancy sequence is divided into a plurality of groups and these divided redundancy sequences are added to any different positions of the run-length coded sequence in a dispersed manner. Thereby, the RLL property after the redundancy sequences have been added, and the DC-free characteristics can be enhanced. Since the sequences are added equidistantly per group, the RLL property after the redundancy sequences have been added, and the DC-free characteristics can be further enhanced.

Among a plurality of bits contained in the redundancy sequence generated by the Reed-Solomon coding unit, the division unit may divide in a manner that any two or more bits are as a group. Among a plurality of bits contained in the generated redundancy sequence the division unit may divide in a manner that 2N bits (N being an integer greater than or equal to 1) are as a group. According to this embodiment, an even number of redundancy sequences are each added to a run-length coded sequence, so that the RLL property after the redundancy sequence has been added can be further enhanced.

Still another aspect of the second embodiment of the present invention relates to a signal decoding apparatus. This apparatus comprises: an input unit which inputs a first signal sequence where a predetermined redundancy sequence has been inserted; a redundancy sequence detector which detects an insertion position of the redundancy sequence in the first signal sequence inputted by the input unit; a redundancy sequence acquiring unit which cuts out a redundancy sequence from the first signal sequence inputted by the input unit, according to the insertion position detected by the redundancy sequence detector; a Reed-Solomon decoding unit which corrects error in a second signal sequence acquired by the redundancy sequence acquiring unit, using a redundancy bit cut out by the redundancy sequence acquiring unit; and a run-length limited decoding unit which performs a run-length limited decoding on the second signal sequence where the error has been inspected by the Reed-Solomon decoding unit. According to this embodiment, the run-length limited decoding is performed on a signal sequence which has been subjected to the Reed-Solomon decoding. Thus, the error correction capability can be enhanced.

Another aspect of the second embodiment of the present invention relates also to a signal decoding apparatus. This apparatus comprises an input unit, a decision-bit acquiring unit, a run-length limited decoding unit, and a signal processing unit. The input unit inputs a coded sequence to which a predetermined decision bit is added. The decision-bit acquiring unit acquires the predetermined decision bit added to the coded sequence inputted by the input unit. The run-length limited decoding unit performs a run-length limited decoding on the coded sequence inputted by the input unit so as to generate a digital signal sequence. The signal processing unit performs either a processing in which a plurality of bits contained in the digital signal sequence generated by said run-length limited decoding unit are bit-inverted, respectively, according to the decision bit acquired by the decision-bit acquiring unit or a processing in which a plurality of bits contained in the digital signal sequence are outputted intact. The signal processing unit may perform a processing of interchanging the order of a plurality of bits contained in the digital sequence in place of bit-inverting and outputting a plurality of bits contained in the digital signal sequence, respectively. According to this embodiment, a processing corresponding to the DC-free coding executed at a coding side is executed, so that the original digital signal sequence can be decoded.

Still another aspect of the second embodiment of the present invention relates to a s signal processing apparatus. This apparatus is comprised of a signal coding apparatus and a signal decoding apparatus. According to this embodiment, the Reed-Solomon coding is performed after the run-length limited coding has been done. Hence, at a decoding side the run-length limited decoding is performed on the signal sequence which has been subjected to the Reed-Solomon decoding. Thereby, the error correction capability can be enhanced.

Still another aspect of the second embodiment of the present invention relates to a storage system. This storage system is comprised of a write channel for writing data to a storage apparatus and a read channel for reading out the data stored in the storage apparatus, and the write channel includes: a first coding unit which performs a run-length limited coding on the data and which performs Reed-Solomon coding on the data which has been subjected to the run-length limited coding; a second coding unit which codes the data coded by the first coding unit using a low-density parity check code; and a write unit which writes the data coded by second coding unit to the storage apparatus, and the read channel includes: an input unit which inputs an analog signal outputted from the storage apparatus; an analog-to-digital converter which converts the analog signal inputted from the input unit into a digital so as to be outputted; a soft-output detector which calculates a likelihood of the digital signal outputted from the analog-to-digital converter and outputs a soft-decision value; a first decoding unit, compatible with the second coding unit, which decodes data outputted from the soft-output detector; and a second decoding unit, compatible with the first coding unit, which decodes data decoded by the first decoding unit. The first coding unit includes: a run-length limited coding unit which generates a run-length coded sequence by subjecting the data to run-length limited coding; a Reed-Solomon coding unit which generates a redundancy sequence by performing Reed-Solomon coding on the run-length coded sequence generated by the run-length limited coding unit; and a redundancy sequence adding unit which adds the redundancy sequence generated by the Reed-Solomon coding unit, to the run-length coded sequence generated by the run-length limited coding unit. The second decoding unit includes: an input unit which inputs the data decoded by the first decoding unit; a redundancy sequence detector which detects a position, at which the redundancy sequence is inserted, in a first signal sequence inputted by the input unit; a redundancy sequence acquiring unit which cuts out a redundancy sequence from the first signal sequence inputted by the input unit, according to the insertion position detected by the redundancy sequence detector; a Reed-Solomon decoding unit which corrects error in a second signal sequence acquired by the redundancy sequence acquiring unit, using a redundancy bit cut out by the redundancy sequence acquiring unit; and a run-length limited decoding unit which performs a run-length limited decoding on the second signal sequence where the error has been inspected by the Reed-Solomon decoding unit.

According to this embodiment, since the run-length limited coding is performed and then the Reed-Solomon coding is performed, the run-length limited decoding is performed on a signal sequence on which Reed-Solomon decoding has been performed. Hence, the error correction capability can be enhanced. Since the error correction capability can be enhanced, access can be made faster to the storage system.

Still another aspect of the second embodiment of the present invention relates also to a storage system. This storage system further comprises a storage apparatus which stores data and a control unit which controls a write to and a read from the storage apparatus. The read channel reads the data stored in the storage apparatus according to an instruction of the control unit, and the write channel writes coded data to the storage apparatus according to an instruction of the control unit. According to this embodiment, since the run-length limited coding is performed and then the Reed-Solomon coding is performed, the run-length limited decoding is performed on a signal sequence on which Reed-Solomon decoding has been performed. Hence, the error correction capability can be enhanced. Since the error correction capability can be enhanced, access can be made faster to the storage system.

Still another aspect of the second embodiment of the present invention relates to a signal coding apparatus. This apparatus may be integrated on a single semiconductor substrate. According to this embodiment, a coding processing having a high DC-free property and high run-length characteristics can be performed efficiently. Also, since there is no need to mount any unnecessary hardware, a semiconductor integrated circuit with a reduced circuit scale can be realized.

Note that any arbitrary combination of the above-described structural components or the components or expressions of the present invention replaced among a method, an apparatus, a system and so forth are all effective as the embodiments of the present invention.

Before explaining the second embodiment of the present invention in concrete terms, a brief description will be first given of a storage system 1100 according to the second embodiment. The storage system 1100 according to the second embodiment includes a hard disk controller, a magnetic disk apparatus, and a read/write channel which includes a read channel and a write channel. At the write channel, Reed-Solomon coding, run-length limited coding, DC-free coding and LDPC coding are performed as error correction coding. This Reed-Solomon coding (hereinafter abbreviated as "RS coding") may be mounted integrally with a semiconductor that mounts the read channel, or may be mounted on other semiconductors. At the read channel, data detection using Viterbi algorithm or the like and LDPC decoding are carried out. Since there exist DC components, the detection accuracy in this data detection is known to deteriorate. Further, since the detection accuracy deteriorates, the correction capability of LDPC decoding drops. Thus, in the second embodiment of the present invention, a structure is provided such that the DC-free coding for reducing the DC components is performed at a stage prior to performing the LDPC coding. Note that the storage system 1100 according to the second embodiment is not limited to the LDPC coding and a structure may be implemented where other error correction coding schemes, such as turbo coding and convolutional coding, are performed.

The DC-free coding is realized by selecting a sequence having a higher DC-free property from two different sequences. When RLL codings having two different properties are performed, the circuit scale increases by the scale equivalent to the required second RLL coding circuit. Even in the case of an application where the circuit scale is no concern, the execution of RLL codings having two different properties does not guarantee the satisfactory DC-free property for the both sequences. Accordingly, the same RLL coding is performed in the second embodiment of the present invention.

In the case when the same RLL is to be performed, it is necessary to avoid a case where the sequences to be selected are identical to each other. Also, it is necessary to avoid a case where the limited coded sequence having a satisfactory DC-free property does not exist at all. In the light of this, two sequences which are an arbitrary signal sequence and a sequence that has undergone a predetermined signal processing are considered before executing the RLL coding in the second embodiment of the present invention. Thereby, the sequences generated are all different from one another, so that the sequences having a statistically satisfactory DC-free property can be generated. Also, the reduction in coding gain is avoided by performing this predetermined signal processing without changing the number of bits in the signal sequence. Further various sequences can be generated by arbitrarily changing the processing contents of the signal processing, thus resulting in a wide range of options to choose from. Accordingly, the probability that the sequences having a more satisfactory DC-free property is produced increases. Thus, the second embodiment of the present invention is suitable for such applications as one in which the coding rate cannot be set lower as in the case of a hard disk or the like.

If any of a plurality of RLL-coded sequences is selected, there is a possibility that a sequence different from that selected at the coding side is to be processed by mistake at the decoding side. In such a case, the error will increase. In general, the Reed-Solomon coding is performed before the RLL coding. In this case, at the decoding side the RLL decoding is performed before the Reed-Solomon decoding (hereinafter abbreviated as "RS decoding") and hence the probability that the decision on a selected sequence is erroneous is not small. Accordingly, in the second embodiment of the present invention, the error correction coding is performed in the order of the RLL coding and/or DC-free coding and the RS coding at the coding side. At the decoding side, it is performed in the order of the RS decoding and the RLL decoding.

However, if at the coding side the error correction coding is performed in the order of the RLL coding and/or DC-free coding and the RS coding, redundancy bits added in the RS coding will not satisfy the RLL property and/or DC-free characteristics. In general, the number of redundancy bits which are generated in the RS coding and added to the RLL coded sequences is about 1/10 of that of the added sequences. Thus the negative effect caused by the fact that the RLL property and/or DC-free characteristics have not been satisfied is large. For this reason, according to the second embodiment the redundancy sequence generated in the RS coding is divided and added to the RLL coded sequence in a dispersed manner. Thereby, the coded sequences obtained after the redundancy sequences have been added do satisfy the RLL property and DC-free characteristics. The detail will be given later.

Referring to Figures, the second embodiment of the present invention will be described in detail hereinbelow.

Figure 9:
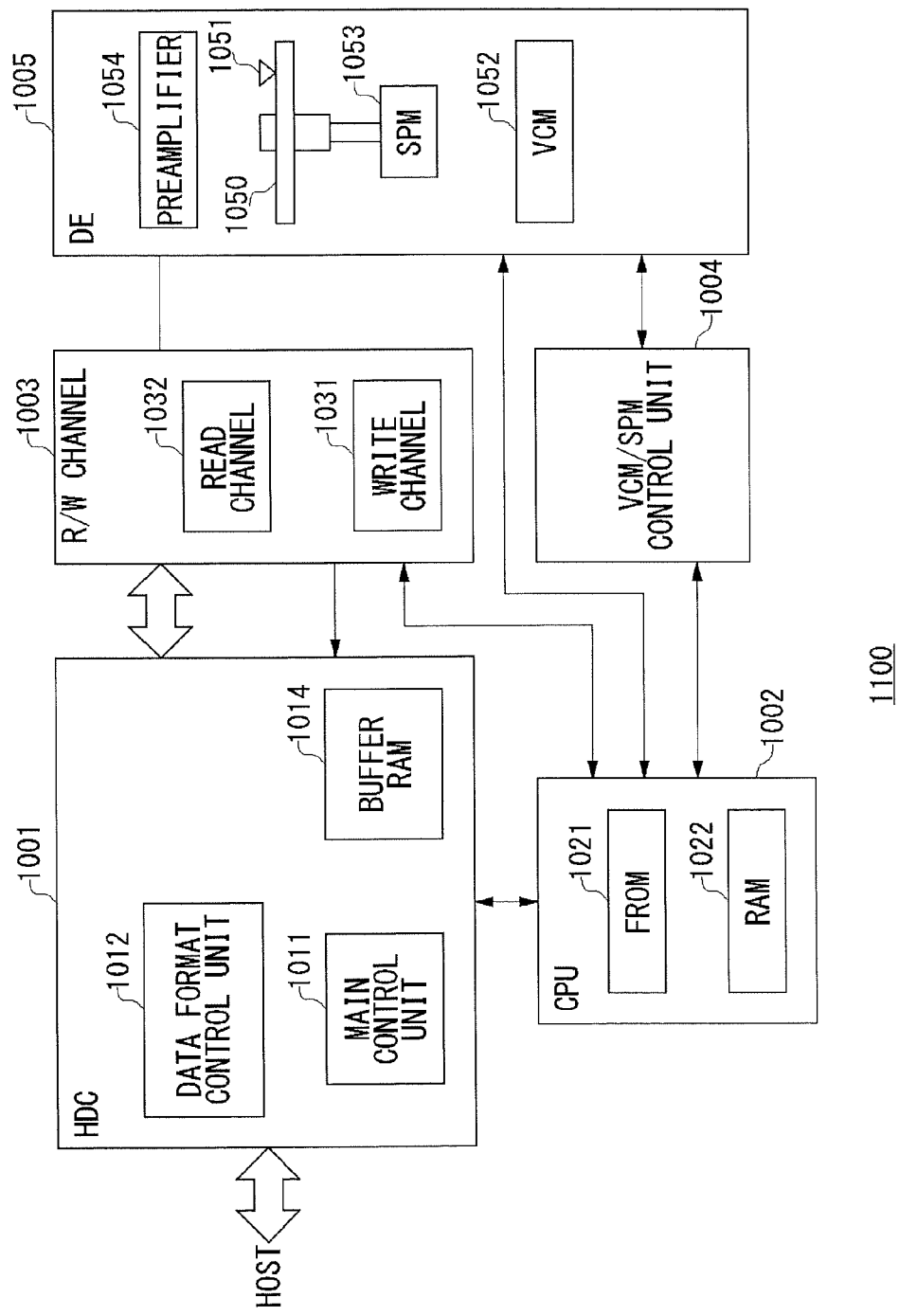
FIG. 9 is a diagram showing a storage system according to a second embodiment of the present invention.

FIG. 9 is a diagram showing a structure of a storage system 1100 according to the second embodiment of the present invention. The storage system 1100 in FIG. 9 is comprised roughly of a hard disk controller 1001 (hereinafter abbreviated as "HDC 1001"), a central processing arithmetic unit 1002 (hereinafter abbreviated as "CPU 1002"), a read/write channel 1003 (hereinafter abbreviated as "R/W channel 1003"), a voice coil motor/spindle motor controller 1004 (hereinafter abbreviated as "VCM/SPM controller 1004"), and a disk enclosure 1005 (hereinafter abbreviated as "DE 1005"). Generally, an HDC 1001, CPU 1002, R/W channel 1003, and VCM/SPM controller 1004 are structured on a single substrate.

The HDC 1001 includes a main control unit 1011 for controlling the whole HDC 1001, a data format control unit 1012, and a buffer RAM 1014. The HDC 1001 is connected to a host system via a not-shown interface unit. It is also connected to the DE 1005 via the R/W channel 1003, and carries out data transfer between the host and the DE 1005 according to the control by the main control unit 1011. Inputted to this HDC 1001 is a read reference clock (RRCK) generated by the R/W channel 1003. The data format control unit 1012 converts the data transferred from the host into a format that is suited to record it on a disk medium 1050 and also converts the data reproduced by the disk medium 1050 into a format that is suited to transfer it to the host. The disk medium 1050 includes a magnetic disk, for example. The buffer RAM 1014 stores temporarily data transferred from the host and transfers it to the R/W channel 1003 with proper timing. Also, the buffer RAM 1014 stores temporarily the read data transferred from the R/W channel 1003 and transfers it to the host with proper timing.

The CPU 1002 includes a flash ROM 1021 (hereinafter abbreviated as "FROM 1021") and a RAM 1022, and is connected to the HDC 1001, R/W channel 1003, VCM/SPM controller 1004, and DE 1005. The FROM 1021 stores an operation program for the CPU 1002.

The R/W channel 1003, which is roughly divided into a write channel 1031 and a read channel 1032, transfers data to be recorded and reproduced data to and from the HDC 1001. Connected to the DE 1005, the R/W channel 1003 also performs transmission of recorded signals and reception of reproduced signals. This will be described in detail later.

The VCM/SPM controller 1004 controls a voice coil motor 1052 (hereinafter abbreviated as "VCM 1052") and a spindle motor 1053 (hereinafter abbreviated as "SPM 1053") in the DE 1005.

The DE 1005, which is connected to the R/W channel 1003, performs reception of recorded signals and transmission of reproduced signals. The DE 1005 is also connected to the VCM/SPM controller 1004. The DE 1005 includes a disk medium 1050, a head 1051, a VCM 1052, an SPM 1053, a preamplifier 1054 and so forth. In the storage system 1100 of FIG. 9, it is so assumed that there is one disk medium 1050 and the head 1051 is disposed only on one side of the disk medium 1050, but the arrangement may be such that a plurality of disk mediums 1050 are formed in a stacked structure. Also, the head 1051 is generally provided corresponding to each face of the disk medium 1050. The recorded signals transmitted from the R/W channel 1003 are supplied to the head 1051 by way of the preamplifier 1054 in the DE 1005 and then recorded on the disk medium 1050 by the head 1051. Conversely, the signals reproduced from the disk medium 1050 by the head 1051 are transmitted to the R/W channel 1003 by way of the preamplifier 1054. The VCM 1052 in the DE 1005 moves the head 1051 in a radial direction of the disk medium 1050 to position the head 1051 at a target position on the disk medium 1050. The SPM 1053 rotates the disk medium 1050.

Figure 10:
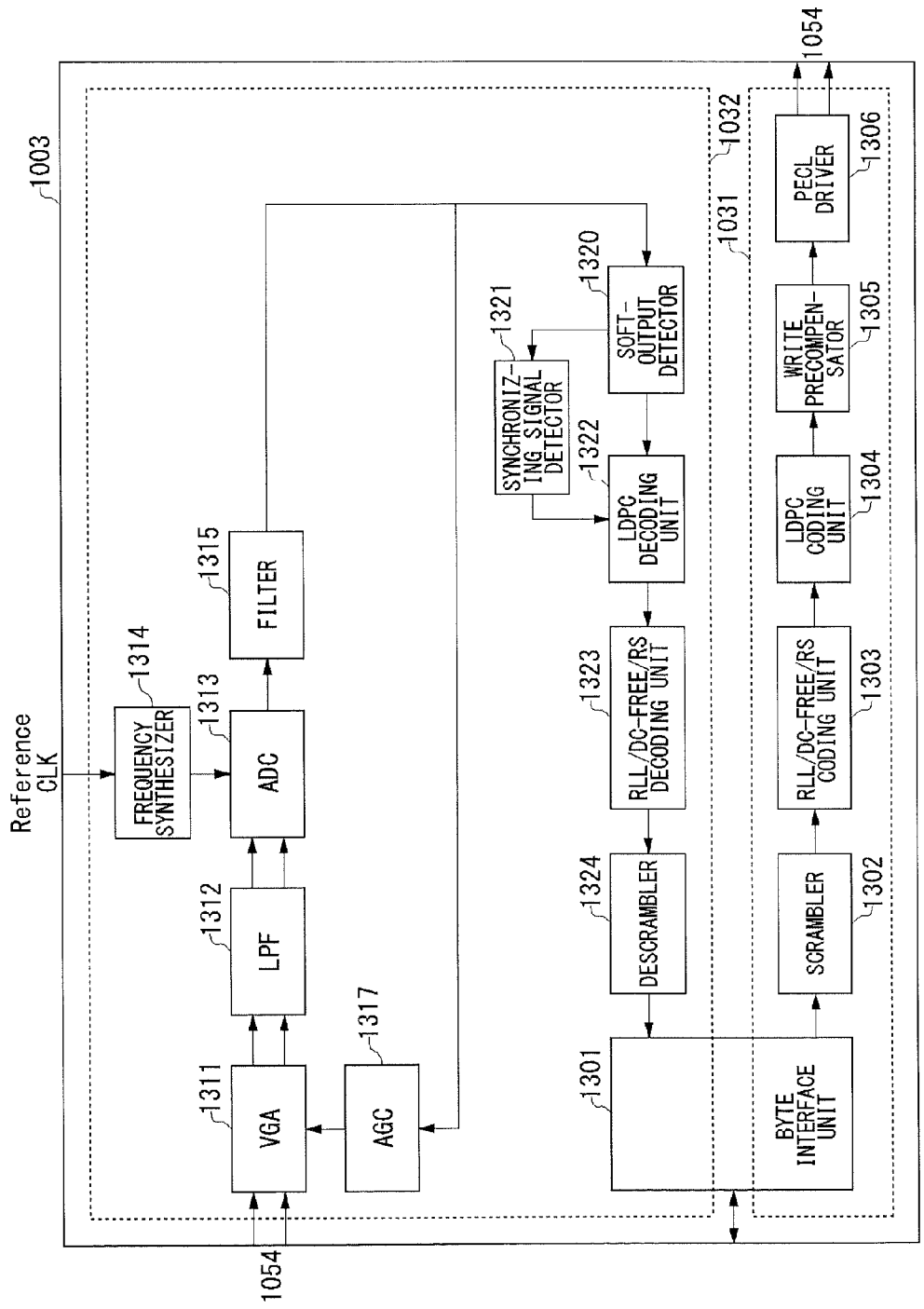
FIG. 10 is a diagram showing a structure of an R/W channel shown in FIG. 9.

Referring now to FIG. 10, a description will be given of the R/W channel 1003. FIG. 10 is a diagram showing a structure of the R/W channel 1003 shown in FIG. 9. The R/W channel 1003 is comprised roughly of a write channel 1031 and a read channel 1032.

The write channel 1031 includes a byte interface unit 1301, a scrambler 1302, a run-length limited/DC-free/RS coding unit 1303 coding (hereinafter abbreviated as "RLL/DC-free/RS coding unit 1303"), a low-density parity check coding unit 1304 (hereinafter abbreviated as "LDPC coding unit 1304"), a write compensation unit 1305 (hereinafter referred to as "write precompensator 1305"), and a driver 1306.

At the byte interface unit 1301, data transferred from the HDC 1001 are processed as input data. Data to be written onto the medium are inputted from the HDC 1001 sector by sector. The data bus, which is normally 1 byte (8 bits) long, is processed as input data by the byte interface unit 1301. The scrambler 1302 converts write data into a random sequence. The repetition of data of the same pattern is designed to remove any adverse effects on detection performance at reading, which may deteriorate the error rate.

The RLL/DC-free/RS coding unit 1303 adds redundancy data, using data to be recorded as information symbols, in order to enable the correction and detection of errors contained in data reproduced by the disk medium 1050. The RS coding also determines if any error has occurred in reproduced data and corrects or detects the error if there is any. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the RS codes for ECC, the number of errors correctable will be "Number of redundancy symbols/2". The RLL/DC-free/RS coding unit 1303 is used to limit the maximum length of consecutive 0's. By limiting the maximum length of consecutive 0's, data are turned into a data sequence appropriate for an automatic gain controller 1317 (hereinafter abbreviated as "AGC 317") and the like. Further, DC components are reduced to help enhance the data detection capability, thereby improving the error correction capability. The detail will be described later.

The LDPC coding unit 1304 plays a role of generating a sequence containing parity bits, which are redundancy bits, by LDPC coding. The LDPC coding is done by multiplying a matrix of k×n, called a generator matrix, by a data sequence of length k from the left. The elements contained in a check matrix H corresponding to this generator matrix are 0 or 1, and the coding is called Low-Density Parity Check codes because the number of 1's is smaller than the number of 0's. By utilizing the arrangement of these 1's and 0's, error correction will be carried out efficiently by an LDPC repeat decoding unit.

The write precompensator 1305 is a circuit for compensating the nonlinear distortion resulting from the continuation of magnetization transition on the medium. The write precompensator 1305 detects a pattern necessary for compensation from write data and preadjusts the write current waveform in such a manner as to cause magnetization transition in correct positions. The driver 1306 outputs signals corresponding to a pseudo ECL level. The output from the driver 1306 is sent to the not-shown DE 1005 and then sent to the head 1051 by way of the preamplifier 1054 before the write data are recorded on the disk medium 1050.

The read channel 1032 includes a variable gain amplifier 1311 (hereinafter abbreviated as "VGA 1311"), a low-pass filter 1312 (hereinafter abbreviated as "LPF 1312"), an AGC 1317, a digital-to-analog converter 1313 (hereinafter abbreviated as "ADC 1313"), a frequency synthesizer 1314, a filter 1315, a soft-output detector 1320, an LDPC repeat decoding unit 1322, a synchronizing signal detector 1321, a run-length-limited/DC-free/RS decoding unit 1323 (hereinafter abbreviated as "RLL/DC-free/RS decoding unit 1323"), and a descrambler 1324.

The VGA 1311 and AGC 1317 adjust the amplitude of the read waveform of data sent from a not-shown preamplifier 1054. The AGC 1317 compares an actual amplitude with an ideal amplitude and determines a gain to be set for the VGA 1311. The LPF 1312, which can adjust the cut-off frequency and boost amount, plays a partial role in reducing high-frequency noise and performing equalization on a partial response (hereinafter abbreviated as "PR") waveform. In the equalization to a PR waveform by the LPF 1312, it is difficult to carry out a perfect equalization of analog signals by an LPF because of a number of factors including variation in head lift, nonuniformity of the medium, and variation in motor speed. Hence, equalization to the PR waveform is carried out again by a filter 1315 located in a subsequent position and having greater flexibility. The filter 1315 may have a function of adjusting its tap coefficient in an adaptable manner. The frequency synthesizer 1314 generates a sampling clock for the ADC 1313.

The ADC 1313 is of a structure to acquire a synchronous samples directly by A-D conversion. Note that in addition to this structure, the structure may be one to acquire asynchronous samples by A-D conversion. In such a case, a zero phase restarter, a timing controller, and an interpolation filter may be further provided in positions subsequent to the ADC 1313. Since a synchronous sample needs to be obtained from the asynchronous sample, such a function is performed by these blocks. The zero phase restarter, which is a block for determining an initial phase, is used to acquire a synchronous sample as quickly as possible. After the determination of the initial phase, the timing controller detects a phase shift by comparing an actual sample value against an ideal sample value. This phase shift is used to determine the parameter for the interpolation filter, and thus a synchronous sample can be obtained.

The soft-output detector 1320 uses a Soft-Output Viterbi Algorithm (hereinafter abbreviated as "SOVA"), a kind of Viterbi algorithm, in order to avoid the deterioration of decoding characteristics resulting from intersymbol interference. In other words, there is a problem of deteriorating decoding characteristics as a result of increased interference between recorded codes along with the rise in recording density of magnetic disk apparatuses in recent years. And a Partial Response Maximum Likelihood (hereinafter abbreviated as "PRML") method, which utilizes the partial response due to intersymbol interference, is used as a method to overcome the problem. The PRML is a method for obtaining a signal sequence that maximizes the likelihood of the partial response of reproduced signals.

When the SOVA method is used in the soft-output detector 1320, the soft-output detector 1320 outputs a soft-decision value. Assume, for instance, that soft-decision values (−0.71, +0.18, +0.45, −0.45, −0.9) have been outputted as SOVA outputs. These values numerically represent their likelihood of being "0" or their likelihood of being "1". For example, the first value of "−0.71" signifies a strong likelihood of being 1, whereas the second value of "+0.18" is more likely to be 0 but is also significantly likely to be 1. The output of a conventional Viterbi detector is hard values, which are the results of hard decision of SOVA output. In the case of the above example, the values will be (1, 0, 0, 1, 1). The hard values, which represent either 0 or 1, no longer have the information suggesting the likelihood of being 0 or 1. Accordingly, the inputting of the soft-decision values to the LDPC repeat decoding unit 1322 can realize improved decoding performance.

The LDPC repeat decoding unit 1322 plays a role of restoring an LDPC-coded data sequence to the sequence before the LDPC coding from the LDPC-coded data sequence. The principal methods for such decoding are the sum-product decoding method and the min-sum decoding method. While the sum-product decoding method gives a better decoding performance, the min-sum decoding method is easily realizable by hardware. In the actual decoding by the use of the LDPC code, a fairly satisfactory decoding performance can be accomplished by repeatedly carrying out the decoding between the soft-output detector 1320 and the LDPC repeat decoding unit 1322. In practice, therefore, the soft-output detector 1320 and the LDPC repeat decoding unit 1322 need to be arranged in multiple stages. The synchronizing signal detector 1321 plays a role of recognizing the top position of data by detecting the synchronizing signal (sync mark) added to the top of data.

The RLL/DC-free/RS decoding unit 1323 restores the data outputted from the LDPC repeat decoding unit 1322 to the original data sequence by carrying out a reverse operation of the RLL/DC-free/RS coding unit 1303 of the write channel 1031 thereon. The detail will be described later.

The descrambler 1324 restores the original data sequence by carrying out a reverse operation of the scrambler 1302 of the write channel 1031. The data generated here are transferred to the HDC 1001.

Figure 11A:
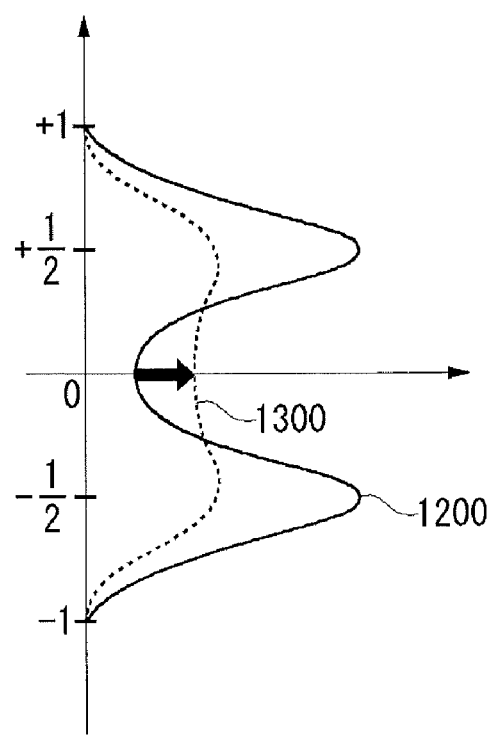
FIGS. 11(a) and 11(b) are diagrams showing examples of DC-free characteristics according to a second embodiment of the present invention.
Figure 11B:
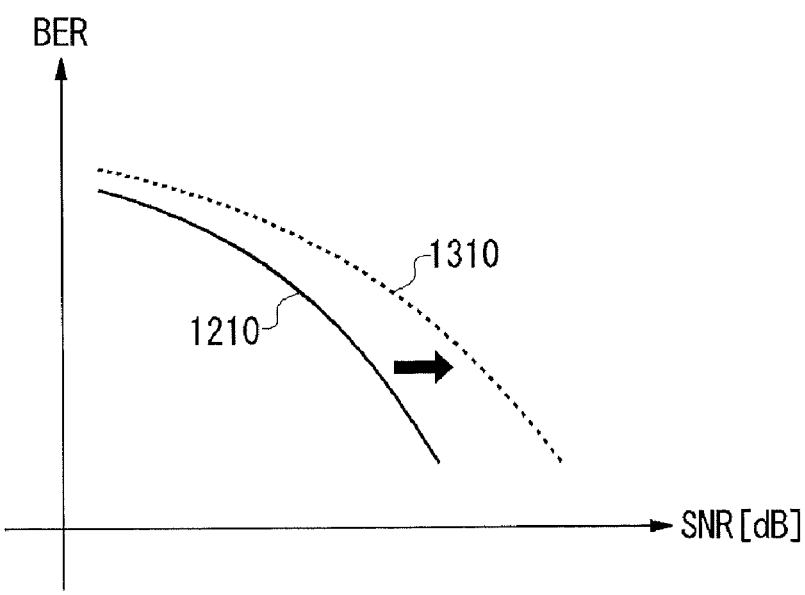

A description is here given of "DC-free". FIGS. 11(*a*) and 11(*b*) are diagrams showing examples of DC-free characteristics according to the second embodiment of the present invention. FIG. 11(*a*) is a diagram showing an example of the distribution of soft-decision values in the case of being DC-free and not being DC-free. The horizontal axis indicates the quantity and the vertical axis indicates the soft-decision value. The vertical axis is an axis that contains the soft-decision values at both the positive side and the negative side with the center being ±0. A first characteristic 1200 indicated by a solid line shows a distribution thereof in the case of being DC-free. A second characteristic 1300 indicated by a dotted line shows a distribution thereof in the case of being not DC-free. As described above, DC-free means that ratio of the number of 0's to the number of 1's contained in a sequence is 50%. In other words, as shown with the first characteristic 1200 of FIG. 11(*a*), DC-free means that ±½ are the center values, the distribution quantity in the vicinity of ±0 is small and so forth. On the other hand, in the case of not being DC-free as shown with the second characteristic 1300 of FIG. 11(*a*), for example, the distribution in the vicinity of ±0 is increased in the distribution of the soft-decision values.

FIG. 11(*b*) is a diagram showing an example of bit error rates in the case of being DC-free and not being DC-free. The horizontal axis indicates the signal-to-noise ratio and the vertical axis indicates the bit error rate. A third characteristic 1210 indicated by a solid line shows a bit error rate characteristic in the case of being DC free. A fourth characteristic 1310 indicated by a dotted line shows a bit error rate characteristic in the case of being not DC-free. As shown in the Figure, in the case of not being DC-free the bit error rate deteriorates as compared with the case of being DC-free.

Figure 12:
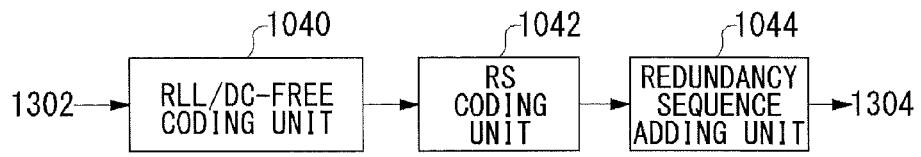
FIG. 12 is a diagram showing an exemplary structure of the RLL/DC-free/RS coding unit shown FIG. 10.

FIG. 12 is a diagram showing an exemplary structure of the RLL/DC-free/RS coding unit 1303 of FIG. 10. The RLL/DC-free/RS coding unit 1303 includes an RLL/DC-free coding unit 1040, an RS coding unit 1042 and a redundancy sequence adding unit 1044. The RLL/DC-free coding unit 1040 performs the run-length limited coding and the DC-free coding on a predetermined signal sequence so as to generate a run-length limited coded sequence (hereinafter referred to as "RLL sequence") having a DC-free property. The RS coding unit 1042 performs the RS coding on the RLL sequence generated by the RLL/DC-free coding unit 1040 so as to generate a redundancy sequence. The redundancy sequence adding unit 1044 adds the redundancy sequence generated by the RS coding unit 1042 to the RLL coded sequence generated by the RLL/DCC-free coding unit 1040 in a dispersed manner.

Figure 13:
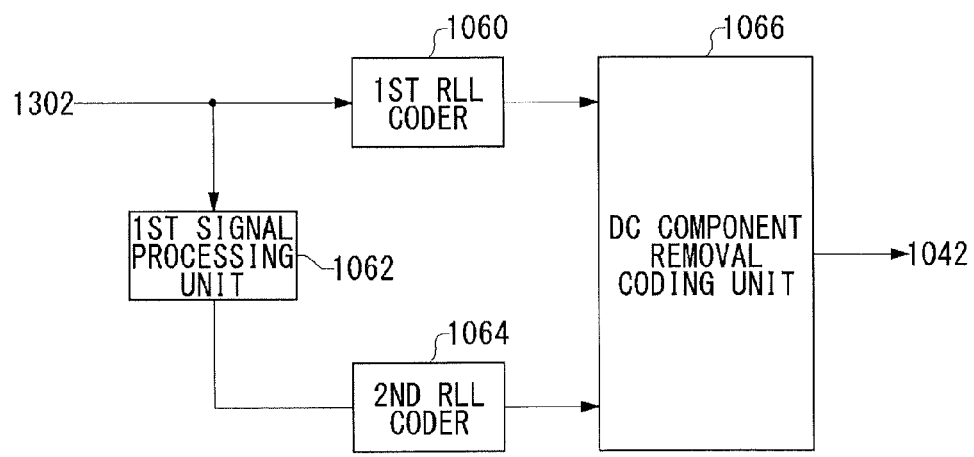
FIG. 13 is a diagram showing an exemplary structure of an RLL/DC-free coding unit shown in FIG. 12.

FIG. 13 is a diagram showing an exemplary structure of the RLL/DC-free coding unit 1040 of FIG. 12. The RLL/DC-free coding unit 1403 includes a first RLL coder 1060, a first signal processing unit 1062, a second RLL coder 1064, and a DC component removal coding unit 1066.

The first RLL coder 1060 performs run-length limited coding of a digital signal sequence outputted from the scrambler 1302 so as to generate a first coded sequence. The first signal processing unit 1062 performs a predetermined signal processing on the digital signal sequence without changing the number of a plurality of bits contained in the digital signal sequence outputted from the scrambler 1302. The predetermined signal processing may be any processing as long as the number of a plurality of bits contained in the digital signal sequence is unchanged. For example, it may be a processing that performs bit inversion processing on a plurality of bits contained in the digital signal sequence, respectively. Also, the order of a plurality of bits contained in the digital signal sequence may be rearranged. Also, both the bit inversion processing and the rearrangement of the bit order may be carried out. The second RLL coder 1064 performs run-length limited coding of a digital signal sequence outputted from the first signal processing unit 1062 so as to generate a second coded sequence. The DC component removal coding unit 1066 selects either the first code sequence generated by the first RLL coder 1060 or the second code sequence generated by the second RLL coder 1064 whichever has a higher DC-free property, and then outputs it.

A description is now given using a specific example. If a digital signal sequence to be processed is composed of 300 bits, the RLL/DC-free coding unit 1040 processes the bits in ten divided sets where one sets holds 30 bits together. Here, if the coding rate of the first RLL coder 1060 and the second RLL coder 1064 is 30/31, the number of bits in a sequence, per output, from the first RLL coder 1060 and the second RLL coder 1064 will be 31 bits.

Figure 14:
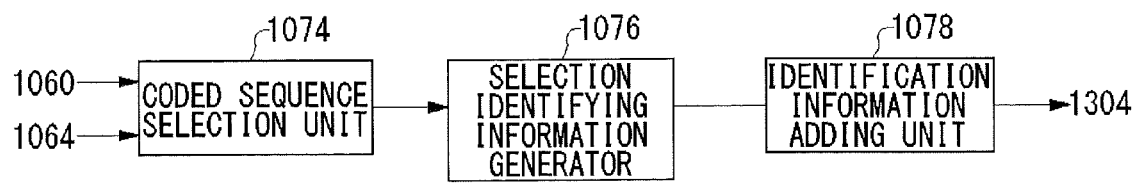
FIG. 14 is a diagram showing an exemplary structure of a DC component removal coding unit shown in FIG. 13.

FIG. 14 is a diagram showing an exemplary structure of the DC component removal coding unit 1066. The DC component removal coding unit 1066 includes a coded sequence selection unit 1074, a selection identifying information generator 1076, and an identification information adding unit 1078. The coded sequence selection unit 1074 selects either one of the first coded sequence generated by the first RLL coder 1060 and the second coded sequence generated by the second RLL coder 1064. The selection identifying information generator 1076 generates selection identifying information that indicates the coded sequence selected by the coded sequence selection unit 1074. The identification information adding unit 1078 adds the selection identifying information generated by the selection identifying generator 1076, to any of positions in the coded sequence selected by the coded sequence selection unit 1074.

A description is now given in concrete terms. If the first coded sequence is selected by the coded sequence selection unit 1074, the selection identifying information added to the first coded sequence by the identification information adding unit 1078 will be "0". If, on the other hand, the second coded sequence is selected by the coded sequence selection unit 1074, the selection identifying information added to the first coded sequence by the identification information adding unit 1078 will be "1". In other words, the first coded sequence added with the selection identifying information "0" or the second coded sequence added with the selection identifying information "1" is outputted to the LDPC coding unit 1304. Note that a position at which the selection identifying information is added by the identification information adding unit 1078 may be an arbitrarily fixed position in a coded sequence and it may be, for example, a rearmost position. Though the detail will be described later, the selection identifying information added here is a decision bit, so that appropriate decoding processing is realized by analyzing the position at which a decision bit is located and the content of the decision bit. In the above-described specific example, a sequence having the total of 32 bits is outputted where 1-bit selection identifying information is added to a 31-bit coded sequence per output. That is, the coding rate in the RLL/DC-free coding unit 1040 will be 30/32.

The coded sequence selection unit 1074 may include a first coupling unit and a second coupling unit which are not shown here. The first coupling unit connects a coded sequence, which has already been selected by the coded sequence selection unit 1074, with the first coded sequence. The second coupling unit connects a coded sequence, which has already been selected by the coded sequence selection unit 1074, with the second coded sequence. In this case, the coded sequence selection unit 1074 may set the sequence connected by the first coupling unit as a new first coded sequence and set the sequence connected by the second coupling unit as a new second coded sequence so as to select either one of them. That is, the coded sequence selection unit 1074 makes a selection decision on coded sequences where the coded sequences selected in the past are connected with the coded sequences which are currently candidates for a selection. This can enhance the DC-free characteristics in a long interval.

Figure 15A:
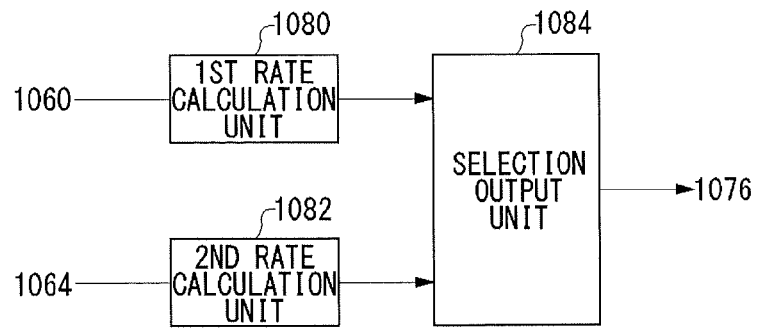
FIGS. 15(a) to 15(c) are diagrams showing first to third exemplary structures of a coded sequence selection unit shown in FIG. 14.
Figure 15B:
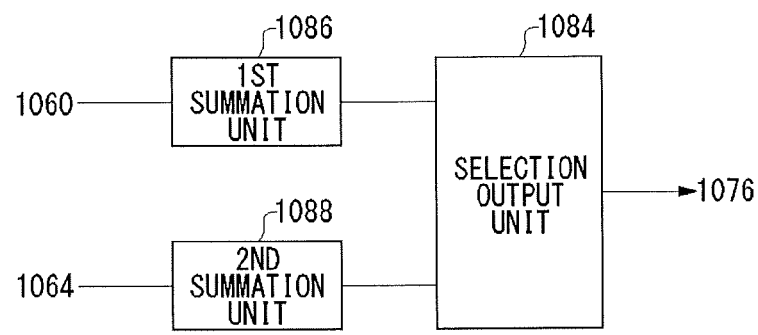
Figure 15C:
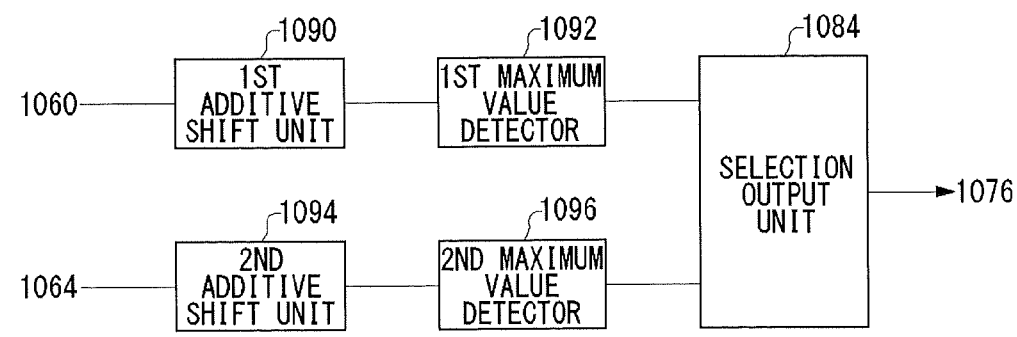

FIGS. 15(*a*) to 15(*c*) are diagrams showing first to third exemplary structures of the coded sequence selection unit 1074 of FIG. 14. FIG. 15(*a*) is a diagram showing the first exemplary structure of the coded sequence selection unit 1074 of FIG. 14. The coded sequence selection unit 1074 in the first structure includes a first rate calculation unit 1080, a second rate calculation unit 1082 and a selection output unit 1084.

The first rate calculation unit 1080 calculates a ratio of bits indicating 0 and bits indicating 1 among a plurality of bits contained in the first coded sequence. The second rate calculation unit 1082 calculates a ratio of bits indicating 0 and bits indicating 1 among a plurality of bits contained in the second coded sequence. The selection output unit 1084 selects a coded sequence corresponding to either the ratio calculated in the first rate calculation unit 1080 or the ratio calculated in the second rate calculation unit 1082 whichever is closer to 50%, and outputs the selected sequence.

A description is now given using a specific example. Suppose that, at time t=1, 31-bit coded sequences are outputted from the first RLL coder 1060 and the second RLL coder 1064, respectively. In this case, the first rate calculation unit 1080 and the second rate calculation unit 1082 analyze the bits contained in the coded sequences, respectively, and calculates the ratios. Here, if there are 14 bits indicating 0's and there are 17 bits indicating 1's in the bits contained in the coded sequence inputted to the first rate calculation unit 1080, the ratio will be calculated as follows by the first rate calculation unit 1080.

Ratio$_{(t=1)}$=(the number of bits indicating 0's+1)/(the number of bits in a coded sequence+1)=(14+1)/(31+1)≈46.9%

Also, if there are 12 bits indicating 0's and there are 19 bits indicating 1's in the bits contained in the coded sequence inputted to the second rate calculation unit 1082, the ratio will be calculated as follows by the second rate calculation unit 1082. Since in this case the ratio in the first coded sequence is closer to 50%, the first coded sequence is selected by the selection output unit 1084 at time t=1. Also, the number of bits, namely "14", for the selected first coded sequence is stored. The reason why "1" and "0" are added in the numerators on the right-hand sides of the above and the following equation, respectively, is that the selection identifying information is presupposed to be "0" and "1", respectively. Also, the reason why "1" is added in the denominators on the right-hand sides of the above and the following equation is to calculate the number of 0's in the coded sequence containing the selection identifying information.

Ratio$_{(t=1)}$=(the number of bits indicating 0's+0)/(the number of bits in a coded sequence+1)=(12)/(31+1)=37.5%

Suppose next that, similar to the case of t=1, 31-bit coded sequences are outputted from the first RLL coder 1060 and the second RLL coder 1064, respectively, at t=2.

Here, if there are 11 bits indicating 0's and there are 20 bits indicating 1's in the bits contained in the coded sequence inputted to the first rate calculation unit 1080, the ratio will be calculated as follows.

Ratio$_{(t=2)}$=(the number of bits indicating 0's+1)/((the number of bits in a coded sequence+1)×t)=(14+1+11+1)/((31+1)×2)≈42.2%

In the above case differing from the case of t=1, the first rate calculation unit 1080 calculates the ratio on a sequence where the coded sequence selected at t=1 is connected with the first coded sequence at t=2 by the first coupling unit. That is, the number of bits, "14+1", indicating 0's in the first coded sequence selected at t=1 will be added with the number of bits, "11+1", indicating 0's in the first coded sequence at t=2, in the numerator of the above equation. In the denominator, it will the number of bits for the two sets of coded sequences.

Also, if there are 17 bits indicating 0's and there are 14 bits indicating 1's in the bits contained in the coded sequence inputted to the second rate calculation unit 1082, the ratio will be calculated as follows by the second rate calculation unit 1082. Since in this case the ratio in the second coded sequence is closer to 50%, the second coded sequence is selected by the selection output unit 1084 at time t=2.

Ratio$_{(t=2)}$=(the number of bits indicating 0's+0)/((the number of bits in a coded sequence+1)×t)=(14+1+17+0)/((31+1)×2)=50.0%

Hereinbelow, at t=3 and thereafter, the ratio is calculated in a similar manner. Here, the ratio at t=k is expressed as follows, where k is an integer greater than or equal to 1. Nbit(m) denotes the number of bits indicating 0's in the bits contained in a coded sequence selected at t=m. Nbit(k) denotes the number of bits indicating 0's in the bits contained in a coded sequence where the ratio is to be calculated. It is assumed here that selection identifying information is also contained in the coded sequence where the ratio is to be calculated.

$$Ratio_{t=k} = \sum_{m=1}^{k} Nbit(m)/(32 \times k) \quad \text{(Eq. 1)}$$

FIG. 15(b) is a diagram showing the second exemplary structure of the coded sequence selection unit 1074 of FIG. 14. The coded sequence selection unit 1074 in the second structure includes a first summation unit 1086, a second summation unit 1088 and a selection output unit 1084. The first summation unit 1086 adds up a plurality of bits contained in the first coded sequence so as to generate a first summation value. The second summation unit 1088 adds up a plurality of bits contained in the second coded sequence so as to generate a second summation value. A coded sequence detector compares the first summation value generated by the first summation unit 1086 with the second summation value generated by the second summation unit 1088, and detects a coded sequence corresponding to a smaller summation value either in the first coded sequence or the second coded sequence. Of the first coded sequence and the second coded sequence, the selection output unit 1084 selects the coded sequence selected by the sequence detector and outputs it.

A description is now given using a specific example. Suppose first that 31-bit coded sequences are outputted from the first RLL coder 1060 and the second RLL coder 1064, respectively. In this case, the first summation unit 1086 and the second summation unit 1088 add up the bits contained in the respective coded sequences. In the adding up, 0 may be replaced with "+1" and 1 may be replaced with "−1" so as to be added up. If the adding up is done in this manner, the summation value will be 0 if the number of bits indicating 1's equals to the number of bits indicating 0's. Thus, it is only necessary that a coded sequence whose summation value is closer to 0 is selected by the selection output unit 1084. For example, a coded sequence whose absolute value of the summation value is smaller may be selected. Note that this technique is also called the running digital summation (hereinafter abbreviated as "RDS").

Here, if at t=1 there are 14 bits indicating 0's and there are 17 bits indicating 1's in the 31 bits contained in the coded sequence inputted to the first summation unit 1086, the ratio will be calculated as follows. The reason why "1" is added in the first term of the right-hand side is that the selection identifying information is presupposed to be 0.

$RDS_{abs}$=|(14+1)×(+1)+17×(−1)|=2

Also, if there are 12 bits indicating 0's and there are 19 bits indicating 1's in the bits contained in the coded sequence inputted to the second summation unit 1088, the ratio will be calculated as follows. Since the RDS of the first coded sequence is smaller in this case, the first coded sequence is selected by the selection output unit 1084 at t=1. Here, the RDS on the first coded sequence prior to calculating the absolute value is stored as "$RDS_1$=−2".

The reason why "1" is added in the second term of the right-hand side is that the selection identifying information is presupposed to be 1.

$RDS_{abs}$=|12×(+1)+(19+1)×(−1)|=6

Suppose next that, similar to the case of t=1, 31-bit coded sequences are outputted from the first RLL coder 1060 and the second RLL coder 1064, respectively, at t=2.

Here, if there are 11 bits indicating 0's and there are 20 bits indicating 1's in the bits contained in the coded sequence inputted to the first summation unit 1086, the RDS will be calculated as follows. Different from the case of t=1, at t=2 the number of bits for the coded sequence selected at t=1 is also taken into account.

$RDS_{abs}$=|$RDS_1$+(11+1)×(+1)+20×(−1)|=|−2+(−8)|=10

Also, if there are 17 bits indicating 0's and there are 14 bits indicating 1's in the bits contained in the coded sequence inputted to the second summation unit 1088, the ratio will be calculated as follows. Since in this case the RDS of the second coded sequence is smaller, the first coded sequence is selected by the selection output unit 1084 at t=2. $RDS_2$=0 is stored.

$RDS_{abs}$=|$RDS_1$+17×(+1)+(14+1)×(−1)|=|−2+(+2)|=0

Hereinbelow, at t=3 and thereafter, the $RDS_{abs}$ is calculated in a similar manner. Here, the $RDS_{abs}$(k) at t=k is expressed as follows, where t is an integer greater than or equal to 1. Nbit0(m) denotes the number of bits indicating 0's in the bits contained in a coded sequence and selection identifying information selected at t=m. Nbit1(m) denotes the number of bits indicating 1's in the bits contained in the coded sequence and selection identifying information selected at t=m. Here, Nbit0(k) and Nbit1(k) denote respectively the number of bits indicating 0's and the number of bits indicating 1's in the bits contained in a coded sequence where the summation value is to be calculated.

$$RDS_{abs}(k) = |RDS(k-1) + Nbit0(k) \times \qquad \text{(Eq. 2)}$$
$$(+1) + Nbit1(k) \times (-1)|$$
$$= \left| \sum_{m=1}^{k} (Nbit0(m) \times (+1) + Nbit1(m) \times (-1)) \right|$$

An operation of the coded sequence selection 1074 is characterized by a feature that while it carries out an interval arithmetic processing at given time, it carries out a moving processing in between continuous times in the past. By combining the interval processing and the moving processing in this manner, the DC-free property can be enhanced in a long interval, for example, in an entire sequence of 300 bits.

The summation processing in the first summation processing unit 1086 and the second summation processing unit 1088 may be such that bits indicating 0 or 1 contained in a coded sequence are directly added up as numerical values. In this case, a coded sequence corresponding to one whose summation value is closer to the half of the number of bits in the coded sequence is selected in the selection output unit 1084.

FIG. 15(*c*) is a diagram showing the third exemplary structure of the coded sequence selection unit 1074 of FIG. 14. The coded sequence selection unit 1074 in the third structure includes a first additive shift unit 1090, a first maximum value detector 1092, a second additive shift unit 1094, a second maximum value detector 1096, and a selection output unit 1084. The first additive shift unit 1090 shifts and adds a plurality of bits contained in the first coded sequence so as to generate first additive shift values the number of which is identical to the number of a plurality of bits. The first maximum value detector 1092 detects a maximum value in a plurality of first additive shift values generated by the first additive shift unit 1090. The second additive shift unit 1094 shifts and adds a plurality of bits contained in the second coded sequence so as to generate second additive shift values the number of which is identical to the number of a plurality of bits. The second maximum value detector 1096 detects a maximum value in a plurality of second additive shift values generated by the second additive shift unit 1094. The coded sequence detector compares the maximum value detected by the first maximum value detector 1092 and the maximum value detected by the second maximum value detector 1096, and detects either the first coded sequence or the second coded sequence whichever corresponds to the smaller maximum value. The selection output unit 1084 selects either the first coded sequence or the second coded sequence whichever was selected by the coded sequence detector, and outputs it.

Similar to the second exemplary structure, in the third exemplary structure of the coded sequence selection unit 1074 the selection output unit 1084 selects a coded sequence by calculating the respective RDSs in the first additive shift unit 1090 and the second additive shift unit 1094. The third exemplary structure differs from the second exemplary structure in that a coded sequence whose maximum value is smaller in the midst of a calculation of RDS of 32 bits is selected. Here, in the second exemplary structure, a coded sequence which is closer to 0 is selected in consideration of only the final calculation value of 32 bits in the RDS calculation. In other words, in the third exemplary structure the selection processing is performed using a moving operation both in a predetermined interval and a plurality of intervals. By implementing such a mode of carrying out the invention as this, a sequence having a satisfactory DC-free property can be selected even in the middle of an interval.

Here, the "maximum value in the midst of a calculation of RDS" at each time t is derived as follows. Here, Min{y(0), y(1)} denotes a function by which a smaller value is selected and the number of the selected sequence is outputted. For example, if y(0)>y(1), S(t) will be 1. Max{x} denotes a function by which a maximum value is detected in x. k denotes a value in the range of 32×(t−1)+1 to 32×t. Bit(m, j) indicates 1 if the mth bit is 0 in the jth coded sequence and indicates −1 if it is 1.

$$S(t) = \text{Min}\{\text{Max}RDS(1), \text{Max}RDS(2)\} \qquad \text{(Eq. 3)}$$
$$\text{Max}RDS(1) = \max\{RDS(k, 1)\}$$
$$\text{Max}RDS(2) = \max\{RDS(k, 2)\}$$
$$RDS(k, 1) = \left| \sum_{m=1}^{k} \text{Bit}(m, 1) \right|$$
$$RDS(k, 2) = \left| \sum_{m=1}^{k} \text{Bit}(m, 2) \right|$$

Every time t increases, Bit(m, 1) and Bit(m, 2) are calculated after the bits of the selected sequence are rewritten as follows.

Bit(m, 1)=Bit(m, 2)=Bit(m, S(t−1)):m=(t−1)×32+1 to t×32, t≈1

Figure 16:
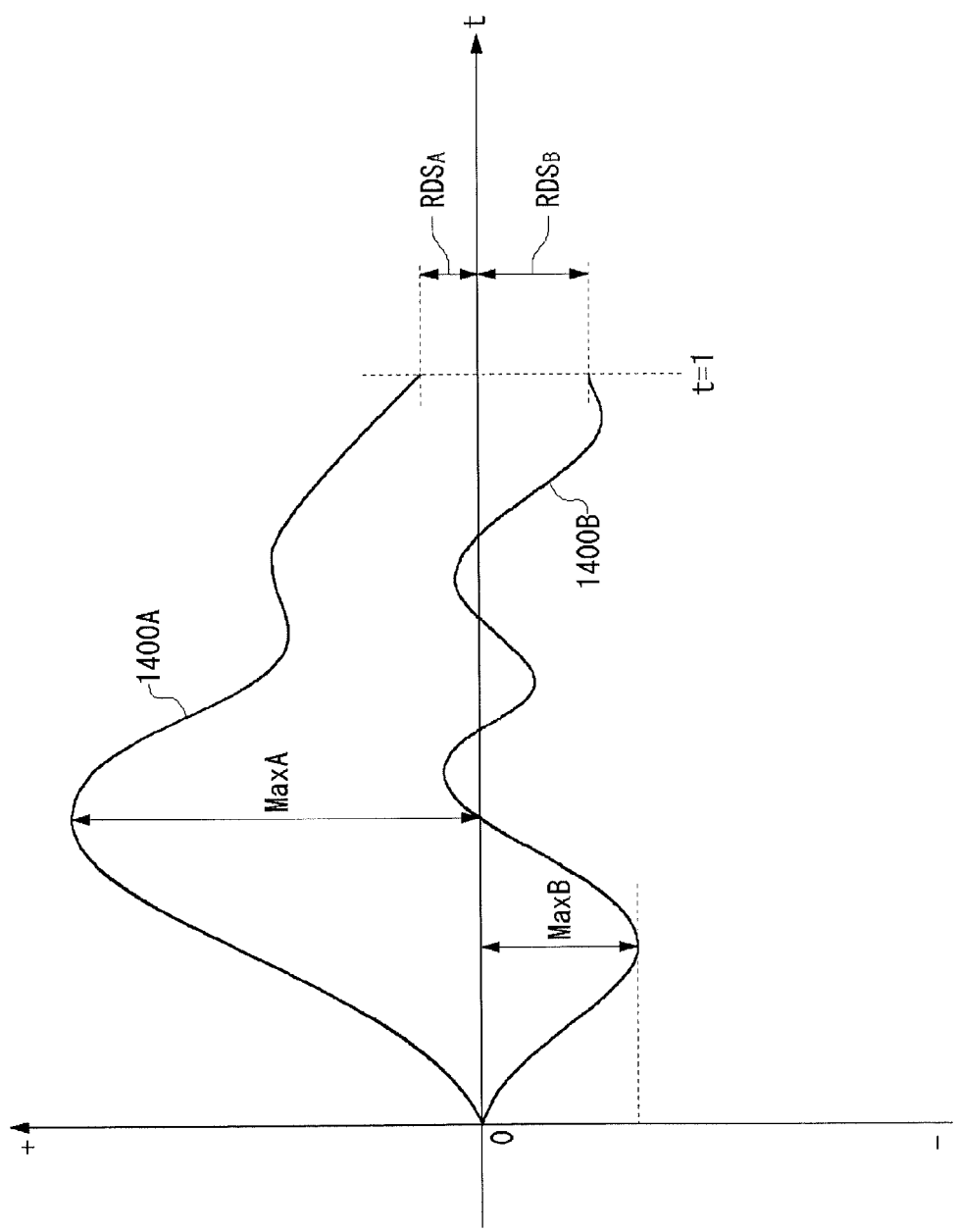
FIG. 16 is a graph showing differences in operation between a coded sequence selection unit shown in FIG. 15(b) and a coded sequence selection unit shown in FIG. 15(c)

The operation in the third exemplary structure of the coded sequence selection unit 1074 shown in FIG. 15(*c*) is here compared with the operation in the second exemplary structure of the coded sequence selection unit 1074 shown in FIG. 15(*b*). FIG. 16 is a graph showing differences in operation between the coded sequence selection unit 1074 shown in FIG. 15(*b*) and the coded sequence selection unit 1074 shown in FIG. 15(*c*). The horizontal axis indicates time, whereas the vertical axis indicates RDS. Here, 1400A indicates a transition of RDS in the first coded sequence. 1400B indicates a transition of RDS in the second coded sequence. In the second exemplary structure of the coded sequence selection unit 1074 shown in FIG. 15(*b*), $RDS_A$ and $RDS_B$ which are the final values in the interval arithmetic of RDS are compared with each other, and a coded sequence having a smaller RDS is selected. Since $RDS_A < RDS_B$ in FIG. 16, the selection output unit 1084 selects the first coded sequence. On the other hand, in the third exemplary structure of the coded sequence selection unit 1074 shown in FIG. 15(*c*), the RDS in each bit is compared, that is, the maximum values are compared among the absolute values obtained after 32 bits have been subjected to a sequential moving processing, and a coded sequence having a smaller one is selected. In FIG. 16, MaxA is the maximum value for the first coded sequence, whereas MaxB is the maximum value for the second coded sequence. Since MaxA>MaxB here, the selection output unit 1084 selects the second coded sequence. With any of the exemplary structures applied to the coded sequence selection unit 1074, a coded sequence having a high DC-free property can be selected.

Refer back to FIG. 12. The redundancy sequence adding unit 1044 includes a not-shown division unit. The division unit divides a redundancy sequence generated by the RS coding unit 1042, into a plurality of groups.

The groups obtained as a result of the division by the division unit are each added to any position, of the run-length coded sequence, which is a different position for each of the groups. The redundancy sequence adding unit 1044 adds to the RLL/DC-free coded sequence equidistantly for each, L, for example, of the groups obtained as a result of division by the division unit. Among a plurality of bits contained in the redundancy sequence generated by the RS coding unit 1042, the division unit divides in a manner that any two or more bits are as a group. Among a plurality of bits contained in the redundancy sequence generated by the RS coding unit 1042, the division unit divides in a manner that 2N bits (N being an integer greater than or equal to 1) are as a group.

Figure 17:
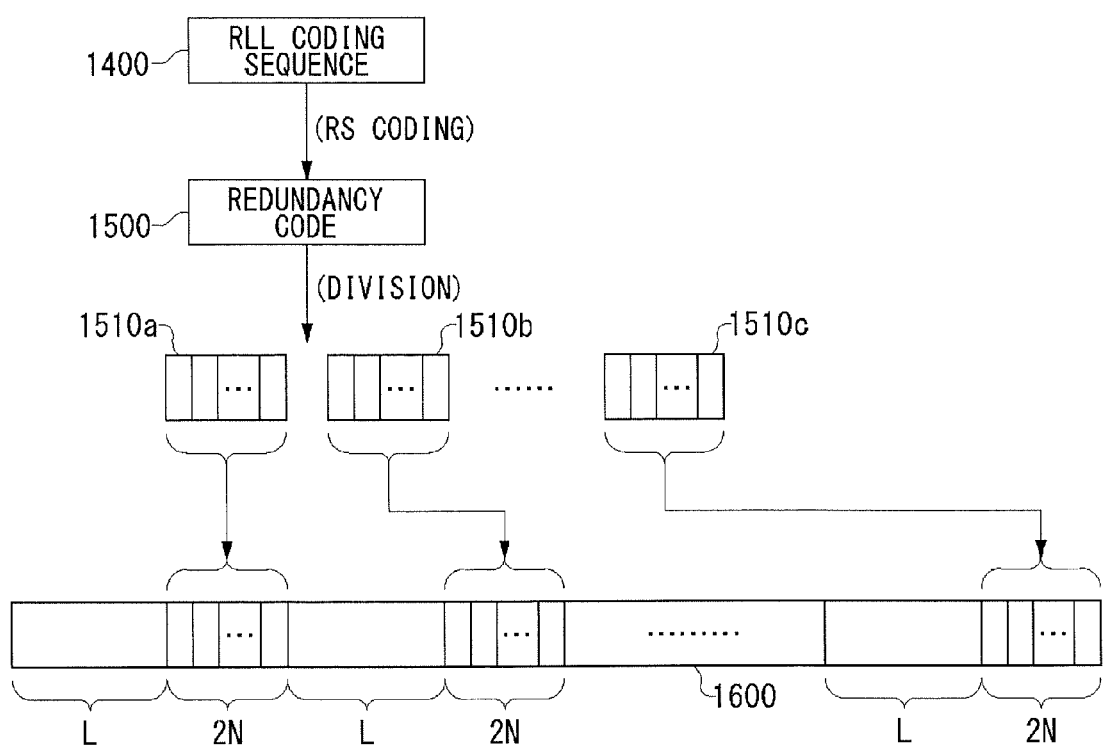
FIG. 17 is a diagram showing an operation example of an RLL/DC-free/RS coding unit shown in FIG. 12.

A description in specific terms is given of an operation of the RLL/DC-free/RS coding unit 1303. FIG. 17 is a diagram showing an exemplary operation of the RLL/DC-free/RS coding unit 1303 shown in FIG. 12. First, the RLL/DC-free coding unit 1040 generates an RLL/DC-free coded sequence 1400. Then the RS coding unit 1042 performs RS coding on the RLL/DC-free coded sequence 1400 so as to generate a redundancy sequence 1500. Then the redundancy sequence adding unit 1044 divides the redundancy sequence 1500 into M redundancy subsequence 1510. A first information subsequence 1510a, a second information subsequence 1510b, ... an Mth information subsequence 1501c are represented by the redundancy subsequence 1510. Each redundancy subsequence 1510 contains 2N bits. The redundancy sequence adding unit 1044 adds each redundancy sequence 1510 to the RLL/DC-free coded sequence 1400 at different positions in a dispersed manner. Also, the redundancy sequence adding unit 1044 adds the redundancy sequence 1510 equidistantly to the RLL/DC-free coded sequence 1400. Thereby, all the bits contained in the redundancy sequence 1500 are added to the RLL/DC-free coded sequence 1400, so that an RLL/DC-free/RS coded sequence 1600 is generated.

Here, the lengths of the RLL/DC-free coded sequence 1400, the redundancy sequence 1500 and the RLL/DC-free coded sequence 1600 are each express as follows. Here, L indicates an interval where the redundancy subsequence 1510 is added. N, s, α and β are each a positive integer.

The length of the RLL/DC-free coded sequence 1400=sL+α.

The length of the redundancy sequence 1500=2NM+β.

The length of the RLL/DC-free/RS coded sequence 1600=the length of RLL/DC-free coded sequence 1400+the length of the redundancy sequence 1500.

Figure 18:
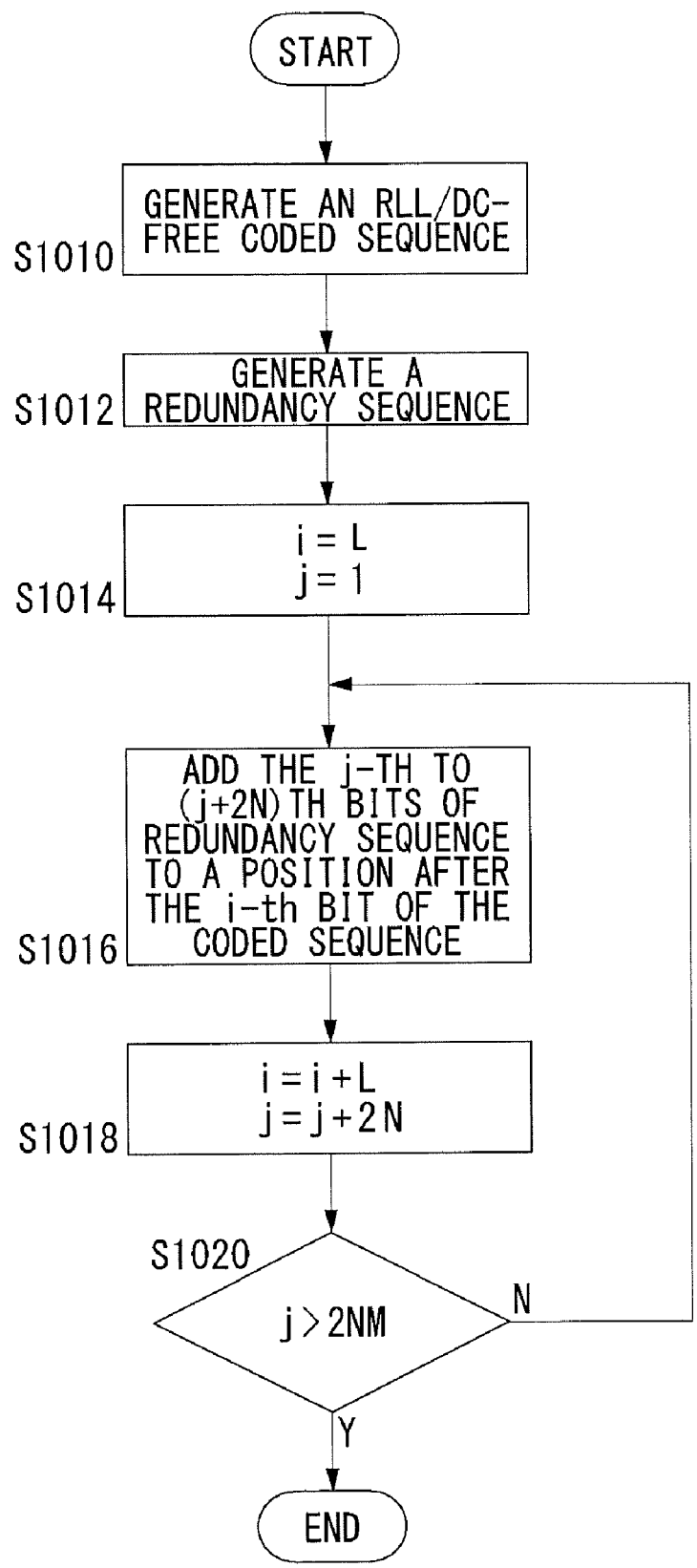
FIG. 18 is a flowchart showing an exemplary operation of an RLL/DC-free/RS coding unit shown in FIG. 12.

A description is next given of a specific operational process of the RLL/DC-free/RS coding unit 1303. FIG. 18 is a flowchart showing an exemplary operation of the RLL/DC-free/RS coding unit 1303 shown in FIG. 12. First, the RLL/DC-free coding unit 1040 generates an RLL/DC-free coded sequence 1400 (S1010). Then the RS coding unit 1042 performs RS coding on the RLL/DC-free coded sequence 1400 so as to generate the redundancy sequence 1500 (S1012). Then the division unit of the redundancy sequence adding unit 1044 divides the redundancy sequence 1500 into M redundancy subsequences 1510 and adds each of them equidistantly to a different position (S1014 to S1020).

In S14 to S20, a counter i relative to the RLL/DC-free coded sequence 1400 is first set to L, and a counter j relative to the redundancy sequence 1500 is first set to 1 (S1014). The jth to (j+2N)-th bits of the redundancy sequence 1500 are added to a position subsequent to ith bit counted from the beginning of the RLL/DC-free coded sequence 1400 (S1016). However, if any of (j+1)th to (j+2N)th bits is missing in the redundancy sequence 1500, all of the existing bits are added up and then proceed to S1018.

Then advance the counter i by L and advance the counter j by 2N (S1018). Here, if j is less than or equal to 2NM (N of S1020), it will be determined that there still remains one or more RLL/DC-free coded sequences 1400 to which the bits are to be added, and the processing of S1016 to S1020 will be repeated. If, on the other hand, j is a value larger than 2NM (Y of S1020), it will be determined that all the redundancy sequences 1500 are added, and the processing will be terminated.

A description is now given using a specific example. In a bit sequence y0(m) indicating a plurality of bits existing in even-numbered bits in x(n) that indicates the RLL/DC-free coded sequence 1400, the RLL/DC-free coding unit 1040 performs the coding in such a manner as to limit the consecutiveness of bits indicating 0. Also, in a bit sequence y1(m) indicating a plurality of bits existing even-numbered bits in x(n), respectively, the RLL/DC-free coding unit 1040 performs the coding in such a manner as to limit the consecutiveness of bits indicating 0. For example, x(n), y0(m) and y1(m) are indicated as follows. It is assumed here that the maximum length of consecutive 0's is 3.

x(n)={01100101001100010001}
y0(m)=x(2n)={0101101000}
y1(m)=x(2n+1)={1100010101}

The DC-free coding is generally such that in a predetermined interval of the RLL/DC-free coded sequence 1400 the coding is performed so that the ratio of bits indicating 0's or 1's is close to 50% and so forth. In other words, there is no need to be DC-free in an interval which is shorter than the predetermined interval. In x(n) of the above-mentioned example, the number of bits indicating 0's is 11. In contrast, the number of bits indicating 1's is 9 and thus the DC-property is almost satisfied here.

Here, comparison is made between x'(n) indicating a first RLL/DC-free/RS coded sequence 1610 where the redundancy bits are serially added and x"(n) indicating a second RLL/DC-free/RS coded sequence where they are added in a dispersed manner when the redundancy sequence 1500 is added to the RLL/DC-free coded sequence 1400 in the redundancy adding unit 1044. Note that the redundancy sequences 1500 to be added are each 4 bits composed of A, B, C and B. y0'(m) and y1'(m) are bit sequences indicating a plurality of bits existing in even-numbered bits and odd-numbered bits in x'(n) indicating the first RLL/DC-free/RS coded sequence 1610, respectively. y0"(m) and y1"(m) are bit sequences indicating a plurality of bits existing in even-numbered bits and odd-numbered bits in x"(n) indicating the second RLL/DC-free/RS coded sequence 1620, respectively.

Redundancy sequence 1500={A, B, C, D}
x'(n)={01100101001100010001ABCD}
y0'(m)={0101101000AC}
y1'(m)={1100010101BD}
x"(n)={01110AB0101001100CD}
y0"(m)={010B11010D00}
y1"(m)={11A00010C101}

According to the above x'(n), y0'(m) and y1'(m), if A is a bit indicating 0 in y0'(m) and y1'(m) where the redundancy bits are added serially, the maximum length of consecutive 0's will be 4. If A and C are bits both indicating 0, the maximum consecutive length of 0's will be 5. This result follows because no RLL coding is performed on the serially added redundancy sequence. On the other hand, according to x"(n), y0"(m) and y1"(m), the maximum length of consecutive 0's remains to be 3, in y0"(m) and y1"(m) where they are added in a dispersed manner, except when A or D is 0. Even if A and B are bits indicating 0, the maximum length of consecutive 0's will be at most 4. In other words, even if even numbers of bits as a set is added to an RLL/DC-free coded sequence, it can be safely said that the RLL property does not deteriorate largely. Still in other words, it can be said that adding the redundancy sequence to the RLL/DC-free coded sequence in a dispersed manner achieves effects equivalent to performing RLL coding on the redundancy sequence.

Now, the DC-free property is examined. If all of A, B, C and D are bits indicating 0, there will be 15 bits indicating 0 and 9 bits indicating 1, so that the DC-free property is a bit deteriorated. If all of A, B, C and D are bits indicating 1, there will be 11 bits indicating 0 and 13 bits indicating 1, so that the DC free property is a bit deteriorated. However, it is rare that all redundancy bits indicates the same bit. Also, the length of redundancy bits is about ⅒ as compared with the length of a run-length coded sequence. In such case, although the DC-free property is locally corrupted, the RLL/DC-free/RS coded sequence 1600 is barely degraded.

Accordingly, the redundancy bits, where one sets holds 2N redundancy bits, are added equidistantly to the RLL sequence, so that the RLL sequence after the redundancy sequence has been added, namely, the RLL/DC-free/RS coded sequence 1600 can satisfy the RLL property and the DC-free characteristics. Note that they not always have to be added equidistantly but adding them equidistantly will be advantageous in that the processing is easily. Compared with a case where they are not added in a dispersed manner, the RLL property of a redundancy sequence portion can be significantly improved.

Figure 19:
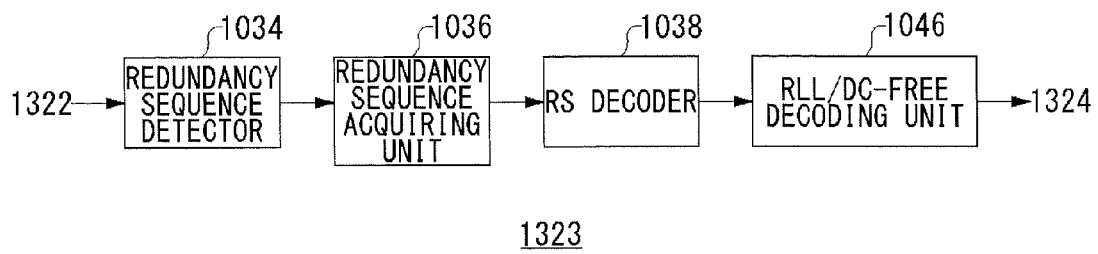
FIG. 19 is a diagram showing an exemplary structure of an RLL/DC-free/RS decoding unit shown in FIG. 10.

FIG. 19 is a diagram showing an exemplary structure of the RLL/DC-free/RS decoding unit 1323 shown in FIG. 10. The RLL/DC-free/RS decoding unit 1323 includes a redundancy sequence detector 1034, a redundancy sequence inquiring unit 1036, an RS decoder 1038 and an RLL/DC-free decoding unit 1046. The redundancy sequence detector 1034 detects a position where a redundancy sequence is inserted, in a first signal sequence inputted by the LDPC repeat decoding unit 1322. More specifically, the insertion position is detected in consideration of an insertion interval of the redundancy sequence and the number of bits thereof per set.

The redundancy sequence acquiring unit 1036 cuts out the redundancy sequence from the first signal sequence inputted by the LDPC repeat decoding unit 1322 according to the insertion position detected by the redundancy sequence detector 1034, and acquires a second signal sequence. The RS decoder 1038 corrects the second signal sequence acquired by the redundancy sequence inquiring unit 1036, using the redundancy bits cut out by the redundancy sequence acquiring unit 1036. The RLL/DC-free decoding unit 1046 performs run-length limited decoding on the second signal sequence where the error has been corrected by the RS decoder 1038. More specifically, the processing is performed in the reverse order of the operation of the RLL/DC-free/RS coding unit 1303 shown in FIG. 12.

Figure 20:
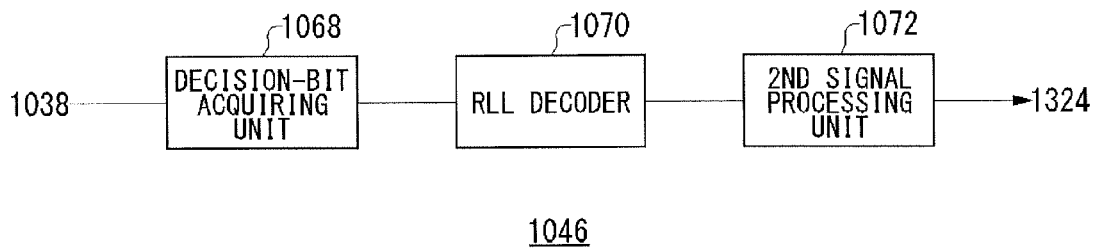
FIG. 20 is a diagram showing an exemplary structure of an RLL/DC-free decoding unit shown in FIG. 19.

FIG. 20 is a diagram showing an exemplary structure of the RLL/DC-free decoding unit 1046 shown in FIG. 19. The RLL/DC-free decoding unit 1046 includes a decision-bit acquiring unit 1068, an RLL decoder 1070, and a second signal processing unit 1072. The decision-bit acquiring unit 1068 acquires a predetermined decision bit added to the second signal sequence where the error has been corrected by the RS decoding unit 1038. The RLL decoder 1070 performs run-length limited decoding on the second signal sequence (except for the decision bit) where the error has been corrected by the RS decoder 1038 so as to generate a digital signal sequence. The second signal processing unit 1072 performs a signal processing, which is reverse to a predetermined signal processing executed in the first signal processing unit 1062, on the digital signal sequence generated by the RLL decoder 1070 according to the decision bit acquired by the decision-bit acquiring unit 1068. For example, if a bit inversion processing and/or a processing, in which the order of bits is interchanged, are/is performed in the first signal processing unit 1062 of FIG. 13, a bit inversion processing and/or a processing, in which the interchanged sequences are restored, are/is performed. Alternatively, according to the decision bit acquired by the decision-bit acquiring unit 1068, the second signal processing unit 1072 performs a processing in which a plurality of bits contained in the digital signal sequence are outputted as they are.

In terms of hardware, these structures described as above can be realized by a CPU, a memory and other LSIs of an arbitrary computer. In terms of software, it can be realized by memory-loaded programs which have communication functions and the like, but drawn and described herein are function blocks that are realized in cooperation with those. Hence, it is understood by those skilled in the art that these function blocks can be realized in a variety of forms such as by hardware only, software only or the combination thereof.

According to the present second embodiment, the RS coding is executed after the execution of the run-length limited coding and therefore at the decoding side the run-length limited decoding is performed on the signal sequence which has been subjected to the RS decoding. In other words, the run-length limited decoding is performed on a sequence which has been error-corrected by the RS decoding. Thereby, the coded sequence selected at the decoding side can be determined with accuracy, so that the error correction capability can be enhanced as a whole. Also, a redundancy sequence which has been divided into a plurality of groups, and the thus divided redundancy sequences are added respectively to different positions, so that the RLL property after the redundancy sequences have been added, and the DC-free characteristics can be enhanced. Since the sequences are added equidistantly per group, the RLL property after the redundancy sequences have been added, and the DC-free characteristics can be further enhanced. An even number of redundancy sequences are each added to a run-length coded sequence, so that the RLL property after the redundancy sequence has been added can be further enhanced. Even if even numbers of bits as a set is added to an RLL/DC-free coded sequence, it can be safely said that the RLL property does not deteriorate largely. Still in other words, it can be said that adding the redundancy sequence to the RLL/DC-free coded sequence in a dispersed manner achieves effects equivalent to performing RLL coding on the redundancy sequence. The length of redundancy bits is about ⅒ as compared with the length of a run-length coded sequence. Hence, the DC property is barely degraded. Also, the RLL property of a redundancy sequence portion can be significantly improved as compared with a case where they are not added in a dispersed manner.

Also, the identical RLL coding is performed, so that a sequence having a satisfactory DC-free property can be produced without increasing the circuit scale. Before the RLL coding, two sequences which are an arbitrary signal sequence and a sequence obtained after a predetermined signal processing has been performed on an arbitrary signal sequence are to be processed. Accordingly, the sequences generated are all different and therefore the sequences having a statistically satisfactory DC-free property can be generated. Also, since this predetermined signal processing is executed without changing the number of bits in the signal sequence, the reduction in coding gain can be avoided. Further, various kinds of sequences can be generated by arbitrarily changing the processing contents of the signal processing, so that the range of choices can be expanded. Thus, sequences having further satisfactory DC-free property can be generated. As a result, this is suitable for applications such as one in which the coding rate cannot be set low as with a hard disk. Also, the circuit configuration can be simplified and the circuit scale can be reduced by using the same RLL coding circuit.

By employing the bit inversion processing and/or by interchanging the order of bits, different sequences can be generated without changing the number of bits contained in a sequence on which the run-length limited coding is to be performed. Since the number of bits contained in the sequence does not increase, the coding sequence can be obtained without deteriorating the total coding rate. A bit inversion processing and/or a processing, in which the order of bits is interchanged, are/is performed as a predetermined processing for generating different sequences, so that the predetermined processing can be achieved by a simple circuit configuration. Also, information indicating that any of coding sequences has been selected is added to the coding sequence, so that the selected coding sequence can be easily determined at a decoding side.

The coding sequence selection unit 1074 makes a selection decision on coded sequences where the coded sequences selected in the past are connected with the coded sequences which are currently candidates for a selection, so that the DC-free characteristics in a long interval can be enhanced. The RDS is calculated in the coded sequence selection unit 1074 by combining the interval processing and the moving processing, so that the DC-free property can be enhanced in a long interval, for example, in an entire sequence of 300 bits. Also, a coded sequence whose ratio of bits indicating 0's and bits indicating 1's is closer to 50% is selected, so that a coding sequence having a high DC-free property can be selected. Also, a plurality of bits contained in coded sequences are summed up and then a coded sequence corresponding to a smaller summation value is selected. Hence, a coded sequence having a high DC-free property can be selected. Of a result where the additive shift has been done to a plurality of bits contained in the coded sequences, a coded sequence is selected using the maximum value. Hence, a coded sequence having a high DC-free property can be selected. A processing corresponding to the DC-free coding executed at a coding side is executed, so that the original digital signal sequence can be decoded. By performing a coding processing having a high DC-free property, access can be made faster to the storage system. Also, since there is no need to mount any unnecessary hardware, a semiconductor integrated circuit with a reduced circuit scale can be realized.

In the second embodiment, the R/W channel 1003 may be integrated on a single semiconductor substrate. In the coded sequence selection unit 1074 according to the second embodiment, a description has been given of the interval arithmetic processing or the moving processing. However, this should not be considered as limiting, and the selection and sorting of a coding sequence having a high DC-free property can be made by performing an interval averaging or a moving averaging. In this case, too, the similar advantage can be obtained. Also, in the structure of the RLL/DC-free coding unit 1303, a description has been given of a case where two different signal sequences are generated by use of the first signal processing unit 1062 that executes a predetermined signal processing. However, this should not be considered as limiting and a plurality of signal sequences may be generated by use of a plurality of signal processing units. For example, there may be provided signal processing units that execute a bit inversion processing, a processing of interchanging the order of bits, and a bit inversion processing and a processing of interchanging the order of bits, respectively. In this case, the decision bits indicating that any one of the four sequences has been selected is of 2 bits, so that a proper decoding processing can be realized at the decoding side. Also, the four different sequences including those to which no signal processing has been given can be generated. Since choices can be broadened, the possibility of generating a sequence having a high DC-free property can be improved.

A description has been given of a case where the RS codes are used as an error correction scheme. However, this should not be considered as limiting and other systematic codes such as LDPC codes or turbo codes may be used. In such a case, it goes without saying that the same advantages as above are obtained.

In the description with reference to FIG. 12 and FIG. 13, the RS coding unit 1042 and the redundancy adding unit 1044 are provide as separate blocks. However, this should not be considered as limiting, and the RS coding unit 1042 may be structured by including the redundancy sequence adding unit 1044. In FIG. 17 and FIG. 18, a description has been given where the intervals of L are first placed and then the redundancy subsequence 1510 is added to the RLL/DC-free coded sequence 1400. However, this should not be considered as limiting and this processing may be performed by substituting arbitrary values, for example, $\alpha$ or 0. Also, in S20, a description has been given where the termination is determined by whether or not j is less than or equal to 2NM. However, this should not be considered as limiting, and the termination may be determined by a condition of whether i is larger than sL or not. In such a case, it goes without saying that the same advantages as above are obtained.

Third Embodiment

A third embodiment of the present invention relates to an error correction coding/decoding technology. It particularly relates to a signal coding apparatus and a signal decoding apparatus for performing error correction coding/decoding on data stored in a storage medium, a signal processing apparatus and a storage system.

The background technology for the third embodiment is described.

In recent years, storage devices using hard disks are becoming indispensable in various fields such as personal computers, hard disk recorders, video cameras and mobile telephones. Depending on the fields applied, there are various specifications required of the storage devices using the hard disks. For example, high speed and large capacity are required of a hard disk mounted on a personal computer. In order to improve the high-speed performance and the large capacity, the error correcting coding with high correction capability needs to be implemented. However, since the amount of data handled per unit time increases as the high-speed performance advances, the error per unit time increase proportionally. Thus, reloading back into a hard disk takes places when an error correction method having a low error correction capability is used. This increases the access time, causing a bottleneck in achieving the high speed operation.

It is generally desired that a signal sequence whose DC components are reduced or eliminated be used as a signal sequence on which the error correction coding is to be performed. Hereinafter this will be referred to as "DC-free" or "DC-free property". The DC-free means that the frequency is 0, that is, the spectrum in the DC components is 0. In other words, the ratio of 0's and 1's contained in a plurality of bits contained in a signal sequence before a modulation is the same or the like. With a signal sequence provided with the DC-free property, the average level of a reproduced signal obtained from a recording pattern of modulation data stored in the storage medium is constantly fixed within a range of a predetermined signal sequence length. This property contributes to enhancing the noise tolerance. That is, in a signal sequence having a low DC-free property, the detection probability will be low in the detection of data using a Viterbi algorithm. As a result, the correction capability in low-density parity check decoding or Reed-Solomon decoding will be also reduced. In general, run-length limited codes are used in order to ensure the synchronism between the sampling timing and the data. The run-length limited code is a coding where the maximum length of consecutive 0's and the maximum length of consecutive 1's are restricted.

Conventionally, a method is proposed, as a run-length limited coding method, where while the DC-free property is met, the run-length limited coding is performed on a signal sequence with different redundancy bits affixed and a sequence having a characteristic closer to the DC-free is selected from among a plurality of coded sequences (See Japanese Patent Application Laid-Open No. 2002-100125, for instance). Also, proposed is a method where a run-length limited coding having a plurality of different properties is executed and a sequence having a characteristic closer to the DC-free is selected from among a plurality of coded sequences (See Japanese Patent Application Laid-Open No. 2004-213863, for instance).

Problems to be resolved by the third embodiment are now described.

Under these circumstances, the inventors of the present invention had come to recognize the following problems to be resolved. When the DC-free coding is to be accomplished by selecting sequences having a satisfactory DC-free property from among a plurality of coded sequences, there are cases where in a plurality of coded sequences to be selected there is no coded sequences having a satisfactory DC-free property. That is, there is a problem where a structure is required such that at least one sequence having the satisfactory DC-free property and this required structure affects the circuit scale and storage capacity.

The third embodiment of the present invention has been made in view of the foregoing circumstances described as above, and a general purpose thereof is to provide a signal coding apparatus, a decoding apparatus, a signal decoding apparatus, a signal processing apparatus and a storage system with a further reduced circuit scale where the DC-free property can be enhanced while satisfying the run-length limit.

In order to resolve the above problems, a coding apparatus according to comprising: a run-length limited coding unit which generates a first coded sequence by subjecting a digital signal sequence to run-length limited coding; a signal processing unit which performs a predetermined signal processing on the digital signal sequence without changing the number of a plurality of bits contained in the digital signal sequence and which generates a second coded sequence; and a DC component removal coding unit which selects and outputs either one of the first coded sequence generated by the first run-length limited coding unit and the second coded sequence generated by the signal processing unit. Here, the "DC component removal coding unit" includes a circuit and the like which eliminate DC components of an inputted sequence or reduce them and a circuit and the like which output a sequence having a high DC-free property.

According to this embodiment, a sequence is generated by the run-length limited coding and a sequence is generated by performing the signal processing on the sequence generated by the run-length limited coding, so that totally different two coded sequences can be obtained. A predetermined signal processing is performed in order not to increase the number of bits contained in the sequence, so that the coded sequence is obtained without degrading the coding rate as a whole. The two coded sequences are phase-inverted to each other, so that more suitable choices are available in choosing a sequence having a high DC-free property. Choosing a coded sequence having a high DC-free property from among more suitable choices enhances the possibility of selecting a coded sequence having a higher DC-free property. Also, the use of a single run-length limited coding circuit can simplify the circuit configuration and also reduce the circuit scale.

The run-length limited coding unit may generate the first coded sequence in a manner that there is at least one consecutive-0 interval having bits indicating consecutive 0's in a plurality of bits contained in the first coded sequence and the length of a consecutive-0 interval having a maximum length is greater than or equal to 0 and less than or equal to a first permissible consecutive length, and there is at least one consecutive-1 interval having bits indicating consecutive 1's in a plurality of bits contained in the first coded sequence and the length of a consecutive-1 interval having a maximum length is greater than or equal to 0 and less than or equal to a second permissible consecutive length. According to this embodiment, both the length of consecutive 0's and the length of consecutive 1's contained in the first coded sequence are restricted by the run-length limited coding unit, so that the restriction is also maintained in the second coded sequence.

The run-length limited coding unit may generates the first coded sequence by setting the first permissible consecutive length and the second permissible consecutive length equal to each other. According to this embodiment, even if, at a posterior stage of the run-length limited coding unit, the bit inversion processing is performed on a coded sequence where the length of consecutive 1's and the length of consecutive 0's have been restricted, the restriction on the consecutive length can be maintained. The signal processing unit may perform bit conversion processing on a plurality of bits contained in the digital signal sequence, respectively. According to this embodiment, the execution of the bit inversion allows for the generation of different coded sequences without increasing the number of bits contained in the coded sequence. Since the number of bits contained in the sequence is not increased, the coded sequence can be obtained without degrading the total coding rate. The bit inversion processing is employed as a predetermined processing executed to generate different sequences, so that the predetermined processing can be achieved with a simple circuit configuration.

The DC component removal coding unit may include: a coded sequence selection unit which selects either one of the first coded sequence and the second coded sequence; a selection identifying information generator which generates selection identifying information that indicates a coded sequence selected by the coded sequence selection unit; and an identification information adding unit which adds the selection identifying information generated by the selection identifying information generator, to any position of the coded sequence selected by the coded sequence selection unit. The coded sequence selection unit may include: a first coupling unit which connects a coded sequence, which has already been selected by the coded sequence selection unit, with the first coded sequence; and a second coupling unit which connects a coded sequence, which has already been selected by the coded sequence selection unit, with the second coded sequence. The coded sequence selection unit may set the sequence connected by the first coupling unit as a new first coded sequence and may set the sequence connected by the second coupling unit as a new second coded sequence, and may select either one of the new coded sequences. The apparatus may further comprise: a first adding unit which adds a first decision bit to any of positions in the first coded sequence outputted from the first run-length limited coding unit; and a second adding unit which adds a second decision bit, where the first decision bit is bit-inverted, to any of positions in the second coded sequence outputted from the signal processing unit.

Here, "adding" includes addition, multiplication, insertion and so forth. "Connects a coded sequence, which has already been selected by the coded sequence selection unit, with the first coded sequence" includes connecting a coded sequence selected in the past with the coded sequences which are currently candidates for a selection, and so forth. According to this embodiment, information indicating that any of coded sequences has been selected is appended to the coded sequence. Thereby, the selected coded sequence can be easily determined at a decoding side.

The coded sequence selection unit may include: a first rate calculation unit which calculates a ratio of bits indicating 0 and bits indicating 1 among a plurality of bits contained in the first coded sequence; a second rate calculation unit which calculates a ratio of bits indicating 0 and bits indicating 1 among a plurality of bits contained in the second coded sequence; and a selection output unit which selects a coded sequence corresponding to either the ratio calculated in the first rate calculation unit or the ratio calculated in the second rate calculation unit whichever is closer to 50% and which outputs the selected sequence. According to this embodiment, either of the ratios of the bits indicating 0 and the bits indicating 1 which is closer to 50% is selected. Thus, the coded sequence with a high DC-free property can be selected.

The coded sequence selection unit may include: a first summation unit which adds up a plurality of bits contained in the first coded sequence and generates a first summation value; a second summation unit which adds up a plurality of bits contained in the second coded sequence and generates a second summation value; a coded sequence detector which compares an absolute value of the first summation value generated by the first summation unit with an absolute value of the second summation value generated by the second summation unit, and which detects a coded sequence corresponding to a smaller summation value either in the first coded sequence or the second coded sequence; and a selection output unit which selects the coded sequence detected by the sequence detector from the first coded sequence and the second coded sequence and which outputs the selected coded sequence. Here, a "summation value" includes that bits contained in a sequence are summed up and so forth. "A plurality of bits contained in a sequence" includes bits indicating 1's or 0's and the like and also includes bits in a case where the bit indicating 0 is substituted by +1 and the bit indicating 1 is substituted by −1 and other cases. According to this embodiment, a plurality of bits contained in a coded sequence are added up and a sequence corresponding to a smaller summation value is selected. Thus, a coded sequence having a high DC-free property can be selected.

The coded sequence selection unit may include: a first additive shift unit which shifts and adds a plurality of bits contained in the first coded sequence and which generates first additive shift values the number of which is equal to the number of the plurality of bits; a first maximum value detector which detects a maximum value in a plurality of first additive shift values generated by the first additive shift unit; a second additive shift unit which shifts and adds a plurality of bits contained in the second coded sequence and which generates second additive shift values the number of which is equal to the number of the plurality of bits; a second maximum value detector which detects a maximum value in a plurality of second additive shift values generated by the second additive shift unit; a coded sequence detector which compares the maximum value detected by the first maximum value detector and the maximum value detected by the second maximum value detector and which detects either the first coded sequence or the second coded sequence whichever corresponds to a smaller maximum value; and a selection output unit which selects either the first coded sequence or the second coded sequence whichever is detected by the coded sequence detector and which outputs the selected sequence. Here, "shifts and adds" includes shifting and adding and further calculating the absolute value thereof. According to this embodiment, a coded sequence is selected by using the maximum value in a result where a plurality of bits contained in the coded sequence have been shifted and added. Thus, a coded sequence having a high DC-free property can be selected.

Another aspect of the third embodiment of the present invention relates to a decoding apparatus. This apparatus comprises: an input unit which inputs a coded sequence to which a predetermined decision bit is added; a decision-bit acquiring unit which acquires the predetermined decision bit added to the coded sequence inputted by the input unit; a signal processing unit which performs either a processing in which for the coded sequence inputted by the input unit a plurality of bits contained in the coded sequence are bit-inverted, respectively, according to the decision bit acquired by the decision-bit acquiring unit and a signal sequence to be decoded is outputted or a processing in which the coded sequence is outputted intact as a signal sequence to be decoded; and a run-length limited decoding unit which performs a run-length limited decoding on the signal sequence to be decoded which has been outputted by the signal processing unit and which generates a digital signal sequence. According to this embodiment, the processing corresponding to the DC-free coding executed at a coding side is performed, so that the original digital signal sequence can be decoded.

Still another aspect of the third embodiment of the present invention relates to a signal processing apparatus. This apparatus is a signal processing apparatus that includes a signal coding apparatus and a signal decoding apparatus, and the coding apparatus includes: a run-length limited coding unit which generates a first coded sequence by subjecting a digital signal sequence to run-length limited coding; a signal processing unit which performs bit inversion processing on each of a plurality of bits contained in the first coded sequence so as to generate a second coded sequence; a first adding unit which adds a first decision bit to any of positions in the first coded sequence outputted from the run-length limited coding unit; a second adding unit which adds a second decision bit, where the first decision bit is bit-inverted, to any of positions in the second coded sequence outputted from the signal processing unit; and a DC component removal coding unit which selects and outputs either one of the first coded sequence to which the first decision bit has been added by the first adding unit and the second coded sequence to which the second decision bit has been added by the second adding unit, and the decoding apparatus includes: an input unit which inputs a coded sequence to which either one of the first decision bit and the second decision bit has been added; a decision-bit acquiring unit which acquires the decision bit added to the coded sequence inputted by the input unit; a signal processing unit which performs either a processing in which for the coded sequence inputted by the input unit a plurality of bits contained in the digital sequence are bit-inverted, respectively, according to the decision bit acquired by the decision-bit acquiring unit and a signal sequence to be decoded is outputted or a processing in which the coded sequence is outputted intact as a signal sequence to be decoded; and a run-length limited decoding unit which performs a run-length limited decoding on the signal sequence to be decoded which has been outputted by said signal processing unit and which generates a digital signal sequence.

According to this embodiment, the inversion processing is performed not to increase the number of bits contained in the coded sequence, and therefore the coded sequence is obtained without degrading the overall coding rate. The two coded sequences are logically inverted to each other, so that more suitable choices are available in choosing a sequence having a high DC-free property. Choosing a coded sequence having a high DC-free property from among more suitable choices enhances the possibility of selecting a coded sequence having a higher DC-free property. Also, the processing corresponding to the DC-free coding executed is performed at a coding side, so that the original digital signal sequence can be decoded.

Still another aspect of the third embodiment of the present invention relates to a signal storage system. This storage system is a signal storage system comprised of a write channel for writing data to a storage apparatus and a read channel for reading out the data stored in the storage apparatus, and the write channel includes: a first coding unit which performs a run-length limited coding on the data; a second coding unit which codes the data coded by the first coding unit using a low-density parity check code; and a write unit which writes the data coded by second coding unit to the storage apparatus, and the read channel includes: an input unit which inputs an analog signal outputted from the storage apparatus; an analog-to-digital converter which converts the analog signal inputted from the input unit into a digital so as to be outputted; a soft-output detector which calculates a likelihood of the digital signal outputted from the analog-to-digital converter and outputs a soft-decision value; a first decoding unit, compatible with the second coding unit, which decodes data outputted from the soft-output detector; and a second decoding unit, compatible with the first coding unit, which decodes data decoded by the first decoding unit. The first coding apparatus includes: a run-length limited coding unit which generates a first coded sequence by subjecting a digital signal sequence to run-length limited coding; a signal processing unit which performs bit inversion processing on each of a plurality of bits contained in the first coded sequence so as to generate a second coded sequence; a first adding unit which adds a first decision bit to any of positions in the first coded sequence outputted from the run-length limited coding unit; a second adding unit which adds a second decision bit, where the first decision bit is bit-inverted, to any of positions in the second coded sequence outputted from the signal processing unit; and a DC component removal coding unit which selects and outputs either one of the first coded sequence to which the first decision bit has been added by the first adding unit and the second coded sequence to which the second decision bit has been added by the second adding unit. The second decoding apparatus includes: an input unit which inputs a coded sequence to which either one of the first decision bit and the second decision bit has been added; a decision-bit acquiring unit which acquires the decision bit added to the coded sequence inputted by the input unit; a signal processing unit which performs either a processing in which for the coded sequence inputted by the input unit a plurality of bits contained in the digital sequence are bit-inverted, respectively, according to the decision bit acquired by the decision-bit acquiring unit and a signal sequence to be decoded is outputted or a processing in which the coded sequence is outputted intact as a signal sequence to be decoded; and a run-length limited decoding unit which performs a run-length limited decoding on the signal sequence to be decoded which has been outputted by the signal processing unit and which generates a digital signal sequence. According to this embodiment, a coding processing having a high DC-free property is performed and thereby access can be made faster to the storage system.

Still another aspect of the third embodiment of the present invention relates also to a storage system. This storage system further comprises: a storage apparatus which stores data; and a control unit which controls a write to said storage apparatus and a read from said storage apparatus. The read channel reads out the data stored in the storage apparatus, according to an instruction of said control unit, and write channel writes coded data to the storage apparatus, according to an instruction of said control unit. According to this embodiment, a coding processing having a high DC-free property is performed and thereby access can be made faster to the storage system.

Still another aspect of the third embodiment of the present invention relates to a coding apparatus. This apparatus may be integrated on a single semiconductor substrate. According to this embodiment, a coding processing having a high DC-free property can be performed efficiently and there is no need to mount any unnecessary hardware, so that a semiconductor integrated circuit with a reduced circuit scale can be realized.

Still another aspect of the third embodiment of the present invention relates to a run-length limited coding method. This method is a run-length limited coding method for generating coded sequences by subjecting digital signal sequences to run-length limited coding and a first coded sequence is generated in a manner that there is at least one consecutive-0 interval having bits indicating consecutive 0's in a plurality of bits contained in the coded sequence and the length of a consecutive-0 interval having a maximum length is greater than or equal to 0 and less than or equal to a first permissible consecutive length, and there is at least one consecutive-1 interval having bits indicating consecutive 1's in a plurality of bits contained in the coded sequence and the length of a consecutive-1 interval having a maximum length is less than a second permissible consecutive length. This run-length limited coding method may be such that the coded sequence may be generated by setting the first permissible consecutive length and the second permissible consecutive length equal to each other. According to this embodiment, both the length of consecutive 0's and the length of consecutive 1's contained in the coded sequence are restricted by the run-length limited coding unit, so that a coded sequence having a further satisfactory limitation can be generated in terms of the runlength.

It is to be noted that any arbitrary combination of the aforementioned constituent elements and the components or expression of the present invention replaced among a method, an apparatus, a system and so forth are also effective as the embodiments of the present invention.

Before explaining the third embodiment of the present invention in concrete terms, a brief description will be first given of a storage system according to the third embodiment. The storage system according to the third embodiment includes a hard disk controller, a magnetic disk apparatus, and a read/write channel which includes a read channel and a write channel. At the write channel, run-length limited coding, DC-free coding and LDPC coding are performed as coding schemes. At the read channel, data detection using Viterbi algorithm or the like and LDPC decoding are carried out. Since there exist DC components, the detection accuracy in this data detection is known to deteriorate. Further, since the detection accuracy deteriorates, the correction capability of LDPC decoding drops. Thus, in the third embodiment of the present invention, a structure is provided such that the DC-free coding for reducing the DC components is performed at a stage prior to performing the LDPC coding. Note that the storage system according to the third embodiment is not limited to the LDPC coding and a structure may be implemented where other error correction coding schemes, such as turbo coding and convolutional coding, are performed.

The DC-free coding is realized by selecting a sequence having a higher DC-free property from two different sequences. When RLL codings having two different properties are performed, the circuit scale increases by the scale equivalent to the required second RLL coding circuit. Even in the case of an application where the circuit scale is no concern, the execution of RLL codings having two different properties does not guarantee the satisfactory DC-free property for the both sequences. Accordingly, the same RLL coding is performed in the third embodiment of the present invention.

In the case when the same RLL is to be performed, it is necessary to avoid a case where the sequences to be selected are identical to each other. Also, it is necessary to avoid a case where the limited coded sequence having a satisfactory DC-free property does not exist at all. In the light of this, two sequences, which are a sequence obtained by the RLL coding and a sequence where said sequence is inverted, are considered to be selected in the third embodiment of the present invention. In the RLL coding, the runlength of not only 0's but also 1's is limited. Thereby, the RLL characteristics can be guaranteed not only in the sequence obtained by the RLL coding but also in the inverted sequence. The two sequences thus generated have practically the same DC-free property. However, the sequences having a statistically satisfactory DC-free property can be generated by averaging them over some intervals As a result, the RLL characteristics and the DC-free property can be both enhanced in the coding apparatus according to the third embodiment. Also, the coding apparatus according to the third embodiment is realized by a simple structure such as a single RLL coding unit and an inversion unit. Thus the circuit scale can be reduced. Further, coded sequences having a high DC-free property can be generated without setting the coding rate low. Thus, the coding apparatus according to the third embodiment is suitable for such applications as one in which the coding rate cannot be set low as in the case of a hard disk or the like. The detail will be discussed later.

Referring to Figures, the third embodiment of the present invention will be described in detail hereinbelow.

Figure 21:
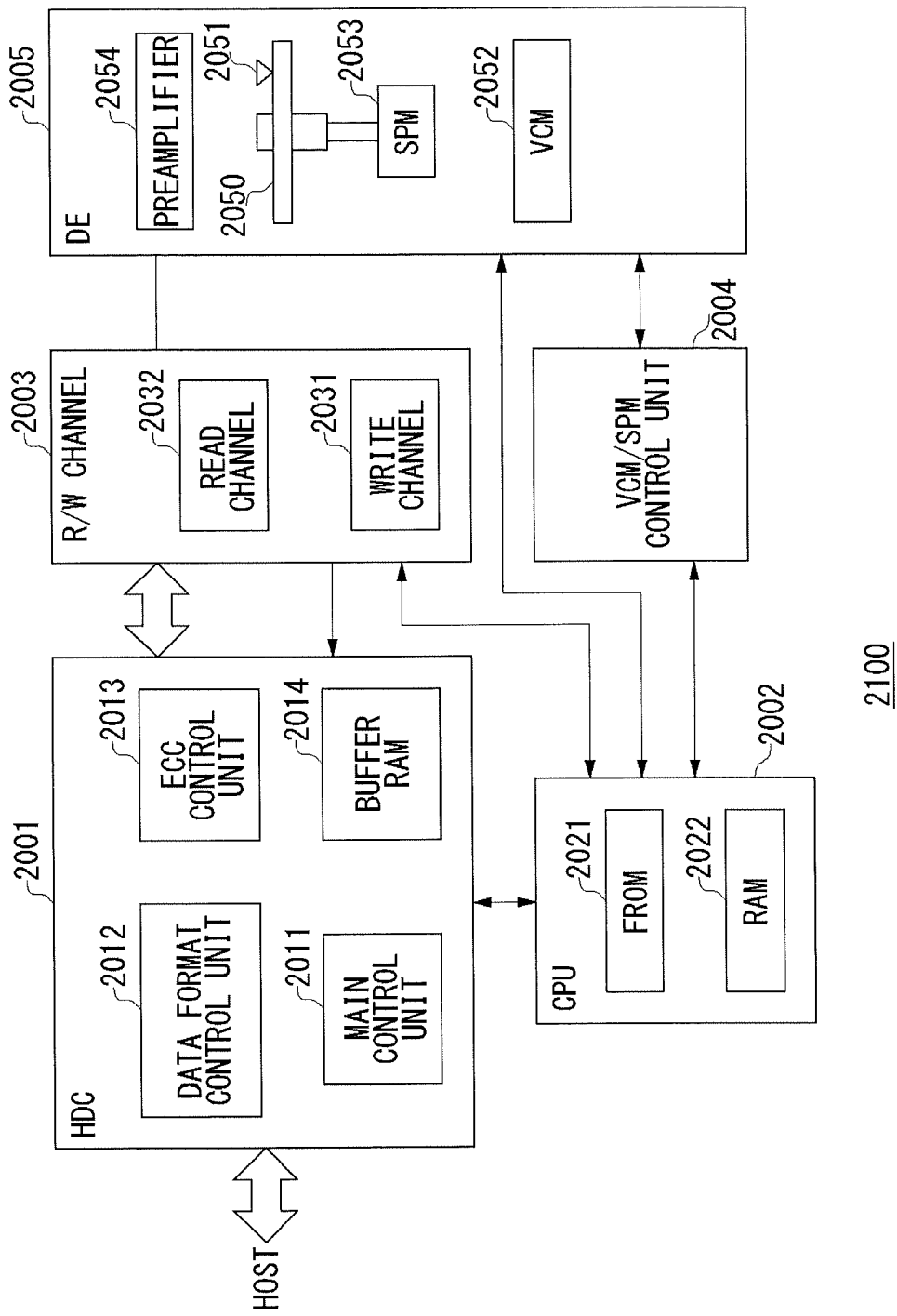
FIG. 21 is a diagram showing a structure of a storage system according to a third embodiment of the present invention.

FIG. 21 is a diagram showing a structure of a storage system 2100 according to the third embodiment of the present invention. The storage system 2100 in FIG. 21 is comprised roughly of a hard disk controller 2001 (hereinafter abbreviated as "HDC 2001"), a central processing arithmetic unit 2002 (hereinafter abbreviated as "CPU 2002"), a read/write channel 2003 (hereinafter abbreviated as "R/W channel 2003"), a voice coil motor/spindle motor controller 2004 (hereinafter abbreviated as "VCM/SPM controller 2004"), and a disk enclosure 2005 (hereinafter abbreviated as "DE 2005"). Generally, an HDC 2001, CPU 2002, R/W channel 2003, and VCM/SPM controller 2004 are structured on a single substrate.

The HDC 2001 includes a main control unit 2011 for controlling the whole HDC 2001, a data format control unit 2012, an error correction coding control unit 2013 (hereinafter abbreviated as "ECC control unit 2013") and a buffer RAM 2014. The HDC 2001 is connected to a host system via a not-shown interface unit. It is also connected to the DE 2005 via the R/W channel 2003, and carries out data transfer between the host and the DE 2005 according to the control by the main control unit 2011. Inputted to this HDC 2001 is a read reference clock (RRCK) generated by the R/W channel 2003. The data format control unit 2012 converts the data transferred from the host into a format that is suited to record it on a disk medium 2050 and also converts the data reproduced by the disk medium 2050 into a format that is suited to transfer it to the host. The disk medium 2050 includes a magnetic disk, for example. The ECC control unit 2013 appends redundancy symbols, using data to be recorded as information symbols, in order to enable the correction and detection of errors contained in data reproduced from the disk medium 2050. The ECC control unit 2013 also determines if any error has occurred in reproduced data and corrects or detects the error if there is any. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the Reed-Solomon (RS) code for ECC, the number of errors correctable will be (the number of redundancy symbols/2). The buffer RAM 2014 stores temporarily data transferred from the host and transfers it to the R/W channel 2003 with proper timing. Also, the buffer RAM 2014 stores temporarily the read data transferred from the R/W channel 2003 and transfers it to the host with proper timing after the completion of ECC decoding or the like.

The CPU 2002 includes a flash ROM 2021 (hereinafter abbreviated as "FROM 2021") and a RAM 1022, and is connected to the HDC 2001, R/W channel 2003, VCM/SPM controller 2004, and DE 2005. The FROM 2021 stores an operation program for the CPU 2002.

The R/W channel 2003, which is roughly divided into a write channel 2031 and a read channel 2032, transfers data to be recorded and reproduced data to and from the HDC 2001. Connected to the DE 2005, the R/W channel 2003 also performs transmission of recorded signals and reception of reproduced signals. The detail will be discussed later.

The VCM/SPM controller 2004 controls a voice coil motor 2052 (hereinafter abbreviated as "VCM 2052") and a spindle motor 2053 (hereinafter abbreviated as "SPM 2053") in the DE 2005.

The DE 2005, which is connected to the R/W channel 2003, performs reception of recorded signals and transmission of reproduced signals. The DE 2005 is also connected to the VCM/SPM controller 2004.

The DE 2005 includes a disk medium 2050, a head 2051, a VCM 2052, an SPM 2053, a preamplifier 2054 and so forth. In the storage system 2100 as shown in FIG. 21, it is so assumed that there is one disk medium 2050 and the head 2051 is disposed only on one side of the disk medium 2050, but the arrangement may be such that a plurality of disk mediums 2050 are formed in a stacked structure. Also, the head 2051 is generally provided corresponding to each face of the disk medium 2050. The recorded signals transmitted from the R/W channel 2003 are supplied to the head 2051 by way of the preamplifier 2054 in the DE 2005 and then recorded on the disk medium 2050 by the head 2051. Conversely, the signals reproduced from the disk medium 2050 by the head 2051 are transmitted to the R/W channel 2003 by way of the preamplifier 2054. The VCM 2052 in the DE 2005 moves the head 2051 in a radial direction of the disk medium 2050 to position the head 2051 at a target position on the disk medium 2050. The SPM 2053 rotates the disk medium 2050.

Figure 22:
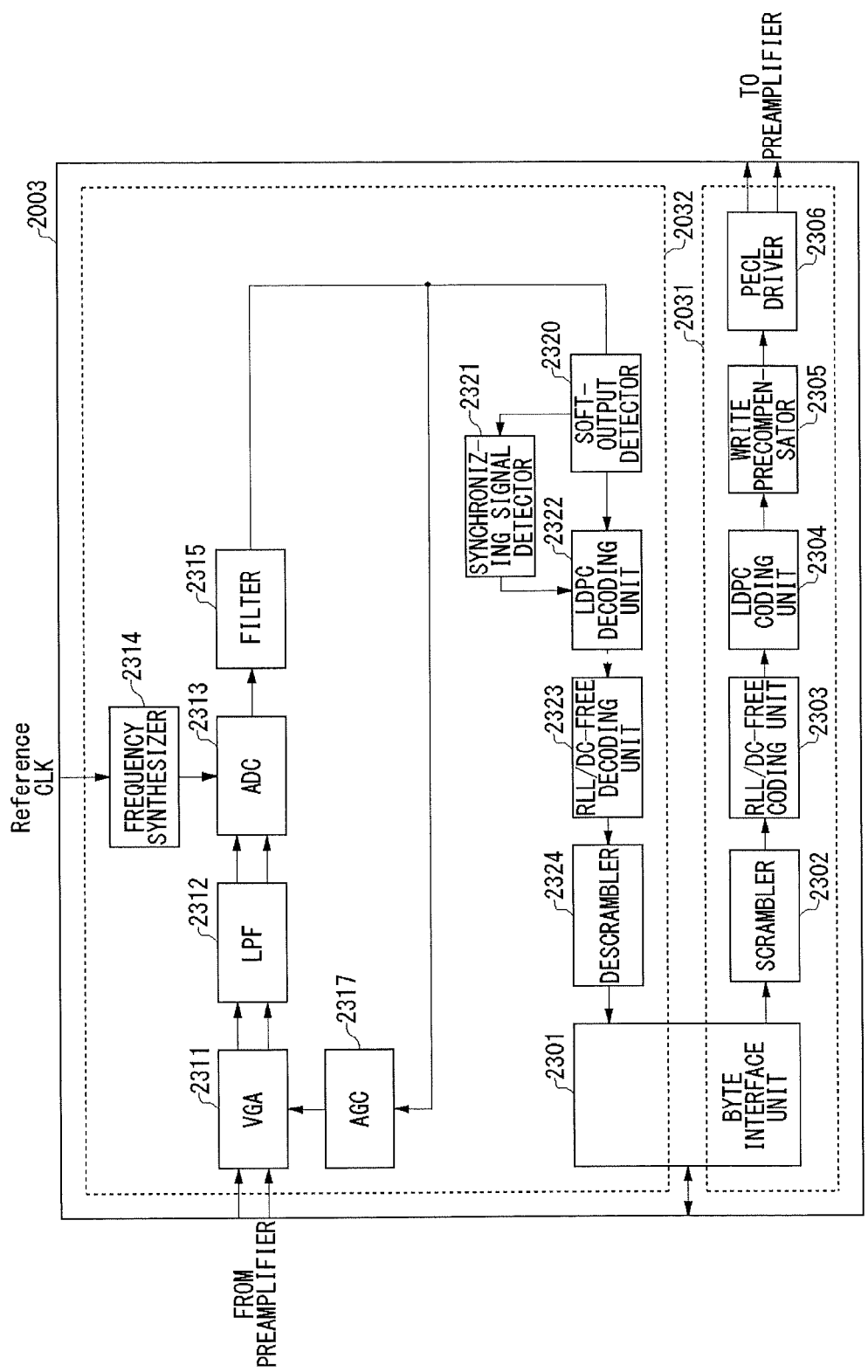
FIG. 22 is a diagram showing a structure of an R/W channel shown in FIG. 21.

Referring now to FIG. 22, a description will be given of the R/W channel 2003. FIG. 22 is a diagram showing a structure of the R/W channel 2003 shown in FIG. 21. The R/W channel 2003 is comprised roughly of a write channel 2031 and a read channel 2032.

The write channel 2031 includes a byte interface unit 2301, a scrambler 2302, a run-length limited and DC-free coding unit 2303 (hereinafter abbreviated as "RLL/DC-free coding unit 2303"), a low-density parity check coding unit 2304 (hereinafter abbreviated as "LDPC coding unit 1304"), a write compensation unit 2305 (hereinafter referred to as "write precompensator 1305"), and a driver 2306.

At the byte interface unit 2301, data transferred from the HDC 2001 are processed as input data. Data to be written onto the medium are inputted from the HDC 2001 sector by sector. At this time, not only user data (512 bytes) for one sector but also ECC bytes added by the HDC 2001 are inputted simultaneously. The data bus, which is normally 1 byte (8 bits) long, is processed as input data by the byte interface unit 2301. The scrambler 2302 converts write data into a random sequence. The repetition of data of the same pattern is designed to remove any adverse effects on detection performance at reading, which may deteriorate the error rate.

The RLL/DC-free coding unit 2303 is used to limit the maximum length of consecutive 0's and consecutive 1's. By limiting the maximum length of consecutive 0's and consecutive 1's data are turned into a data sequence appropriate for an automatic gain controller 2317 (hereinafter abbreviated as "AGC 2317") and the like. Further, DC components are reduced to help enhance the data detection capability, thereby improving the error correction capability. The detail will be described later.

The LDPC coding unit 2304 plays a role of generating a sequence containing parity bits, which are redundancy bits, by LDPC coding. The LDPC coding is done by multiplying a matrix of k×n, called a generator matrix, by a data sequence of length k from the left. The elements contained in a check matrix H corresponding to this generator matrix are 0 or 1, and the coding is called Low-Density Parity Check codes because the number of 1's is smaller than the number of 0's. By utilizing the arrangement of these 1's and 0's, error correction will be carried out efficiently by an LDPC repeat decoding unit.

The write precompensator 2305 is a circuit for compensating the nonlinear distortion resulting from the continuation of magnetization transition on the medium. The write precompensator 2305 detects a pattern necessary for compensation from write data and preadjusts the write current waveform in such a manner as to cause magnetization transition in correct positions. The driver 2306 outputs signals corresponding to a pseudo ECL level. The output from the driver 2306 is sent to the not-shown DE 2005 and then sent to the head 2051 by way of the preamplifier 2054 before the write data are recorded on the disk medium 2050.

The read channel 2032 includes a variable gain amplifier 2311 (hereinafter abbreviated as "VGA 2311"), a low-pass filter 2312 (hereinafter abbreviated as "LPF 2312"), an AGC 2317, a digital-to-analog converter 2313 (hereinafter abbreviated as "ADC 2313"), a frequency synthesizer 2314, a filter 2315, a soft-output detector 2320, an LDPC repeat decoding unit 2322, a synchronizing signal detector 2321, a run-length-limited/DC-free decoding unit 2323 (hereinafter abbreviated as "RLL/DC-free decoding unit 2323"), and a descrambler 2324.

The VGA 2311 and AGC 2317 adjust the amplitude of the read waveform of data sent from a not-shown preamplifier 2054. The AGC 2317 compares an actual amplitude with an ideal amplitude and determines a gain to be set for the VGA 2311. The LPF 2312, which can adjust the cut-off frequency and boost amount, plays a partial role in reducing high-frequency noise and performing equalization on a partial response (hereinafter abbreviated as "PR") waveform. In the equalization to a PR waveform by the LPF 2312, it is difficult to carry out a perfect equalization of analog signals by an LPF because of a number of factors including variation in head lift, nonuniformity of the medium, and variation in motor speed. Hence, equalization to the PR waveform is carried out again by a filter 2315 located in a subsequent position and having greater flexibility. The filter 2315 may have a function of adjusting its tap coefficient in an adaptable manner. The frequency synthesizer 2314 generates a sampling clock for the ADC 2313.

The ADC 2313 is of a structure to acquire a synchronous samples directly by A-D conversion. Note that in addition to this structure, the structure may be one to acquire asynchronous samples by A-D conversion. In such a case, a zero phase restarter, a timing controller, and an interpolation filter may be further provided in positions subsequent to the ADC 2313. Since a synchronous sample needs to be obtained from the asynchronous sample, such a function is performed by these blocks. The zero phase restarter, which is a block for determining an initial phase, is used to acquire a synchronous sample as quickly as possible. After the determination of the initial phase, the timing controller detects a phase shift by comparing an actual sample value against an ideal sample value.

This phase shift is used to determine the parameter for the interpolation filter, and thus a synchronous sample can be obtained.

The soft-output detector 2320 uses a Soft-Output Viterbi Algorithm (hereinafter abbreviated as "SOVA"), a kind of Viterbi algorithm, in order to avoid the deterioration of decoding characteristics resulting from intersymbol interference. In other words, there is a problem of deteriorating decoding characteristics as a result of increased interference between recorded codes along with the rise in recording density of magnetic disk apparatuses in recent years. And a Partial Response Maximum Likelihood (hereinafter abbreviated as "PRML") method, which utilizes the partial response due to intersymbol interference, is used as a method to overcome the problem. The PRML is a method for obtaining a signal sequence that maximizes the likelihood of the partial response of reproduced signals.

When the SOVA method is used in the soft-output detector 2320, the soft-output detector 2320 outputs a soft-decision value. Assume, for instance, that soft-decision values (−0.71, +0.18, +0.45, −0.45, −0.9) have been outputted as SOVA outputs. These values numerically represent their likelihood of being "0" or their likelihood of being "1". For example, the first value of "−0.71" signifies a strong likelihood of being 1, whereas the second value of "+0.18" is more likely to be 0 but is also significantly likely to be 1. The output of a conventional Viterbi detector is hard values, which are the results of hard decision of SOVA output. In the case of the above example, the values will be (1, 0, 0, 1, 1). The hard values, which represent either 0 or 1, no longer have the information suggesting the likelihood of being 0 or 1. Accordingly, the inputting of the soft-decision values to the LDPC repeat decoding unit 2322 can realize improved decoding performance.

The LDPC repeat decoding unit 2322 plays a role of restoring an LDPC-coded data sequence to the sequence before the LDPC coding from the LDPC-coded data sequence. The principal methods for such decoding are the sum-product decoding method and the min-sum decoding method. While the sum-product decoding method gives a better decoding performance, the min-sum decoding method is easily realizable by hardware. In the actual decoding by the use of the LDPC code, a fairly satisfactory decoding performance can be accomplished by repeatedly carrying out the decoding between the soft-output detector 2320 and the LDPC repeat decoding unit 2322. In practice, therefore, the soft-output detector 2320 and the LDPC repeat decoding unit 2322 need to be arranged in multiple stages. The synchronizing signal detector 2321 plays a role of recognizing the top position of data by detecting the synchronizing signal (sync mark) added to the top of data.

The RLL/DC-free decoding unit 2323 restores the data outputted from the LDPC repeat decoding unit 2322 to the original data sequence by carrying out a reverse operation of the RLL/DC-free coding unit 2303 of the write channel 2031 thereon. The detail will be described later.

The descrambler 2324 restores the original data sequence by carrying out a reverse operation of the scrambler 2302 of the write channel 2031. The data generated here are transferred to the HDC 2001.

Figure 23A:
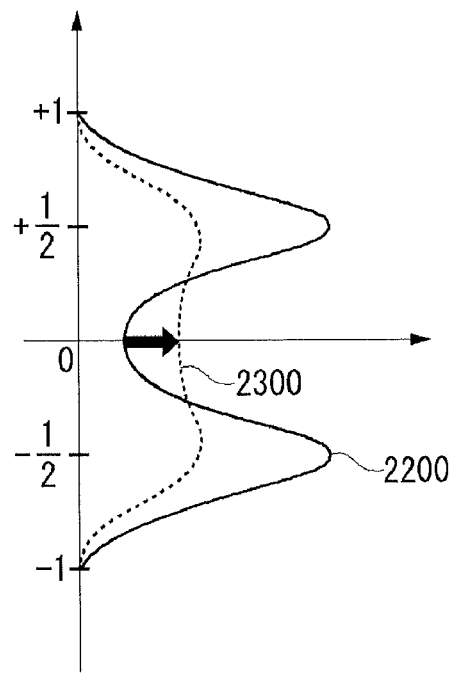
FIGS. 23(a) and 23(b) are diagrams showing examples of DC-free characteristics according to a third embodiment of the present invention.
Figure 23B:
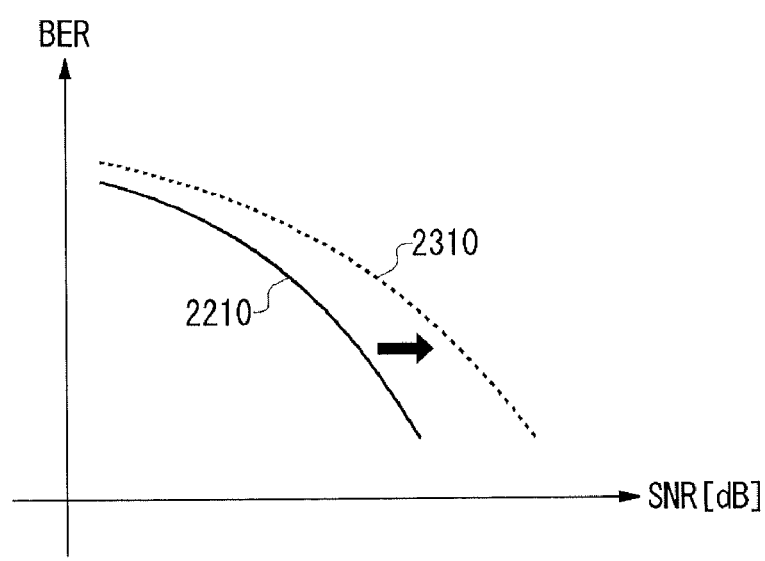

A description is here given of "DC-free". FIGS. 23(*a*) and 23(*b*) are diagrams showing examples of DC-free characteristics according to the third embodiment of the present invention. FIG. 23(*a*) is a diagram showing an example of the distribution of soft-decision values in the case of being DC-free and not being DC-free. The horizontal axis indicates the quantity and the vertical axis indicates the soft-decision value. The vertical axis is an axis that contains the soft-decision values at both the positive side and the negative side with the center being ±0. A first characteristic 2200 indicated by a solid line shows a distribution thereof in the case of being DC-free. A second characteristic 2300 indicated by a dotted line shows a distribution thereof in the case of being not DC-free. As described above, DC-free means that ratio of the number of 0's to the number of 1's contained in a sequence is 50%. In other words, as shown with the first characteristic 2200 of FIG. 23(*a*), DC-free means that ±½ are the center values, the distribution quantity in the vicinity of ±0 is small and so forth. On the other hand, in the case of not being DC-free as shown with the second characteristic 2300 of FIG. 23(*a*), for example, the distribution in the vicinity of ±0 is increased in the distribution of the soft-decision values.

FIG. 23(*b*) is a diagram showing an example of bit error rates in the case of being DC-free and not being DC-free. The horizontal axis indicates the signal-to-noise ratio and the vertical axis indicates the bit error rate. A third characteristic 2210 indicated by a solid line shows a bit error rate characteristic in the case of being DC free. A fourth characteristic 2310 indicated by a dotted line shows a bit error rate characteristic in the case of being not DC-free. As shown in the Figure, in the case of not being DC-free the bit error rate deteriorates as compared with the case of being DC-free.

Figure 24:
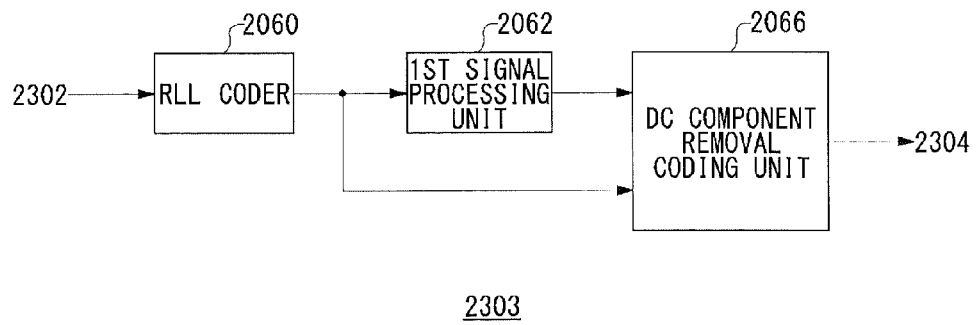
FIG. 24 is a diagram showing an exemplary structure of an RLL/DC-free coding unit shown in FIG. 24.

FIG. 24 is a diagram showing an exemplary structure of the RLL/DC-free coding unit 2303 of FIG. 22. The RLL/DC-free coding unit 2303 includes a first RLL coder 2060, a first signal processing unit 2062, and a DC component removal coding unit 2066.

The RLL coder 2060 performs run-length limited coding of a digital signal sequence outputted from the scrambler 2302 so as to generate a first coded sequence. The first signal processing unit 2062 performs a predetermined signal processing on the first coded sequence without changing the number of a plurality of bits contained in the first coded sequence outputted from the RLL coder 2060 and then generates a second coded sequence. The predetermined signal processing may be any processing as long as the number of a plurality of bits contained in the digital signal sequence is unchanged. For example, it may be a processing that performs bit inversion processing on a plurality of bits contained in the digital signal sequence, respectively. The DC component removal coding unit 2066 selects either the first coded sequence generated by the RLL coder 2060 or the second coded sequence generated by the first signal processing unit 2062 whichever has a higher DC-free property, and then outputs it. Here, if a digital signal sequence to be processed is composed of 300 bits, the RLL/DC-free coding unit 2303 processes the bits in ten divided sets where one sets holds 30 bits together. Here, if the coding rate of the RLL coder 2060 is 30/31, the number of bits in a sequence, per output, from the RLL coder 2060 and the first signal processing unit will be 31 bits.

Generally, the RLL coding is performed so that the runlength of 0's existing in a signal sequence is limited according to a rule (d, k). The rule (d, k) is a rule required for a signal sequence generated as a result of the RLL coding in which the number of "0's" between two "1's" in this signal sequence is greater than or equal to d and less than or equal to k. Here, "two "1's" in the signal sequence" are two "1's" adjacent to each other when all "0's" are removed from the entire signal sequence. For example, if the rule (d, k) is (0, 3), the signal sequence "0110100010" is said to satisfy the rule. On the other hand, if the rule (d, k) is (1, 3), the signal sequence "0110100010" cannot be said to satisfy the rule. This is because the number of "0's" between the second bit "1" and the third bit adjacent thereto is 0 and this does not satisfy the condition of greater than or equal to 1 and less than or equal to 3. In other words, if d is not "0" in the rule (d, k), it can be said that the condition is very severe. Note that d and k in the rule (d, k) are both integers greater than or equal to 0.

In the RLL coder 2060 according to the third embodiment, the above-described rule (d, k) is applied to not only "0" but also "1". "Applied to "1"" means that the number of "1's" between two "0's" is greater than or equal to d and less than or equal to k. That is, the RLL coder 2060 applies a rule (d0, k0) to the runlength of "0's" and applies a rule (d1, k1) to the runlength of "1's", so that the RLL coder 2060 limits the runlength of "0's" and that of "1's" simultaneously. Further, the RLL coder 2060 outputs a first coded sequence, where both the runlength of "0's" and that of "1's" are limited simultaneously, to the DC component removal coding unit 2066, and at the same time outputs a second coded sequence, where said coded sequence is inverted, to the DC component removal coding unit 2066 by way of the first signal processing unit 2062. According to this embodiment, the two coded sequences inputted to the DC component removal coding unit 206 can both satisfy the RLL characteristic. In other words, the first coded sequence satisfies the rule (d0, k0) about "0's", whereas the second coded sequence satisfies the rule (d1, k1) about "1's".

In the two rules (d0, k0) and (d1, k1) according to the third embodiment, the value "0" is preferably set to both d0 and d1. As described above, this is because if d is not 0 in the rule (d, k), the condition will be very stringent and therefore the coding rate will deteriorate significantly. Also, as for k0 and k1, it is preferable that k0 be set as a value which is greater than or equal to k1. This is because, in the storage system 2100 in the third embodiment, the restriction on the runlength of "0's" has more priority. Also, more preferably, the value may be set as k0=k1. It is because if the number of "1's" occupied in a signal sequence is extremely small, the performance of the AGC 2317 in FIG. 22 or a not-shown timing controller will deteriorate or there will be cases where they do not operate normally. It goes without saying that k0 and k1 are each an integer excluding 0 and must be set to values greater than d0 and d1, respectively. In summary, d0, k0, d1 and k1 in the two rules (d0, k0) and (d1, k1) are preferably so set as to hold the following relations. If the values are set as follows, the first coded sequence and the second coded sequence, where the first coded sequence is inverted, generated by the RLL coder 2060 and the first signal processing unit 2062 will the same RLL characteristic.

d0=d1=0 k0=k1>0

Figure 25:
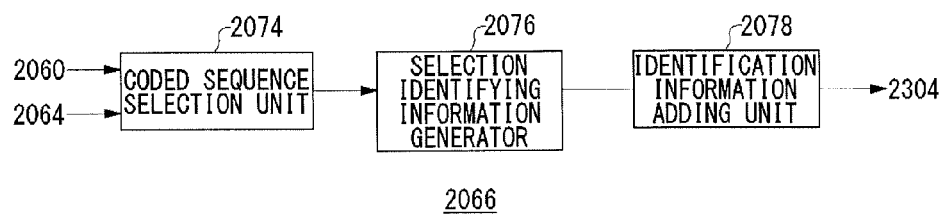
FIG. 25 is a diagram showing an exemplary structure of a DC component removal coding unit shown FIG. 24.

FIG. 25 is a diagram showing an exemplary structure of the DC component removal coding unit 2066 shown in FIG. 24. The DC component removal coding unit 2066 includes a coded sequence selection unit 2074, a selection identifying information generator 2076, and an identification information adding unit 2078. The coded sequence selection unit 2074 selects either one of the first coded sequence generated by the RLL coder 2060 and the second coded sequence generated by the first signal processing unit 2062. The selection identifying information generator 2076 generates selection identifying information that indicates the coded sequence selected by the coded sequence selection unit 2074. The identification information adding unit 2078 adds the selection identifying information generated by the selection identifying generator 2076, to any of positions in the coded sequence selected by the coded sequence selection unit 2074.

A description is now given in concrete terms. If the second coded sequence is selected by the coded sequence selection unit 2074, the selection identifying information added to the first coded sequence by the identification information adding unit 2078 will be "0". If, on the other hand, the second coded sequence is selected by the coded sequence selection unit 2074, the selection identifying information added to the second coded sequence by the identification information adding unit 2078 will be "1". In other words, the second coded sequence added with the selection identifying information "0" or the second coded sequence added with the selection identifying information "1" is outputted to the LDPC coding unit 2304. Note that a position at which the selection identifying information is added by the identification information adding unit 2078 may be an arbitrarily fixed position in a coded sequence and it may be, for example, a rearmost position. Though the detail will be described later, the selection identifying information added here is a decision bit, so that appropriate decoding processing is realized by analyzing the position at which a decision bit is located and the content of the decision bit. In the above-described specific example, a sequence having the total of 32 bits is outputted where 1-bit selection identifying information is added to a 31-bit coded sequence per output. That is, the overall coding rate in the RLL/DC-free coding unit 2040 will be 30/32.

The coded sequence selection unit 2074 may include a first coupling unit and a second coupling unit which are not shown here. The first coupling unit connects a coded sequence, which has already been selected by the coded sequence selection unit 2074, with the first coded sequence. The second coupling unit connects a coded sequence, which has already been selected by the coded sequence selection unit 2074, with the second coded sequence. In this case, the coded sequence selection unit 2074 may set the sequence connected by the first coupling unit as a new first coded sequence and set the sequence connected by the second coupling unit as a new second coded sequence so as to select either one of them. That is, the coded sequence selection unit 2074 makes a selection decision on coded sequences where the coded sequences selected in the past are connected with the coded sequences which are currently candidates for a selection. This can enhance the DC-free characteristics in a long interval.

Figure 26A:
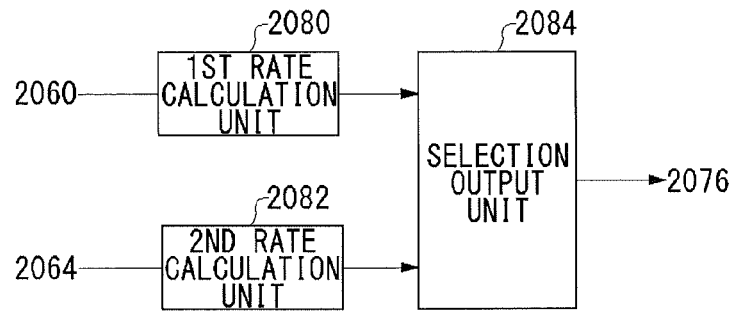
FIGS. 26 (a) to 26(c) are diagrams showing first to third exemplary structures of a coded sequence selection unit shown in FIG. 25.

FIGS. 26 (*a*) to 26(*c*) are diagrams showing first to third exemplary structures of the coded sequence selection unit 2074 of FIG. 25. FIG. 26(*a*) is a diagram showing the first exemplary structure of the coded sequence selection unit 2074 of FIG. 25. The coded sequence selection unit 2074 in the first structure includes a first rate calculation unit 2080, a second rate calculation unit 2082 and a selection output unit 2084.

The first rate calculation unit 2080 calculates a ratio of bits indicating 0 and bits indicating 1 among a plurality of bits contained in the first coded sequence. The second rate calculation unit 2082 calculates a ratio of bits indicating 0 and bits indicating 1 among a plurality of bits contained in the second coded sequence. The selection output unit 2084 selects a coded sequence corresponding to either the ratio calculated in the first rate calculation unit 2080 or the ratio calculated in the second rate calculation unit 2082 whichever is closer to 50%, and outputs the selected sequence.

A description is now given using a specific example. Suppose that, at time t=1, 31-bit coded sequences are outputted from the RLL coder 2060 and the first signal processing unit 2062, respectively. In this case, the first rate calculation unit 2080 and the second rate calculation unit 2082 analyze the bits contained in the coded sequences, respectively, and calculates the ratios. Here, if there are 14 bits indicating 0's and there are 17 bits indicating 1's in the bits contained in the coded sequence inputted to the first rate calculation unit 2080, the ratio will be calculated as follows by the first rate calculation unit 2080.

$$\text{Ratio}_{(t=1)}=(\text{the number of bits indicating 0's}+1)/(\text{the number of bits in a coded sequence}+1)=(14+1)/(31+1)\approx 46.9\%$$

Among the bits contained in the coded sequence inputted to the second rate calculation unit 2082, there are 17 bits that indicate 0's and there are 14 bits that indicate 1's. This is because the coded sequence inputted to the second rate calculation unit 2082 is a sequence where the coded sequence inputted to the first rate calculation unit 2080 is logically inverted. Thus, the ratio$_{t=1}$ is calculated as follows. The reason why "1" and "0" are added in the numerators on the right-hand sides of the above and the following equation, respectively, is that the selection identifying information is presupposed to be "0" and "1", respectively. Also, the reason why "1" is added in the denominators on the right-hand sides of the above and the following equation is to calculate the number of 0's in the coded sequence containing the selection identifying information.

$$\text{Ratio}_{(t=1)}=(\text{the number of bits indicating 0's}+0)/(\text{the number of bits in a coded sequence}+1)=(17+0)/(31+1)\approx 53.1\%$$

Here, if the ratio of the first coded sequence and the ratio of the second coded sequence are each expressed as "50(±α)%", α=3.1 in the both cases. Thus, either of the ratios is said to be equally close to 50% and therefore any of the coded sequences may be selected. In such a case, the first coded sequence is preferably selected. The first coded sequence does not go through the first signal processing unit 2062 and thus needs not to be subjected to the processing, which corresponds to the first signal processing, in the RLL/DC-free decoding unit 2323 described later. Accordingly, when the first coded sequence is selected, the processing power in the storage system 2100 can be reduced. Hereinbelow, a description will be given on the assumption that the first coded sequence is selected when α is the same at t=0.

As described above, at t=1 the first coded sequence is selected by the selection output unit 2084. The number of bits, "14", indicating 0's for the selected first coded sequence is stored. Suppose next that, similar to the case of t=1, 31-bit coded sequences are outputted from the first RLL coder 2060 and the first signal processing unit 2062, respectively, at t=2. Here, if there are 11 bits indicating 0's and there are 20 bits indicating 1's in the bits contained in the coded sequence inputted to the first rate calculation unit 2080, the ratio will be calculated as follows.

Ratio$_{(t=2)}$=(the number of bits indicating 0's+1)/((the number of bits in a coded sequence+1)×$t$)=(14+1+11+1)/((31+1)×2)≈42.2%

In the above case differing from the case of t=1, the first rate calculation unit 2080 calculates the ratio on a sequence where the coded sequence selected at t=1 is connected with the first coded sequence at t=2 by the first coupling unit. That is, the number of bits, "14+1", indicating 0's in the first coded sequence selected at t=1 will be added with the number of bits, "11+1", indicating 0's in the first coded sequence at t=2, in the numerator of the above equation. In the denominator, it will be the number of bits for the two sets of coded sequences.

Also, among the bits contained in the coded sequence inputted to the second rate calculation unit 2082 there are 20 bits indicating 0 and there are 11 bits indicating 1. Then, the ratio will be calculated as follows by the second rate calculation unit 2082. Since in this case the ratio in the second coded sequence is closer to 50%, the second coded sequence is selected by the selection output unit 2084 at time t=2.

Ratio$_{(t=2)}$=(the number of bits indicating 0's+0)/((the number of bits in a coded sequence+1)×$t$)=(14+1+20+0)/((31+1)×2)=54.7%

Hereinbelow, at t=3 and thereafter, the ratio is calculated in a similar manner. Here, the ratio at t=k is expressed as follows, where k is an integer greater than or equal to 1. Nbit(m) denotes the number of bits indicating 0's in the bits contained in a coded sequence selected at t=m. Nbit(n) denotes the number of bits indicating 0's in the bits contained in a coded sequence where the ratio is to be calculated. It is assumed here that selection identifying information is also contained in the coded sequence where the ratio is to be calculated.

$$\text{Ratio}_{t=n} = \sum_{m=1}^{n} (Nbit(m)/(32 \times n)) \quad \text{(Eq. 4)}$$

FIG. 26(*b*) is a diagram showing the second exemplary structure of the coded sequence selection unit 2074 of FIG. 25. The coded sequence selection unit 2074 in the second structure includes a first summation unit 2086, a second summation unit 2088 and a selection output unit 2084. The first summation unit 2086 adds up a plurality of bits contained in the first coded sequence so as to generate a first summation value. The second summation unit 2088 adds up a plurality of bits contained in the second coded sequence so as to generate a second summation value. A coded sequence detector compares the first summation value generated by the first summation unit 2086 with the second summation value generated by the second summation unit 2088, and detects a coded sequence corresponding to a smaller summation value either in the first coded sequence or the second coded sequence. Of the first coded sequence and the second coded sequence, the selection output unit 2084 selects the coded sequence selected by the sequence detector and outputs it.

A description is now given using a specific example. Suppose first that 31-bit coded sequences are outputted from the first RLL coder 1060 and the second RLL coder 1064, respectively. In this case, the first summation unit 2086 and the second summation unit 2088 add up the bits contained in the respective coded sequences. In the adding up, 0 may be replaced with "+1" and 1 may be replaced with "−1" so as to be added up. If the adding up is done in this manner, the summation value will be 0 if the number of bits indicating 1's equals to the number of bits indicating 0's. Thus, it is only necessary that a coded sequence whose summation value is closer to 0 is selected by the selection output unit 2084. For example, a coded sequence whose absolute value of the summation value is smaller may be selected. Note that this technique is also called the running digital summation (hereinafter abbreviated as "RDS").

Here, if at t=1 there are 14 bits indicating 0's and there are 17 bits indicating 1's in the 31 bits contained in the coded sequence inputted to the first summation unit 2086, the ratio will be calculated as follows. The reason why "1" is added in the first term of the right-hand side is that the selection identifying information is presupposed to be 0.

$RDS_{abs}$=|(14+1)×(+1)+17×(−1)|=2

Also, there are 17 bits indicating 0's and there are 14 bits indicating 1's in the bits contained in the coded sequence inputted to the second summation unit 2088. Thus, the ratio will be calculated as follows. The reason why "1" is added in the second term of the right-hand side is that the selection identifying information is presupposed to be 1.

$RDS_{abs}$=|17×(+1)+(14+1)×(−1)|=2

Since at t=1 the above two $RDSs_{abs}$ of the first coded sequence and the second coded sequence are equal to each other, any of the coded sequences may be selected. In other words, since the first coded sequence and the second coded sequence are related to each other in a manner that one is the logical inversion of the other, the respective $RDSs_{abs}$ are always the same. Here, "being always the same" includes the case when the RDSs are identical at the instant. That is, even if the $RDSs_{abs}$ at time t=1 are identical to each other, they will not always be the same. This is because the $RDS_{abs}$ at t=2 described later is calculated after the $RDSs_{abs}$ selected at t=1 has been duly reflected. If two $RDSs_{abs}$ are identical to each other, the first coded sequence will be preferably selected. The first coded sequence does not go through the first signal processing unit 2062 and thus needs not be subjected to the processing, which corresponds to the first signal processing, in the RLL/DC-free decoding unit 2323 described later. Accordingly, when the first coded sequence is selected, the processing power in the storage system 2100 can be reduced. Hereinafter, a description will be given on the assumption that the first coded sequence has been selected at t=1. Also, assume that the RDS on the first coded sequence before the calculation of the absolute value thereof is stored as "$RDS_1$=−2".

Suppose next that, similar to the case of t=1, 31-bit coded sequences are outputted from the first RLL coder 2060 and the first signal processing unit 2062, respectively, at t=2. Here, if there are 11 bits indicating 0's and there are 20 bits indicating 1's in the bits contained in the coded sequence inputted to the first summation unit 2086, the RDS will be calculated as follows. Different from the case of t=1, at t=2 the number of bits for the coded sequence selected at t=1 is also taken into account.

$$RDS_{abs}=|RDS_1+(11+1)\times(+1)+20\times(-1)|=|-2+(-8)|=10$$

Also, there are 20 bits indicating 0's and there are 11 bits indicating 1's in the bits contained in the coded sequence inputted to the second summation unit 2088 in the coded sequence inputted to the second summation unit 2088. Thus, the ratio will be calculated as follows. Since in this case the RDS of the second coded sequence is smaller, the second coded is selected by the selection output unit 2084 at t=2. $RDS_2=6$ is stored.

$$RDS_{abs}=|RDS_1+20\times(+1)+(11+1)\times(-1)|=|-2+(+8)|=6$$

Hereinbelow, at t=3 and thereafter, the $RDS_{abs}$ is calculated in a similar manner. Here, the $RDS_{abs}(n)$ at t=n is expressed as follows, where t is an integer greater than or equal to 1. Nbit0($m$) denotes the number of bits indicating 0's in the bits contained in a coded sequence and selection identifying information selected at t=m. Nbit1($m$) denotes the number of bits indicating 1's in the bits contained in the coded sequence and selection identifying information selected at t=m. Here, Nbit0($n$) and Nbit1($n$) denote respectively the number of bits indicating 0's and the number of bits indicating 1's in the bits contained in a coded sequence where the summation value is to be calculated.

$$RDS_{abs}(n) = |RDS(n-1) + Nbit0(n) \times (+1) + Nbit1(n) \times (-1)| \qquad (\text{Eq. 5})$$

$$= \left|\sum_{m=1}^{n} (Nbit0(m) \times (+1) + Nbit(m) \times (-1))\right|$$

A description is given here of convergence of RDS(n) in the third exemplary embodiment. Here, RDS(n) indicates a value before the absolute value is calculated in $RDS_{abs}(n)$. "Convergence of RDS (n)" includes a case where n is infinity, RDS(n) is 0 and the like, a case where RDS(n) at least does not diverge, a case where it oscillates about ±0 at given time t, and the like. The constantly satisfactory DC-free property can be maintained by generating RDS(n) having such a property.

A description is now given using a specific example. Here, suppose that RDSs of the respective coded sequences at time n=1 to 5 are calculated as follows. Note that RDS1(n) indicates RDS in the first coded sequence, whereas RDS2(n) indicates RDS in the second coded sequence.

$$RDS1(n)=\{+5, +7, -1, -6, -4\}$$

$$RDS2(n)=\{-5, -7, +1, +6, +4\}$$

Here, suppose that when n=1, the $RDS_{abs}$ is the same, as described above, and RDS1(1) is selected. Then, RDS(n) calculated at n=1 to 5 will be as follows.

$$RDS(n)=\{5, -2, -1, 5, 1\}$$

If RDS(n) is greater than or equal to 0 at given time n, a code sequence having a negative RDS will be selected at the next time (n+1). Thus the above equation indicates that RDS is brought close to 0. If RDS(n) is less than or equal to 0 at given time n, a code sequence having a positive RDS will be selected at the next time (n+1). And this indicates that RDS is brought close to 0. Since, as described above, in the third exemplary embodiment the first coded sequence and the second coded sequence are logically inverted to each other, the values of RDS1(n) and RDS2(n) are such that the sign (plus/minus) of one is opposite to that of the other. Thus, at given time n, one of RDSs has the inverted sign of the other RDS. Accordingly, as indicated by the above equation, RDS(n) does not diverge at given time n and has a property that it oscillates about ±0. In other words, the first coded sequence and the second coded sequence are related to each other in a manner that one is the inversion of the other. Thereby, RDS(n) is provided with the excellent convergence property. As a result, the high DC-free property can be guaranteed and maintained. Further, as described above, the first coded sequence and the second coded sequence have the same RLL characteristic. Thus, by implementing a mode shown in the third exemplary embodiment, the storage system 2100 can enhance the RLL characteristic and the DC-free property simultaneously. It goes without saying that the similar advantage can be obtained in a mode in FIG. 26(c) described later.

An operation of the coded sequence selection 2074 is characterized by a feature that while it carries out an interval arithmetic processing at given time, it carries out a moving processing in between continuous times in the past. By combining the interval processing and the moving processing in this manner, the DC-free property can be enhanced in a long interval, for example, in an entire sequence of 300 bits.

The summation processing in the first summation unit 2086 and the second summation unit 2088 may be such that bits indicating 0 or 1 contained in a coded sequence are directly summed up as numerical values. In this case, a coded sequence corresponding to one whose summation value is closer to the half of the number of bits in the coded sequence is selected.

Figure 26B:
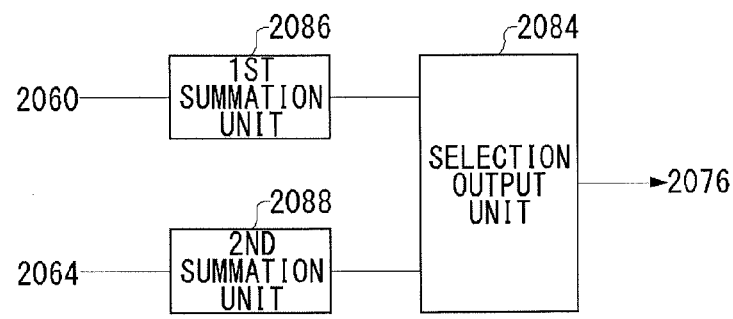
Figure 26C:
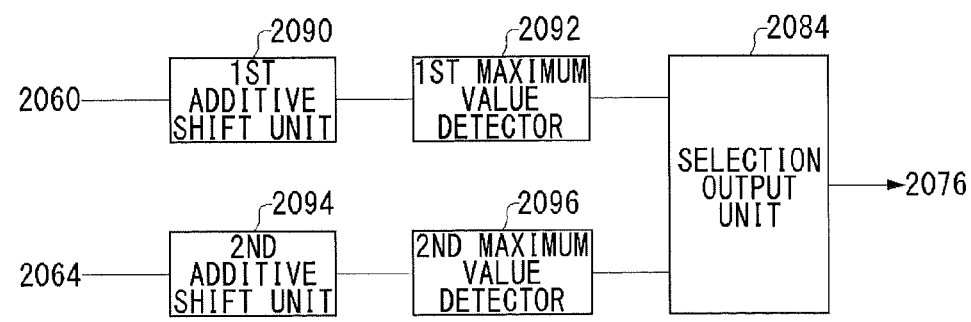

FIG. 26(c) is a diagram showing the third exemplary structure of the coded sequence selection unit 2074 of FIG. 25. The coded sequence selection unit 2074 in the third structure includes a first additive shift unit 2090, a first maximum value detector 2092, a second additive shift unit 2094, a second maximum value detector 2096, and a selection output unit 2084. The first additive shift unit 2090 shifts and adds a plurality of bits contained in the first coded sequence so as to generate first additive shift values the number of which is identical to the number of a plurality of bits. The first maximum value detector 2092 detects a maximum value in a plurality of first additive shift values generated by the first additive shift unit 2090. The second additive shift unit 2094 shifts and adds a plurality of bits contained in the second coded sequence so as to generate second additive shift values the number of which is identical to the number of a plurality of bits. The second maximum value detector 2096 detects a maximum value in a plurality of second additive shift values generated by the second additive shift unit 2094. The coded sequence detector compares the maximum value detected by the first maximum value detector 2092 and the maximum value detected by the second maximum value detector 2096, and detects either the first coded sequence or the second coded sequence whichever corresponds to the smaller maximum value. The selection output unit 2084 selects either the first coded sequence or the second coded sequence whichever was selected by the coded sequence detector, and outputs it.

Similar to the second exemplary structure, in the third exemplary structure of the coded sequence selection unit 2074 the selection output unit 2084 selects a coded sequence by calculating the respective RDSs in the first additive shift unit 2090 and the second additive shift unit 2094. The third exemplary structure differs from the second exemplary structure in that a coded sequence whose maximum value is smaller in the midst of a calculation of RDS of 32 bits is selected. Here, in the second exemplary structure, a coded sequence which is closer to 0 is selected in consideration of only the final calculation value of 32 bits in the RDS calculation. In other words, in the third exemplary structure the selection processing is performed using a moving operation both in a predetermined interval and a plurality of intervals. By implementing such a mode of carrying out the invention as this, a sequence having a satisfactory DC-free property can be selected even in the middle of an interval.

Here, the "maximum value in the midst of a calculation of RDS" at each time t is derived as follows. Here, Min{y(0), y(1)} denotes a function by which a smaller value is selected and the number of the selected sequence is outputted. For example, if y(0)>y(1), S(t) will be 1. Max{x} denotes a function by which a maximum value is detected in x. n denotes a value in the range of (t−1)×32+1 to 32×t. Bit(m, j) indicates 1 if the mth bit is 0 in the jth coded sequence and indicates −1 if it is 1.

$$S(t) = \text{Min}\{\text{Max}RDS(1), \text{Max}RDS(2)\} \quad \text{(Eq. 6)}$$

$$\text{Max}RDS(1) = \max\{RDS(n, 1)\}$$

$$\text{Max}RDS(2) = \max\{RDS(n, 2)\}$$

$$RDS(n, 1) = \left|\sum_{m=1}^{n} \text{Bit}(m, 1)\right|$$

$$RDS(n, 2) = \left|\sum_{m=1}^{n} \text{Bit}(m, 2)\right|$$

Every time t increases, Bit(m, 1) and Bit(m, 2) are calculated after the bits of the selected sequence are rewritten as follows.

Bit(m, 1)=Bit(m, 2)=Bit(m, S(t−1)):m=(t−1)×32+1 to t×32, t≠1

Figure 27:
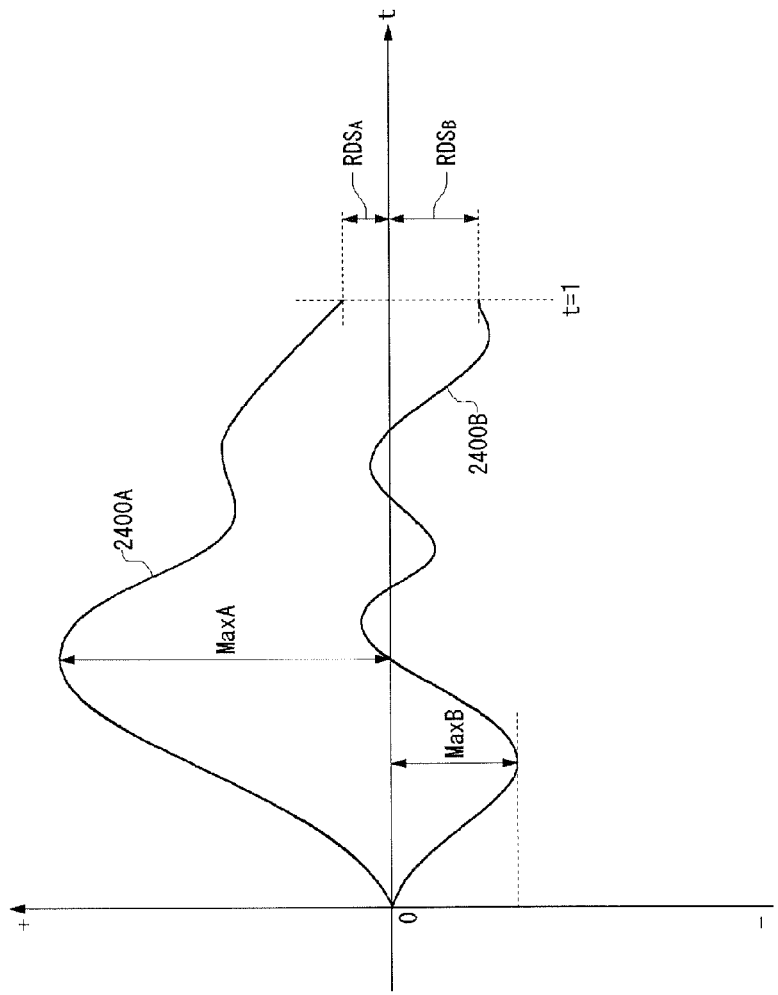
FIG. 27 is a graph showing differences in operation between a coded sequence selection unit shown in FIG. 26(b) and a coded sequence selection unit shown in FIG. 26(c)

The operation in the third exemplary structure of the coded sequence selection unit 2074 shown in FIG. 26(c) is here compared with the operation in the second exemplary structure of the coded sequence selection unit 2074 shown in FIG. 26(b). FIG. 27 is a graph showing differences in operation between the coded sequence selection unit 2074 shown in FIG. 26(b) and the coded sequence selection unit 2074 shown in FIG. 26(c). The horizontal axis indicates time, whereas the vertical axis indicates RDS. Here, 2400A indicates a transition of RDS in the first coded sequence. 2400B indicates a transition of RDS in the second coded sequence. In the second exemplary structure of the coded sequence selection unit 2074 shown in FIG. 26(b), $RDS_A$ and $RDS_B$ which are the final values in the interval arithmetic of RDS are compared with each other, and a coded sequence having a smaller RDS is selected. Since $RDS_A < RDS_B$ in FIG. 27, the selection output unit 2084 selects the first coded sequence. On the other hand, in the third exemplary structure of the coded sequence selection unit 2074 shown in FIG. 26(c), the RDS in each bit is compared, that is, the maximum values are compared among the absolute values obtained after 32 bits have been subjected to a sequential moving processing, and a coded sequence having a smaller one is selected. In FIG. 27, MaxA is the maximum value for the first coded sequence, whereas MaxB is the maximum value for the second coded sequence. Since MaxA>MaxB here, the selection output unit 2084 selects the second coded sequence. With any of the exemplary structures applied to the coded sequence selection unit 2074, a coded sequence having a high DC-free property can be selected.

Figure 28:
FIG. 28 is a diagram showing an exemplary structure of an RLL/DC-free decoding unit shown in FIG. 22.

FIG. 28 is a diagram showing an exemplary structure of the RLL/DC-free decoding unit 2323. The RLL/DC-free decoding unit 2323 includes a decision-bit acquiring unit 2068, an RLL decoder 2070, and a second signal processing unit 2072. The decision-bit acquiring unit 2068 acquires a predetermined decision bit added to a coded sequence which has been inputted by the LDPC repeat decoding unit 2322. The second signal processing unit 2072 performs a signal processing, which is reverse to a predetermined signal processing executed in the first signal processing unit 2062, on the digital signal sequence according to the decision bit acquired by the decision-bit acquiring unit 2068, and outputs it. For example, if a bit inversion processing is performed in the first signal processing unit 2062 of FIG. 24, a bit re-inversion processing in which the inversion processing is restored is performed. Alternatively, according to the decision bit acquired by the decision-bit acquiring unit 2068, the second signal processing unit 2072 performs a processing in which a plurality of bits contained in the coded sequence are outputted as they are. The RLL decoder 2070 generates a digital signal sequence by performing the run-length limited decoding on the coded sequence outputted by the second signal processing unit 2072.

In terms of hardware, these structures described as above can be realized by a CPU, a memory and other LSIs of an arbitrary computer. In terms of software, it can be realized by memory-loaded programs which have communication functions and the like, but drawn and described herein are function blocks that are realized in cooperation with those. Hence, it is understood by those skilled in the art that these function blocks can be realized in a variety of forms such as by hardware only, software only or the combination thereof.

According to the present third embodiment, an RLL-coded signal sequence and a signal sequence obtained after the bit inversion processing has been performed on said RLL-coded signal sequence are to be processed. Thereby, the sequences generated are logically inverted to each other. Thus, if the first coded sequence and the second coded sequence are so related as to be logically inverted to each other, the RDS(n) calculated can have the satisfactory convergence property and therefore the high DC-free property can be guaranteed and maintained. Further, as described above, the first coded sequence and the second coded sequence have the same RLL characteristic. Hence, by implementing a mode shown in the third exemplary embodiment, the storage system 2100 can enhance the RLL characteristic and the DC-free property simultaneously. Also, since the bit inversion processing is performed, different coded sequences can be generated without increasing the number of bits contained in the coded sequences.

Since the number of bits contained in the coded sequences does not increase, the coded sequences can be obtained without reducing the overall coding rate. Also, information indicating that any of the coded sequences has been selected is appended to the coded sequence, so that the selected coded sequence can be easily determined at a decoding side. Also, the coding sequence selection unit 2074 makes a selection decision on coded sequences where the coded sequences selected in the past are connected with the coded sequences which are currently candidates for a selection, so that the DC-free characteristics in a long interval can be enhanced. The RDS is calculated in the coded sequence selection unit 2074 by combining the interval processing and the moving processing, so that the DC-free property can be enhanced in a long interval, for example, in an entire sequence of 300 bits. Also, a coded sequence whose ratio of bits indicating 0's and bits indicating 1's is closer to 50% is selected, so that a coding sequence having a high DC-free property can be selected. Also, a plurality of bits contained in coded sequences are summed up and then a coded sequence corresponding to a smaller summation value is selected. Hence, a coded sequence having a high DC-free property can be selected. Of a result where the additive shift has been done to a plurality of bits contained in the coded sequences, a coded sequence is selected using the maximum value. Hence, a coded sequence having a high DC-free property can be selected. A processing corresponding to the DC-free coding executed at a decoding side is executed, so that the original digital signal sequence can be decoded. By performing a coding processing having a high DC-free property, access can be made faster to the storage system. Also, since there is no need to mount any unnecessary hardware, a semiconductor integrated circuit with a reduced circuit scale can be realized.

In the third embodiment, the R/W channel 2003 may be integrated on a single semiconductor substrate. In the coded sequence selection unit 2074 according to the third embodiment, a description has been given of the interval arithmetic processing or the moving processing. However, this should not be considered as limiting, and the selection and sorting of a coded sequence having a high DC-free property can be made by performing an interval averaging or a moving averaging. In this case, too, the similar advantage can be obtained.

Fourth Embodiment

A fourth embodiment relates to a technology of access to storage media. It particularly relates to an amplitude adjustment apparatus and an amplitude adjustment method for adjusting the amplitude of signals read out from the storage media, and a storage system.

The background technology for the fourth embodiment is described.

In recent years, storage devices using hard disks are becoming indispensable in various fields such as personal computers, hard disk recorders, video cameras and mobile telephones. Depending on the fields applied, there are various specifications required of the storage devices using the hard disks. For example, high speed and large capacity are required of a hard disk mounted on a personal computer. However, since the amount of data handled per unit time increases as the high-speed performance advances, the error per unit time increase proportionally. Thus, it becomes difficult to correct all of errors. As a result there are cases where time required to access the hard disk increases, thus causing a bottleneck in achieving the high speed operation.

In general, magnetoresistive elements were used as elements for reading out signals stored in a storage apparatus. However, there is a problem where an output amplitude of positive pulse and that of negative pulse are asymmetrical to each other in a reproduced signal wave read out from the storage apparatus via the magnetoresistive element (hereinafter referred to as "amplitude asymmetry") (See nonpatent document 1, for instance). The problem of amplitude asymmetry is caused by the fact that the output amplitude of either positive pulse or negative pulse is reduced by the magnetoresistive element and then outputted, and it means that the dynamic ranges of both the pulses differ from each other. If the amplitude asymmetry is obvious, the detection accuracy in data detection processing performed subsequent to the magnetoresistive element will deteriorate. As a result, the correction capacity of an error correction decoding performed after data detection will deteriorate. In such a case, access to the storage apparatus needs to be made again in order to properly reproduce the data stored in the storage apparatus, thus making it difficult to achieve the high speed operation. As a technique to resolve this asymmetry, a bias magnetic field applied to the magnetoresistive element has been controlled in the conventional practice (See Japanese Patent Application Laid-Open No. Hei04-205903, for instance). Also, the asymmetry has been corrected by adjusting a zero level of an analog-to-digital converter (See Japanese Patent Application Laid-Open No. Hei05-205205, for instance). Also, the asymmetry has been corrected by feeding back a result obtained after an error correction processing (See Japanese Patent Application Laid-Open No. Hei11-238205, for instance).

[Nonpatent document 1] Akihiko Takeo, et al., "Characterization of GMR Nonlinear Response and the Impact on BER in Perpendicular Magnetic Recording", IEEE Transaction on Magnetics, July, 2004, Vol. 40, No. 4

Problems to be resolved by the fourth embodiment are now described.

Under these circumstances, the inventors of the present invention had come to recognize the following problems to be resolved. That is, there are problems where the operation becomes unstable depending on an analog circuit and thus it is difficult to accurately correct the nonlinearity and also the circuit scale increases and so forth. On the other hand, there are problems where when the nonlinearity is corrected by a digital processing, a delay is caused by a feedback or the circuit scale increases due to the increase in the number of bits in the analog-to-digital converter.

The fourth embodiment of the present invention has been made in view of the foregoing circumstances described as above, and a general purpose thereof is to provide a storage apparatus, capable of reducing the amplitude asymmetry, with a further reduced circuit scale.

In order to resolve the above problems, an amplitude adjustment apparatus according to one aspect of the fourth embodiment of the present invention comprises an input unit and an analog-to-digital conversion unit. The input unit inputs an analog signal wherein the analog signal has been outputted via a magnetoresistive element, a dynamic range in a positive interval and that in a negative interval are asymmetrical to each other, and the analog signal has a nonlinear interval in either one of the positive interval and the negative interval. When an amplitude of the analog signal inputted by the input unit is present in the nonlinear interval, the analog-to-digital conversion unit adjusts the amplitude of the analog signal and converts the analog signal to a digital signal so as to be outputted. The analog-to-digital conversion unit has a preadjustment unit which adjusts the amplitude of the analog signal in such a manner as to cancel out nonlinearity in the nonlinear interval before converting the analog signal to the digital signal.

Here, "nonlinear interval" includes an interval where the amplitude of the analog signal inputted to the magnetoresistive element in the input-output characteristic of the magnetoresistive element is distorted and outputted accordingly, and so forth. "A preadjustment unit in such a manner as to cancel out nonlinearity in the nonlinear interval before converting the analog signal to the digital signal" means that it includes a preadjustment unit having an inverse characteristic of an input-output characteristic in the nonlinear interval or one approximated to the inverse characteristic, as the input-output characteristic thereof, and so forth.

According to this embodiment, an amplitude nonlinearity that has occurred in the magnetoresistive element can be eliminated by adjusting the amplitude of an analog signal in the analog-to-digital conversion unit. Since the amplitude nonlinearity that has occurred in the magnetoresistive element is eliminated, the detection accuracy of data detection executed at subsequent stages can be enhanced. Further, the error characteristic after the error decoding executed at a subsequence stage can be improved.

The preadjustment unit may adjust the amplitude of the analog signal in the nonlinear interval in a manner that an input-output characteristic in the nonlinear interval is set to a value equivalent to reciprocal of a hyperbolic tangent. The preadjustment unit may set a linear function having a first slope at least larger than 1, as an input-output characteristic in a first partial interval among a plurality of partial intervals included in the nonlinear interval, and set a linear function having a slope different from the first slope, as an input-output characteristic in a second partial interval successive to the first partial interval among the plurality of partial intervals. "A value equivalent to reciprocal of a hyperbolic tangent" includes at least a value where the input-output characteristic of a hyperbolic tangent is approximated, and so forth. For example, it includes a plurality of values where input-output characteristics of the hyperbolic tangent and an nth-order function (n being an integer greater than or equal to 1) are added together, subtracted from one from the other, multiplied together or divided therebetween. "Successive to" includes that the end point of the first partial interval agrees with the start point of the second partial interval and also includes that the start point of the first partial interval agrees with the end point of the second partial point.

The preadjustment unit may include a plurality of resistive elements and a comparator. The plurality of resistive elements are arranged in series and they each receives an input of a reference signal having a constant voltage and outputs sequentially a reference signal whose amplitude has been adjusted to a subsequent resistive element. The comparator compares each of the reference signals outputted from the plurality of resistive elements with the amplitude of the analog signal inputted from the input unit so as to adjust the amplitude of the analog signal. The plurality of resistive elements may vary the width of amplitude in a manner that values of the respective resistive elements are given nonuniformity. A resistive element, corresponding to the nonlinear interval, in the plurality of resistive elements may be set to a resistance value different from resistance values of resistive elements corresponding to intervals other than the nonlinear interval, so as to adjust the nonlinearity in the nonlinear interval. Here, "the respective resistive elements are given nonuniformity" includes that the resistance values of at least one resistive element of a plurality of resistive elements differ from the resistance values of the other resistive elements. And there may be a plurality of resistive elements having the same resistance value in the given plurality of resistive elements. According to this embodiment, simply setting respectively the resistance values of a plurality of resistive elements contained in the analog-to-digital conversion unit can reduce the amplitude asymmetry of the analog signal using a small-scale circuitry.

The preadjustment unit may further include a reference voltage control unit, connected to an input terminal of at least one resistive element of the plurality of resistive elements, which adjusts amplitudes of reference signals outputted from the plurality of resistive elements, respectively, by applying corresponding reference voltages respectively to the input terminals. In this case, the plurality of resistive elements may have an identical resistance value. Also, the reference voltage control unit may apply a reference voltage different from that applied to input terminals of resistive elements corresponding to intervals other than the nonlinear interval, to an input terminal of a resistive element, corresponding to the nonlinear interval, among the plurality of resistive elements so as to adjust the nonlinearity in the nonlinear interval. Here, "corresponding reference voltages" include reference voltages which have been associated and determined for each resistive element. And they may be determined in advance or may vary dynamically according to the quality of the magnetoresistive element. According to this embodiment, the amplitude of the reference signal can be flexibly controlled by the reference voltage control unit. Also, since the resistance values of a plurality of resistive elements contained in the analog-to-digital conversion unit can be made identical, the circuitry cost can be reduced. Also, the reduction in asymmetry of the amplitude of the analog signal can be achieved with a small-scale circuitry.

Another aspect of the fourth embodiment of the present invention relates to an amplitude adjustment method. This method comprises inputting and outputting. The inputting inputs an analog signal wherein the analog signal has been outputted via a magnetoresistive element, a dynamic range in a positive interval and that in a negative interval are asymmetrical to each other, and the analog signal has a nonlinear interval in either one of the positive interval and the negative interval. The outputting adjusts the amplitude of an analog signal existing in the nonlinear interval in such a manner as to cancel out nonlinearity in the nonlinear interval and converts the analog signal to a digital signal so as to be outputted. According to this embodiment, the amplitude nonlinearity that has occurred in the magnetoresistive element can be eliminated by adjusting the amplitude of an analog signal in the outputting. Since the amplitude nonlinearity that has occurred in the magnetoresistive element is eliminated, the detection accuracy of data detection executed at subsequent stages can be enhanced. Further, the error characteristics after the error correction decoding executed at a subsequence stage.

Still another aspect of the fourth embodiment of the present invention relates to a storage system. This storage system is a signal storage system that comprises a write channel for writing data to a storage apparatus and a read channel for reading out the data stored in the storage apparatus. The write channel includes: a first coding unit which performs a run-length limited coding on the data; a second coding unit which codes the data coded by the first coding unit using a low-density parity check code; and a write unit which writes the data coded by second coding unit to the storage apparatus. The read channel includes an input unit, an analog-to-digital conversion unit, a soft-output detector, a first decoding unit, and a second decoding unit. The input unit inputs an analog signal wherein the analog signal has been outputted from the storage apparatus via a magnetoresistive element, a dynamic range in a positive interval and that in a negative interval are asymmetrical to each other, and the analog signal has a nonlinear interval in either one of the positive interval and the negative interval. The analog-to-digital conversion unit converts the analog signal inputted from the input unit, to a digital signal so as to be outputted. The soft-output detector calculates a likelihood of the digital signal outputted from the analog-to-digital conversion unit and outputs a soft-decision value. The first decoding unit, which corresponds to the second coding unit, decodes data outputted from the soft-output detector. The second decoding unit, which corresponds to the first coding unit, decodes data decoded by the first decoding unit. The analog-to-digital conversion unit has a preadjustment unit which adjusts the amplitude of the analog signal in such a manner as to cancel out nonlinearity in the nonlinear interval before converting the analog signal to the digital signal, when the amplitude of the analog signal inputted by the input unit is present in the nonlinear interval. According to this embodiment, the effect of the amplitude asymmetry that has occurred in the magnetoresistive element can be reduced and thereby access can be made faster to the storage system.

Still another aspect of the fourth embodiment of the present invention relates also to a storage system. This storage system further comprises: a storage apparatus which stores data; and a control unit which controls a write to the storage apparatus and a read from the storage apparatus. The read channel reads out the data stored in the storage apparatus via the magnetoresistive element, according to an instruction of the control unit, and the write channel writes coded data to the storage apparatus, according to an instruction of the control unit. According to this embodiment, the effect of the amplitude asymmetry that has occurred in the magnetoresistive element can be reduced and thereby access can be made faster to the storage system.

Still another aspect of the fourth embodiment of the present invention relates to an amplitude adjustment apparatus. This apparatus is integrated on a single semiconductor substrate. According to this embodiment, the integration can achieve a small-scale semiconductor circuit.

Still another aspect of the fourth embodiment of the present invention relates to a recorded information reader. The recorded information reader comprises: an analog signal input unit which inputs an analog signal outputted from a reader that reads out recorded information recorded in a disk; and an analog-to-digital conversion unit which inputs the analog signal from the analog signal input unit and converts into a digital signal wherein in either one of a positive interval and a negative interval in an input level of the analog signal, a relation between an analog signal and a digital signal in an input-output characteristics differs between when the input level of the analog signal is small and when the input level of the analog signal is large. The analog-to-digital conversion unit may include: a plurality of resistive elements, arranged in series, which each receives an input of a reference signal having a constant voltage and outputs sequentially a reference signal, whose amplitude has been adjusted, to a subsequent resistive element; and a comparator which compares each of the reference signals outputted from the plurality of resistive elements with the input level of the analog signal inputted from the input unit so as to adjust the input level of the analog signal. The plurality of resistive elements may vary a range of the input level in a manner that resistance values of the respective resistive elements are nonuniform.

Still another aspect of the fourth embodiment of the present invention relates to a recorded information reader. This apparatus comprises: an analog signal input unit which inputs an analog signal outputted from a reader that reads out recorded information recorded in a disk; an analog-to-digital conversion unit which inputs the analog signal from the analog signal input unit and converts the analog signal into a digital signal wherein a relation between the analog signal and the digital signal in an input-output characteristic is variable; and a control unit which determines the relation between the analog signal and the digital signal in an input-output characteristic of the analog-to-digital conversion unit, according to an output of the analog-to-digital conversion unit. The analog-to-digital conversion unit may have a variable resistor to which the analog signal is inputted, and the control unit may determine a resistance value of the variable resistor.

Note that any arbitrary combination of the above-described structural components or the components or expressions of the present invention replaced among a method, an apparatus, a system and so forth are all effective as the embodiments of the present invention.

Before explaining the fourth embodiment of the present invention in concrete terms, a brief description will be first given of a storage system according to the fourth embodiment. The storage system according to the fourth embodiment includes a hard disk controller, a magnetic disk apparatus, and a read/write channel which includes a read channel and a write channel. In the magnetic disk apparatus, the data stored in a hard disk are usually read out via a head that contains a magnetoresistive element (hereinafter abbreviated as "MR element"). Here, there are cases where, in the waveform of signal read out from the hard disk, the output amplitude of a positive pulse thereof and that of a negative pulse are asymmetrical to each other. This causes a bottleneck in achieving the high speed operation. In the light of this, according to the fourth embodiment of the present invention, the amplitude asymmetry is remedied when the analog signal read out at the read channel is converted to the digital signal. Though the detail will be described later, the input-output characteristic of the analog-to-digital conversion unit is set to such a characteristic as to cancel out the input-output characteristic of the analog-to-digital conversion unit, thereby reducing the amplitude asymmetry.

Referring to Figures, the fourth embodiment of the present invention will be described in detail hereinbelow.

Figure 29:
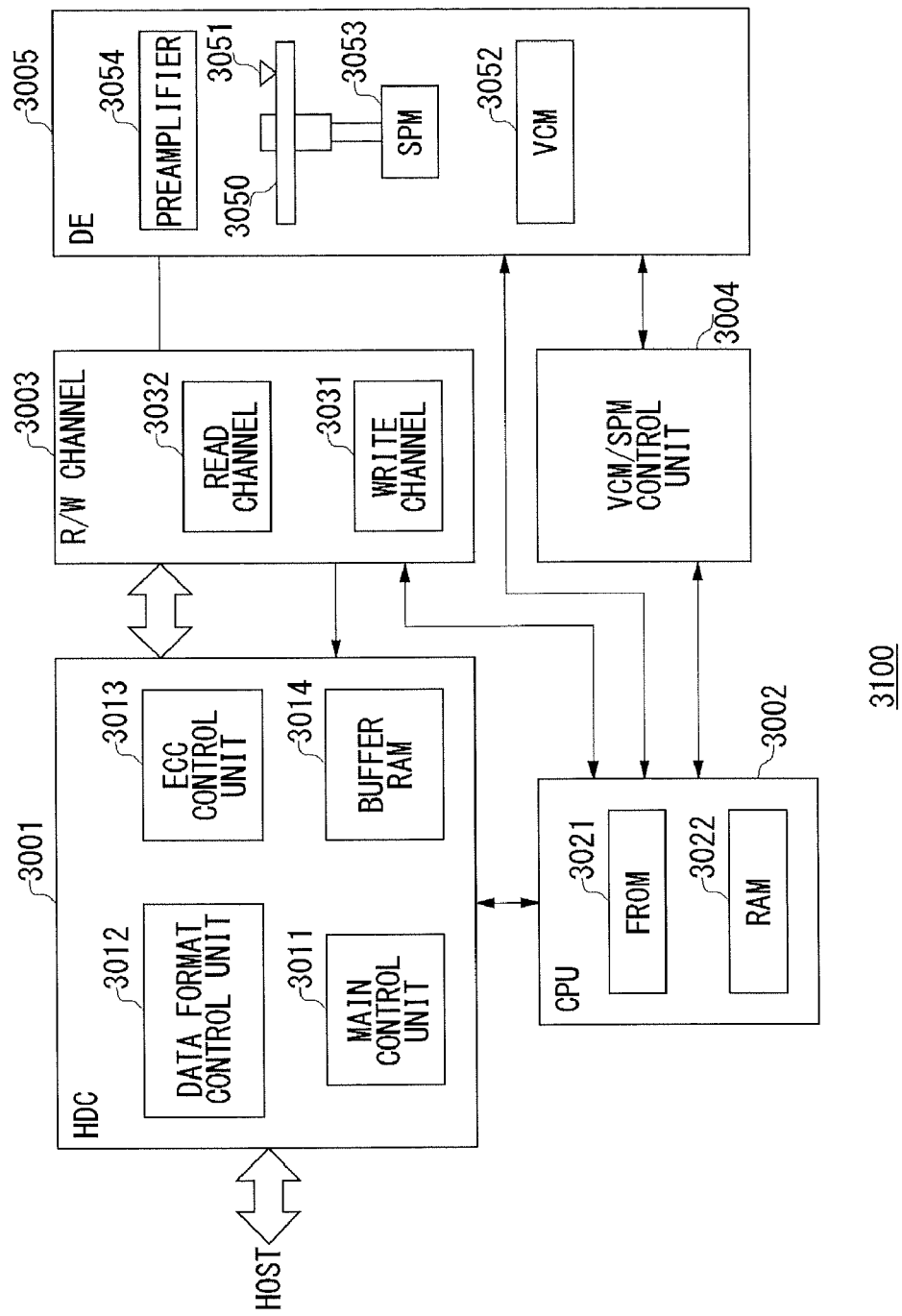
FIG. 29 is a diagram showing a structure of a storage system according to a fourth embodiment of the present invention.

FIG. 29 is a diagram showing a structure of a magnetic disk apparatus 3100 according to the fourth embodiment of the present invention. The magnetic disk apparatus 3100 in FIG. 29 is comprised roughly of a hard disk controller 3001 (hereinafter abbreviated as "HDC 3001"), a central processing arithmetic unit 3002 (hereinafter abbreviated as "CPU 3002"), a read/write channel 3003 (hereinafter abbreviated as "R/W channel 3003"), a voice coil motor/spindle motor controller 3004 (hereinafter abbreviated as "VCM/SPM controller 3004"), and a disk enclosure 3005 (hereinafter abbreviated as "DE 3005"). Generally, an HDC 3001, CPU 3002, R/W channel 3003, and VCM/SPM controller 3004 are structured on a single substrate.

The HDC 3001 includes a main control unit 3011 for controlling the whole HDC 3001, a data format control unit 3012, an error correction coding control unit 3013 (hereinafter abbreviated as "ECC control unit 3013") and a buffer RAM 3014. The HDC 3001 is connected to a host system via a not-shown interface unit. It is also connected to the DE 3005 via the R/W channel 3003, and carries out data transfer between the host and the DE 3005 according to the control by the main control unit 3011. Inputted to this HDC 3001 is a read reference clock (RRCK) generated by the R/W channel 3003. The data format control unit 3012 converts the data transferred from the host into a format that is suited to record it on a disk medium 3050 and also converts the data reproduced by the disk medium 3050 into a format that is suited to transfer it to the host. The disk medium 3050 includes a magnetic disk, for example. The ECC control unit 3013 appends redundancy symbols, using data to be recorded as information symbols, in order to enable the correction and detection of errors contained in data reproduced from the disk medium 3050. The ECC control unit 3013 also determines if any error has occurred in reproduced data and corrects or detects the error if there is any. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the Reed-Solomon (RS) code for ECC, the number of errors correctable will be (the number of redundancy symbols/2). The buffer RAM 3014 stores temporarily data transferred from the host and transfers it to the R/W channel 3003 with proper timing. Also, the buffer RAM 3014 stores temporarily the read data transferred from the R/W channel 3003 and transfers it to the host with proper timing after the completion of ECC decoding or the like.

The CPU 3002 includes a flash ROM 3021 (hereinafter abbreviated as "FROM 3021") and a RAM 3022, and is connected to the HDC 3001, R/W channel 3003, VCM/SPM controller 3004, and DE 3005. The FROM 3021 stores an operation program for the CPU 3002.

The R/W channel 3003, which is roughly divided into a write channel 3031 and a read channel 3032, transfers data to be recorded and reproduced data to and from the HDC 3001. Connected to the DE 3005, the R/W channel 3003 also performs transmission of recorded signals and reception of reproduced signals. The detail will be discussed later.

The VCM/SPM controller 3004 controls a voice coil motor 3052 (hereinafter abbreviated as "VCM 3052") and a spindle motor 3053 (hereinafter abbreviated as "SPM 3053") in the DE 3005.

The DE 3005, which is connected to the R/W channel 3003, performs reception of recorded signals and transmission of reproduced signals. The DE 3005 is also connected to the VCM/SPM controller 3004. The DE 3005 includes a disk medium 3050, a head 3051, a VCM 3052, an SPM 3053, a preamplifier 3054 and so forth. In the magnetic disk apparatus 3100 of FIG. 29, it is so assumed that there is one disk medium 3050 and the head 3051 is disposed only on one side of the disk medium 3050, but the arrangement may be such that a plurality of disk mediums 3050 are formed in a stacked structure. Also, the head 3051 is generally provided corresponding to each face of the disk medium 3050. The recorded signals transmitted from the R/W channel 3003 are supplied to the head 3051 by way of the preamplifier 3054 in the DE 3005 and then recorded on the disk medium 3050 by the head 3051. Conversely, the signals reproduced from the disk medium 3050 by the head 3051 are transmitted to the R/W channel 3003 by way of the preamplifier 3054. The VCM 3052 in the DE 3005 moves the head 3051 in a radial direction of the disk medium 3050 to position the head 3051 at a target position on the disk medium 3050. The SPM 3053 rotates the disk medium 3050. In the head 3051, the output amplitudes thereof are asymmetrical due to the MR element, as described above. The detail will be discussed later.

Figure 30:
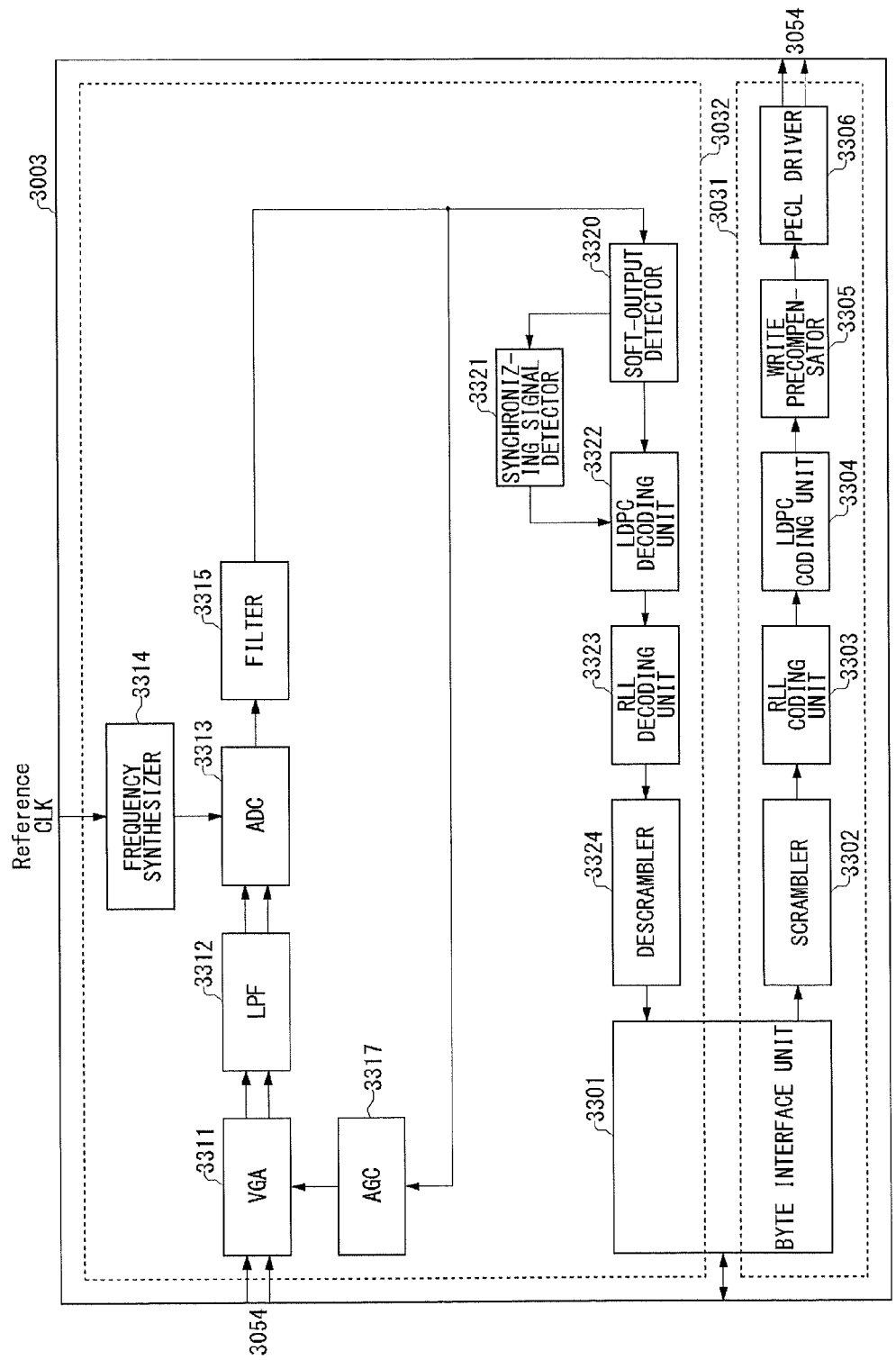
FIG. 30 is a diagram showing a structure of an R/W channel shown in FIG. 29.

Referring now to FIG. 30, a description will be given of the R/W channel 3003. FIG. 30 is a diagram showing a structure of the R/W channel 3003 shown in FIG. 29. The R/W channel 3003 is comprised roughly of a write channel 3031 and a read channel 3032.

The write channel 3031 includes a byte interface unit 3301, a scrambler 3302, a run-length limited coding unit 3303 (hereinafter abbreviated as "RLL coding unit 3303"), a low-density parity check coding unit 3304 (hereinafter abbreviated as "LDPC coding unit 3304"), a write compensation unit 3305 (hereinafter referred to as "write precompensator 3305"), and a driver 3306.

At the byte interface unit 3301, data transferred from the HDC 3001 are processed as input data. Data to be written onto the medium are inputted from the HDC 3001 sector by sector. At this time, not only user data (512 bytes) for one sector but also ECC bytes added by the HDC 3001 are also inputted simultaneously. The data bus, which is normally 1 byte (8 bits) long, is processed as input data by the byte interface unit 3301. The scrambler 3302 converts write data into a random sequence. The repetition of data of the same pattern is designed to remove any adverse effects on detection performance at reading, which may deteriorate the error rate. The RLL coding unit 3303 is used to limit the maximum run length of 0's. By limiting the maximum length of consecutive 0's, data are turned into a data sequence appropriate for an automatic gain controller 3317 (hereinafter abbreviated as "AGC 3317") and the like.

The LDPC coding unit 3304 plays a role of generating a sequence containing parity bits, which are redundancy bits, by LDPC coding. The LDPC coding is done by multiplying a matrix of k×n, called a generator matrix, by a data sequence of length k from the left. The elements contained in a check matrix H corresponding to this generator matrix are 0 or 1, and the coding is called Low-Density Parity Check codes because the number of 1's is smaller than the number of 0's. By utilizing the arrangement of these 1's and 0's, error correction will be carried out efficiently by an LDPC repeat decoding unit.

The write precompensator 3305 is a circuit for compensating the nonlinear distortion resulting from the continuation of magnetization transition on the medium. The write precompensator 3305 detects a pattern necessary for compensation from write data and preadjusts the write current waveform in such a manner as to cause magnetization transition in correct positions. The driver 3306 outputs signals corresponding to a pseudo ECL level. The output from the driver 3306 is sent to the not-shown DE 3005 and then sent to the head 3051 by way of the preamplifier 3054 before the write data are recorded on the disk medium 3050.

The read channel 3032 includes a variable gain amplifier 3311 (hereinafter abbreviated as "VGA 3311"), a low-pass filter 3312 (hereinafter abbreviated as "LPF 3312"), an AGC 3317, a digital-to-analog converter 3313 (hereinafter abbreviated as "ADC 3313"), a frequency synthesizer 3314, a filter 3315, a soft-output detector 3320, an LDPC repeat decoding unit 3322, a synchronizing signal detector 3321, a run-length-limited decoding unit 3323 (hereinafter abbreviated as "RLL decoding unit 3323"), and a descrambler 3324.

The VGA 3311 and AGC 3317 adjust the amplitude of the read waveform of data sent from a not-shown preamplifier 3054. The AGC 3317 compares an actual amplitude with an ideal amplitude and determines a gain to be set for the VGA 3311. The LPF 3312, which can adjust the cut-off frequency and boost amount, plays a partial role in reducing high-frequency noise and performing equalization on a partial response (hereinafter abbreviated as "PR") waveform.

In the equalization to a PR waveform by the LPF 3312, it is difficult to carry out a perfect equalization of analog signals by an LPF because of a number of factors including variation in head lift, nonuniformity of the medium, and variation in motor speed. Hence, equalization to the PR waveform is carried out again by a filter 3315 located in a subsequent position and having greater flexibility. The filter 3315 may have a function of adjusting its tap coefficient in an adaptable manner. The frequency synthesizer 3314 generates a sampling clock for the ADC 3313.

The ADC 3313 is of a structure to acquire a synchronous samples directly by A-D conversion. Note that in addition to this structure, the structure may be one to acquire asynchronous samples by A-D conversion. In such a case, a zero phase restarter, a timing controller, and an interpolation filter may be further provided in positions subsequent to the ADC 3313. Since a synchronous sample needs to be obtained from the asynchronous sample, such a function is performed by these blocks. The zero phase restarter, which is a block for determining an initial phase, is used to acquire a synchronous sample as quickly as possible. After the determination of the initial phase, the timing controller detects a phase shift by comparing an actual sample value against an ideal sample value. This phase shift is used to determine the parameter for the interpolation filter, and thus a synchronous sample can be obtained. The ADC 3313 is so configured as to have an input-output characteristic opposite to the asymmetry, which remedies the amplitude asymmetry that has occurred in the head 3051. Its detail will be described later.

The soft-output detector 3320 uses a Soft-Output Viterbi Algorithm (hereinafter abbreviated as "SOVA"), a kind of Viterbi algorithm, in order to avoid the deterioration of decoding characteristics resulting from intersymbol interference. In other words, there is a problem of deteriorating decoding characteristics as a result of increased interference between recorded codes along with the rise in recording density of magnetic disk apparatuses in recent years. And a Partial Response Maximum Likelihood (hereinafter abbreviated as "PRML") method, which utilizes the partial response due to intersymbol interference, is used as a method to overcome the problem. The PRML is a method for obtaining a signal sequence that maximizes the likelihood of the partial response of reproduced signals.

When the SOVA method is used in the soft-output detector 3320, the soft-output detector 3320 outputs a soft-decision value. Assume, for instance, that soft-decision values (−0.71, +0.18, +0.45, −0.45, −0.9) have been outputted as SOVA outputs. These values numerically represent their likelihood of being "0" or their likelihood of being "1". For example, the first value of "−0.71" signifies a strong likelihood of being 1, whereas the second value of "+0.18" is more likely to be 0 but is also significantly likely to be 1. The output of a conventional Viterbi detector is hard values, which are the results of hard decision of SOVA output. In the case of the above example, the values will be (1, 0, 0, 1, 1). The hard values, which represent either 0 or 1, no longer have the information suggesting the likelihood of being 0 or 1. Accordingly, the inputting of the soft-decision values to the LDPC repeat decoding unit 3322 can realize improved decoding performance.

The LDPC repeat decoding unit 3322 plays a role of restoring an LDPC-coded data sequence to the sequence before the LDPC coding from the LDPC-coded data sequence. The principal methods for the decoding are the sum-product decoding method and the min-sum decoding method. While the sum-product decoding method gives a better decoding performance, the min-sum decoding method can be better realized by hardware. In the actual decoding by the use of the LDPC code, a fairly satisfactory decoding performance can be accomplished by repeatedly carrying out the decoding between the soft-output detector 3320 and the LDPC repeat decoding unit 3322. In practice, therefore, the soft-output detector 3320 and the LDPC repeat decoding unit 3322 need to be arranged in multiple stages.

The synchronizing signal detector 3321 plays a role of recognizing the top position of data by detecting the synchronizing signal (sync mark) appended to the top of data.

The RLL decoding unit 3323 restores the data outputted from the LDPC repeat decoding unit 3322 to the original data sequence by carrying out a reverse operation of the RLL coding unit 3303 of the write channel 3031 thereon. The descrambler 3324 restores the original data sequence by carrying out a reverse operation of the scrambler 3302 of the write channel 3031. The data generated here are transferred to the HDC 3001.

In terms of hardware, these structures described as above can be realized by a CPU, a memory and other LSIs of an arbitrary computer. In terms of software, it can be realized by memory-loaded programs which have communication functions and the like, but drawn herein are function blocks that are realized in cooperation with those. Hence, it is understood by those skilled in the art that these function blocks can be realized in a variety of forms such as by hardware only, software only or the combination thereof.

Figure 31A:
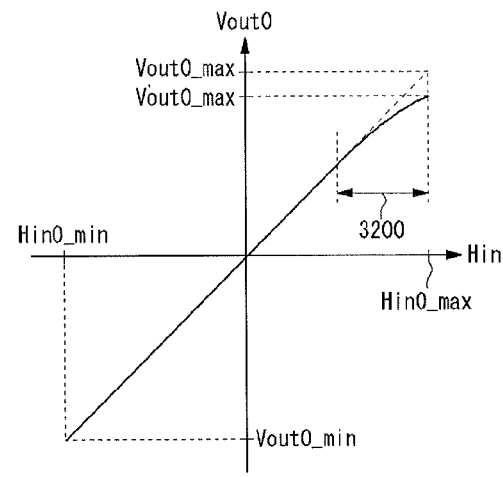
FIG. 31(a) is a graph showing an example of input-output characteristic of a head shown in FIG. 29.
Figure 31B:
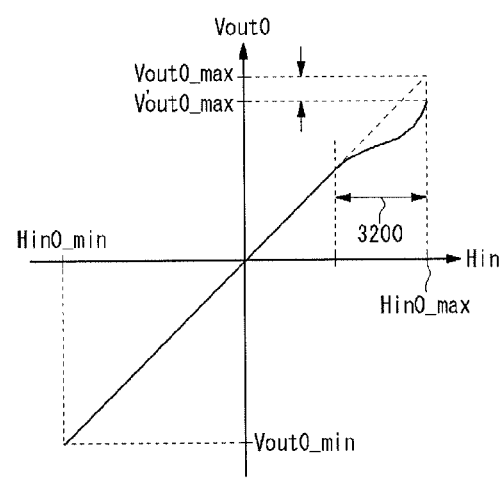
FIG. 31(b) is a graph showing an example of output characteristic of an LPF shown in FIG. 30.

Here, a description is given of input-output characteristics of the head 3051 shown in FIG. 29 and input-output characteristics desired in ADC 3313 shown in FIG. 30. FIG. 31(a) is a graph showing an example of input-output characteristics of a head 3051 shown in FIG. 29. The horizontal axis indicates an input magnetic field Hin and the vertical axis an output voltage Vout. The input magnetic field takes values in the range of Hin0_min to Hin0_max. When there is no nonlinearity due to the MR element of the head 3051, the output voltage takes values in the range of Vout0_min to Vout0_max as shown by the dotted line. However, when there is nonlinearity due to the MR element of the head 3051, the output voltage takes values in the range of Vout0_min to V'out0_max as shown by the solid line. That is, the input-output characteristic is asymmetrical with respect to the origin. FIG. 31(a) also indicates that the input-output characteristic is nonlinear in a nonlinear interval 3200 of a positive interval. As a result, when the input voltage is Vin0_max, the output voltage does not become Vout0_max but becomes V'out0_max. FIG. 31(b) is a graph showing that the dynamic range of output voltage in the head 3051 shown in FIG. 39(a) is further distorted by the LPF 3312. The horizontal axis indicates the input magnetic field Hin and the vertical axis the output voltage Vout. The input magnetic field takes values in the range of Hin0_min to Hin0_max.

Figure 31C:
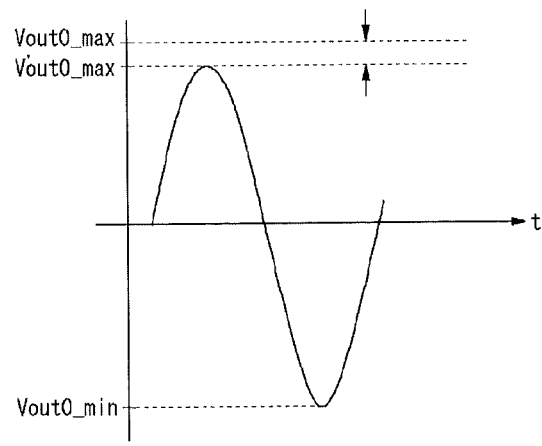
FIG. 31(c) is a graph showing an example of output waveform of a head shown in FIG. 29.

FIG. 31(c) is a graph showing an example of output waveform of the head 3051 shown in FIG. 29. The horizontal axis indicates time and the vertical axis the output voltage. FIG. 31(c) illustrates an asymmetry with respect to 0V in the positive interval and the negative interval. That is, it is shown that the amplitude energy drops by (Vout0_max-V'out0_max) by the head 3051. As a result, the detection accuracy in data detection provided in a subsequent stage (not shown) deteriorates. Further, the correction capability in an error correction circuit (not shown) at a subsequent stage deteriorates, too. The nonlinearity due to the MR element includes that, as shown in FIG. 31(c), the dynamic range in the positive interval and the dynamic range in the negative interval are asymmetric to each other and so forth.

Figure 32A:
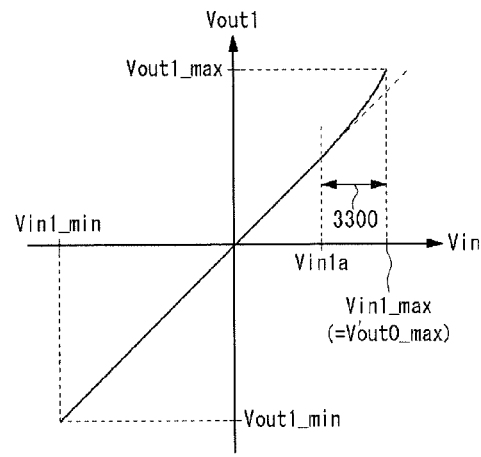
FIGS. 32(a) to 32(c) are graphs showing examples of input-output characteristics of an ADC shown in FIG. 30.
Figure 32B:
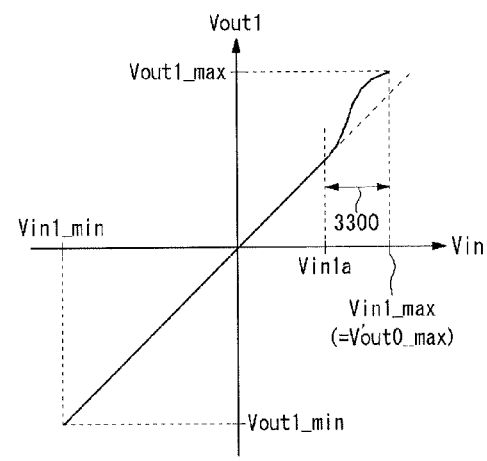

FIGS. 32(a) and 32(b) are graphs showing examples of input-output characteristics of the ADC 3313 shown in FIG. 30. The horizontal axis indicates the input voltage Vin and the vertical axis the output voltage Vout. The output voltage indicated in FIGS. 32(a) and 32(b) is not a digital signal output in the ADC 3313 but an output voltage of analog signal in the ADC 3313 where the amplitude thereof has been adjusted. The input voltage takes values in the range of Vin1_min to Vin1_max. When there is nonlinearity due to the MR element of the head 3051, the output voltage takes values in the range of Vout1_min to Vout1_max as shown by the solid line. FIG. 32(a) illustrates a case where, in order to eliminate the nonlinearity (as shown in FIG. 31(a)) caused by the MR element of the head 3051, a characteristic corresponding to the inverse characteristic thereof is provided in the ADC 3313. FIG. 32(b) illustrates a case where, in order to eliminate the nonlinearity (shown in FIG. 31(b)) caused by the MR element of the head 3051 and the distortion caused by the LPF 3312, a characteristic corresponding to the inverse characteristic thereof is provided in the ADC 3313. Here, if it is assumed that there is no variation in voltage between the head 3051 and the ADC 3313, the voltages shown in FIGS. 31(*a*) and 31(*b*) and FIGS. 32(*a*) and 32(*b*) are related as follows.

Vin1_max=V'out0_max

Vout1_max=Vout0_max

This means that the nonlinearity caused by the MR element contained in the head 3051 is eliminated. In other words, the characteristics equivalent to the inverse characteristics of the input-output characteristic in the nonlinear intervals 3200 of FIGS. 31(*a*) and 31(*b*), respectively, that is, the characteristics in nonlinear intervals 3300 of FIGS. 32(*a*) and 32(*b*) are provided in the ADC 3313. Thereby, the nonlinearity caused by the MR element can be eliminated. In general, the input-output characteristic in the nonlinear interval 3200 of FIG. 32(*a*) is known to be a hyperbolic tangent as in the following equation, $$V_{out0} = V_{out0\_max} \times \frac{\tanh\left(a \times \frac{H_{in}}{H_{in0\_max}}\right)}{a} \qquad \text{Equation (7)}$$

Accordingly, the input-output characteristic of the ADC 3313 may be set to the characteristic equivalent to the reverse characteristic of a hyperbolic tangent, for example, as expressed by the following equation. Here, a is a real number which may be determined by the characteristic of the head 3051.

$$V_{out1} = V_{out1\_max} \times \frac{\operatorname{arctanh}\left(a \times \frac{V_{in}}{V_{out0\_max}}\right)}{a} \qquad \text{Equation (8)}$$

Figure 32C:
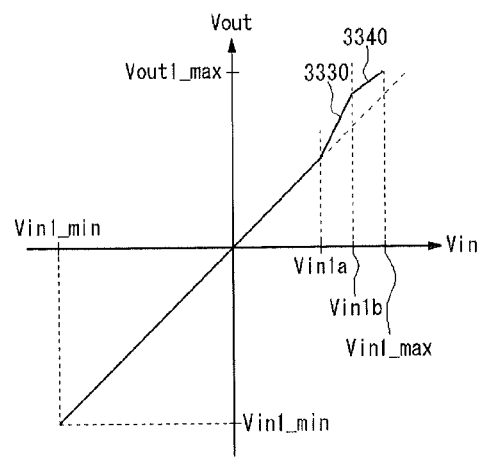

FIG. 32(*c*) illustrates an example of the input-output characteristics of the ADC 3313 in a case where the input-output characteristics in the nonlinear interval 3300 of FIG. 32(*b*). Similar to FIG. 32(*b*), the horizontal axis indicates the input voltage and the vertical axis the output voltage in FIG. 32(*c*). The input voltage takes values in the range of Vin1_min to Vin1_max. The output voltage takes values in the range of Vout1_min to Vout1_max. As described above, in order to eliminate the nonlinearity due to the MR element it is only necessary to make the input-output characteristics of the ADC 3313 opposite the characteristics of the hyperbolic tangent. However, it is generally difficult to realize this characteristic. Thus, in the fourth embodiment of the present invention, two linear functions are used to approximate them as shown in FIG. 32(*c*). More specifically, when the input voltage lies in the range of Vin1a to Vin1b, the input-output characteristic is set to one represented by a first linear function 3330. Also, when the input voltage lies in the range of Vin1b to Vin1_max, the input-output characteristic has only to be set to one represented by a second linear function 3340.

Figure 33:
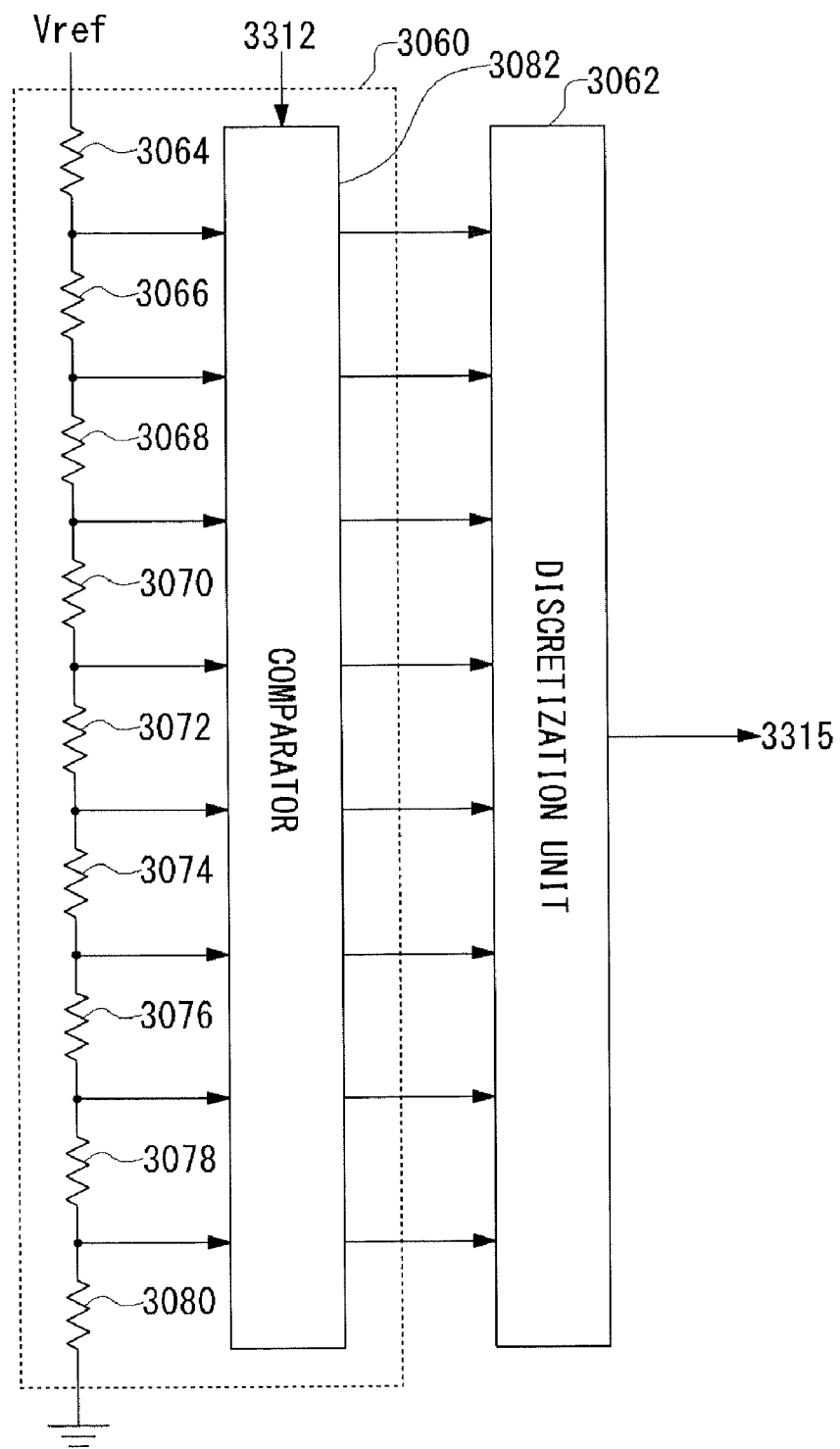
FIG. 33 is a diagram showing an exemplary structure of an ADC shown in FIG. 30.

A description is given here of three specific structures that achieve the input-output characteristics shown in FIG. 32(*c*). FIG. 33 is a diagram showing an exemplary structure of the ADC 3313 shown in FIG. 30. The ADC 3313 includes a preadjustment unit 3060 indicated by a dotted line and a discretization unit 3062. Illustrated here is a case where an analog signal is converted into a 3-bit digital signal. However, the present invention is not limited thereto.

If the amplitude of the analog signal inputted in the input unit exists in a nonlinear interval, the ADC 3313 will adjust the amplitude of the analog signal and, at the same time, convert it to a digital signal so as to be outputted. That is, before converting the analog signal into the digital signal, the preadjustment unit 3060 adjusts the amplitude of the analog signal in such a manner as to eliminate nonlinearity in the nonlinear interval. More specifically, the preadjustment unit 3060 sets the input-output characteristic in the nonlinear interval to an approximation value of the reciprocal of the hyperbolic tangent, and thereby adjusts the amplitude of the analog signal in the nonlinear interval. Then, the discretization unit 3062 converts the analog signal, whose amplitude has been adjusted by the preadjustment unit 3060, into the 3-bit digital signal and outputs it.

The preadjustment unit 3060 sets a first linear function 3330 having a first slope at least larger than 1, as an input-output characteristic in a first partial interval among a plurality of partial intervals included in the nonlinear interval. Also, a second linear function 3340 having a slope different from the first slope is set as an input-output characteristic in a second partial interval successive to the first partial interval among the plurality of partial intervals. Here, the first partial interval indicates the interval between Vin1a and Vin1b shown in FIG. 32(*c*), for example. The second partial interval successive to the first partial interval indicates the interval between Vin1b and Vin1_max shown in FIG. 32(*c*), for example. If the input-output characteristic of the second partial interval is one as shown in FIG. 32(*c*), the slope of the second linear function 3340 will be set smaller than the first slope.

A description is now given specifically. The preadjustment unit 3060 includes a first resistive element 3064, a second resistive element 3066, a third resistive element 3068, a fourth resistive element 3070, a fifth resistive element 3072, a sixth resistive element 3074, a seventh resistive element 3076, an eighth resistive element 3078 and a ninth resistive element 3080, which are represented by resistive elements 3400, and a comparator 3082. The resistive elements 3400 are arranged in series. And each of them receives an input of a reference signal Vref having a constant voltage and outputs sequentially a reference signal, whose amplitude has been adjusted, to a subsequent resistive element. Then the comparator 3082 compares each of the reference signals outputted from the plurality of resistive elements 3400 with the amplitude of the analog signal inputted from the LPF 3312 so as to adjust the amplitude of the analog signal. That is, the analog signal which is a value continuous in time is compared with a reference signal outputted from each of the resistive elements 3400, and eight discrete signals are outputted based on the magnitude relation between them. Although the eight signals are analog signals here, they have each a fixed amplitude indicating either plus or minus.

A plurality of resistive elements 3400 are each set to a nonuniform resistance value, so that a decrease width in voltage outputted from each resistive element is varied. More specifically, the reference voltage Vref applied to each resistive element is reduced according to the resistive value in the output of each resistive element and then outputted. That is, the larger the resistance value is, more the voltage is lowered. The smaller it is, the smaller the degree of reduction is. In other words, in a plurality of resistive elements 3400 each resistance value of them is set to a nonuniform value for each interval. As a result thereof, a voltage adjustment range in each of the resistive elements 3400 differs and thereby the slope of the input-output characteristic can be varied for each interval. According to the fourth embodiment of the present invention, the resistance values of the resistive elements corresponding to the first partial interval and the second partial interval which are nonlinear intervals, respectively, are varied. Thereby, the slope of the input-output characteristic for each interval is adjusted.

Assume, for example, that resistive elements corresponding to either the first partial interval or intervals other than the second interval are the fifth resistive element 3072, the sixth resistive element 3074, the seventh resistive element 3076 and the eighth resistive element 3078, and assume also that each resistance value of these is R. Assume also that resistive elements corresponding to the first partial interval are the third resistive element 3068 and the fourth resistive element 3070. In this case, the resistance values of the third resistance element 3068 and the fourth resistance element 3070 may be set to a value, for example, R/3 which is smaller than the resistance value R of the resistance elements corresponding to either the first partial first interval or intervals other than the second partial interval. The resistance value of the second resistive element 3066 according to the second partial interval may be set to a value, for example, 2R which is larger than the resistance value R. In general, the first resistive element 3064 and the ninth resistive element 3080 which are the resistive elements at the ends are set to half the value, R/2, of the resistance value R of the normal resistive element.

Figure 34A:
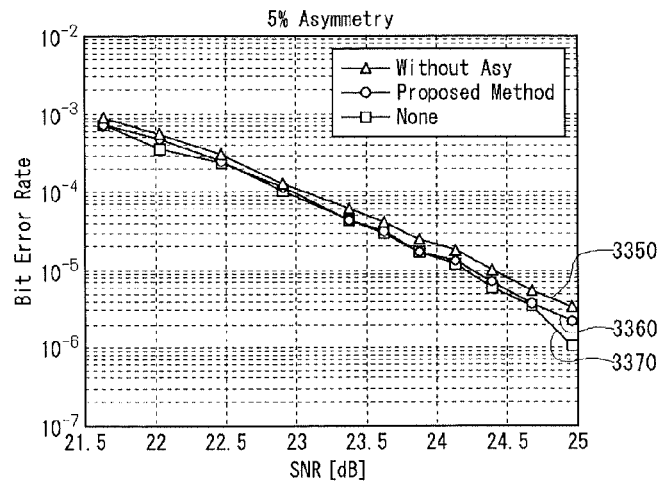
FIGS. 34(a) to 34(c) are diagrams showing examples of output signal characteristics of a soft-output detector shown in FIG. 30.
Figure 34B:
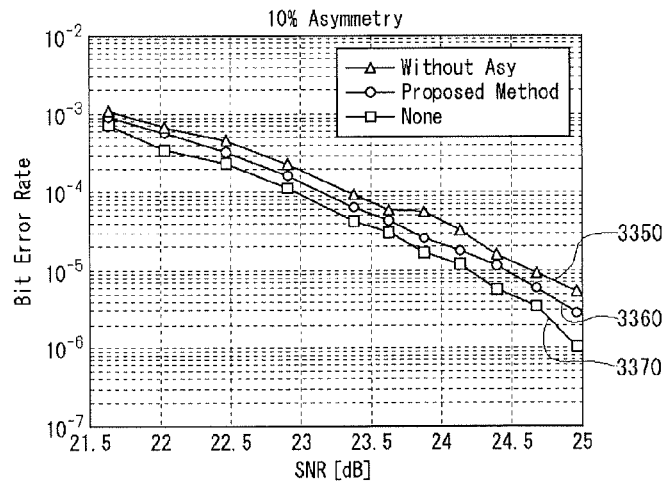
Figure 34C:
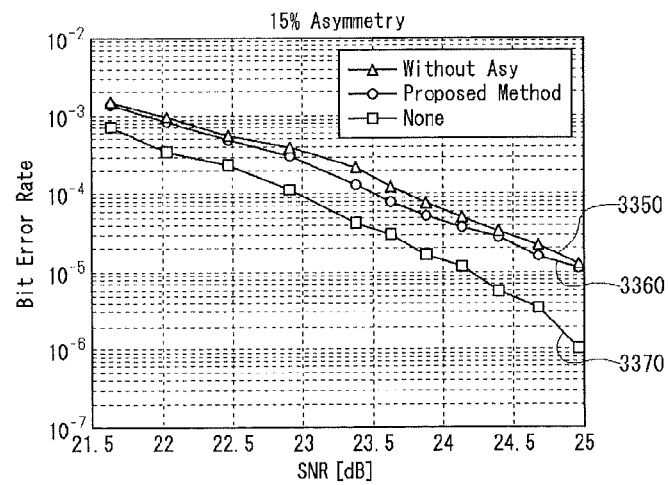

FIGS. 34(a) to 34(c) are diagrams showing examples of output signal characteristics of the soft-output detector 3320 shown in FIG. 30. In each Figure, the vertical axis indicates a Bit Error Rate and the horizontal axis a Signal-to-Noise Ratio. FIG. 34(a) is a diagram showing a first bit error rate characteristic 3320 of the soft-output detector 3320 in a case when a 5% asymmetry of the input-output characteristic is present in the head 3051 of FIG. 29 and a second bit error rate characteristic 3360 in a case when the fourth embodiment of the present invention has been applied. FIG. 34(a) also shows a third bit error rate characteristic 3370 in a case when the above-described asymmetry is ideally eliminated or when no asymmetry of input-output characteristic is present in the head 3051 of FIG. 29. The 5% asymmetry indicates that a dynamic range V1 in a positive interval is about 90% of a dynamic range V2 in a negative interval (V1=V2×(1−0.05)/(1+0.05)≈0.9×V2). As shown by the second bit error rate characteristic 3360 of FIG. 34(a), the bit error rate characteristic can be improved by employing the fourth embodiment of the present invention. For example, as shown by the second bit error rate characteristic 3360, a desired SNR at the bit error rate of $10^{-5}$ is improved by about 0.1 dB as compared with the first bit error rate characteristic 3350 where the fourth embodiment of the present invention is not applied.

In the field of storage apparatuses including hard disks, it is generally known to normally require about one generation of technological innovation for the bit error rate to improve by about 0.1 dB. Thus it is obvious to those skilled in the art that an improvement of the bit error rate by as much as 0.1 dB accomplished by the fourth embodiment of the present invention is a very significant advantageous effect.

FIG. 34(b) is a diagram showing a bit error rate characteristic in a case when a 10% asymmetry of the input-output characteristic is present in the head 3051 of FIG. 29. FIG. 34(c) is a diagram showing a bit error rate characteristic in a case when a 15% asymmetry of the input-output characteristic is present in the head 3051 of FIG. 29. As shown by the second bit error rate characteristics 3360 of FIG. 34(b) and FIG. 34(c), the asymmetry of the amplitude is reduced by employing the fourth embodiment of the present invention and thus the bit error rate can be significantly improved similarly to the case of FIG. 34(a).

The present invention has been described based on the fourth embodiment. This fourth embodiment is merely exemplary and it is understood by those skilled in the art that various modifications to the combination of each component or process thereof or any mutual combination within the embodiment are possible and such modifications are also within the scope of the present invention.

According to the fourth embodiment of the present invention, the amplitude of the analog signal is adjusted in the analog-to-digital conversion unit, so that the amplitude nonlinearity that occurred in the magnetoresistive element can be reduced. Since the amplitude nonlinearity that occurred in the magnetoresistive element is reduced, the error characteristics after the error correction decoding can be significantly improved. Also, simply setting respectively the resistance values of a plurality of resistive elements contained in the analog-to-digital conversion unit can reduce the amplitude asymmetry of the analog signal using a small-scale and highly stable circuitry. Since the effect of the amplitude asymmetry that occurred in the magnetoresistive element is reduced, access can be made faster to the storage system. Also, since there is no need to mount any unnecessary hardware, a semiconductor integrated circuit with a reduced circuit scale can be realized.

Next, modifications of the fourth embodiment of the present invention will be presented. An outline thereof will be given first. This modification relates to a storage system that reduces the amplitude asymmetry caused by the magnetoresistive element contained in the head. In this modification, a magnetic disk apparatus 3100 has a structure similar to that of FIG. 29. Also, an R/W channel 3003 has a structure similar to that of FIG. 30. A difference from the fourth embodiment of the present invention is that the ADC 3313 of FIG. 30 has a structure shown in FIG. 35. That is, this modification is characterized in that the resistance value in the analog-to-digital conversion unit included in the storage system is set variably. The components common to the above-described fourth embodiment are given the identical reference numerals and thus the description will be simplified.

Figure 35:
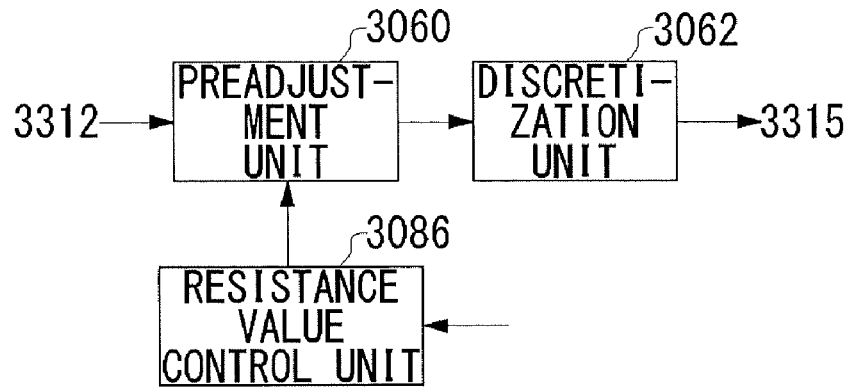
FIG. 35 is a diagram showing a modification of the structure of an ADC shown in FIG. 30.

FIG. 35 is a diagram showing a modification of the structure of the ADC 3313 shown in FIG. 30. The ADC 3313 includes a preadjustment unit 3060, a discretization unit 3062 and a resistance value control unit 3086. The resistance value control unit 3086 controls resistance values of resistive elements 3400 contained in the preadjustment unit 3060, according to an external instruction. The "external instruction" includes an instruction from a circuit other than the ADC 3313 and it may be an instruction from the LDPC repeat decoding unit 3322, for example. In this case, a correction result in the LDPC repeat decoding unit 3322 is notified. If the notified result is satisfactory, the resistance values of the preadjustment unit 3060 will remain unchanged. If not, a control will be performed by changing the resistance values. Also, according to a user's instruction given via a not-shown interface, the resistance value control unit 3086 may instruct the preadjustment unit 3060 as to resistive elements whose resistance values are to be changed and the resistance values after the change. In this case, the resistance value control unit 3086 controls the preadjustment unit 3060 so that a specified resistive element 3400 has a specified resistance value.

Figure 36:
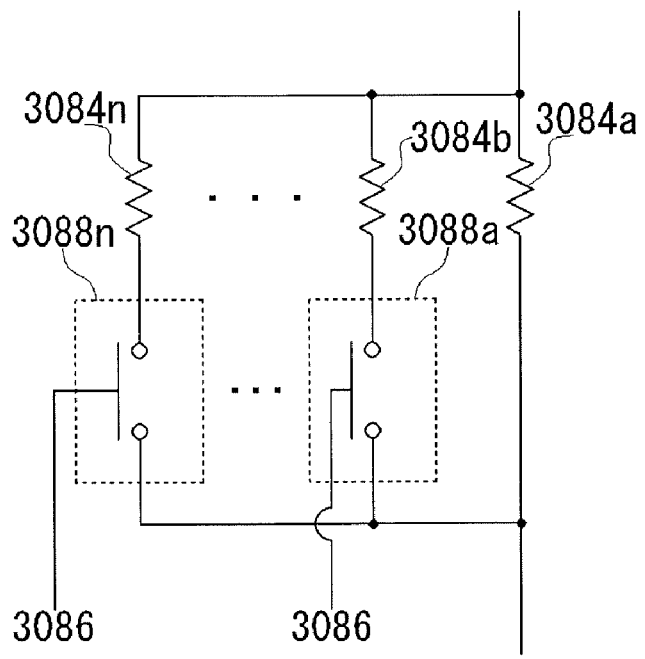
FIG. 36 is a diagram showing a modification of resistive elements shown in FIG. 33.

FIG. 36 is a diagram showing a modification of the structure of the resistive element 3400 shown in FIG. 33. The resistive element 3400 includes a first adjustment resistive element 3084a, a second adjustment resistive element 3084b, ... and an nth resistive element 3084n, which are represented by adjustment resistive elements 3084, and a first switching unit 3088a, ... and an mth switching unit, which are represented by switching units 3088, where n is an integer greater than or equal 2 and m is an integer greater than or equal to 1. The respective switching units 3088 turn on or off the switches based on an instruction of the resistance value control unit 3086. A description is now given using a specific example. Assume, for example, that the resistance values of the adjustment resistive elements 3084 are all 2R. In this case, when every switching unit 3088 is OFF, the resistance value of the resistive elements 3400 is 2R. When only one of the switching units 3088 is ON, the resistance value of the resistive elements 3400 is R. When k switching units 3088 are ON, the value of the resistive elements 3400 is 2R/k. In other words, for resistive elements 3400 corresponding to intervals other than the nonlinear interval, the resistance value control unit 3086 turns on any one of the switching units 3088 and sets the resistance value thereof to R. For resistive elements 3400 corresponding to the nonlinear interval, it is preferred that the resistance value control unit 3086 turns on none or two or more of switching units 3088 and sets the resistance value thereof to a value other than R. Note that any only one of or any two or more of a plurality of resistive elements contained in the preadjustment unit 3060 may be configured as shown in FIG. 36. Also, the resistance values of the resistive elements 3084 may not be all identical. Even in such cases, it goes without saying that the similar effects are obtained by changing the control of the switching units 3088 by the resistance value control unit 3086 as appropriate.

Figure 37:
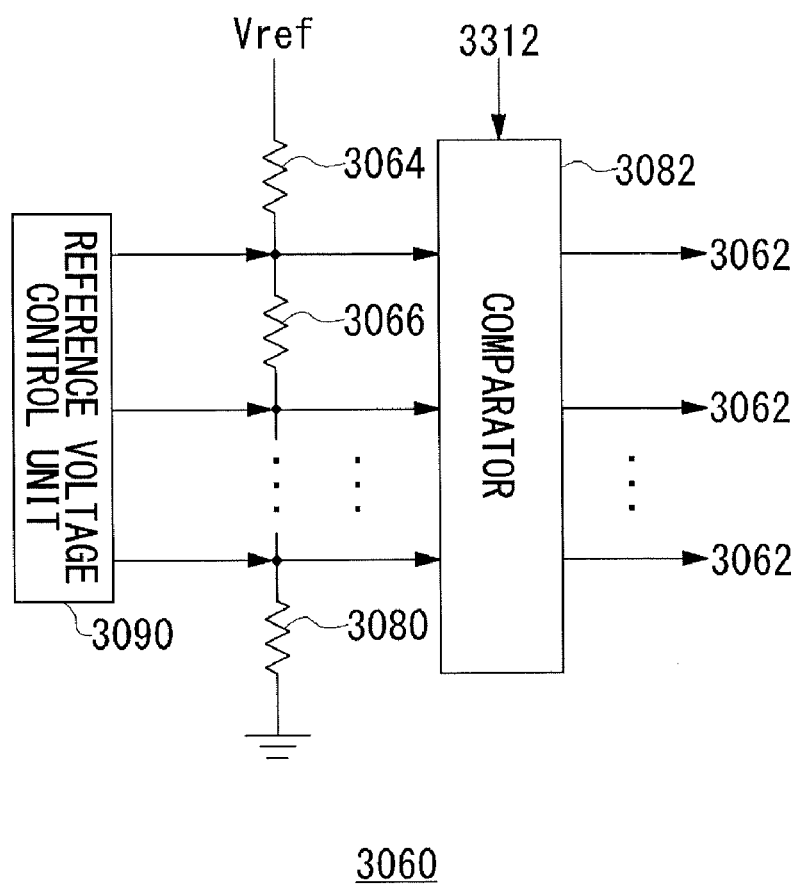
FIG. 37 is a diagram showing a modification of the structure a preadjustment unit shown in FIG. 33.

FIG. 37 is a diagram showing a modification of the structure of the preadjustment unit 3060 shown in FIG. 33. The structure of the preadjustment unit 3060 shown in FIG. 37 is such that a reference voltage control unit 3090 is added to the preadjustment unit 3060 shown in FIG. 33. The components common to the above-described preadjustment unit 3060 shown in FIG. 33 are given the identical reference numerals and thus the description will be simplified. The reference voltage control unit 3090 is connected to at least one input terminal of a plurality of resistive elements, and applies corresponding reference voltages to the input terminals, respectively, so as to adjust the amplitudes of reference signals outputted respectively from the plurality of resistive elements. In this modification, a plurality of resistive elements may each have an identical resistance value. Also, the reference voltage control unit 3090 may adjust nonlinearity in a nonlinear interval by applying the reference voltages, different from input terminals of resistive elements corresponding to intervals other than the nonlinear interval, to the input terminals of the resistive elements, corresponding to the nonlinear interval, in a plurality of resistive elements. Here, the "reference voltages corresponding to" includes reference voltages which have been determined by bringing them into correspondence with the resistive elements, respectively. And they may be preset or may vary dynamically according to the quality of magnetoresistive elements. According to this embodiment, the amplitude of reference signals can be flexibly controlled by the reference voltage control unit. Also, the resistance values of a plurality of resistive elements contained in the analog-to-digital conversion unit can be made equal to one another, so that the circuitry cost can be reduced. Also, the reduction in asymmetry of the amplitude of the analog signal can be achieved with a small-scale circuitry.

The modification of the present invention has been described based on the fourth embodiment. This modification is merely exemplary and it is understood by those skilled in the art that various other modifications to the combination of each component or process thereof or any mutual combination within the embodiment are possible and such modifications are also within the scope of the present invention.

According to the modification of the fourth embodiment, the effects similar to the fourth embodiment can be obtained. Also, the amplitude asymmetry can be flexibly improved by setting the resistance values of the resistive elements variably.

In the present fourth embodiment, a description has been given assuming that the nonlinearity exists in the positive interval in the input-output characteristic of the head 3051. However, the case is not limited thereto and the nonlinearity may exist in the negative interval. Even in this case, the similar effects can be obtained if the resistance values of the resistive elements 3400 corresponding to the nonlinear interval are made to differ from those in the other intervals. Also, the R/W channel 3003 may be integrated on a single semiconductor substrate.

Fifth Embodiment

A fifth embodiment relates to a technology of decoding digital signals. It particularly relates to a decoding apparatus for error correcting/decoding data stored in a storage medium, a decoding method and a storage system.

The background technology for the fifth embodiment is described.

In recent years, storage devices using hard disks are becoming indispensable in various fields such as personal computers, hard disk recorders, video cameras and mobile telephones. Depending on the fields applied, there are various specifications required of the storage devices using the hard disks. For example, high speed and large capacity are required of a hard disk mounted on a personal computer. Error correction coding with high correction capability must be implemented in order to improve the high speed property and the large capacity. However, since the amount of data handled per unit time increases as the high-speed performance advances, the error per unit time increase proportionally. Thus, reloading back into a hard disk takes places when an error correction method having a low error correction capability is used. This increases the access time, causing a bottleneck in achieving the high speed operation.

Generally, the data sequences read out from the hard disk suffers from intersymbol interference. In a conventional practice, a soft-decision Viterbi algorithm (hereinafter denoted by "SOVA"), which is capable of accurately detecting a data sequence containing white noise, is used to thereby detect a data sequence where the intersymbol has been removed (See Japanese Patent Application Laid-Open No. 2003-228923 and Japanese Patent Application Laid-Open No. 2004-139664 for instance). However, there are cases where the data sequences read out from the hard disk contain colored noise. In such a case, even if data are detected using SOVA, the intersymbol interference would not be removed properly. And even if the decoding is executed at a subsequent stage, accurate decoding could not be expected. To address such a problem, DDNP (Data Dependent Noise Predictive)-SOVA, which detects data sequences by predicting noise occurring depending on the signals in the past or noise, namely, colored noise, has been used as a data detection algorithm (See "Aleksandar Kavcic, et al. 'The Viterbi Algorithm and Markov Noise Memory', IEEE Transaction on Information Theory, Vol. 46, No. 1, p. 291-301, June 2000", for instance).

Under these circumstances, the inventors of the present invention had come to recognize the following problems to be resolved. That is, there is a problem where at a stage when a data sequence is read out from the hard disk it is difficult to determine whether the noise contained in the data sequence is either colored noise or while noise or it contains both the noises. Accordingly, even if the data are detected using any of detection algorithms and then decoded, the decoding characteristics thereof will be unstable, thus causing a problem.

The fifth embodiment of the present invention has been made in view of the foregoing circumstances described as above, and a general purpose thereof is to provide a decoding apparatus, a decoding method and a storage system capable of improving the decoding characteristics irrespective of the noise characteristics.

In order to resolve the above-described problems, a decoding apparatus according to one embodiment of the present invention comprises: an input unit which inputs a data sequence; a generator which generates a plurality of different signal sequences from the data sequence inputted by the input unit; a selector which selects one signal sequence from among the plurality of signal sequences generated by the generator; a decoder which decodes the signal sequence selected by the selector; a detector which detects the degree of decoding error in the signal sequence decoded by the decoder; and a decision unit which determines whether the degree of error detected by the detector is within a predetermined tolerance or not. When it is determined that the degree of error is within the predetermined tolerance, the output of the signal sequence decoded by the decoder is specified. When it is determined that the degree of error exceeds the predetermined tolerance, the selection of another signal sequence different from the one signal is specified by the selector, and the signal sequence newly selected by the selector again undergoes processing by the decoder and the subsequent.

Here, a "plurality of different signal sequences" include a plurality of signal sequences generated by performing different data detection methods on a predetermined signal sequence, and so forth. "Detects the degree of decoding error" includes checking whether error has been corrected or not, determining whether there is error or not by the error detection such as CRC, and so forth. "Degree of error is within a predetermined tolerance" includes that a correct decoding result has been obtained, and so forth. It includes, for example, that the error has been corrected and it has been determined, by the error detection such as CRC, that there is no error, and so forth. "Degree of error exceeds the predetermined tolerance" includes the correct decoding result has not been obtained, and so forth. It includes, for example, that the error has not been corrected and it has been determined by the error detection such as CRC that error remains, and so forth. "Selection of another signal sequence different from" includes the selection of a signal sequence different from the already selected signal. Processing by the decoder and the subsequent includes the processings by the decoder, detector and decision unit. According to this embodiment, the decoding processing is repeated until a decoded sequence where the error is within a predetermined tolerance is obtained. Thereby, the decoding performance can be enhanced. Also, the decoding performance can be stabilized.

The selector may preferentially select a signal sequence having a high probability that the degree of error is determined to be within the predetermined tolerance by the decision unit. Also, the selector may preferentially select a signal sequence corresponding to a data sequence detected by using a Viterbi algorithm which has a function of predicting noise occurring depending on a signal, from among the plurality of signal sequences generated by the generator. Here, "noise occurring depending on a signal" includes noise that occurs depending on the signals in the past or the noise, and so forth. According to this embodiment, the signal sequence having a high probability that the degree of error is determined to be within the predetermined tolerance is selected, so that the number of required repeating times in a predetermined processing by the decoder and the subsequent can be reduced.

The input unit may include a first input unit and a second input which generate different data sequences, respectively. The generator may generate one or more signal sequences from either one of data sequences inputted from the first input unit and the second input unit, or both of the data sequences. The generator may generate the signal sequence, based on a data sequence of a plurality of data sequences inputted by the first input unit and the second input unit, respectively, wherein the data sequence is detected by a first Viterbi algorithm having a function of predicting noise occurring depending on a signal and/or the data sequence is detected by a second Viterbi algorithm having a function different from that of the first Viterbi algorithm. According to this embodiment, candidates to be decoded can be generated in plurality. Since a plurality of candidates are generated, the degree of certainty of decoding can be improved.

The input unit may input a soft-decision valued data sequence, and the generator may generate a signal sequences by representing the data sequence, inputted by the input unit, by a hard-decision value. According to this embodiment, decoded sequences can be generated using a simplified structure. When, in the data sequence inputted by the input unit, soft-decision data having an absolute value smaller than a predetermined threshold value are contiguous in an interval longer than or equal to a predetermined length and the number of soft-decision data contiguous in the interval is larger than a predetermined quantity, the generator may generate a signal sequence in a manner that the sign of the contiguous soft-decision data is inverted and thereafter represented by a hard-decision value or the soft-decision data are represented by a hard-decision value and thereafter the hard-decision-processed data are logically inverted. When, among a plurality of soft-decision data contained in the data sequence inputted by the input unit, the signs of adjacent soft-decision data differ, respectively, in an interval longer than or equal to a predetermined length, the generator may generate a signal sequence in a manner that the sign of the soft-decision data corresponding to the interval is inverted and thereafter represented by a hard-decision value or the soft-decision data corresponding to the interval are represented by a hard-decision value and thereafter the hard-decision data are logically inverted. The generator may generate a signal sequence in a manner that the sign of soft-decision data having an absolute value smaller than a predetermined threshold value, among a plurality of soft-decision data contained in the data sequence inputted by the input unit, is inverted and thereafter represented by a hard-decision value or the soft-decision data having an absolute value smaller than the predetermined threshold value are represented by a hard-decision value and thereafter the hard-decision-processed data are logically inverted.

Here, "soft-decision value" includes a value represented by a multi-level larger than binary, and also includes the degree of reliability. The degree of reliability indicates the likelihood of data and may be represented by the absolute value of a soft-decision value. "The sign of soft-decision data is inverted" includes that soft-decision data is multiplied by (−1) and so forth and also includes the hard-decision value of soft-decision data is logically inverted and so forth. "When the signs of adjacent soft-decision data differ, respectively," includes a case when a plurality of soft-decision data are soft-decision data indicating a positive and a negative alternately and a case when a sign bit indicating a positive and that indicating a negative are contained alternately in the soft-decision data. According to this embodiment, a hard-decision value corresponding to a soft-decision whose degree of reliability is low is determined in the opposition direction and thereby the decoding characteristics can be improved.

Also, the generator may generate the signal sequence in a manner that, based on a hard-decision value of one of two data sequences, a hard-decision value of the other data sequence is modified where the two data sequences are among the plurality of data sequences inputted by the first input unit and the second input unit. Also, the generator may generate the signal sequence in a manner that, based on a hard-decision value of either one of the data sequence detected by the first Viterbi algorithm having a function of predicting noise occurring depending on a signal and the data sequence detected by a second Viterbi algorithm having a function different from that of the first Viterbi algorithm, a hard-decision value of the other data sequence is modified wherein the two data sequences are among the plurality of data sequences inputted by the first input unit and the second input unit. The generator may modify the hard-decision value of one of the two data sequences in a manner that when a hard-decision value of first data contained in one of two data sequences differs from a hard-decision value of second data, contained in the other data sequence, existing in a position corresponding to the first data, the first data contained in one of the two data sequences are substituted by the second data, wherein the two data sequences are among the plurality of data sequences inputted by the first input unit and the second input unit. Also, the generator may modify the hard-decision value of one of the two data sequences in a manner that when a hard-decision value of first data contained in one of two data sequences differs from a hard-decision value of second data, contained in the other data sequence, existing in a position corresponding to the first data and a difference between an absolute value of a soft-value of the second data and an absolute value of a soft-decision value of the first data is larger than a predetermined threshold value, the first data contained in one of the two data sequences are substituted by the second data, wherein the two data sequences are among the plurality of data sequences inputted by the first input unit and the second input unit. According to this embodiment, a plurality of hard-decision sequences are corrected mutually, so that the signal sequences which are robust against both noise characteristics are generated. The decoding characteristics can be improved. A hard-decision value corresponding to a soft-decision value whose degree of reliability is low is determined in the opposite direction. Thereby, the decoding characteristics can be improved.

Another aspect of the fifth embodiment of the present invention relates to a decoding method. This method comprises: inputting a data sequence; generating a plurality of different signal sequences from the inputted data sequence; selecting one signal sequence from among the plurality of signal sequences generated; and decoding the signal sequence selected, wherein the selecting is such that a signal sequence different from that which has already been selected is selected sequentially and processing after said decoding is repeated until the degree of error in the signal sequence decoded in the decoding becomes smaller than a predetermined value. "The degree of error in the signal sequence decoded in the decoding becomes smaller than a predetermined value" includes that the correct decoding result has been obtained, and so forth. It includes, for example, that the error has been corrected and it has been determined, by the error detection such as CRC, that there is no error, and so forth. According to this embodiment, the decoding processing is repeated until a decoded sequence where the error is within a predetermined tolerance is obtained. Thereby, the decoding performance can be enhanced. Also, the decoding performance can be stabilized.

Still another aspect of the fifth embodiment of the present invention relates to a storage system. This storage system is comprised of a write channel for writing data to a storage apparatus and a read channel for reading out the data stored in the storage apparatus, and the write channel includes: a coding unit which performs Reed-Solomon coding on the data; and a write unit which writes the data coded by the coding unit to the storage apparatus, and the read channel includes: an input unit which inputs an analog signal outputted from the storage apparatus; an analog-to-digital converter which converts the analog signal inputted from the input unit into a digital so as to be outputted; a soft-output detector which calculates a likelihood of the digital signal outputted from the analog-to-digital converter and outputs a soft-decision value; and a decoding unit, compatible with the coding unit, which decodes data outputted from the soft-output detector. The decoding apparatus includes: an input unit which inputs the data outputted from the soft-output detector; a generator which generates a plurality of different signal sequences from the data inputted by the input unit; a selector which selects one signal sequence from among the plurality of signal sequences generated by the generator; a decoder which decodes the signal sequence selected by the selector; a detector which detects the degree of decoding error in the signal sequence decoded by the decoder; and a decision unit which determines whether the degree of error detected by the detector is within a predetermined tolerance or not. When it is determined by the decision unit that the degree of error is within the predetermined tolerance, the output of the signal sequence decoded by the decoder is specified; and when it is determined by the decision unit that the degree of error exceeds the predetermined tolerance, the selection of another signal sequence different from the one signal is specified by the selector, and the signal sequence newly selected by the selector again undergoes processing by the detector and the subsequent. Still another embodiment of the present invention relates to a decoding apparatus. This apparatus may be integrated on a single semiconductor substrate. According to this embodiment, there is provided a decoding unit having a stable and high decoding capability, so that access can be made faster to the storage system. Also, since there is no need to mount any unnecessary hardware, a semiconductor integrated circuit with a reduced circuit scale can be realized.

Still another aspect of the fifth embodiment of the present invention relates also to a storage system. This storage system further comprises a storage apparatus which stores data and a control unit which controls a write to and a read from the storage apparatus. The read channel reads the data stored in the storage apparatus according to an instruction of the control unit, and the write channel writes coded data to the storage apparatus according to an instruction of the control unit. Still another embodiment of the present invention relates to a decoding apparatus. This apparatus may be integrated on a single semiconductor substrate. According to this embodiment, there is provided a decoding unit having a stable and high decoding capability, so that access can be made faster to the storage system. Also, since there is no need to mount any unnecessary hardware, a semiconductor integrated circuit with a reduced circuit scale can be realized.

Still another aspect of the fifth embodiment of the present invention relates to a decoding apparatus. The decoding apparatus comprises: an input unit which includes a first input unit that generates a data sequence and a second input unit that generates a data sequence different from that generated by the first input unit; a generator which generates a plurality of different signal sequences from the data sequences inputted by the input unit; a selector which selects one signal sequence from among the plurality of signal sequences generated by the generator; a decoder which decodes the signal sequence selected by the selector; a detector which detects the degree of decoding error in the signal sequence decoded by the decoder; and a decision unit which determines whether the degree of error detected by the detector is within a predetermined tolerance or not. When it is determined by the decision unit that the degree of error is within the predetermined tolerance, the output of the signal sequence decoded by the decoder is specified.

When it is determined by the decision unit that the degree of error exceeds the predetermined tolerance, the selection of another signal sequence different from the one signal may be specified by the selector, and the signal sequence newly selected by the selector may again undergo processing by the decoder and the subsequent. The selector may preferentially select a signal sequence having a high probability that the degree of error is determined to be within the predetermined tolerance by the decision unit. When a bit contained in the inputted signal sequence is represented by a hard-decision value, the generator may refer to a degree of reliability of other bits. When the bit contained in the inputted signal sequence is represented by a hard-decision value, the generation may refer to the degree of reliability of said bit and the degree of reliability of bits, other than said bit, contained in the signal sequence. When representing by a hard-decision value, the generator may refer to a degree of reliability of an output signal from the first input unit and a degree of reliability of an output signal from the second input unit. When determining a hard-decision value of a bit, the generator may refer to the degree of reliability of an output signal from the first input unit and the degree of reliability of an output signal from the second input unit. When determining a hard-decision value of a bit, the generator may compare the degrees of reliability of mutually corresponding bits in the output signal from the first input unit and the output signal of the second input unit. When selecting an output from the first input unit and an output from the second input, the selector may preferentially select the output from the first input unit.

The decoding apparatus further comprises: a read unit which reads out recorded information recorded in a disk and outputs it to the input unit; and a read status decision unit which determines a read status in the read unit. The selector may determine whether priority is given to either an output from the first input unit or an output from the second input unit, based on the status determined by the read status decision unit.

Note that any arbitrary combination of the above-described structural components or the components or expressions of the present invention replaced among a method, an apparatus, a system and so forth are all effective as the embodiments of the present invention.

Before explaining the fifth embodiment of the present invention in concrete terms, a brief description will be first given of a storage system 4100 according to the fifth embodiment. The storage system 4100 according to the fifth embodiment includes a hard disk controller, a magnetic disk apparatus, and a read/write channel which includes a read channel and a write channel. In the read channel, a data detection processing for removing intersymbol interference or an RS decoding for correcting/detecting the error contained in the detected data sequence is performed as a decoding processing. In the data detection processing, SOVA for achieving a high detection performance for the white noise, DDNP-SOVA for achieving a high detection performance for the colored noise or the like is generally used.

However, a problem arises where, at a stage when a data sequence is read out from the magnetic disk apparatus, it is difficult to determine if the noise contained in the data sequence is white noise or colored noise, or the data sequence contains the both noises. Accordingly, there are cases where even if the data detection is done using any detection algorithm, the intersymbol interference will not be removed. In such a case, even if the error contained in the data sequence is corrected at a subsequence stage, the decoding characteristic thereof will be unstable. Thus, in the fifth embodiment of the present invention, a plurality of dada sequences detected by SOVA and DDNP-SOVA are at least generated and the decoding performance is stabilized by sequentially performing the decoding processing. Also, in the decoding processing, such data sequences as those in which the error contained in decoded sequences is small is to be decoded preferentially. Thus, high-speed decoding processing is realized. The detail thereof will be described later.

Referring to Figures, the fifth embodiment of the present invention will be described in detail hereinbelow.

Figure 38:
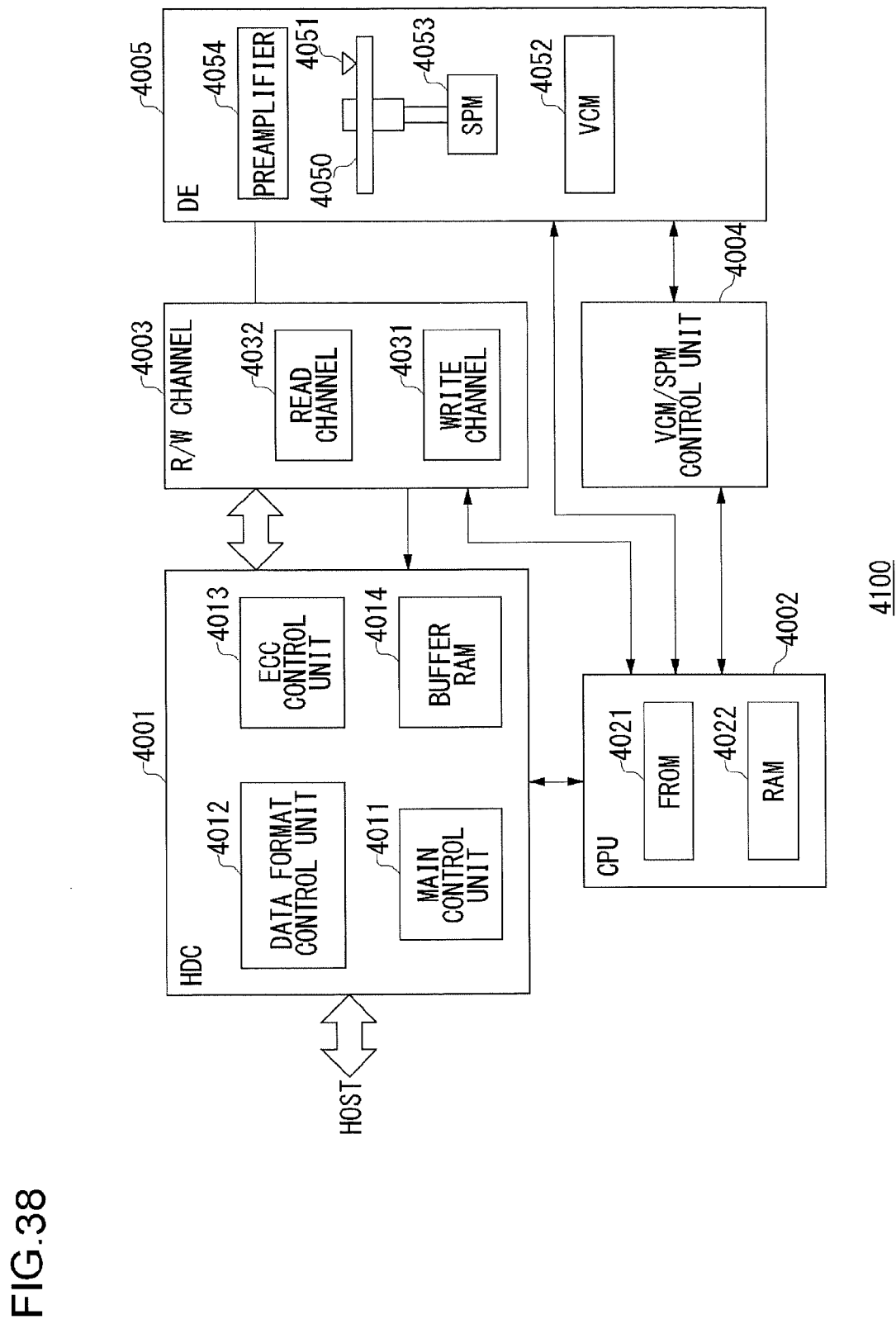
FIG. 38 is a diagram showing an exemplary structure of a storage system according to a fifth embodiment of the present invention.

FIG. 38 is a diagram showing an exemplary structure of a storage system 4100 according to the fifth embodiment of the present invention. The storage system 4100 in FIG. 38 is comprised roughly of a hard disk controller 4001 (hereinafter abbreviated as "HDC 4001"), a central processing arithmetic unit 4002 (hereinafter abbreviated as "CPU 4002"), a read/write channel 4003 (hereinafter abbreviated as "R/W channel 4003"), a voice coil motor/spindle motor controller 4004 (hereinafter abbreviated as "VCM/SPM controller 4004"), and a disk enclosure 4005 (hereinafter abbreviated as "DE 4005"). Generally, an HDC 4001, CPU 4002, R/W channel 4003, and VCM/SPM controller 4004 are structured on a single substrate.

The HDC 4001 includes a main control unit 4011 for controlling the whole HDC 4001, a data format control unit 4012, an error correction coding control unit 4013 (hereinafter abbreviated as "ECC control unit 4013") and a buffer RAM 4014. The HDC 4001 is connected to a host system via a not-shown interface unit. It is also connected to the DE 4005 via the R/W channel 4003, and carries out data transfer between the host and the DE 4005 according to the control by the main control unit 4011. Inputted to this HDC 4001 is a read reference clock (RRCK) generated by the R/W channel 4003. The data format control unit 4012 converts the data transferred from the host into a format that is suited to record it on a disk medium 4050 and also converts the data reproduced by the disk medium 4050 into a format that is suited to transfer it to the host. The disk medium 4050 includes a magnetic disk, for example. The buffer RAM 4014 stores temporarily data transferred from the host and transfers it to the R/W channel 4003 with proper timing. Also, the buffer RAM 4014 stores temporarily the read data transferred from the R/W channel 4003 and transfers it to the host with proper timing after the completion of ECC decoding or the like.

The ECC control unit 4013 appends redundancy symbols, using data to be recorded as information symbols, in order to enable the correction and detection of errors contained in data reproduced from the disk medium 4050. The ECC control unit 4013 also determines if any error has occurred in reproduced data and corrects the error if there is any. If the error cannot be corrected or if the error is detected by CRC (Cyclic Redundancy Code) and the like, the decoding processing will be performed on the other data sequences depending on the degree thereof. The detail will be described later. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the Reed-Solomon (RS) code for ECC, the number of errors correctable will be (the number of redundancy symbols/2).

The CPU 4002 includes a flash ROM 4021 (hereinafter abbreviated as "FROM 4021") and a RAM 4022, and is connected to the HDC 4001, R/W channel 4003, VCM/SPM controller 4004, and DE 4005. The FROM 4021 stores an operation program for the CPU 4002.

The R/W channel 4003, which is roughly divided into a write channel 4031 and a read channel 4032, transfers data to be recorded and reproduced data to and from the HDC 4001. Connected to the DE 4005, the R/W channel 4003 also performs transmission of recorded signals and reception of reproduced signals. The detail will be discussed later.

The VCM/SPM controller 4004 controls a voice coil motor 4052 (hereinafter abbreviated as "VCM 4052") and a spindle motor 4053 (hereinafter abbreviated as "SPM 4053") in the DE 4005.

The DE 4005, which is connected to the R/W channel 4003, performs reception of recorded signals and transmission of reproduced signals. The DE 4005 is also connected to the VCM/SPM controller 4004. The DE 4005 includes a disk medium 4050, a head 4051, a VCM 4052, an SPM 4053, a preamplifier 4054 and so forth. In the storage system 4100 of FIG. 38, it is so assumed that there is one disk medium 4050 and the head 4051 is disposed only on one side of the disk medium 4050, but the arrangement may be such that a plurality of disk mediums 4050 are formed in a stacked structure. Also, the head 4051 is generally provided corresponding to each face of the disk medium 4050. The recorded signals transmitted from the R/W channel 4003 are supplied to the head 4051 by way of the preamplifier 4054 in the DE 4005 and then recorded on the disk medium 4050 by the head 4051. Conversely, the signals reproduced from the disk medium 4050 by the head 4051 are transmitted to the R/W channel 4003 by way of the preamplifier 4054. The VCM 4052 in the DE 4005 moves the head 4051 in a radial direction of the disk medium 4050 to position the head 4051 at a target position on the disk medium 4050. The SPM 4053 rotates the disk medium 4050.

Figure 39:
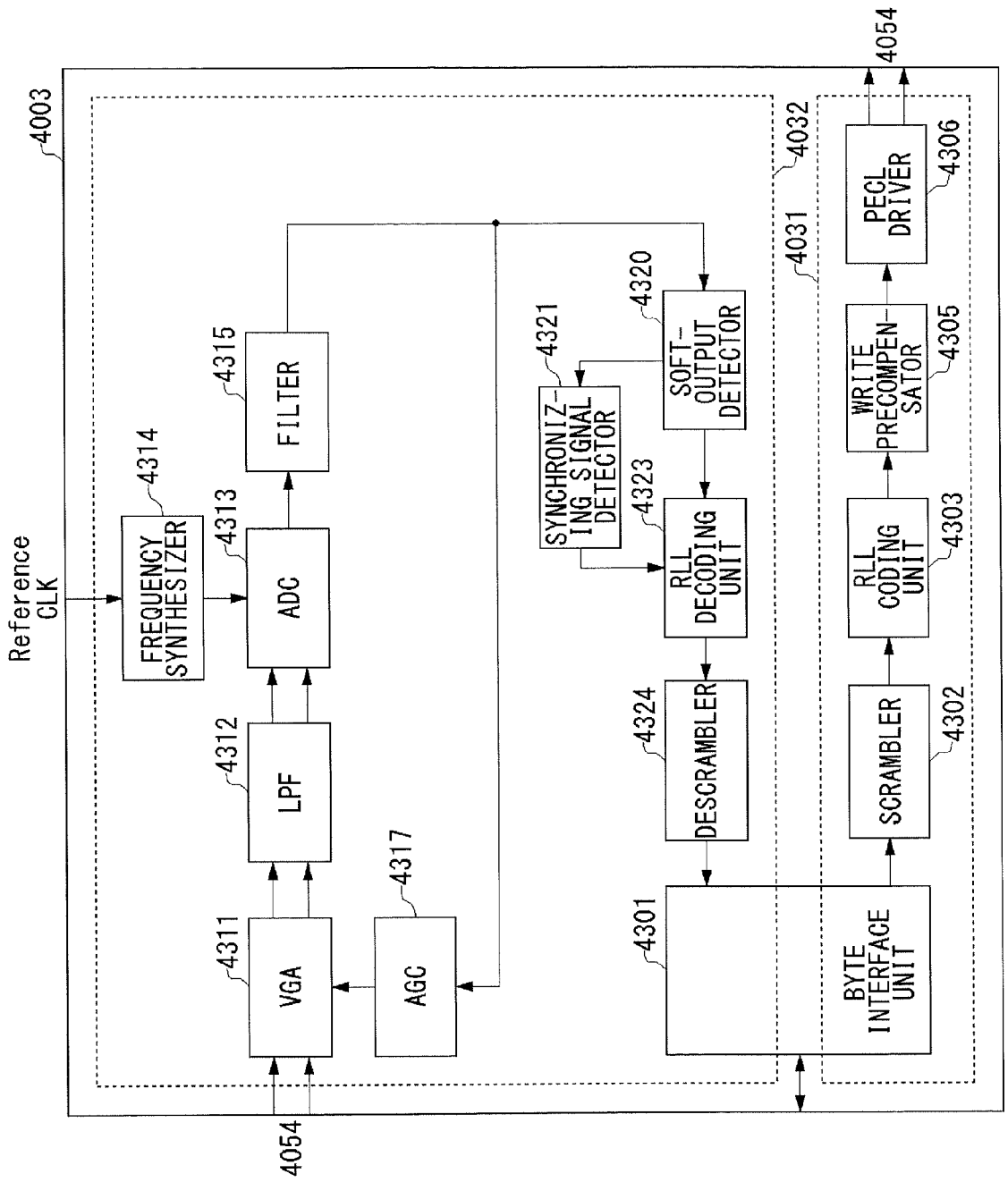
FIG. 39 is a diagram showing a structure of an R/W channel shown in FIG. 38.

Referring now to FIG. 39, a description will be given of the R/W channel 4003. FIG. 39 is a diagram showing a structure of the R/W channel 4003 shown in FIG. 38. The R/W channel 4003 is comprised roughly of a write channel 4031 and a read channel 4032.

The write channel 4031 includes a byte interface unit 4301, a scrambler 4302, a run-length limited coding unit 4303 (hereinafter abbreviated as "RLL coding unit 4303"), a write compensation unit 4305 (hereinafter referred to as "write precompensator 4305"), and a driver 4306.

At the byte interface unit 4301, data transferred from the HDC 4001 are processed as input data. Data to be written onto the medium are inputted from the HDC 4001 sector by sector. At this time, not only user data (512 bytes) for one sector but also ECC bytes added by the HDC 4001 are also inputted simultaneously. The data bus, which is normally 1 byte (8 bits) long, is processed as input data by the byte interface unit 4301. The scrambler 4302 converts write data into a random sequence. The repetition of data of the same pattern is designed to remove any adverse effects on detection performance at reading, which may deteriorate the error rate.

The RLL coding unit 4303 is used to limit the maximum runlength of 0's. By limiting the maximum length of consecutive 0's, data are turned into a data sequence appropriate for an automatic gain controller 4317 (hereinafter abbreviated as "AGC 4317") and the like.

The write precompensator 4305 is a circuit for compensating the nonlinear distortion resulting from the continuation of magnetization transition on the medium. The write precompensator 4305 detects a pattern necessary for compensation from write data and preadjusts the write current waveform in such a manner as to cause magnetization transition in correct positions. The driver 4306 outputs signals corresponding to a pseudo ECL level. The output from the driver 4306 is sent to the not-shown DE 4005 and then sent to the head 4051 by way of the preamplifier 4054 before the write data are recorded on the disk medium 4050. The read channel 4032 includes a variable gain amplifier 4311 (hereinafter abbreviated as "VGA 4311"), a low-pass filter 4312 (hereinafter abbreviated as "LPF 4312"), an AGC 4317, a analog-to-digital converter 4313 (hereinafter abbreviated as "ADC 4313"), a frequency synthesizer 4314, a filter 4315, a soft-output detector 4320, a synchronizing signal detector 4321, a run-length-limited decoding unit 4323 (hereinafter abbreviated as "RLL decoding unit 4323"), and a descrambler 4324.

The VGA 4311 and AGC 4317 adjust the amplitude of the read waveform of data sent from a not-shown preamplifier 4054. The AGC 4317 compares an actual amplitude with an ideal amplitude and determines a gain to be set for the VGA 4311. The LPF 4312, which can adjust the cut-off frequency and boost amount, plays a partial role in reducing high-frequency noise and performing equalization on a partial response (hereinafter abbreviated as "PR") waveform. In the equalization to a PR waveform by the LPF 4312, it is difficult to carry out a perfect equalization of analog signals by an LPF because of a number of factors including variation in head lift, nonuniformity of the medium, and variation in motor speed. Hence, equalization to the PR waveform is carried out again by a filter 4315 located in a subsequent position and having greater flexibility. The filter 4315 may have a function of adjusting its tap coefficient in an adaptable manner. The frequency synthesizer 4314 generates a sampling clock for the ADC 4313.

The ADC 4313 is of a structure to acquire a synchronous samples directly by A-D conversion. Note that in addition to this structure, the structure may be one to acquire asynchronous samples by A-D conversion. In such a case, a zero phase restarter, a timing controller, and an interpolation filter may be further provided in positions subsequent to the ADC 4313. Since a synchronous sample needs to be obtained from the asynchronous sample, such a function is performed by these blocks. The zero phase restarter, which is a block for determining an initial phase, is used to acquire a synchronous sample as quickly as possible. After the determination of the initial phase, the timing controller detects a phase shift by comparing an actual sample value against an ideal sample value. This phase shift is used to determine the parameter for the interpolation filter, and thus a synchronous sample can be obtained.

The soft-output detector 4320 detects data sequences by using the SOVA, which is a kind of Viterbi algorithm, in order to avoid the deterioration of decoding characteristics resulting from intersymbol interference. Along with the rise in recording density of magnetic disk apparatus in recent years, interference between recorded codes increases. As a result, decoding characteristics deteriorate. To overcome this, a Partial Response Maximum Likelihood (hereinafter abbreviated as "PRML") method, which utilizes the partial response due to intersymbol interference, is used. The PRML is a method for obtaining a signal sequence that maximizes the likelihood of the partial response of reproduced signals. Also, a plurality of signal sequences to be decoded are generated using the detected data sequences. The detail will be given later.

When the SOVA method is used in the soft-output detector 4320, the soft-output detector 4320 outputs a soft-decision value. Assume, for instance, that soft-decision values (−0.71, +0.18, +0.45, −0.45, −0.9) have been outputted as SOVA outputs. These values numerically represent their likelihood of being "0" or their likelihood of being "1". For example, the first value of "−0.71" signifies a strong likelihood of being 1, whereas the second value of "+0.18" is more likely to be 0 but is also significantly likely to be 1. The output of a conventional Viterbi detector is hard values, which are the results of hard decision of SOVA output. In the case of the above example, the values will be (1, 0, 0, 1, 1). The hard values, which represent either 0 or 1, no longer have the information suggesting the likelihood of being 0 or 1. Accordingly, the inputting of the soft-decision values to the LDPC repeat decoding unit 4322 can realize improved decoding performance.

The RLL decoding unit 4323 restores the data outputted from the soft-output detector 4320 to the original data sequence by carrying out a reverse operation of the RLL coding unit 4303 of the write channel 4031 thereon. The descrambler 4324 restores the original data sequence by carrying out a reverse operation of the scrambler 4302 of the write channel 3031. The data generated here are transferred to the HDC 4001.

Figure 40:
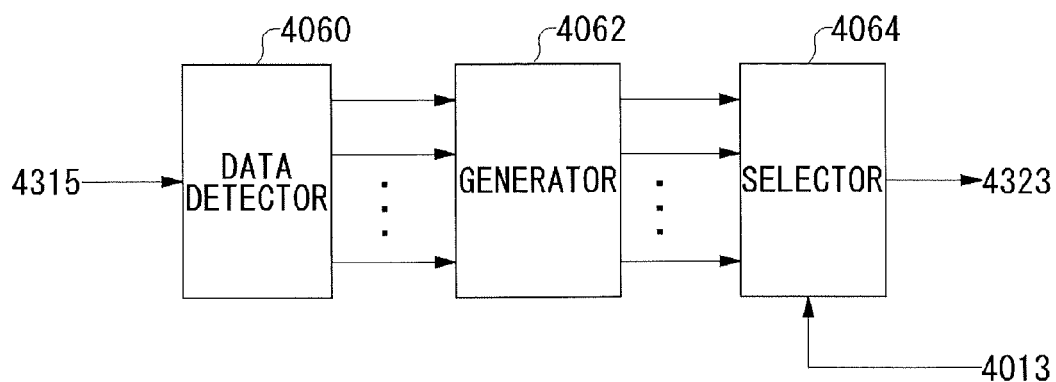
FIG. 40 is a diagram showing an exemplary structure of a soft-output detector shown in FIG. 39.
Figure 41:
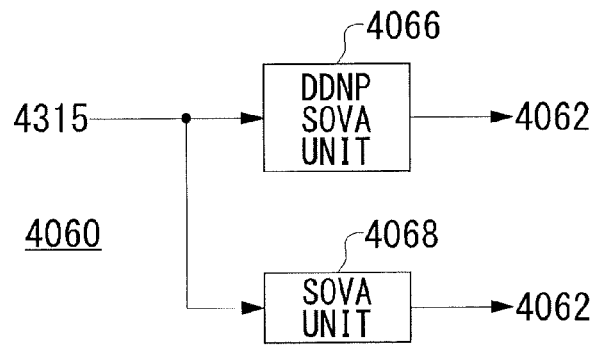
FIG. 41 is a diagram showing an exemplary structure of a data detector shown in FIG. 40.

FIG. 40 is a diagram showing an exemplary structure of the soft-output detector 4320 shown in FIG. 39. The soft-output detector 4320 includes a data detector 4060, a generator 4062, and a selector 4064. The data detector 4060 inputs a data sequence. The inputted data sequence may be a single data sequence or a plurality of data sequences. FIG. 41 is a diagram showing an exemplary structure of the data detector 4060 of FIG. 40. The data detector 4060 includes a DDNP-SOVA unit 4066 and an SOVA unit 4068. The DDNP-SOVA unit 4066 performs a Viterbi algorithm (DDNP-SOVA), having a function to predict noise occurring depending on the signals in the past or the noise, on the inputted signal so as to detect a data sequence. The SOVA unit 4068 performs a soft-decision Viterbi algorithm on the inputted signal so as to detect a data sequence. It is to be noted that the data detector 4060 may be comprised of a data detection apparatus other than the DDNP-SOVA unit 4066 and the SOVA unit 4068. For example, it may be comprised of a data detection apparatus which executes the data detection by using a normal Viterbi algorithm that outputs hard-decision values. The data detector 4060 may further comprise a data detection apparatus that uses the normal Viterbi algorithm.

Refer back to FIG. 40. The generator 4062 generates a plurality of different signal sequences from the data sequence inputted by the data detector 4060. The plurality of signal sequences are generated by performing a signal processing, described later, on one or more data sequences. Before a decoding processing is executed by a subsequent-stage decoding method, all the signal sequences may be generated in advance. Also, a signal sequence to be decoded may be generated every time the necessity of performing a decoding processing or redecoding processing arises. The selector 4064 selects one signal sequence from among a plurality of signal sequences generated by the generator 4062. The selector 4064 may preferentially select a signal sequence having a high probability that the error can be corrected by the ECC control unit 4013 of FIG. 38. More specifically, the selector 4064 may preferentially select a signal sequence corresponding to a data sequence detected using DDNP-SOVA, from among a plurality of signal sequences generated by the generator 4062. Also, the selector 4064 may select a signal sequence different from the signal sequences which have already been selected, according to an instruction given from the ECC control unit 4013. Accordingly, a plurality of signal sequences are to be decoded, so that the decoding performance can be stabilized irrespective of the noise characteristics. In other words, a plurality of noise characteristics are estimated beforehand and the signal sequences which are robust against the assumed noise characteristics are generated, so that the decoding performance can be improved within a range of the expected noise characteristic.

Here, a description is given of a case where the signal sequences are generated using two data sequences outputted from two data detectors shown in FIG. 41. A description is given hereinbelow of ten signal sequences where a probability that the error can be corrected by the control unit 4013 of FIG. 38 is considered high. The order in which the selection is made in the selector 4064 does not necessarily starts from the first signal sequence as described later, but may be set arbitrarily.

The generator 4062 represents the soft-decision values contained in a soft-decision valued data sequence outputted from the DDNP-SOVA 4066 shown in FIG. 41, by hard-decision values, respectively, so as to generate a signal sequence (hereinafter denoted by "first signal sequence"). Also, the generator 4062 performs the similar processing on a data sequence, which is of soft-decision values, outputted from the SOVA unit 4068 so as to generate a signal sequence (hereinafter denoted by "second signal sequence"). The representation by hard-decision values is executed in a manner that whether a soft-decision value is larger than a predetermined threshold or not is determined and, as a result this determination, the soft-decision value is substituted by a 0 or 1 bit. For example, when soft-decision values lie in a range of $-\alpha$ to $+\alpha$ ($\alpha>0$) and the threshold value is 0, it will be substituted by 0 if a soft-decision value is positive and it will be substituted by 1 if the soft-decision value is negative. When hard-decision values lie in a range of 0 to $+\beta$ ($\beta>0$), the threshold value may be set to $\beta/2$. The representations by these hard-decision values (hereinafter denoted as "first correction decision algorithm") is achieved with a simplified structure, so that the circuit scale can be reduced.

The generator 4062 searches a degree of reliability having a value smaller than a predetermined threshold value, among a plurality of degrees of reliability contained in the data sequences inputted by the DDNP-SOVA unit 4066 of FIG. 41. Further, a signal sequence (hereinafter denoted by "third signal sequence") is generated by inverting "0" and "1" of a bit corresponding to the searched degree of reliability in a sequence where a soft-decision value is represented by a hard-decision value. Also, the generator 4062 performs the similar processing on a data sequence, which is of soft-decision values, outputted from the SOVA unit 4068 so as to generate a signal sequence (hereinafter denoted by "fourth signal sequence"). The representation by these hard-decision values (hereinafter denoted as "second correction decision algorithm") is achieved with a simplified structure, so that the circuit scale can be reduced. Also, the decision values having a high probability of containing error are corrected, so that the error rate in the decoded sequences outputted from the decoder 4070 of FIG. 42 can be improved.

A description is now given using a specific example. Degrees of reliability contained in a data sequence are shown as follows.

{9 1 1 1 5 7 3 3 6 9}

Indicated as follows is a data sequence represented by hard decision.

{1 0 0 1 1 1 0 0 0 1}

Assume here that a threshold value is 4. Then a data sequence generated using the second correction decision algorithm is expressed as follows.

As shown below, the second to the fourth and the seventh and the eighth bit in the above expression will be modified as follows.

{1 1 1 0 1 1 1 1 0 1}

The generator 4062 searches an interval in which degrees of reliability having values smaller than a predetermined threshold value are arranged successively for more than a predetermined number, among a plurality of degrees of reliability contained in the data sequences inputted by DDNP-SOVA unit 4066. Further, a signal sequence (hereinafter denoted by "fifth signal sequence") is generated by inverting "0" and "1" of a bit corresponding to the searched degree of reliability in a sequence where soft-decision values are represented by hard-decision values. Also, the generator 4062 performs the similar processing on a data sequence, which is of soft-decision values, outputted from the SOVA unit 4068 so as to generate a signal sequence (hereinafter denoted by "sixth signal sequence"). The representation by these hard-decision values (hereinafter denoted as "third correction decision algorithm") is achieved with a simplified structure, so that the circuit scale can be reduced. Also, the interval containing the error is corrected in a focused manner, so that burst errors can be reduced and therefore the error rate in the decoded sequences outputted from the decoder 4070 of FIG. 42 can be improved.

A description is now given using a specific example. Degrees of reliability contained in a data sequence are shown as follows.

{9 1 1 1 5 7 3 3 6 9}

Indicated as follows is a data sequence represented by hard decision.

{1 0 0 1 1 1 0 0 0 1}

Assume here that the threshold value is 4 and the predetermined number is 3. Then a data sequence generated using the third correction decision algorithm is expressed as follows. As shown below, the second, the third and fourth bit in the above expression will be modified as follows.

{1 1 1 0 1 1 0 0 0 1}

If the signs of adjacent soft-decision data differ respectively in an interval longer than a predetermined length among data sequences inputted by the DDNP-SOVA unit 4066 of FIG. 41, the generator 4062 will invert the sign of the soft-decision data corresponding to the interval. Thereafter, a signal sequence (hereinafter denoted by "seventh signal sequence") is generated by representing the soft-decision data in soft-decision values. "If the signs of adjacent soft-decision data differ respectively" includes, for example, "010101 . . . " or "101010 . . . " if soft-decision data are represented by hard-decision data. Also, the generator 4062 performs the similar processing on a data sequence, which is of soft-decision values, outputted from the SOVA unit 4068 so as to generate a signal sequence (hereinafter denoted by "eighth signal sequence"). The representation by these hard-decision values (hereinafter denoted as "fourth correction decision algorithm") is achieved with a simplified structure, so that the circuit scale can be reduced. Also, a pattern having a likelihood of containing error is corrected, so that the error rate in the decoded sequences outputted from the decoder 4070 of FIG. 42 can be improved.

A description is now given using a specific example. A data sequence represented by hard decision is shown below.

{0 0 1 0 1 1 0 1 1 0}

Assume here that the predetermined length is 4. Then a data sequence generated using the fourth correction decision algorithm is expressed as follows. As shown below, the second to the fifth bit in the above expression will be modified as follows.

{0 1 0 1 0 1 0 1 1 0}

Based on the hard-decision values of either one of two data sequences inputted by the DDNP-SOVA unit 4066 and the SOVA unit 4068 of FIG. 41, the generator 4062 corrects the hard-decision values of the other data sequence so as to generate a signal sequence. More specifically, for example, a data sequence of the DDNP-SOVA unit 4066 are used as a sequence to be corrected and the correction is done by the generator 4062 using a data sequence of the SOVA unit 4068. First, the generator 4062 compares hard-decision values of first data contained in a data sequence of the DDNP-SOVA unit 4066 with hard decision values of second data, contained in a data sequence of the SOVA unit 4068, which is present in position corresponding to the firs data. Here, if the two sequences differ, a signal sequence (hereinafter denoted by "ninth signal sequence") is generated in a manner that the first data different from the corresponding second data between data sequences of the DDNP-SOVA unit 4066 is substituted by the second data. The representation by the hard-decision values (hereinafter denoted as "fifth correction decision algorithm") is achieved with a simplified structure, so that the circuit scale can be reduced. Of two data sequences, one data is substituted by the other data in the data which are different from each other, so that the error rate in the decoded sequences outputted from the decoder 4070 of FIG. 42 can be improved.

A description is now given using a specific example. The hard-decision values of a data sequence outputted by the DDNP-SOVA unit 4066 are shown below.

{0 0 1 0 1 1 0 1 1 0}

The hard-decision values of a data sequence outputted by the SOVA unit 4068 are shown below.

{0 1 0 1 0 1 0 1 0 0}

Here, shown below is a sequence after correction in the case where the data sequence outputted by the DDNP-SOVA unit 4066 is used as a data sequence to be corrected.

{0 1 0 1 0 1 0 1 0 0}

The generator 4062 compares hard-decision values of first data contained in either one of two data sequences inputted by the DDNP-SOVA unit 4066 and the SOVA unit of FIG. 41, with the hard-decision values of second data, contained in the other data sequence, existing in position corresponding to the first data. Further, if as a result of the comparison the first data and the second data differ from each other and a condition "the degree of reliability of the second data—the degree of reliability of the first data>α (αbeing a predetermined value)" is met, the first value will be substituted by the second value, thus correcting the hard-decision values of the other data sequence. More specifically, the hard-decision values of a plurality of data contained in the data sequence of the DDNP-SOVA unit 4066 and the hard decision values of a plurality of data contained in the data sequence of the SOVA unit 4068 are compared with data corresponding respectively thereto. As a result of comparison where they differ from each other, the data corresponding to the degree of reliability 2 in a case of "the degree of reliability—degree of reliability 2>α" is substituted by the hard-decision values of data corresponding to the degree of reliability 1. Thereby a signal sequence (hereinafter denoted by "tenth signal sequence") is generated. The representation by the hard-decision values (hereinafter denoted as "sixth correction decision algorithm") is achieved with a simplified structure, so that the circuit scale can be reduced. Of two data sequences, data contained in either one of the data sequences is substituted by data considered to have less error, so that the error rate in the decoded sequences outputted from the decoder 4070 of FIG. 42 can be improved.

A description is now given using a specific example. The degrees of reliability and the hard-decision values of a data sequence outputted by the DDNP-SOVA unit 4066 are shown below, respectively.

{3 4 6 5 5 1 1 5 2 4}
{0 0 1 0 1 1 1 1 1 1}

Also, the degree of reliability and the hard-decision values of a data sequence outputted by the SOVA unit 4068 are shown below, respectively.

{3 2 5 2 3 3 4 5 4 6}
{0 1 0 1 0 1 0 1 0 0}

Also, shown below is a sequence after having been corrected based on the sixth correction decision algorithm.

{0 0 1 0 1 1 0 1 0 0}

The above-described first correction decision algorithm to the sixth correction decision algorithm may be combined so as to derive new correction decision algorithms. Thereby, the types of and the number of signal sequences which can be generated can be increased. For example, it goes without saying that if the third and the fourth correction decision algorithm are combined respectively with the fifth and the sixth correction decision algorithm, the signal sequence will be generated under more severe condition. In this case, decoding candidates in the ECC control unit 4013 can be increased and therefore the decoding stability can be enhanced. Preferably, the new correction decision algorithm may be a combination of the second and the third correction decision algorithm, a combination of the second, the third and the fourth correction decision algorithm or a combination of the fourth and the sixth correction decision algorithm.

Figure 42:
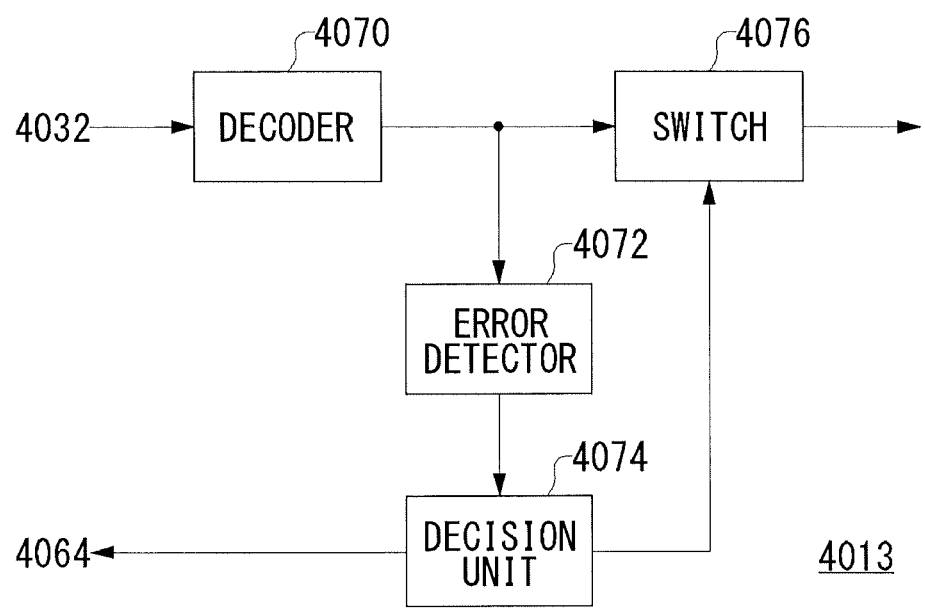
FIG. 42 is a diagram showing an exemplary structure of an ECC control unit shown FIG. 38.

FIG. 42 is a diagram showing an exemplary structure of the ECC control unit 4013 shown in FIG. 38. The ECC control unit 4013 includes a decoder 4070, an error detector 4072, a decision unit 4074 and a switch 4076. Note that the decoding-side structure only is shown here and the structure on the coding side is omitted. Here, the decoder 4070 is coupled to error detector 4072 or they may be formed as an integrated device. The decoder 4070 decodes the signal sequence selected by the selector 4064 of FIG. 40. The error detector 4072 checks to see whether the error can be corrected by the decoder 4070 or not, or it detects error using CRC. "The signal sequence selected by the selector 4064 of FIG. 40" includes a signal sequence outputted by way of the RLL decoding unit 4323 or the descrambler 4324 provided subsequent to the soft-output detector 4320 containing the selector 4064 of FIG. 40, and so forth.

If it is determined that the error has been corrected and it is determined by CRC and the like that no error is present, the decision unit 4074 will determine that a correct decoded result has been obtained. When it is determined that the correct decoded result has been obtained in the decision unit 4074, the output of the signal sequence decoded by the decoder 4070 is specified to the switch 4076. In other words, the switch 4076 will not output the signal inputted from the decoder 4070 until an instruction is given. If it is determined that the correct decoded result has not been obtained in the decision unit 4074, the selection of another signal sequence different from the signal sequence that has already been selected by the selector 4064 is specified and the signal sequence newly selected by the selector 4064 again undergoes processing by the decoder and the subsequent. Here, "is specified" may indicate that the ECC control unit 4013 specifies to the switch 4076 or the selector 4064 directly or specifies by way of a not-shown controller.

In terms of hardware, these structures described as above can be realized by a CPU, a memory and other LSIs of an arbitrary computer. In terms of software, it can be realized by memory-loaded programs which have communication functions and the like, but drawn herein are function blocks that are realized in cooperation with those. Hence, it is understood by those skilled in the art that these function blocks can be realized in a variety of forms such as by hardware only, software only or the combination thereof.

Figure 43:
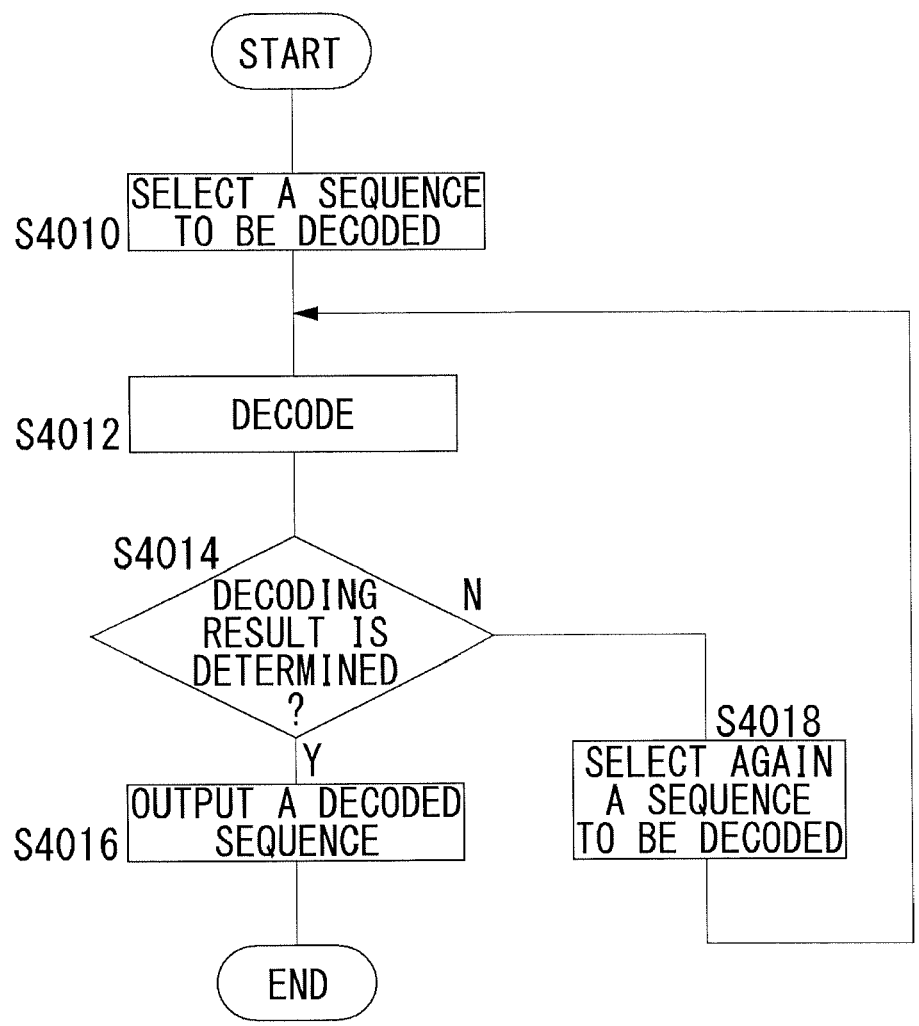
FIG. 43 is a flowchart showing operation examples of a selector shown in FIG. 40 and an ECC control unit shown in FIG. 42.

FIG. 43 is a flowchart showing an operation example of the selector 4064 shown in FIG. 40 and the ECC control unit 4013 shown in FIG. 42. First, the selector 4064 selects a signal sequence to be decoded (S4010). Then, a decoding processing is performed in the ECC control unit 4013 (S4012). Then, whether a correct decoded result is obtained or not is determined in the ECC control unit 4013 (S4014). If it is determined that the correct decoded result has been obtained (Y of S4014), the decision unit 4074 will instruct the switch 4076 to output the decoded sequence outputted from the decoder 4070 intact (S4016) and the processing is terminated. If it is determined that the correct decoded result has not been obtained (N of S4014), the selector 4064 will select a signal sequence to be decoded and repeat the processing from S4012 onward (S4018).

Here, in the selection in S4010 or S4018, a signal sequence having a high probability that the error can be corrected as a result of decoding is given priority. However, the order do not always has to be set in this manner and it may be set arbitrarily. For example, the selection order is so set that the above-described first signal sequence is first selected and then the second signal sequence, the third signal sequence, . . . and the tenth signal sequence are selected in sequence until it is determined that the correct decoded result has been obtained. In this case, the order in which the selection is made may be defined by the numbers of the signal sequences, or it may be defined by the above-described first correction decision algorithm to sixth correction decision algorithm.

Figure 44:
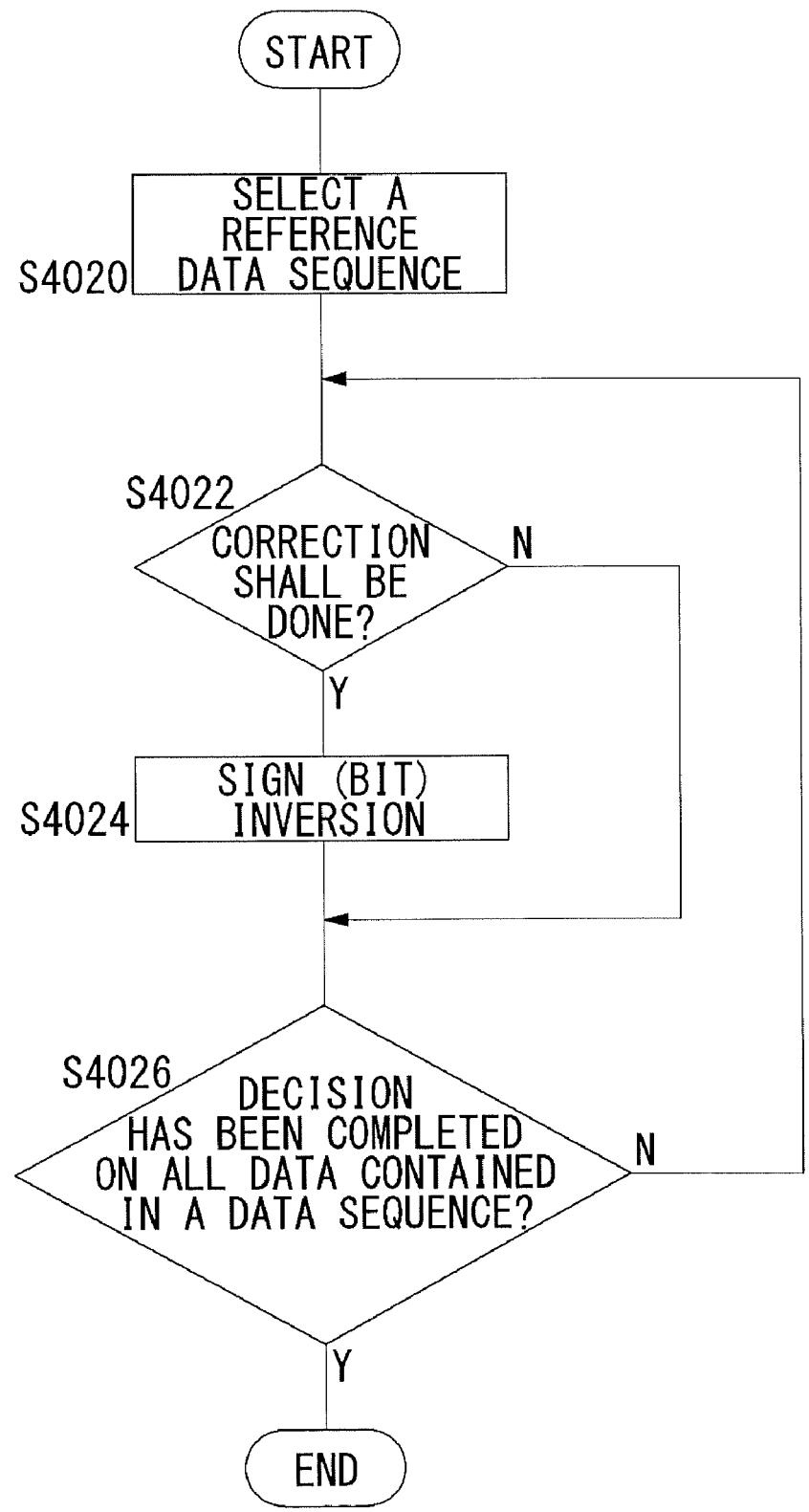
FIG. 44 is a flowchart showing an operation example of a generator shown in FIG. 40.

FIG. 44 is a flowchart showing an operation example of the generator 4062 shown in FIG. 40. The generator 4062 first generates a reference data sequence (S4020). The reference data sequence indicates a data sequence to be corrected and it means a data sequence outputted from either one of the DDNP-SOVA unit 4066 and the SOVA unit 4068. Then whether or not the data contained in the data sequence selected in S4020 are to be corrected one by one is determined (S4022). If it is determined in S4022 that correction is be done (Y of S4022), the sign of said data will be inverted and the processing will be moved on to S4036 (S4024). If it is determined that no correction is to be done (N of S4022), proceed with the processing of S4026. Then, whether decision on all the data contained in the data sequence has been completed or not is determined in S4026. And if it is determined that the decision has not been completed, the processing of S4022 and the subsequence processing will be performed repeatedly on data which have not yet been determined (S4026). On the other hand, if it is determined that the decision on all the data has been completed (Y of S4026), the processing comes to an end. Note that the above-described processing may be performed for each of correction decision algorithms which are to generate the signal sequence or it may be performed for each signal sequence. Thus, if a plurality of correction decision algorithms are used or when a plurality of signal sequences are to be generated, the flowchart shown in FIG. 44 will be repeatedly executed.

According to the present fifth embodiment, the decoding processing is repeated until a correct decoded result is obtained, so that the decoding performance in a decoder can be enhanced. Also, the decoding performance can be stabilized. The signal sequence having a high probability that error can be corrected is preferentially selected, so that the number of required repeating times of execution in a predetermined processing by the decoder and the subsequent can be reduced. Also, candidates to be decoded can be generated in plurality. Since a plurality of candidates are generated, the degree of certainty of decoding can be improved. A hard-decision value corresponding to a soft-decision value whose degree of reliability is low is corrected in the opposite direction. Thereby, the decoding characteristics can be improved. Also, a plurality of hard-decision sequences are corrected mutually, so that the signal sequences which are robust against both the noise characteristics can be generated. Thereby, The decoding characteristics can be improved. Also, a hard-decision value corresponding to a soft-decision value whose degree of reliability is low is corrected in the opposite direction. Thereby, the decoding characteristics can be improved. Also, there is provided a decoding unit having a stable and high decoding capability, so that access can be made faster to the storage system. Also, since there is no need to mount any unnecessary hardware, a semiconductor integrated circuit with a reduced circuit scale can be realized.

The present invention has been described based on the fifth embodiment. This fifth embodiment is merely exemplary and it is understood by those skilled in the art that various modifications to the combination of each component or process thereof or any mutual combination within the fifth embodiment are possible and such modifications are also within the scope of the present invention.

In the fifth embodiment, a description has been given where the ECC control unit 4013 is mounted inside the HDC. However, this should not be considered as limiting and it may be mounted inside the read-write channel. Also, the HDC and the read-write channel may be integrated as an LSI. Though a description has been given where the candidates are prepared using the SOVA, Viterbi may be used. In this case, the candidates may be prepared based on not soft-decision values but hard-decision values outputted from Viterbi.

The present fifth embodiment is not limited to the above-described structure and, for example, the decoding apparatus may further comprise: a read unit which reads out recorded information recorded in a disk and outputs it to the input unit; and a read status decision unit which determines a read status in the read unit. The read status decision unit determines disk characteristics such as the number of rotations of a disk or whether a read position is in an inner circumference or outer circumference. The read status decision unit may determine the characteristic of a GMR head placed over a disk, the characteristic of an A-D conversion unit inside the decoding apparatus placed subsequent to the disk or the temperature outside the apparatus. When these statuses have been determined, the selector may determine signals to be outputted, based on the statuses determined by the read status decision unit. For example, an output, from the input unit, indicating a better status than the other may be preferentially selected and outputted. According to such an embodiment, a satisfactory result can be obtained regardless of the status.

The present invention has been described based on the embodiments. The embodiments are merely exemplary and it is understood by those skilled in the art that various modifications to the combination of each component or process thereof or any mutual combination of embodiments and are possible and such modifications are also within the scope of the present invention.

What is claimed is:

1. A coding apparatus, comprising:
    a first run-length limited coding unit which generates a first coded sequence by subjecting a digital signal sequence to run-length limited coding;
    a signal processing unit which performs a predetermined signal processing on the digital signal sequence;
    a second run-length limited coding unit which generates a second coded sequence by subjecting the digital signal sequence, on which the predetermined signal processing has been performed by said signal processing unit, to run-length limited coding; and
    a DC component removal coding unit which selects and outputs either one of the first coded sequence generated by said first run-length limited coding unit and the second coded sequence generated by said second run-length limited coding unit.

2. A coding apparatus according to claim 1, wherein said signal processing unit performs bit inversion processing on each of a plurality of bits contained in the digital signal sequence.

3. A coding apparatus according to claim 1, wherein said signal processing unit rearranges the order of a plurality of bits contained in the digital signal sequence.

4. A coding apparatus according to claim 1,
    said DC component removal coding unit including:
        a coded sequence selection unit which selects either one of the first coded sequence and the second coded sequence;
        a selection identifying information generator which generates selection identifying information that indicates a coded sequence selected by the coded sequence selection unit; and
        an identification information adding unit which adds the selection identifying information generated by the selection identifying information generator, to any position of the coded sequence selected by the coded sequence selection unit.

5. A coding apparatus according to claim 4, the coded sequence selection unit including:
    a first coupling unit which connects a coded sequence, which has already been selected by the coded sequence selection unit, with the first coded sequence; and
    a second coupling unit which connects a coded sequence, which has already been selected by the coded sequence selection unit, with the second coded sequence,
    wherein the coded sequence selection unit sets the sequence connected by the first coupling unit as a new first coded sequence and sets the sequence connected by the second coupling unit as a new second coded sequence, and selects either one of the new coded sequences.

6. A coding apparatus according to claim 1, further comprising:
    a first adding unit which adds a first decision bit to any of positions in the first coded sequence outputted from said first run-length limited coding unit; and
    a second adding unit which adds a second decision bit, where the first decision bit is bit-inverted, to any of positions in the second coded sequence outputted from said second run-length limited coding unit.

7. A coding apparatus according to claim 4, the coded sequence selection unit including:

a first rate calculation unit which calculates a ratio of the number of bits indicating 0 and that of bits indicating 1 among a plurality of bits contained in the first coded sequence;

a second rate calculation unit which calculates a ratio of the number of bits indicating 0 and that of bits indicating 1 among a plurality of bits contained in the second coded sequence; and a selection output unit which selects a coded sequence corresponding to either the ratio calculated in the first rate calculation unit or the ratio calculated in the second rate calculation unit whichever is closer to 50% and which outputs the selected sequence.

8. A coding apparatus according to claim 4, the coded sequence selection unit including:

a first summation unit which adds up a plurality of bits contained in the first coded sequence and generates a first summation value;

a second summation unit which adds up a plurality of bits contained in the second coded sequence and generates a second summation value a coded sequence detector which compares an absolute value of the first summation value generated by the first summation unit with an absolute value of the second summation value generated by the second summation unit, and which detects a coded sequence corresponding to a smaller summation value either in the first coded sequence or the second coded sequence; and a selection output unit which selects the coded sequence detected by the sequence detector from the first coded sequence and the second coded sequence and which outputs the selected coded sequence.

9. A coding apparatus according to claim 4, the coded sequence selection unit including:

a first additive shift unit which shifts and adds a plurality of bits contained in the first coded sequence and which generates first additive shift values the number of which is equal to the number of the plurality of bits;

a first maximum value detector which detects a maximum value in a plurality of first additive shift values generated by the first additive shift unit;

a second additive shift unit which shifts and adds a plurality of bits contained in the second coded sequence and which generates second additive shift values the number of which is equal to the number of the plurality of bits;

a second maximum value detector which detects a maximum value in a plurality of second additive shift values generated by the second additive shift unit;

a coded sequence detector which compares the maximum value detected by the first maximum value detector and the maximum value detected by the second maximum value detector and which detects either the first coded sequence or the second coded sequence whichever corresponds to a smaller maximum value; and a selection output unit which selects either the first coded sequence or the second coded sequence whichever is detected by the coded sequence detector and which outputs the selected sequence.

10. A decoding apparatus, comprising:

an input unit which inputs a coded sequence to which a predetermined decision bit is added;

a decision-bit acquiring unit which acquires the predetermined decision bit added to the coded sequence inputted by said input unit;

a run-length limited decoding unit which performs a run-length limited decoding on the coded sequence inputted by said input unit so as to generate a digital signal sequence;

a signal processing unit which performs either a processing in which a plurality of bits contained in the digital signal sequence generated by said run-length limited decoding unit are bit-inverted, respectively, according to the decision bit acquired by said decision-bit acquiring unit or a processing in which a plurality of bits contained in the digital signal sequence are outputted intact.

11. A decoding apparatus according to claim 10, wherein said signal processing unit performs a processing of interchanging the order of a plurality of bits contained in the digital sequence, in place of bit-inverting and outputting a plurality of bits contained in the digital signal sequence, respectively.

12. A signal processing apparatus including a coding unit and a decoding unit, the coding unit including:

a first run-length limited coding unit which generates a first run-length coded sequence by subjecting a digital signal sequence to run-length limited coding;

a first signal processing unit which performs bit inversion processing on each of a plurality of bits contained in the digital signal sequence without changing the number of a plurality of bits contained in the digital signal sequence;

a second run-length limited coding unit which generates a second coded sequence by subjecting the digital signal sequence, on which the bit inversion processing has been performed by the signal processing unit, to run-length limited coding;

a first adding unit which adds a first decision bit to any of positions in the first coded sequence outputted from the first run-length limited coding unit;

a second adding unit which adds a second decision bit, where the first decision bit is bit-inverted, to any of positions in the second coded sequence outputted from the second run-length limited coding unit; and a DC component removal coding unit which selects and outputs either one of the first coded sequence generated by the first run-length limited coding unit and the second coded sequence generated by the second run-length limited coding unit, and the decoding unit including:

an input unit which inputs a coded sequence to which the first decision bit or the second decision bit is added;

a decision-bit acquiring unit which acquires either one of the first decision bit and the second decision bit added to the coded sequence inputted by the input unit;

a run-length limited decoding unit which performs a run-length limited decoding on the coded sequence inputted by the input unit so as to generate a decoded signal sequence; and a second signal processing unit which outputs the decoded signal sequence generated by the run-length limited decoding unit, intact when the decision bit acquired by the decision-bit acquiring unit is the first decision bit and which outputs the signal sequence generated by performing the bit inversion on a plurality of bits contained in the decoded signal sequence generated by the run-length limited decoding unit when the decision bit acquired by the decision-bit acquiring unit is the second decision bit.

13. A signal storage system comprising a write channel for writing data to a storage apparatus and a read channel for reading out the data stored in the storage apparatus,
    said write channel including:
        a first coding unit which performs a run-length limited coding on the data;
        a second coding unit which codes the data coded by the first coding unit using a low-density parity check code; and
        a write unit which writes the data coded by second coding unit to the storage apparatus, and
    said read channel including:
        an input unit which inputs an analog signal outputted from the storage apparatus;
        an analog-to-digital converter which converts the analog signal inputted from the input unit into a digital so as to be outputted;
        a soft-output detector which calculates a likelihood of the digital signal outputted from the analog-to-digital converter and outputs a soft-decision value;
        a first decoding unit, compatible with the second coding unit, which decodes data outputted from the soft-output detector; and
        a second decoding unit, compatible with the first coding unit, which decodes data decoded by the first decoding unit, and
    the first coding apparatus including:
        a first run-length limited coding unit which generates a first run-length coded sequence by subjecting a digital signal sequence to run-length limited coding;
        a first signal processing unit which performs a predetermined processing on the digital signal sequence without changing the number of a plurality of bits contained in the digital signal sequence;
        a second run-length limited coding unit which generates a second coded sequence by subjecting the digital signal sequence, on which the predetermined processing has been performed by the first signal processing unit, to run-length limited coding; and
        a DC component removal coding unit which selects and outputs either one of the first coded sequence generated by the first run-length limited coding unit and the second coded sequence generated by the second run-length limited coding unit, and
    the second decoding unit including:
        a run-length limited decoding unit which performs a run-length limited decoding on the data decoded by the first decoding unit so as to generate a digital signal sequence; and
        a second signal processing unit which performs either a processing in which for the digital signal sequence generated by the run-length limited decoding unit a plurality of bits contained in the digital signal sequence are bit-inverted, respectively, according to the selection by the DC component removal coding unit or a processing in which a plurality of bits contained in the digital signal sequence is outputted intact.

14. A storage system according to claim 13, further comprising a storage apparatus which stores data; and a control unit which controls a write to and a read from the storage apparatus,
    wherein said read channel reads the data stored in the storage apparatus according to an instruction of the control unit, and
    wherein said write channel writes coded data to the storage apparatus according to an instruction of the control unit.

15. A signal coding apparatus according to claim 1, wherein said apparatus is integrated on a single semiconductor substrate.

16. The coding apparatus of claim 1, wherein the signal processing unit performs the predetermined signal processing on the digital signal sequence without changing the number of a plurality of bits contained in the digital signal sequence.

17. A coding apparatus according to claim 1, wherein said first run-length limited coding unit and said run-length limited coding unit are of an identical structure.

18. A coding apparatus according to claim 16 wherein said signal processing unit inverts at least part of bits in a plurality of bits contained in the digital signal sequence.

19. A signal coding apparatus, comprising:
    a run-length limited coding unit which generates a run-length coded sequence by subjecting a predetermined signal sequence to run-length limited coding; and
    a Reed-Solomon coding unit which performs Reed-Solomon coding on the run-length limited coded sequence generated by said run-length limited coding unit,
    said Reed-Solomon coding unit including:
        a redundancy sequence generator which generates a redundancy sequence used to perform Reed-Solomon coding on the run-length coded sequence; and
        a redundancy sequence adding unit which adds the redundancy sequence generated by the redundancy sequence generator, to the run-length coded sequence.

20. The coding apparatus of claim 1, further comprising:
    a Reed-Solomon coding unit which generates a redundancy sequence by performing Reed-Solomon coding on the run-length coded sequence outputted by said DC component removal unit; and
    a redundancy sequence adding unit which adds a redundancy sequence generated by said Reed-Solomon coding unit, to the run-length coded sequence outputted by said DC component removal coding unit.

21. A signal coding apparatus according to claim 19, wherein said redundancy sequence adding unit has a division unit which divides the generated redundancy sequence into a plurality of groups,
    wherein each of the groups obtained as a result of the division by the division unit is added to any position, of the run-length coded sequence, which is a different position for each of the groups.

22. A signal coding apparatus according to claim 21, wherein said redundancy sequence adding unit adds to the run-length coded sequence equidistantly for each of the groups obtained as a result of division by the division unit.

23. A signal coding apparatus according to claim 21, wherein among a plurality of bits contained in the generated redundancy sequence the division unit divides in a manner that any two or more bits are as a group.

24. A signal coding apparatus according to claim 21, wherein among a plurality of bits contained in the generated redundancy sequence the division unit divides in a manner that 2N bits (N being an integer greater than or equal to 1) are as a group.

25. A signal decoding apparatus, comprising:
    an input unit which inputs a first signal sequence where a predetermined redundancy sequence has been inserted;
    a redundancy sequence detector which detects an insertion position of the redundancy sequence in the first signal sequence inputted by the input unit;
    a redundancy sequence acquiring unit which cuts out a redundancy sequence from the first signal sequence inputted by the input unit, according to the insertion position detected by the redundancy sequence detector;

a Reed-Solomon decoding unit which corrects error in a second signal sequence acquired by the redundancy sequence acquiring unit, using a redundancy bit cut out by the redundancy sequence acquiring unit; and a run-length limited decoding unit which performs a run-length limited decoding on the second signal sequence where the error has been inspected by the Reed-Solomon decoding unit.

26. A signal processing apparatus including a signal coding apparatus and a signal decoding apparatus, the signal coding apparatus including:

a run-length limited coding unit which generates a run-length coded sequence by subjecting a predetermined signal sequence to run-length limited coding;

a Reed-Solomon coding unit which generates a redundancy sequence by performing Reed-Solomon coding on the run-length coded sequence generated by the run-length limited coding unit and which generates a redundancy sequence; and a redundancy sequence adding unit which adds a redundancy sequence generated by the Reed-Solomon coding unit, to the run-length coded sequence generated by the run-length limited coding unit, and the signal decoding apparatus including:

an input unit which inputs a first signal sequence where a predetermined redundancy sequence has been inserted;

a redundancy sequence detector which detects an insertion position of the redundancy sequence in the first signal sequence inputted by the input unit;

a redundancy sequence acquiring unit which cuts out a redundancy sequence from the first signal sequence inputted by the input unit and acquires a second signal sequence, according to the insertion position detected by the redundancy sequence detector;

a Reed-Solomon decoding unit which corrects error in a second signal sequence acquired by the redundancy sequence acquiring unit, using a redundancy bit cut out by the redundancy sequence acquiring unit; and a run-length limited decoding unit which performs a run-length limited decoding on the second signal sequence where the error has been inspected by the Reed-Solomon decoding unit.

27. A signal processing apparatus including a signal coding apparatus and a signal decoding apparatus, the signal coding apparatus including:

a first run-length limited coding unit which generates a first run-length coded sequence by subjecting a digital signal sequence to run-length limited coding;

a signal processing unit which performs a predetermined signal processing on the digital signal sequence without changing the number of a plurality of bits contained in the digital signal sequence;

a second run-length limited coding unit which generates a second coded sequence by subjecting the digital signal sequence, on which the predetermined signal processing has been performed by the signal processing unit, to run-length limited coding;

a DC component removal coding unit which selects and outputs either one of the first run-length coded sequence generated by the first run-length limited coding unit and the second run-length coded sequence generated by the second run-length limited coding unit;

a Reed-Solomon coding unit which generates a redundancy sequence by performing Reed-Solomon coding on the run-length coded sequence outputted by the DC component removal unit; and a redundancy sequence adding unit which adds a redundancy sequence generated by the Reed-Solomon coding unit, to the run-length coded sequence outputted by the DC component removal coding unit, and the signal decoding apparatus including:

an input unit which inputs a first signal sequence where a predetermined redundancy sequence has been inserted;

a redundancy sequence detector which detects an insertion position of the redundancy sequence in the first signal sequence inputted by the input unit;

a redundancy sequence acquiring unit which cuts out a redundancy sequence from the first signal sequence inputted by the input unit and acquires a second signal sequence, according to the insertion position detected by the redundancy sequence detector;

a Reed-Solomon decoding unit which corrects error in a second signal sequence acquired by the redundancy sequence acquiring unit, using a redundancy bit cut out by the redundancy sequence acquiring unit; and a run-length limited decoding unit which performs a run-length limited decoding on the second signal sequence where the error has been inspected by the Reed-Solomon decoding unit.

28. A signal storage system comprising a write channel for writing data to a storage apparatus and a read channel for reading out the data stored in the storage apparatus, said write channel including:

a first coding unit which performs a run-length limited coding on the data and which performs Reed-Solomon coding on the data which has been subjected to the run-length limited coding;

a second coding unit which codes the data coded by the first coding unit using a low-density parity check code; and a write unit which writes the data coded by second coding unit to the storage apparatus, and said read channel including:

a first input unit which inputs an analog signal outputted from the storage apparatus;

an analog-to-digital converter which converts the analog signal inputted from the first input unit into a digital so as to be outputted;

a soft-output detector which calculates a likelihood of the digital signal outputted from the analog-to-digital converter and outputs a soft-decision value;

a first decoding unit, compatible with the second coding unit, which decodes data outputted from the soft-output detector; and a second decoding unit, compatible with the first coding unit, which decodes data decoded by the first decoding unit, wherein the first coding unit includes:

a run-length limited coding unit which generates a run-length coded sequence by subjecting the data to run-length limited coding;

a Reed-Solomon coding unit which generates a redundancy sequence by performing Reed-Solomon coding on the run-length coded sequence generated by the run-length limited coding unit; and a redundancy sequence adding unit which adds the redundancy sequence generated by the Reed-Solomon coding unit, to the run-length coded sequence generated by the run-length limited coding unit, and wherein the second decoding unit includes:
- a second input unit which inputs the data decoded by the first decoding unit as a first signal sequence;
- a redundancy sequence detector which detects a position, at which the redundancy sequence is inserted, in the first signal sequence inputted by the second input unit;
- a redundancy sequence acquiring unit which cuts out a redundancy sequence from the first signal sequence inputted by the second input unit, according to the insertion position detected by the redundancy sequence detector;
- a Reed-Solomon decoding unit which corrects error in a second signal sequence acquired by the redundancy sequence acquiring unit, using the redundancy sequence cut out by the redundancy sequence acquiring unit; and
- a run-length limited decoding unit which performs a run-length limited decoding on the second signal sequence where the error has been inspected by the Reed-Solomon decoding unit.

29. A storage system according to claim 28, further comprising a storage apparatus which stores data; and a control unit which controls a write to and a read from the storage apparatus,
   wherein said read channel reads the data stored in the storage apparatus according to an instruction of the control unit, and
   wherein said write channel writes coded data to the storage apparatus according to an instruction of the control unit.

30. A coding apparatus according to claim 19, wherein said apparatus is integrated on a single semiconductor substrate.

31. A coding apparatus, comprising:
   a run-length limited coding unit which generates a first coded sequence by subjecting a signal sequence to run-length limited coding;
   a signal processing unit which performs a predetermined signal processing on the digital signal sequence without changing the number of a plurality of bits contained in the digital signal sequence and which generates a second coded sequence; and
   a DC component removal coding unit which selects and outputs either one of the first coded sequence generated by said first run-length limited coding unit and the second coded sequence generated by said signal processing unit;
   wherein said run-length limited coding unit generates the first coded sequence in a manner that there is at least one consecutive-0 interval having bits indicating consecutive 0's in a plurality of bits contained in the first coded sequence and the length of a consecutive-0 interval having a maximum length is greater than or equal to 0 and less than or equal to a first permissible consecutive length, and there is at least one consecutive-1 interval having bits indicating consecutive 1's in a plurality of bits contained in the first coded sequence and the length of a consecutive-1 interval having a maximum length is greater than or equal to 0 and less than or equal to a second permissible consecutive length.

32. A coding apparatus according to claim 31, wherein said run-length limited coding unit generates the first coded sequence by setting the first permissible consecutive length and the second permissible consecutive length equal to each other.

33. A coding apparatus according to claim 31, wherein said signal processing unit performs bit conversion processing on a plurality of bits contained in the digital signal sequence, respectively.

34. A coding apparatus, comprising:
   a run-length limited coding unit which generates a first coded sequence by subjecting a digital signal sequence to run-length limited coding;
   a signal processing unit which performs a predetermined signal processing on the digital signal sequence without changing the number of a plurality of bits contained in the digital signal sequence and which generates a second coded sequence; and
   a DC component removal coding unit which selects and outputs either one of the first coded sequence generated by said first run-length limited coding unit and the second coded sequence generated by said signal processing unit;
   wherein said DC component removal coding unit comprises:
      a coded sequence selection unit which selects either one of the first coded sequence and the second coded sequence;
      a selection identifying information generator which generates selection identifying information that indicates a coded sequence selected by the coded sequence selection unit; and
      an identification information adding unit which adds the selection identifying information generated by the selection identifying information generator, to any position of the coded sequence selected by the coded sequence selection unit.

35. A coding apparatus according to claim 34, the coded sequence selection unit including:
   a first coupling unit which connects a coded sequence, which has already been selected by the coded sequence selection unit, with the first coded sequence; and
   a second coupling unit which connects a coded sequence, which has already been selected by the coded sequence selection unit, with the second coded sequence,
   wherein the coded sequence selection unit sets the sequence connected by the first coupling unit as a new first coded sequence and sets the sequence connected by the second coupling unit as a new second coded sequence, and selects either one of the new coded sequences.

36. A coding apparatus, comprising:
   a run-length limited coding unit which generates a first coded sequence by subjecting a digital signal sequence to run-length limited coding;
   a signal processing unit which performs a predetermined signal processing on the digital signal sequence without changing the number of a plurality of bits contained in the digital signal sequence and which generates a second coded sequence;
   a DC component removal coding unit which selects and outputs either one of the first coded sequence generated by said first run-length limited coding unit and the second coded sequence generated by said signal processing unit;
   a first adding unit which adds a first decision bit to any of positions in the first coded sequence outputted from said first run-length limited coding unit; and
   a second adding unit which adds a second decision bit, where the first decision bit is bit-inverted, to any of positions in the second coded sequence outputted from said signal processing unit.

37. A coding apparatus according to claim 34, the coded sequence selection unit including:
- a first rate calculation unit which calculates a ratio of bits indicating 0 and bits indicating 1 among a plurality of bits contained in the first coded sequence;
- a second rate calculation unit which calculates a ratio of bits indicating 0 and bits indicating 1 among a plurality of bits contained in the second coded sequence; and
- a selection output unit which selects a coded sequence corresponding to either the ratio calculated in the first rate calculation unit or the ratio calculated in the second rate calculation unit whichever is closer to 50% and which outputs the selected sequence.

38. A coding apparatus according to claim 34, the coded sequence selection unit including:
- a first summation unit which adds up a plurality of bits contained in the first coded sequence and generates a first summation value;
- a second summation unit which adds up a plurality of bits contained in the second coded sequence and generates a second summation value;
- a coded sequence detector which compares an absolute value of the first summation value generated by the first summation unit with an absolute value of the second summation value generated by the second summation unit, and which detects a coded sequence corresponding to a smaller summation value either in the first coded sequence or the second coded sequence; and
- a selection output unit which selects the coded sequence detected by the sequence detector from the first coded sequence and the second coded sequence and which outputs the selected coded sequence.

39. A coding apparatus according to claim 34, the coded sequence selection unit including:
- a first additive shift unit which shifts and adds a plurality of bits contained in the first coded sequence and which generates first additive shift values the number of which is equal to the number of the plurality of bits;
- a first maximum value detector which detects a maximum value in a plurality of first additive shift values generated by the first additive shift unit;
- a second additive shift unit which shifts and adds a plurality of bits contained in the second coded sequence and which generates second additive shift values the number of which is equal to the number of the plurality of bits;
- a second maximum value detector which detects a maximum value in a plurality of second additive shift values generated by the second additive shift unit;
- a coded sequence detector which compares the maximum value detected by the first maximum value detector and the maximum value detected by the second maximum value detector and which detects either the first coded sequence or the second coded sequence whichever corresponds to a smaller maximum value; and
- a selection output unit which selects either the first coded sequence or the second coded sequence whichever is detected by the coded sequence detector and which outputs the selected sequence.

40. A decoding apparatus, comprising:
- an input unit which inputs a coded sequence to which a predetermined decision bit is added;
- a decision-bit acquiring unit which acquires the predetermined decision bit added to the coded sequence inputted by said input unit;
- a signal processing unit which performs either a processing in which for the coded sequence inputted by said input unit a plurality of bits contained in the coded sequence are bit-inverted, respectively, according to the decision bit acquired by said decision-bit acquiring unit and a signal sequence to be decoded is outputted or a processing in which the coded sequence is outputted intact as a signal sequence to be decoded; and
- a run-length limited decoding unit which performs a run-length limited decoding on the signal sequence to be decoded which has been outputted by said signal processing unit and which generates a digital signal sequence.

41. A signal processing apparatus including a signal coding apparatus and a signal decoding apparatus, the coding apparatus including:
- a run-length limited coding unit which generates a first coded sequence by subjecting a digital signal sequence to run-length limited coding;
- a first signal processing unit which performs bit inversion processing on each of a plurality of bits contained in the first coded sequence so as to generate a second coded sequence;
- a first adding unit which adds a first decision bit to any of positions in the first coded sequence outputted from said run-length limited coding unit;
- a second adding unit which adds a second decision bit, where the first decision bit is bit-inverted, to any of positions in the second coded sequence outputted from said first signal processing unit; and
- a DC component removal coding unit which selects and outputs either one of the first coded sequence to which the first decision bit has been added by said first adding unit and the second coded sequence to which the second decision bit has been added by said second adding unit, the decoding apparatus including:
- an input unit which inputs a coded sequence to which either one of the first decision bit and the second decision bit has been added;
- a decision-bit acquiring unit which acquires the decision bit added to the coded sequence inputted by said input unit;
- a second signal processing unit which performs either a processing in which for the coded sequence inputted by said input unit a plurality of bits contained in the coded sequence are bit-inverted, respectively, according to the decision bit acquired by said decision-bit acquiring unit and a signal sequence to be decoded is outputted or a processing in which the coded sequence is outputted intact as a signal sequence to be decoded; and
- a run-length limited decoding unit which performs a run-length limited decoding on the signal sequence to be decoded which has been outputted by said second signal processing unit and which generates a digital signal sequence.

42. A signal storage system comprising a write channel for writing data to a storage apparatus and a read channel for reading out the data stored in the storage apparatus,
said write channel including:
- a first coding unit which performs a run-length limited coding on the data;
- a second coding unit which codes the data coded by the first coding unit using a low-density parity check code; and
- a write unit which writes the data coded by second coding unit to the storage apparatus, and said read channel including:
- an input unit which inputs an analog signal outputted from the storage apparatus;

an analog-to-digital converter which converts the analog signal inputted from the input unit into a digital so as to be outputted;

a soft-output detector which calculates a likelihood of the digital signal outputted from the analog-to-digital converter and outputs a soft-decision value;

a first decoding unit, compatible with the second coding unit, which decodes data outputted from the soft-output detector; and a second decoding unit, compatible with the first coding unit, which decodes data decoded by the first decoding unit, and the first coding apparatus including:

a run-length limited coding unit which generates a first coded sequence by subjecting a digital signal sequence to run-length limited coding;

a signal processing unit which performs bit inversion processing on each of a plurality of bits contained in the first coded sequence so as to generate a second coded sequence;

a first adding unit which adds a first decision bit to any of positions in the first coded sequence outputted from the run-length limited coding unit;

a second adding unit which adds a second decision bit, where the first decision bit is bit-inverted, to any of positions in the second coded sequence outputted from the signal processing unit; and a DC component removal coding unit which selects and outputs either one of the first coded sequence to which the first decision bit has been added by the first adding unit and the second coded sequence to which the second decision bit has been added by the second adding unit, the second decoding apparatus including:

an input unit which inputs a coded sequence to which either one of the first decision bit and the second decision bit has been added;

a decision-bit acquiring unit which acquires the decision bit added to the coded sequence inputted by the input unit;

a signal processing unit which performs either a processing in which for the coded sequence inputted by the input unit a plurality of bits contained in the coded sequence are bit-inverted, respectively, according to the decision bit acquired by the decision-bit acquiring unit and a signal sequence to be decoded is outputted or a processing in which the coded sequence is outputted intact as a signal sequence to be decoded; and a run-length limited decoding unit which performs a run-length limited decoding on the signal sequence to be decoded which has been outputted by the signal processing unit and which generates a digital signal sequence.

43. A storage system according to claim 42, further comprising:

a storage apparatus which stores data; and a control unit which controls a write to said storage apparatus and a read from said storage apparatus, wherein said read channel reads out the data stored in said storage apparatus, according to an instruction of said control unit, and wherein said write channel writes coded data to said storage apparatus, according to an instruction of said control unit.

44. A coding apparatus, comprising:

a run-length limited coding unit which generates a first coded sequence by subjecting a digital signal sequence to run-length limited coding;

a signal processing unit which performs a predetermined signal processing on the digital signal sequence without changing the number of a plurality of bits contained in the digital signal sequence and which generates a second coded sequence; and a DC component removal coding unit which selects and outputs either one of the first coded sequence generated by said first run-length limited coding unit and the second coded sequence generated by said signal processing unit;

wherein said apparatus is integrated on a single semiconductor substrate.

45. An amplitude adjustment apparatus, comprising:

an input unit which inputs an analog signal wherein the analog signal has been outputted via a magnetoresistive element, a dynamic range in a positive interval and that in a negative interval are asymmetrical to each other, and the analog signal has a nonlinear interval in either one of the positive interval and the negative interval; and an analog-to-digital conversion unit which adjusts an amplitude of the analog signal and converts the analog signal to a digital signal so as to be outputted when the amplitude of the analog signal inputted by the input unit is present in the nonlinear interval, wherein said analog-to-digital conversion unit has a preadjustment unit which adjusts the amplitude of the analog signal in such a manner as to cancel out nonlinearity in the nonlinear interval before converting the analog signal to the digital signal.

46. An amplitude adjustment apparatus according to claim 45, wherein said preadjustment unit adjusts the amplitude of the analog signal in the nonlinear interval in a manner that an input-output characteristic in the nonlinear interval is set to as a value equivalent to reciprocal of a hyperbolic tangent.

47. An amplitude adjustment apparatus according to claim 45, wherein said preadjustment unit sets a linear function having a first slope at least larger than 1, as an input-output characteristic in a first partial interval among a plurality of partial intervals included in the nonlinear interval, and sets a linear function having a slope different from the first slope, as an input-output characteristic in a second partial interval successive to the first partial interval among the plurality of partial intervals.

48. An amplitude adjustment apparatus according to claim 45, said preadjustment unit including:

a plurality of resistive elements, arranged in series, which each receives an input of a reference signal having a constant voltage and outputs sequentially a reference signal, whose amplitude has been adjusted, to a subsequent resistive element; and a comparator which compares each of the reference signals outputted from the plurality of resistive elements with the amplitude of the analog signal inputted from said input unit so as to adjust the amplitude of the analog signal.

49. An amplitude adjustment apparatus according to claim 48, wherein the plurality of resistive elements vary width of amplitude in a manner that resistance values of the respective resistive elements are given nonuniformity.

50. An amplitude adjustment apparatus according to claim 49, wherein a resistive element, corresponding to the nonlinear interval, in the plurality of resistive elements is set to a resistance value different from resistance values of resistive elements corresponding to intervals other than the nonlinear interval, so as to adjust the nonlinearity in the nonlinear interval.

51. An amplitude adjustment apparatus according to claim 48, said preadjustment unit further including a reference voltage control unit, connected to an input terminal of at least one resistive element of the plurality of resistive elements, which adjusts amplitudes of reference signals outputted from the plurality of resistive elements, respectively, by applying corresponding predetermined reference voltages respectively to the input terminals.

52. An amplitude adjustment apparatus according to claim 51, wherein the plurality of resistive elements have an identical resistance value.

53. An amplitude adjustment apparatus according to claim 51, wherein the reference voltage control unit applies a reference voltage different from that applied to input terminals of resistive elements corresponding to intervals other than the nonlinear interval, to an input terminal of a resistive element, corresponding to the nonlinear interval, among the plurality of resistive elements so as to adjust the nonlinearity in the nonlinear interval.

54. A signal storage system comprising a write channel for writing data to a storage apparatus and a read channel for reading out the data stored in the storage apparatus,
said write channel including:
a first coding unit which performs a run-length limited coding on the data;
a second coding unit which codes the data coded by the first coding unit using a low-density parity check code; and
a write unit which writes the data coded by second coding unit to the storage apparatus, and
said read channel including:
an input unit which inputs an analog signal wherein the analog signal has been outputted from the storage apparatus via a magnetoresistive element, a dynamic range in a positive interval and that in a negative interval are asymmetrical to each other, and the analog signal has a nonlinear interval in either one of the positive interval and the negative interval; and
an analog-to-digital conversion unit which converts the analog signal inputted from the input unit, to a digital signal so as to be outputted;
a soft-output detector which calculates a likelihood of the digital signal outputted from the analog-to-digital conversion unit and outputs a soft-decision value;
a first decoding unit, compatible with the second coding unit, which decodes data outputted from the soft-output detector; and
a second decoding unit, compatible with the first coding unit, which decodes data decoded by the first decoding unit,
wherein said analog-to-digital conversion unit has a preadjustment unit which adjusts the amplitude of the analog signal in such a manner as to cancel out nonlinearity in the nonlinear interval before converting the analog signal to the digital signal, when the amplitude of the analog signal inputted by the input unit is present in the nonlinear interval.

55. A signal storage system according to claim 54, further comprising:
a storage apparatus which stores data; and
a control unit which controls a write to said storage apparatus and a read from said storage apparatus,
wherein said read channel reads out the data stored in said storage apparatus via the magnetoresistive element, according to an instruction of said control unit, and wherein said write channel writes coded data to said storage apparatus, according to an instruction of said control unit.

56. An amplitude adjustment apparatus according to claim 45, wherein said apparatus is integrated on a single semiconductor substrate.

57. A recorded information reader, comprising:
an analog signal input unit which inputs an analog signal outputted from a reader that reads out recorded information recorded in a disk; and
an analog-to-digital conversion unit which inputs the analog signal from said analog signal input unit and converts into a digital wherein in either one of a positive interval and a negative interval in an input level of the analog signal, a relation between an analog signal and a digital signal in an input-output characteristics differs between when the input level of the analog signal is small and when the input level of the analog signal is large;
wherein said analog-to-digital conversion unit comprises:
a plurality of resistive elements, arranged in series, which each receives an input of a reference signal having a constant voltage and outputs sequentially a reference signal, whose amplitude has been adjusted, to a subsequent resistive element; and
a comparator which compares each of the reference signals outputted from the plurality of resistive elements with the input level of the analog signal inputted from said input unit so as to adjust the input level of the analog signal.

58. An amplitude adjustment apparatus according to claim 57, wherein the plurality of resistive elements vary a range of the input level in a manner that resistance values of the respective resistive elements are given nonuniformity.

59. A recorded information reader, comprising:
an analog signal input unit which inputs an analog signal outputted from a reader that reads out recorded information recorded in a disk;
an analog-to-digital conversion unit which inputs the analog signal from said analog signal input unit and converts the analog signal into a digital signal wherein a relation between the analog signal and the digital signal in an input-output characteristic is variable; and
a control unit which determines the relation between the analog signal and the digital signal in an input-output characteristic of said analog-to-digital conversion unit, according to an output of said anaolog-to-digital conversion unit;
wherein said analog-to-digital conversion unit has a variable resistor to which the analog signal is inputted,
wherein said control unit determines a resistance value of the variable resistor.

60. A decoding apparatus, comprising:
an input unit which inputs a data sequence;
a generator which generates a plurality of different signal sequences from the data sequence inputted by said input unit;
a selector which selects one signal sequence from among the plurality of signal sequences generated by said generator;
a decoder which decodes the signal sequence selected by said selector;
a detector which detects the degree of decoding error in the signal sequence decoded by said decoder; and a decision unit which determines whether the degree of error detected by said detector is within a predetermined tolerance or not, wherein when it is determined that the degree of error is within the predetermined tolerance, an output of the signal sequence decoded by said decoder is specified, and wherein when it is determined that the degree of error exceeds the predetermined tolerance, the selection of another signal sequence different from the one signal is specified by said selector, and the signal sequence newly selected by said selector undergoes processing by said decoder and the subsequent.

61. A decoding apparatus according to claim 60, wherein said selector preferentially selects a signal sequence having a high probability that the degree of error is determined to be within the predetermined tolerance by said decision unit.

62. A decoding apparatus according to claim 60, wherein said selector preferentially selects a signal sequence corresponding to a data sequence detected by using a Viterbi algorithm which has a function of predicting noise occurring depending on a signal, from among the plurality of signal sequences generated by said generator.

63. A decoding apparatus according to claim 60, wherein said input unit includes a first input unit and a second input which generate different data sequences, respectively, and wherein said generator generates one or more signal sequences from either one of data sequences inputted from the first input unit and the second input unit, or both of the data sequences.

64. A decoding apparatus according to claim 63, wherein said generator generates the signal sequence, based on a data sequence of a plurality of data sequences inputted by the first input unit and the second input unit, respectively, wherein the data sequence is detected by a first Viterbi algorithm having a function of predicting noise occurring depending on a signal and/or the data sequence is detected by a second Viterbi algorithm having a function different from that of the first Viterbi algorithm.

65. A decoding apparatus according to claim 60, wherein said input unit inputs a soft-decision valued data sequence, and wherein said generator generates a signal sequences by representing the data sequence, inputted by said inputted unit, by a hard-decision value.

66. A decoding apparatus according to claim 65, wherein when, in the data sequence inputted by said input unit, soft-decision data having an absolute value smaller than a predetermined threshold value are contiguous in an interval longer or equal to than a predetermined length and the number of soft-decision data contiguous in the interval is larger than a predetermined quantity, said generator generates a signal sequence in a manner that the sign of the contiguous soft-decision data is inverted and thereafter represented by a hard-decision value or the soft-decision data are represented by a hard-decision value and thereafter the hard-decision-processed data are logically inverted.

67. A decoding apparatus according to claim 65, wherein when, among a plurality of soft-decision data contained in the data sequence inputted by said input unit, the signs of adjacent soft-decision data differ, respectively, in an interval longer than or equal to a predetermined length, said generator generates a signal sequence in a manner that the sign of the soft-decision data corresponding to the interval is inverted and thereafter represented by a hard-decision value or the soft-decision data corresponding to the interval are represented by a hard-decision-processed value and thereafter the hard-decision data are logically inverted.

68. A decoding apparatus according to claim 65, wherein said generator generates a signal sequence in a manner that the sign of soft-decision data having an absolute value smaller than a predetermined threshold value, among a plurality of soft-decision data contained in the data sequence inputted by said input unit, is inverted and thereafter represented by a hard-decision value or the soft-decision data having an absolute value smaller than the predetermined threshold value are represented by a hard-decision value and thereafter the hard-decision-processed data are logically inverted.

69. A decoding apparatus according to claim 64, wherein said generator generates the signal sequence in a manner that, based on a hard-decision value of one of two data sequences, a hard-decision value of the other data sequence is modified where the two data sequences are among the plurality of data sequences inputted by the first input unit and the second input unit.

70. A decoding apparatus according to claim 64, wherein said generator generates the signal sequence in a manner that, based on a hard-decision value of either one of the data sequence detected by the first Viterbi algorithm having a function of predicting noise occurring depending on a signal and the data sequence detected by a second Viterbi algorithm having a function different from that of the first Viterbi algorithm, a hard-decision value of the other data sequence is modified where the two data sequences are among the plurality of data sequences inputted by the first input unit and the second input unit.

71. A decoding apparatus according to claim 69, wherein said generator modifies the hard-decision value of one of the two data sequences in a manner that when a hard-decision value of first data contained in one of two data sequences differs from a hard-decision value of second data, contained in the other data sequence, existing in a position corresponding to the first data, the first data contained in one of the two data sequences are substituted by the second data, where the two data sequences are among the plurality of data sequences inputted by the first input unit and the second input unit.

72. A decoding apparatus according to claim 69, wherein said generator modifies the hard-decision value of one of the two data sequences in a manner that when a hard-decision value of first data contained in one of two data sequences differs from a hard-decision value of second data, contained in the other data sequence, existing in a position corresponding to the first data and a difference between an absolute value of a soft-value of the second data and an absolute value of a soft-decision value of the first data is larger than a predetermined threshold value, the first data contained in one of the two data sequences are substituted by the second data, where the two data sequences are among the plurality of data sequences inputted by the first input unit and the second input unit.

73. A decoding method, comprising:

generating a plurality of different data sequences;

generating a plurality of signal sequences from the plurality of data sequences generated;

selecting one signal sequence from among the plurality of signal sequences generated; and decoding the signal sequence selected, wherein said selecting is such that a signal sequence different from that which has already been selected is selected sequentially and processing after said decoding is repeated until the degree of error in the signal sequence decoded in said decoding becomes smaller than a predetermined value.

74. A decoding apparatus according to claim 60, wherein said apparatus is integrated on a single semiconductor substrate.

75. A decoding apparatus, comprising:
- an input unit which includes a first input unit that generates a data sequence and a second input unit that generates a data sequence different from that generated by the first input unit;
- a generator which generates a plurality of different signal sequences from the data sequences inputted by said input unit;
- a selector which selects one signal sequence from among the plurality of signal sequences generated by said generator;
- a decoder which decodes the signal sequence selected by said selector;
- a detector which detects the degree of decoding error in the signal sequence decoded by said decoder; and
- a decision unit which determines whether the degree of error detected by said detector is within a predetermined tolerance or not,
- wherein when it is determined by said decision unit that the degree of error is within the predetermined tolerance, the output of the signal sequence decoded by said decoder is specified.

76. A decoding apparatus according to claim 75, wherein when it is determined by said decision unit that the degree of error exceeds the predetermined tolerance, the selection of another signal sequence different from the one signal is specified by said selector, and the signal sequence newly selected by said selector again undergoes processing by said decoder and the subsequent.

77. A decoding apparatus according to claim 75, wherein said selector preferentially selects a signal sequence having a high probability that the degree of error is determined to be within the predetermined tolerance by said decision unit.

78. A decoding apparatus according to claim 60, wherein when a bit contained in the inputted signal sequence is represented by hard-decision values, said generator refers to a degree of reliability of other bits.

79. A decoding apparatus according to claim 78, wherein when the bit contained in the inputted signal sequence is represented by a hard-decision value, said generation refers to the degree of reliability of said bit and the degree of reliability of bits, other than said bit, contained in the signal sequence.

80. A decoding apparatus according to claim 75, wherein when representing by a hard-decision value, said generator refers to a degree of reliability of an output signal from the first input unit and a degree of reliability of an output signal from the second input unit.

81. A decoding apparatus according to claim 80, wherein when determining a hard-decision value of a bit, said generator refers to the degree of reliability of an output signal from the first input unit and the degree of reliability of an output signal from the second input unit.

82. A decoding apparatus according to claim 81, wherein when determining a hard-decision value of a bit, said generator compares the degrees of reliability of mutually corresponding bits in the output signal from the first input unit and the output signal of the second input unit.

83. A decoding apparatus according to claim 75, wherein when selecting an output from the first input unit and an output from the second input, said selector preferentially selects either one of the outputs therefrom.

84. A decoding apparatus according to claim 75, further comprising:
- a read unit which reads out recorded information recorded in a disk and outputs it to said input unit; and
- a read status decision unit which determines a read status in said read unit,
- wherein said selector determines whether priority is given to either an output from the first input unit or an output from the second input unit, based on the status determined by said read status decision unit.

* * * * *